United States Patent [19]
Fowler

[11] Patent Number: 6,078,253
[45] Date of Patent: Jun. 20, 2000

[54] OCCUPANCY SENSOR AND METHOD OF OPERATING SAME

[75] Inventor: John J. Fowler, Austin, Tex.

[73] Assignee: Mytech Corporation, Austin, Tex.

[21] Appl. No.: 08/951,119

[22] Filed: Oct. 15, 1997

Related U.S. Application Data

[63] Continuation-in-part of application No. 08/795,367, Feb. 4, 1997, Pat. No. 5,784,323.

[51] Int. Cl.[7] .................................................. G08B 23/00
[52] U.S. Cl. .......................... 340/501; 340/511; 340/521; 340/522; 340/567; 307/116; 307/117; 307/32
[58] Field of Search .................................... 340/501, 567, 340/511, 517, 516, 521, 522, 541, 514; 307/116, 117, 32; 364/145; 315/159, 362, 292

[56] References Cited

U.S. PATENT DOCUMENTS

| | | | |
|---|---|---|---|
| 3,074,053 | 1/1963 | McDonough et al. | 340/522 |
| 3,383,678 | 5/1968 | Palmer | 342/28 |
| 3,721,972 | 3/1973 | Hermans | 340/506 |
| 3,725,888 | 4/1973 | Solomon | 340/522 |
| 3,777,139 | 12/1973 | Peel | 246/125 |
| 3,781,859 | 12/1973 | Hermans | 340/507 |
| 3,801,978 | 4/1974 | Gershberg et al. | 340/516 |
| 3,838,408 | 9/1974 | McMaster | 340/501 |
| 3,958,118 | 5/1976 | Schwarz | 250/221 |
| 3,967,283 | 6/1976 | Clark et al. | 342/28 |
| 4,021,679 | 5/1977 | Bolle et al. | 307/117 |
| 4,051,472 | 9/1977 | Albanese et al. | 342/28 |
| 4,172,253 | 10/1979 | Hermans | 367/94 |
| 4,207,559 | 6/1980 | Meyer | 340/531 |
| 4,225,808 | 9/1980 | Saraceni | 315/307 |
| 4,243,979 | 1/1981 | Kleinschmidt | 340/554 |
| 4,275,390 | 6/1981 | Heywang et al. | 340/554 |
| 4,315,596 | 2/1982 | Johnson, Jr. et al. | 236/94 |
| 4,331,952 | 5/1982 | Galvin et al. | 340/508 |
| 4,336,464 | 6/1982 | Weber | 307/141.4 |
| 4,337,402 | 6/1982 | Nowakowski | 307/121 |
| 4,361,767 | 11/1982 | Pelka et al. | 307/117 |
| 4,383,288 | 5/1983 | Hess, II et al. | 362/552 |
| 4,391,406 | 7/1983 | Fried | 236/47 |
| 4,401,976 | 8/1983 | Stadelmayr | 340/522 |
| 4,461,977 | 7/1984 | Pierpoint et al. | 315/159 |

(List continued on next page.)

FOREIGN PATENT DOCUMENTS

| | | |
|---|---|---|
| 0 066 691 | 12/1982 | European Pat. Off. . |
| 40 05 169 | 8/1991 | Germany . |
| 4302836 | 7/1994 | Germany . |
| WO 92/10074 | 6/1992 | WIPO . |
| WO 93/05627 | 3/1993 | WIPO . |
| WO 94/20937 | 9/1994 | WIPO . |
| WO 96/25021 | 8/1996 | WIPO . |

OTHER PUBLICATIONS

International Search Report dated May 18, 1998 (PCT/US98/02010) (MYTE:023P).

Imbrecht et al., In: Building Energy Efficiency Standards, California Energy Commision, Jul. 1988.

O'Mara, "Dual–technology sensors solve installation problems," *Security Distributing & Marketing*, pp. 81–83, Aug. 1990.

International Search Report dated Jun. 7, 1996.

Hubbell, "Mass 1500A and 750A Motion Switching Sustem," 1993.

*Primary Examiner*—Benjamin C. Lee
*Attorney, Agent, or Firm*—Arnold, White & Durkee

[57] ABSTRACT

A multiple sensing technology-based occupancy sensor. Ultrasonic and infrared sensors are used to produce first and second occupancy estimator signals that are combined using a fusion based detection algorithm to produce a combined estimator signal. The combined estimator is then used to switch electrical loads when the combined estimator signal is above a predetermined threshold. The result is an occupancy sensor that has a very high probability of occupancy detection and a low probability of false tripping. In addition, infrared sensitivity is adjusted based upon an estimation of the background noise in order to minimize the occurrence of false tripping.

9 Claims, 78 Drawing Sheets

U.S. PATENT DOCUMENTS

| | | | |
|---|---|---|---|
| 4,468,658 | 8/1984 | Rossin | 340/567 |
| 4,521,843 | 6/1985 | Pezzolo et al. | 364/145 |
| 4,551,654 | 11/1985 | Barnum | 318/159 |
| 4,575,659 | 3/1986 | Pezzolo et al. | 315/159 |
| 4,593,234 | 6/1986 | Yang | 315/362 |
| 4,636,774 | 1/1987 | Galvin et al. | 340/565 |
| 4,660,024 | 4/1987 | McMaster | 340/522 |
| 4,661,720 | 4/1987 | Cameron, Jr. et al. | 307/117 |
| 4,678,985 | 7/1987 | Moskin | 323/324 |
| 4,703,171 | 10/1987 | Kahl et al. | 250/221 |
| 4,710,750 | 12/1987 | Johnson | 340/522 |
| 4,713,598 | 12/1987 | Smith | 323/245 |
| 4,751,339 | 6/1988 | Koehring et al. | 307/117 |
| 4,751,399 | 6/1988 | Koehring et al. | 307/117 |
| 4,757,303 | 7/1988 | Scheidweiler | 340/501 |
| 4,769,765 | 9/1988 | Green | 364/145 |
| 4,787,222 | 11/1988 | Claytor | 359/742 |
| 4,815,046 | 3/1989 | Dorr | 367/95 |
| 4,820,938 | 4/1989 | Mix et al. | 307/117 |
| 4,833,450 | 5/1989 | Buccola et al. | 340/506 |
| 4,843,283 | 6/1989 | Chen | 315/153 |
| 4,857,912 | 8/1989 | Everett, Jr. et al. | 340/825.3 |
| 4,866,425 | 9/1989 | Lindmark | 340/556 |
| 4,874,962 | 10/1989 | Rowland | 200/61.45 R |
| 4,882,567 | 11/1989 | Johnson | 340/522 |
| 4,890,093 | 12/1989 | Allison et al. | 340/567 |
| 4,929,833 | 5/1990 | Smith | 250/338.1 |
| 5,015,994 | 5/1991 | Hoberman et al. | 340/567 |
| 5,077,548 | 12/1991 | Dipoala | 340/522 |
| 5,083,025 | 1/1992 | Blomberg | 250/353 |
| 5,084,696 | 1/1992 | Guscott et al. | 340/541 |
| 5,101,194 | 3/1992 | Sheffer | 340/567 |
| 5,124,546 | 6/1992 | Hu | 250/216 |
| 5,124,566 | 6/1992 | Hu | 307/116 |
| 5,128,654 | 7/1992 | Griffen et al. | 340/567 |
| 5,142,199 | 8/1992 | Elwell | 315/154 |
| 5,181,010 | 1/1993 | Chick | 340/426 |
| 5,189,393 | 2/1993 | Hu | 340/522 |
| 5,194,848 | 3/1993 | Kerr | 340/566 |
| 5,196,826 | 3/1993 | Whiting | 340/554 |
| 5,221,919 | 6/1993 | Hermans | 340/567 |
| 5,243,327 | 9/1993 | Bentz et al. | 340/566 |
| 5,258,743 | 11/1993 | Nelson et al. | 340/568.1 |
| 5,258,775 | 11/1993 | Casey et al. | 347/255 |
| 5,258,899 | 11/1993 | Chen | 362/394 |
| 5,276,427 | 1/1994 | Peterson | 340/522 |
| 5,281,961 | 1/1994 | Elwell | 340/825 |
| 5,282,118 | 1/1994 | Lee | 362/276 |
| 5,283,551 | 2/1994 | Guscott | 340/567 |
| 5,293,097 | 3/1994 | Elwell | 315/154 |
| 5,307,054 | 4/1994 | Concannon, Sr. et al. | 340/690 |
| 5,317,304 | 5/1994 | Choi | 340/571 |
| 5,317,620 | 5/1994 | Smith | 379/40 |
| 5,319,283 | 6/1994 | Elwell | 315/194 |
| 5,349,330 | 9/1994 | Diong | 340/567 |
| 5,357,170 | 10/1994 | Luchaco | 315/159 |
| 5,374,854 | 12/1994 | Chen | 307/117 |
| 5,386,210 | 1/1995 | Lee | 340/567 |
| 5,406,176 | 4/1995 | Sudgen | 315/292 |
| 5,471,194 | 11/1995 | Guscott | 340/511 |
| 5,473,202 | 12/1995 | Mudge et al. | 307/116 |
| 5,482,314 | 1/1996 | Corrado et al. | 280/735 |
| 5,489,827 | 2/1996 | Xia | 315/294 |
| 5,504,476 | 4/1996 | Cecic et al. | 340/541 |
| 5,543,777 | 8/1996 | Vane et al. | 340/514 |
| 5,578,988 | 11/1996 | Hoseit et al. | 340/522 |
| 5,581,237 | 12/1996 | DiPoala | 340/554 |
| 5,586,048 | 12/1996 | Coveley | 702/189 |
| 5,640,143 | 6/1997 | Myron et al. | 340/541 |
| 5,673,022 | 9/1997 | Patel | 340/565 |
| 5,701,117 | 12/1997 | Platner et al. | 340/567 |

|   | A |   |   |   |   |   |   |   |   |   |   |   |   |   |   |   |
|---|---|---|---|---|---|---|---|---|---|---|---|---|---|---|---|---|
|   | 0 | 1 | 2 | 3 | 4 | 5 | 6 | 7 | 8 | 9 | 10 | 11 | 12 | 13 | 14 | 15 |
| 0 | 0 | 1 | 2 | 3 | 4 | 5 | 6 | 7 | 8 | 9 | 10 | 11 | 12 | 13 | 14 | 15 |
| 1 | 1 | 1 | 2 | 3 | 4 | 5 | 6 | 7 | 8 | 9 | 10 | 11 | 12 | 13 | 14 | 15 |
| 2 | 2 | 2 | 2 | 3 | 4 | 5 | 6 | 7 | 8 | 9 | 10 | 11 | 12 | 13 | 14 | 15 |
| 3 | 3 | 3 | 3 | 4 | 5 | 5 | 6 | 7 | 8 | 9 | 10 | 11 | 12 | 13 | 14 | 15 |
| 4 | 4 | 4 | 4 | 5 | 5 | 6 | 7 | 8 | 8 | 9 | 10 | 11 | 12 | 13 | 14 | 15 |
| 5 | 5 | 5 | 5 | 5 | 6 | 7 | 7 | 8 | 9 | 10 | 11 | 12 | 13 | 13 | 14 | 15 |
| 6 | 6 | 6 | 6 | 6 | 7 | 7 | 8 | 9 | 10 | 10 | 11 | 12 | 13 | 14 | 15 | 16 |
| 7 | 7 | 7 | 7 | 7 | 8 | 8 | 9 | 9 | 10 | 11 | 12 | 13 | 13 | 14 | 15 | 16 |
| 8 | 8 | 8 | 8 | 8 | 8 | 9 | 10 | 10 | 11 | 12 | 12 | 13 | 14 | 15 | 16 | 17 |
| 9 | 9 | 9 | 9 | 9 | 9 | 10 | 10 | 11 | 12 | 12 | 13 | 14 | 15 | 15 | 16 | 17 |
| 10 | 10 | 10 | 10 | 10 | 10 | 11 | 11 | 12 | 12 | 13 | 14 | 14 | 15 | 16 | 17 | 18 |
| 11 | 11 | 11 | 11 | 11 | 11 | 12 | 12 | 13 | 13 | 14 | 14 | 15 | 16 | 17 | 17 | 18 |
| 12 | 12 | 12 | 12 | 12 | 12 | 13 | 13 | 13 | 14 | 15 | 15 | 16 | 16 | 17 | 18 | 19 |
| 13 | 13 | 13 | 13 | 13 | 13 | 13 | 14 | 14 | 15 | 15 | 16 | 17 | 17 | 18 | 19 | 19 |
| 14 | 14 | 14 | 14 | 14 | 14 | 14 | 15 | 15 | 16 | 16 | 17 | 17 | 18 | 19 | 19 | 20 |
| 15 | 15 | 15 | 15 | 15 | 15 | 15 | 16 | 16 | 17 | 17 | 18 | 18 | 19 | 19 | 20 | 21 |

B (row labels)

FIG. 21

|   | A |   |   |   |   |   |   |   |   |   |   |   |   |   |   |   |
|---|---|---|---|---|---|---|---|---|---|---|---|---|---|---|---|---|
|   | 0 | 1 | 2 | 3 | 4 | 5 | 6 | 7 | 8 | 9 | 10 | 11 | 12 | 13 | 14 | 15 |
| 0 | 0 | 1 | 2 | 3 | 4 | 5 | 6 | 7 | 8 | 9 | 10 | 11 | 12 | 13 | 14 | 15 |
| 1 | 1 | 4 | 5 | 7 | 9 | 10 | 11 | 13 | 14 | 16 | 17 | 18 | 19 | 21 | 22 | 23 |
| 2 | 2 | 5 | 8 | 9 | 11 | 13 | 14 | 16 | 18 | 19 | 20 | 22 | 23 | 25 | 26 | 27 |
| 3 | 3 | 7 | 9 | 12 | 13 | 15 | 17 | 19 | 20 | 22 | 23 | 25 | 27 | 28 | 29 | 31 |
| 4 | 4 | 9 | 11 | 13 | 16 | 17 | 19 | 21 | 23 | 25 | 26 | 28 | 29 | 31 | 32 | 34 |
| 5 | 5 | 10 | 13 | 15 | 17 | 20 | 21 | 23 | 25 | 27 | 29 | 30 | 32 | 34 | 35 | 37 |
| 6 | 6 | 11 | 14 | 17 | 19 | 21 | 24 | 25 | 27 | 29 | 31 | 33 | 34 | 36 | 38 | 39 |
| 7 | 7 | 13 | 16 | 19 | 21 | 23 | 25 | 28 | 29 | 31 | 33 | 35 | 37 | 39 | 40 | 42 |
| 8 | 8 | 14 | 18 | 20 | 23 | 25 | 27 | 29 | 32 | 33 | 35 | 37 | 39 | 41 | 43 | 44 |
| 9 | 9 | 16 | 19 | 22 | 25 | 27 | 29 | 31 | 33 | 36 | 37 | 39 | 41 | 43 | 45 | 47 |
| 10 | 10 | 17 | 20 | 23 | 26 | 29 | 31 | 33 | 35 | 37 | 40 | 41 | 43 | 45 | 47 | 49 |
| 11 | 11 | 18 | 22 | 25 | 28 | 30 | 33 | 35 | 37 | 39 | 41 | 44 | 45 | 47 | 49 | 51 |
| 12 | 12 | 19 | 23 | 27 | 29 | 32 | 34 | 37 | 39 | 41 | 43 | 45 | 48 | 49 | 51 | 53 |
| 13 | 13 | 21 | 25 | 28 | 31 | 34 | 36 | 39 | 41 | 43 | 45 | 47 | 49 | 52 | 53 | 55 |
| 14 | 14 | 22 | 26 | 29 | 32 | 35 | 38 | 40 | 43 | 45 | 47 | 49 | 51 | 53 | 56 | 57 |
| 15 | 15 | 23 | 27 | 31 | 34 | 37 | 39 | 42 | 44 | 47 | 49 | 51 | 53 | 55 | 57 | 60 |

B (row labels)

FIG. 22

OCCUPANCY SENSOR AND METHOD OF OPERATING SAME

The present application is a continuation-in-part of pending application Ser. No. 08/795,327, filed February 4, 1997 now U.S. Pat. No. 5,784,323.

BACKGROUND OF THE INVENTION

The present invention relates to occupancy sensors.

A portion of the disclosure of this patent document contains material that is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

An occupancy sensor is an energy conservation device designed to detect the presence of human occupant(s) in a given area. When occupancy is sensed, the various electrically-powered loads in that area controlled by the sensor (for example, lights, ventilation, and the like) are energized. When that same area has been unoccupied for a predetermined period of time, the sensor de-energizes the electrical loads that it controls. Occupancy sensors may therefore conserve a great deal of energy in areas where the occupants do not exercise diligence in de-energizing those electrical loads when they leave the area.

Over the last few decades, several events have led to the growth of a large consumer market for energy saving devices including occupancy sensors. First, there has been an increase in public awareness of energy conservation and its beneficial environmental consequences. In addition, there has been increased realization by both private and government-controlled power generation industries of the economic and environmental advantages of energy conservation as a means of meeting peak load power demands. Finally, there have been legislative mandates at the federal, state and local levels for the use of energy conserving devices, such as occupancy sensors, in government and other public buildings.

Occupancy sensors have been successfully designed and tested using a variety of technologies. A brief description of the most widely used occupancy sensor technologies along with the strengths and weaknesses of those technologies follows:

Active Ultrasonic Acoustic Doppler Occupancy Detection.

This technology allows continuous detection of moving objects that reflect ultrasonic acoustic energy. This method of occupancy detection is highly sensitive since it is based on an active source of ultrasonic acoustic energy. An apparatus and method of this type are disclosed in U.S. patent application Ser. No. 08/384,580, filed Feb. 6, 1995, now U.S. Pat. No. 5,640,14, assigned to the same assignee as the present invention and entitled: OCCUPANCY SENSOR AND METHOD FOR OPERATING SAME, the disclosure of which is incorporated herein by reference.

However, this method of occupancy detection has several limitations: first, it is insensitive to motion that is orthogonal to the direction toward the receiver; second it is insensitive to motion generally not in the line of sight of the receiver; third, it is subject to false tripping due to other sources of ultrasonic energy; fourth, it is subject to false tripping due to heating and air conditioning air flow; and finally, it has no means of range discrimination. Since occupancy sensors based on Doppler techniques have no means of range discrimination, a large-distant target moving at approximately the same speed as a smaller, nearby target might have similar target signatures.

Active Electromagnetic Doppler Occupancy Detection

This technology allows continuous detection of moving objects that reflect electromagnetic energy. This method of occupancy detection is highly sensitive since it is based on an active source of electromagnetic energy. However, this method of motion detection also has several limitations: first, it is insensitive to motion that is orthogonal to the direction toward the receiver; second, it is insensitive to motion generally not in the line of sight of the receiver; third, it is subject to false tripping due to other sources of electromagnetic energy; and finally, it has no means of range discrimination.

Passive Audio Acoustic Occupancy Detection

This technology allows continuous detection of objects that emit audio acoustic energy. This method of occupancy detection is quite sensitive but is subject to false tripping due to non-occupant sources of audio acoustic energy such as facsimile machine, telephone and security system tones, automobile and emergency vehicle horns, etc.

Passive Infrared Occupancy Detection

This technology allows continuous detection of moving objects that emit infrared energy. This method of occupancy detection is also quite sensitive even though it is based on passive sensing of moving sources of infrared energy. This method of occupancy detection also has several limitations: first, it is insensitive to sources generally not in the line of sight of the receiver; second, it is subject to being blinded by intense, stationary sources of infrared energy; third, it is subject to false tripping due to rapid fluctuations in the intensity of stationary infrared sources; and finally, it is subject to a detection coverage tradeoff involving the number of lens facets versus detection range.

Position Sensor Based Occupancy Detection

This technology uses one or more mercury switches to sense changes in the physical position of the sensor. This technology has several limitations: first, it is insensitive to minor motion that may be indicative of occupancy; and second, it is inherently a digital (off/on) device.

Piezoelectric Sensor Based Occupancy Detection

This technology senses the changes in the resistance of a piezoelectric sensor to sense occupancy. This technology is subject to false tripping due to changes in temperature.

Significant innovation in the design of occupancy sensors has occurred over the last few decades. The early occupancy sensors utilized primarily analog signal processing techniques. The large area motion sensor described in U.S. Pat. No. 3,967,283 by Clark et. al., issued Jun. 29, 1976, utilized electromagnetic motion detection and was based on analog signal processing techniques. The occupancy sensor described in U.S. Pat. No. 4,661,720 by Cameron, Jr. et. al., issued Apr. 28, 1987, and the low voltage motion sensor for activating a high voltage load described in U.S. Pat. No. 4,820,938 by Mix et. al., issued Apr. 11, 1989, utilized analog signal processing techniques. The variable gain amplifier used in these sensors required manual adjustment. The room occupancy sensor, lens and method of lens fabrication described in U.S. Pat. No. 5,221,919 by Hermans, issued Jun. 22, 1993, utilized passive infrared detection and was based on analog signal processing techniques. The motion detection sensor with computer interface described in U.S. Pat. No. 5,281,961 by Elwell, issued Jan. 25, 1994, utilized active ultrasonic motion detection and was based primarily on analog signal processing techniques. Although easy to design and relatively cheap to implement, the analog filters in these devices had filter response characteristics that drifted with temperature variations and that varied over the lifetime of the various analog filter components. The overall result of using a sensor based on analog signal processing techniques was an occupancy sensor whose performance was unpredictable.

Additionally, the majority of these early occupancy sensors were based on a single sensing technology. Since each technology has its own inherent limitations, these sensors were subject to false tripping due to a variety of sources. For example, ultrasonic Doppler sensors were subject to false trips due to air conditioning and heating system air flow. In addition, since these sensors had no means of range discrimination, they were subject to false trips due to motion outside the desired range of interest. Similarly, passive infrared (PIR) sensors were subject to being blinded by intense, stationary sources of infrared energy. The automatic lighting device described in U.S. Pat. No. 4,751,399 by Koehring et. al. issued Jun. 14, 1988 utilized only acoustic motion detection. This sensor was subject to false tripping due to non-occupant sources of audio acoustic energy such as facsimile machine, telephone and security system controller tones, emergency vehicle and automobile horns, etc. The selective illumination technique described in U.S. Pat. No. 4,225,808 by Saraceni issued Sep. 30, 1980 allowed the use of pressure, ultrasonic motion, microwave, photoelectric and audible sound sensors but failed to combine these technologies to achieve a more reliable sensor with a reduced probability of false tripping. In order to lessen the probability of false trips, the user was often forced to reduce the sensor's sensitivity. The overall result of using a sensor based on a single technology was an occupancy sensor with reduced sensitivity and reliability.

The next generation of occupancy sensors used two or more sensing technologies. These sensors typically required the user to specify a separate activation threshold for each detector technology in the sensor. The digital detector output of each sensor technology was then combined using classical digital logic to detect occupancy. The preset light controller including infrared sensor operable in multiple modes described in U.S. Pat. No. 5,128,654 by Griffin et. al., issued Jul. 7, 1992, used infrared and visible light sensors. The dual technology motion sensor described in U.S. Pat. No. 5,189,393 by Hu, issued Feb. 23, 1993, combined the outputs of its ultrasonic and infrared sensors using classical Boolean AND and OR hardware logic. In general, these multiple sensing technology sensors had better performance than their predecessors but still exhibited a sensitivity-false alarm tradeoff. For example, if the various detector signals were combined using the logical OR function, the overall sensitivity of the sensor increased at the expense of an increased incidence of false trips. On the other hand, if the various detector signals were combined using the logical AND function, the overall incidence of false trips decreased at the expense of decreased sensor sensitivity. Since each sensing technology has its own separate activation threshold, these sensors were often unable to reliably detect motion in marginal cases where one or more sensing technologies observed signal levels just below the user-defined threshold level. The overall result of using these early multiple sensing technology-based occupancy sensors was an improved performance occupancy sensor that was unable to sense occupancy in the more complex marginal sensor signal level situations.

In general, prior art occupancy sensors heretofore known suffer from a number of disadvantages, including:

1. Lack of a sophisticated multiple sensing technology sensor signal conditioning to more completely exploit the advantages of sensing technologies while minimizing disadvantages. The prior art failed to combine the various occupancy sensor detection technologies in a sophisticated fashion to increase the overall probability of occupancy detection while simultaneously lowering the overall probability of false tripping.
2. Lack of adaptive sensor behavior. The prior art failed to produce an occupancy sensor whose performance adapted over time to optimize the sensor's performance.
3. Lack of digital signal processing techniques. The prior art used analog signal processing techniques. The analog filters used in these sensors required manual tuning that was a costly, time consuming process. In addition, the performance of these analog filters was temperature dependent and drifted with time.
4. Lack of means to simply and efficiently communicate the status of the sensor to installation and maintenance personnel. An occupancy sensor, typically has a number of settings that determine its mode of operation, and that the person who installs or maintains the sensor may wish to review. The sensor is typically installed out of reach on a ceiling or wall such that its adjustment knobs or dials are not readily visible. The prior art does not incorporate a system to make such settings readily available and apparent to a person who wishes to query them.
5. Lack of means to check status of the controlled signal to determine if a load device is connected, or if the controlled output is misconnected or shorted.
6. Lack of permanent storage of sensor variables. The prior art failed to permanently store various sensor settings. In the event of a power failure, these sensors had no means of recovering their previous settings.
7. Lack of no means to recognize an excessively reverberant controlled space with excessive ultrasonic return signal amplitude, and lack of means to compensate by adjusting the ultrasonic transmitter amplitude.
8. Lack of ultrasonic receiver preamplifier and demodulator performance monitoring means. The prior art did not monitor ultrasonic receiver preamplifier and demodulator performance and did not have means for making adjustments to accommodate a poorly executed installation or highly acoustically reflective space. A sophisticated ultrasonic sensor incorporates a high gain receiver preamplifier that may become saturated due to excessive acoustic reflections from room walls and other hard structures within the space. Furthermore, the sensor may be installed incorrectly too close to a fixed acoustic reflector such as a wall, exit sign, or other architectural feature. Saturation of the receiver preamplifier causes the motion signal to be lost, and the sensor to be effectively blinded by the excessive signal level. It is desirable that the sensor may be installed by unskilled personnel, and that the sensor be able to accommodate non-ideal situations created either by improper installation or difficult acoustic environments. The prior art has no means to determine saturation of the receiver preamplifier, nor any means to correct for such saturation.
9. Lack of occupancy cycle detection and utilization. The prior art did not detect the typical daily and weekly occupancy cycle of the sensor's environment and use that information to make occupancy decisions. A workspace is typically occupied according to a cycle that varies predictably throughout the day, and also according to a set pattern through the work week. Heretofore, sensors have not taken into account this pattern, and the prior art has no means to survey and record the typical daily and weekly occupancy patterns, nor to store that information, nor to act on the basis of that information.

10. Lack of adaptive PIR sensitivity adjustment to accommodate different and time-varying levels of ambient PIR noise

SUMMARY OF THE INVENTION

The present invention solves the above-noted failings in the prior art by providing an occupancy based load controller, comprising least one occupancy sensor for producing at least one occupancy estimator signal indicative of motion within a space, a programmable microprocessor, connected to the at least one occupancy sensor, for calculating an occupancy signal from the at least one occupancy estimator signal, for comparing the occupancy signal to an activation threshold, and for adjusting a sensitivity of the at least one occupancy sensor as a function of time-varying noise that corrupts the at least one occupancy estimator signal; and a controllable load energizing device responsive to the programmable microprocessor, operable to automatically energize an electrical load when the microprocessor determines that the occupancy signal is greater than the activation threshold.

The at least one occupancy sensor may be a PIR sensor, in which case the programmable microprocessor adjusts the sensitivity of the PIR sensor as a function of seasonal infrared noise that corrupts the output of the PIR sensor.

The invention also includes a method of operating an occupancy based load controller, including: at least one occupancy sensor that produces at least one occupancy estimator signal indicative of motion within a space, a programmable microprocessor, connected to the at least one occupancy sensor, for comparing the occupancy estimator signal to a predetermined threshold; and a controllable load energizing device responsive to the programmable microprocessor, operable to automatically energize an electrical load when the microprocessor determines that the occupancy estimator signal is greater than the predetermined threshold; the method comprising, estimating noise that corrupts the at least one occupancy estimator signal; and adjusting a sensitivity of the at least one occupancy sensor as a function of the estimated noise. The estimating step may include estimating noise by filtering the occupancy estimator signal using a statistical order filter, by digitally filtering the occupancy estimator signal by time integrating the occupancy estimator, by averaging the occupancy estimator signal over time, or by detecting an envelope of the occupancy estimator signal. Sensitivity adjustment is preferably done based upon samples of the occupancy estimator signal taken while the electrical load is de-energized. Further, sensitivity adjustment may be accomplished by adjusting the predetermined threshold as a function of the estimated noise.

Other features and advantages of the invention will become apparent from a consideration of the drawings and ensuing detailed description.

BRIEF DESCRIPTION OF THE DRAWINGS

FIG. 7($b$) is an alternative sampling control circuit useable in the circuit of FIG. 7($a$)

FIG. 21 is a decision surface for a table look-up version of the Yager Union function in FIG. 19.

FIG. 22 is a decision surface for a table look-up version of the Yager Union function in FIG. 20.

DESCRIPTION OF ILLUSTRATIVE EMBODIMENTS

Glossary of Acronyms

Figure 1:
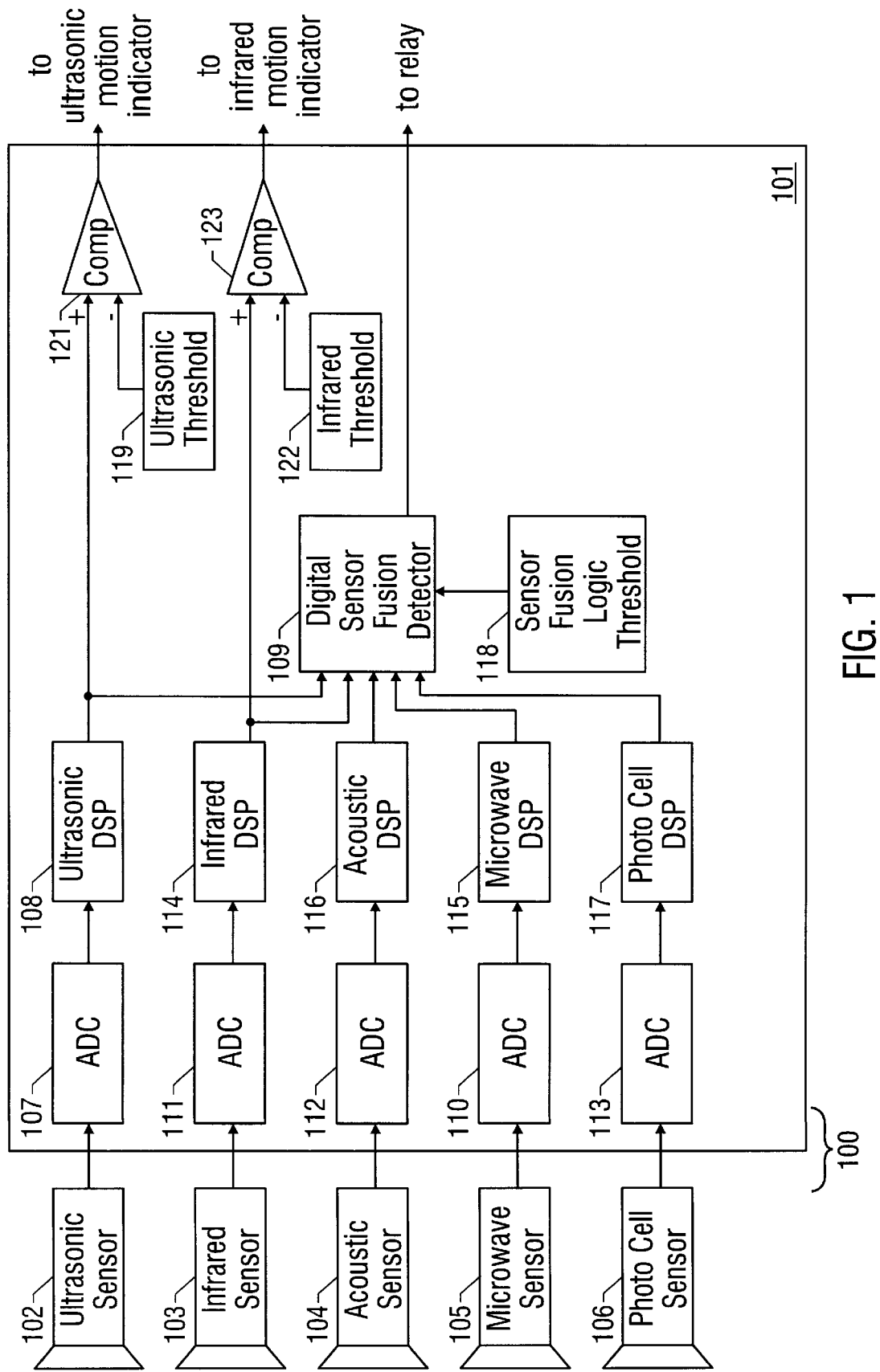
FIG. 1 is a simplified functional block diagram of the present invention.

A/D analog-to-digital converter
ASA automatic sensitivity adjustment
ATA automatic timer adjustment
CCP capture/compare/PWM
CMOS complimentary metal oxide semiconductor
DSP digital signal processing
EEPROM electrically erasable programmable read only memory
GSB gain setback
HVAC heating, ventilation, air conditioning
I/O input/output
LED light emitting diode
MUX multiplexer
OP AMP operational amplifier
PIR passive infrared
PWM pulse width modulation
RAM random access memory
ROM read only memory
TTL transistor-transistor logic
VDC volts direct current A simplified, functional block diagram of the multi-technology-based occupancy sensor 100 of the present invention is shown in FIG. 1. The occupancy sensor inputs are on the left side of FIG. 1. The digital microcontroller 101 and various signal conditioning blocks are in the center of FIG. 1. The various outputs are on the right hand side of FIG. 1. FIG. 1 illustrates the use of five different sensor technologies: ultrasonic 102, infrared 103, acoustic 104, microwave 105 and visible light 106. The analog output signal of the ultrasonic sensor 102 is digitized using an analog-to-digital converter (A/D) 107. The digital ultrasonic sensor signal is then processed using an ultrasonic DSP algorithm 108 on the digital microcontroller. The resulting ultrasonic output signal, referred to as an occupancy estimator signal, is then fed to a digital sensor fusion detector 109. In a similar fashion, occupancy estimator signals are generated for the analog signals from the infrared, acoustic, microwave and visible light sensors 103, 104, 105, 106 by digitizing the analog signal using A/Ds 110, 111, 112, 113 and processing the signal using the appropriate DSP algorithms 114, 115, 116, 117. The resulting occupancy estimator signals are fed to the digital sensor fusion detector 109. The digital sensor fusion occupancy detector 109 then combines the different processed sensor signals to produce a composite occupancy estimator that is compared to a composite sensor fusion threshold 118 (either a composite activation or composite maintenance threshold) to determine occupancy. The output of the sensor fusion detector 109 is used to actuate a relay that energizes the electrical load(s) controlled by the occupancy sensor.

If the ultrasonic DSP 108 output signal exceeds the user-defined ultrasonic activation threshold 119 as determined by comparator 121, the ultrasonic motion indicators will be turned on. Similarly, if the infrared DSP 114 output signal exceeds the user-defined infrared activation threshold 122 as determined by comparator 123, the infrared motion indicators will be turned on. It should be noted that the individual sensor technology activation thresholds 119 and 122 are preferably used only to drive the various sensor technology motion indicators and are not used alone to sense occupancy.

Figure 2:
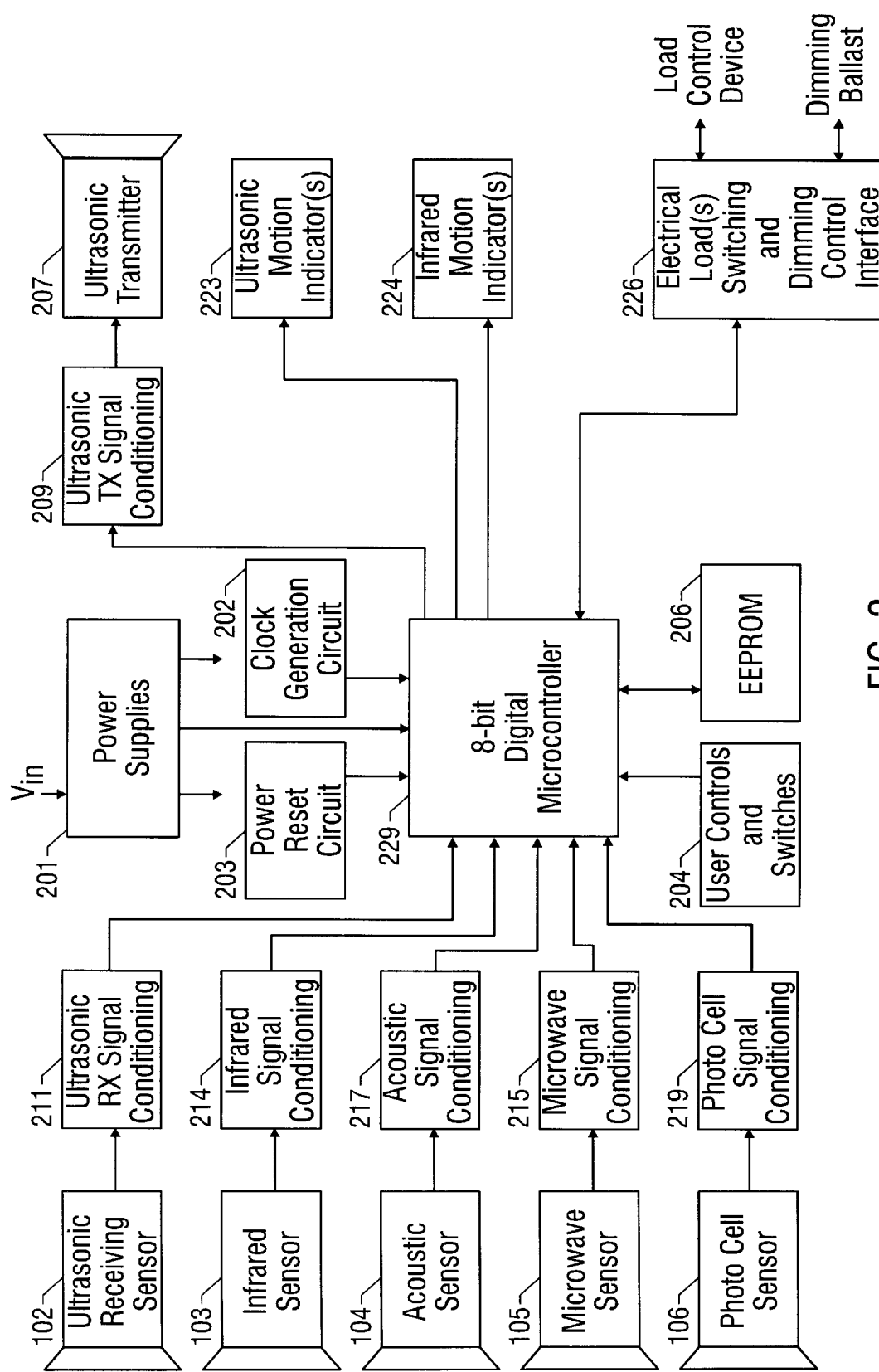
FIG. 2 is a detailed functional block diagram of the present invention.

A more detailed functional block diagram of the present invention is shown in FIG. 2. The occupancy sensor inputs are on the left hand side of the diagram. The digital microcontroller and its related blocks are in the center of the diagram. The various outputs are on the right hand side of the diagram. The occupancy sensor has the following major functional blocks: power supplies circuit 201; clock generator circuit 202; power reset circuit 203; user controls and switches 204; EEPROM circuit 206; ultrasonic transmitter circuit 207; ultrasonic receiver circuit 102; ultrasonic transmitter signal conditioning circuit 209; ultrasonic receiver signal conditioning circuit 211; infrared sensor circuit 103; infrared signal conditioning circuit 214; acoustic sensor circuit 104; acoustic signal conditioning circuit 217; microwave sensor circuit 105, microwave signal conditioning circuit 215, microwave transmitter circuit 225, microwave transmitter signal conditioning circuit 210, photo cell sensor circuit 106; photo cell signal conditioning circuit 219; ultrasonic motion indicator circuit 223; infrared motion indicator circuit 224; electrical load(s) switching and dimming control interface 226; and digital microcontroller circuit 229.

Each of these electrical hardware blocks is now described in detail. An exemplary embodiment of the power supplies circuit 201 accepts an unregulated input voltage, Vin, and produces one or more regulated out voltages that are used to power the various components shown in FIG. 2. An exemplary embodiment has an input voltage is 24 VDC and produces nominal regulated output voltages of 13.1, 5.1 and 2.5 VDC, although other input and output voltages would also be acceptable. The 2.5 VDC supply is also referred to as VREF.

Clock generator circuit 202 may be of conventional crystal oscillator design, and in the exemplary embodiment, includes a crystal and a clock driver circuit internal to the digital microcontroller 229. The clock generator circuit 202 has no input and the output of the clock generator circuit is the digital oscillator clock signal for the digital microcontroller 229. An 8.0 MHz or 9.8 MHz parallel cut crystal is used depending on the desired ultrasonic transmitter frequency.

Power reset circuit 203 is of conventional design. The input to power reset circuit 203 is the 5.1 VDC power supply. The output of power reset circuit 203 is an exponentially rising analog signal used to reset the digital microcontroller 229 upon application of power.

Figure 3:
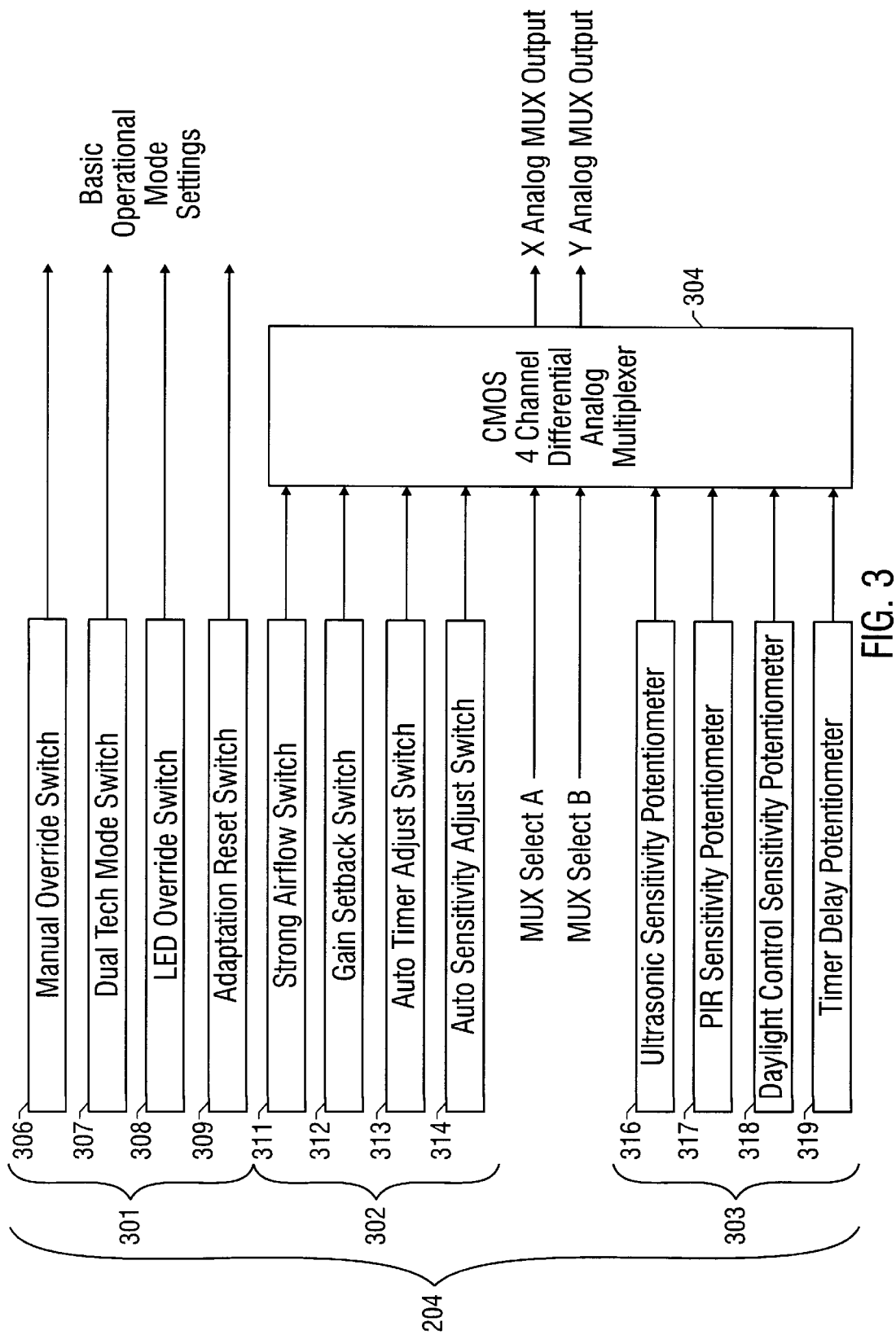
FIG. 3 is the user controls and switches circuit of the present invention.

An exemplary embodiment of the user controls and switches block 204 is shown in FIG. 3 and comprises two banks of switches 301, 302, four potentiometers 303 and a CMOS 4 channel differential analog multiplexer 304. The inputs to the user controls and switches block 204 are the user-specified settings of these switches and potentiometers. The outputs of the user controls and switches block 204 are the analog voltages corresponding to the user-specified settings.

The first bank of switches 301 includes four switches 306, 307, 308, 309 that determine the basic operational mode of the sensor. Specifically, these switches include manual override switch 306, dual technology mode switch 307, LED override switch 308 and adaptation reset switch 309.

Manual override switch 306 is used to override the normal operation of the sensor. In the ON state, the electrical load switched by the sensor will be energized at all times. In the OFF state, the electrical load switched by the sensor will be energized whenever occupancy is sensed.

Dual technology mode switch 307 determines the thresholds to be used for comparing to the composite occupancy estimator. The system can be configured with any combination of ultrasonic, PIR and acoustic detection technologies. In the OFF state (referred to as the HIGH CONFIDENCE THRESHOLD mode), the sensor's composite activation threshold is set at a high level. In this mode, the sensor is less likely to false trigger, but the sensor is not as sensitive and therefore less likely to detect marginal detection cases. In the ON state (referred to as the HIGH SENSITIVITY THRESHOLD mode), the sensor's composite activation threshold is set at a lower level than the HIGH CONFIDENCE THRESHOLD mode. In this mode, the sensor is more sensitive and will more accurately detect marginal cases at the risk of a greater likelihood of false triggering.

LED override switch 308 is used to override the normal operation of the sensor's LEDs. In the OFF state, all sensor LEDs will be disabled. In the ON state, all sensor LEDs will be enabled.

Adaptation reset switch 309 is used to reset the sensor's adaptive variables. If the sensor's environment changes significantly a long time after the power on reset condition, the sensor's adaptive variables may need to be reset so that the sensor can begin adapting to its new environment. In the OFF state, the sensor's adaptive variables will not be reset. In the ON state, the sensor's adaptive variables will be reset.

The second bank of switches 302 comprises four switches 311, 312, 313, 314 that select the more advanced features of the sensor. Specifically, these switches include: strong airflow algorithm switch 311, gain setback switch 312, automatic timer adjustment switch 313, and automatic sensitivity adjustment switch 314.

Strong airflow algorithm switch 311 is used to modify the ultrasonic sensor's response in order to better compensate for the presence of air flow. In the OFF state, the sensor uses its standard airflow ultrasonic DSP algorithm. In the ON state, the sensor uses its strong airflow ultrasonic DSP algorithm.

Gain setback switch 312 is used to determine the sensor's gain as a function of time since motion was last sensed. In the OFF state, the sensor's gain does not vary as a function of time. In the ON state, the sensor's gain will vary as a function of time.

Automatic timer adjustment switch 313 is used to determine the sensor's timer delay setting as a function of time. In the OFF state, the sensor's timer delay setting does not automatically vary as a function of time. In the ON state, the sensor's timer delay setting varies automatically as a function of time.

Automatic sensitivity adjustment switch 314 is used to determine the sensor's sensitivity setting as a function of time. In the OFF state, the sensor's sensitivity setting does not automatically vary as a function of time. In the ON state, the sensor's sensitivity setting varies automatically as a function of time.

The user controls and switches block 204 also contains four potentiometers: ultrasonic sensitivity potentiometer 316, PIR sensitivity potentiometer 317, daylight control sensitivity potentiometer 318, and timer delay potentiometer 319.

Ultrasonic sensitivity potentiometer 316 is used to increase or decrease the sensor's ultrasonic sensitivity. The ultrasonic sensitivity potentiometer setting maps linearly to sensor range. PIR sensitivity potentiometer 317 is used to increase or decrease the sensor's PIR sensitivity. Daylight control sensitivity potentiometer 318 is used to adjust the sensor's daylight control sensitivity by increasing or decreasing the daylight control ambient light threshold. Timer delay potentiometer 319 is used to adjust the sensor's timer delay by increasing or decreasing the length of time the sensor's electrical load(s) are energized following occupancy detection. The timer delay potentiometer setting maps linearly to sensor time delay.

The user controls and switches block 204 also contains a CMOS 4 channel differential analog multiplexer 304. Multiplexer 304 may be a 4052 type multiplexer, available from National Semiconductor. Multiplexer 304 allows the user to simultaneously read two analog input signals. The inputs to multiplexer 304 are two banks of four analog signals 302, 303 and two digital logic control signals A and B generated by digital microcontroller 229 (FIG. 2). The outputs of multiplexer 304 are the two analog signals selected using the multiplexer 304 for application to digital microcontroller 229.

In the exemplary embodiment, EEPROM circuit 206 comprises a CMOS 256×8 serial EEPROM for non-volatile storage of the various occupancy sensor registers although other memories may be used. EEPROM circuit 206 has two inputs, a serial clock and serial data line. The output of the EEPROM circuit is a serial data line. In the exemplary embodiment, EEPROM 206 uses a standard serial bus protocol for saving and retrieving the various occupancy sensor register values.

Figure 4:
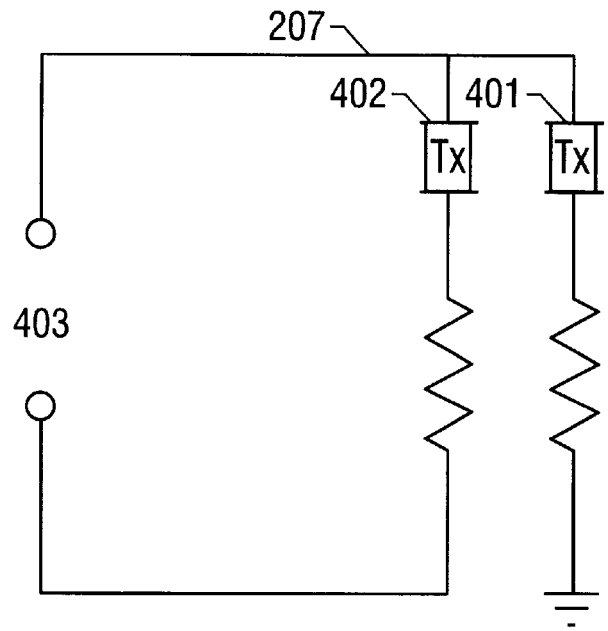
FIG. 4 is the ultrasonic transmitter circuit of the present invention.

An exemplary embodiment of the ultrasonic transmitter circuit 207 is shown in FIG. 4 and is comprised of one or two 16 mm narrowband air ultrasonic ceramic transducers 401, 402. The input 403 to these transducers 401, 402 is either a 0 to 15 volt or −15 to 15 volt variable duty cycle square wave, although other driving signal may also be acceptable. The output of transducers 401, 402 is an ultrasonic continuous-wave tone at the desired frequency of interest.

An exemplary embodiment supports ultrasonic transmitter frequencies of 25 KHz, 32 KHz and 40 KHz, but other frequencies would also be acceptable. A variety of commercial ultrasonic transmitting transducers are available. For example, acceptable 16 mm transmitting transducers available from S-Square are shown in Table 1.

TABLE 1

Exemplary S-Square Ultrasonic Transmitting Transducers

| Frequency (KHz) | Model Number | Sound Level (dB) | Bandwidth (KHz) | Capacitance (pF) | Input Power (watts) |
|---|---|---|---|---|---|
| 25 | 250ST160 | 112 | 2 | 2400 | 0.2 |
| 32 | 328ST160 | 115 | 2 | 2400 | 0.2 |
| 40 | 400ST160 | 119 | 2 | 2400 | 0.2 |

Figure 5:
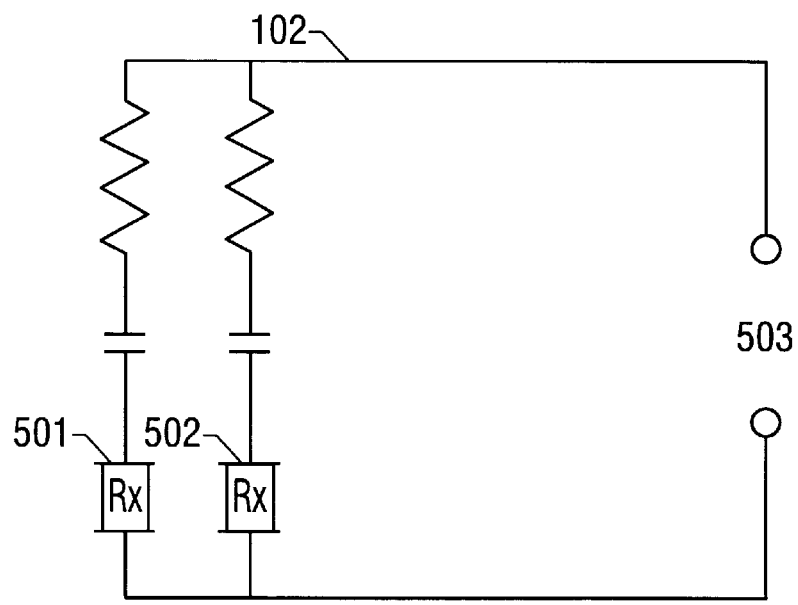
FIG. 5 is the ultrasonic receiver circuit of the present invention.

An exemplary embodiment of ultrasonic receiver circuit 102 is shown in FIG. 5 and includes one or two 16 mm narrowband air ultrasonic ceramic transducers 501, 502. The input to these transducers 501, 502 is an ultrasonic continuous-wave tone centered at the desired frequency of interest with an additional Doppler-shifted signal corresponding to motion in the sensor's field of view. The output 503 of ultrasonic receiver circuit 102 is an electrical signal corresponding to the received acoustic signal. An exemplary embodiment of the present invention supports ultrasonic receiver frequencies of 25 KHz, 32 KHz and 40 KHz, and variety of commercial ultrasonic receiving transducers are available. For example, acceptable 16 mm receiving transducers available from S-Square are shown in Table 2.

TABLE 2

Exemplary S-Square Ultrasonic Receiving Transducers

| Frequency (KHz) | Model Number | Sensitivity (dB) | Bandwidth (KHz) | Capacitance (pF) | Input Power (watts) |
|---|---|---|---|---|---|
| 25 | 250SR160 | −65 | 2 | 2400 | 0.2 |
| 32 | 328SR160 | −67 | 2.5 | 2400 | 0.2 |
| 40 | 400SR160 | −65 | 2.5 | 2400 | 0.2 |

Figure 6:
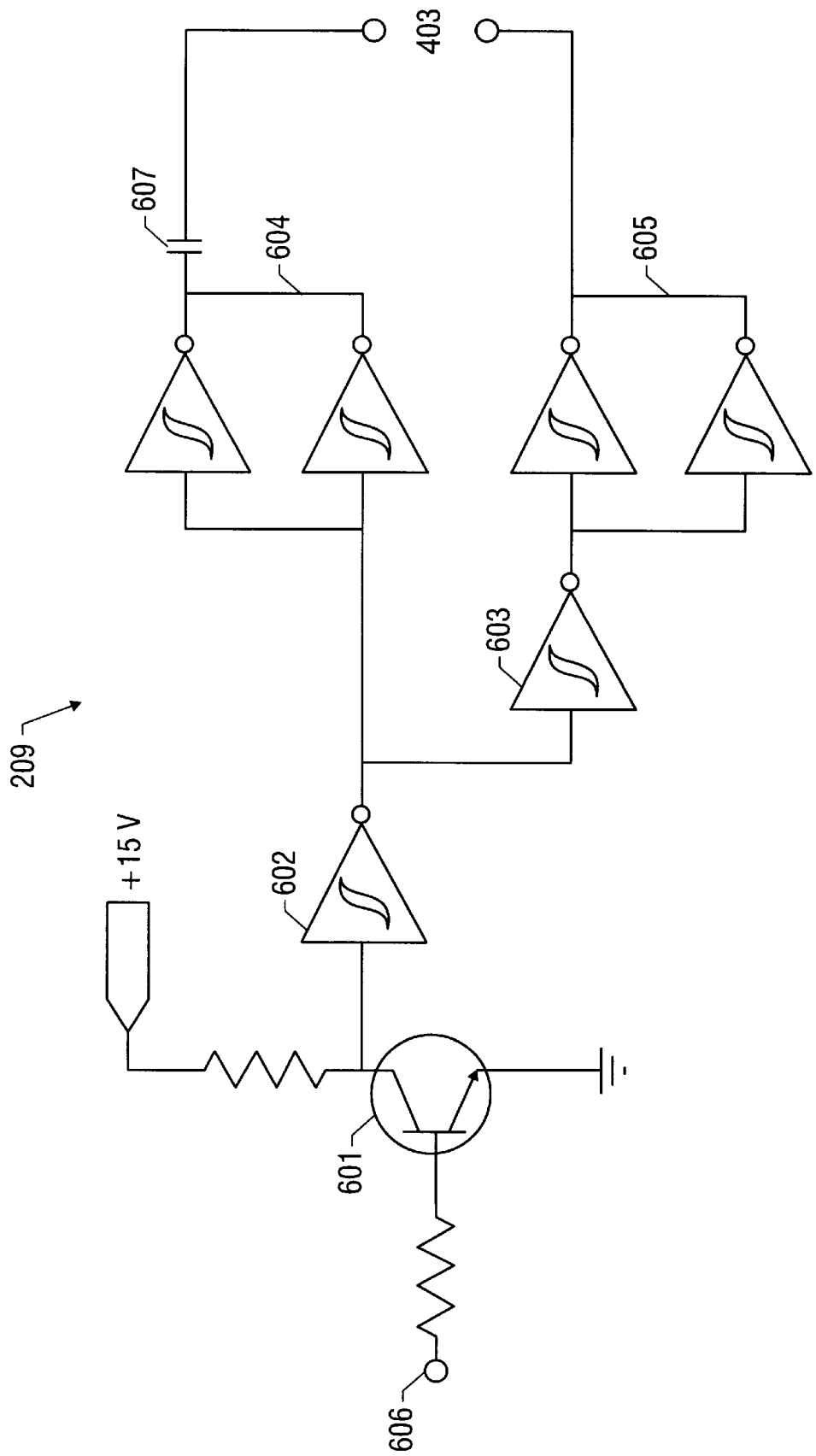
FIG. 6 is the ultrasonic transmitter signal conditioning circuit of the present invention.

An exemplary ultrasonic transmitter signal conditioning circuit 209 is shown in FIG. 6 and includes an NPN transistor circuit 601, a CMOS buffer circuit 602, a CMOS inverter circuit 603 and two CMOS driver circuits 604, 605. Input 606 to circuit 209 is a variable duty cycle TTL-level square wave generated by the digital microcontroller 229. Output 403 of circuit 209 is applied to ultrasonic transmitter circuit 207 (FIG. 4) and is either a single-ended or double-ended ultrasonic transmitter signal at the desired frequency of interest.

The variable duty cycle TTL-level square wave input signal 606 generated by the digital microcontroller 229 is generated by a latch (not shown) that is set at a rate determined by a carrier period counter value, and that is cleared within each carrier period at a point determined by the carrier pulse width counter value. Unequal turn-on and turn-off times of the transmitter signal conditioning circuit 209 that drives the carrier send transducer may result in an asymmetric signal at the amplifier output, and thus less than full power being dissipated in transmitter. The sensor algorithm may compensate for the unequal turn-on and turn-off times by setting the carrier pulse width counter to a predetermined value intended to yield a symmetric square wave at the amplifier output. In the event that it is desired to decrease the transmitter output power level, the carrier pulse width counter may be varied to deviate from a 50% duty cycle square wave, lowering the effective AC drive level to the transmitting transducer, and thus the output level.

NPN transistor circuit 601 is used as a level shifter. The input to NPN transistor circuit 601 is a TTL-level square wave. The output of NPN transistor circuit 601 is a 0 to 15 volt level square wave. CMOS buffer circuit 602 is composed of a single CMOS inverter with Schmitt trigger. This CMOS inverter 602 is used to increase the output drive capability of the NPN transistor circuit 601. The input to the CMOS buffer 602 is a 0 to 15 volt level square wave. The output of the CMOS buffer 602 is a 0 to 15 volt level square wave. CMOS inverter circuit 603 is comprised of a single CMOS inverter with Schmitt trigger. CMOS inverter circuit 603 inverts the ultrasonic transmitter signal to allow double-ended transmitter drive capability. The two CMOS driver circuits 604,605 are each comprised of two CMOS inverters with Schmitt triggers, in parallel. These two driver circuits 604, 605 allow the ultrasonic transducer(s) to be driven in either single ended or differential mode. For single ended mode the transducer(s) is connected between driver circuit 604 via capacitor 607, and the effective drive applied to the transducer(s) is a square wave with amplitude +7.5V to −7.5V. For differential drive, the transducer(s) is connected between driver circuit 604, coupled via capacitor 607, and driver circuit 605, and the effective drive applied to the transducer(s) is a square wave of amplitude +15V to −15V.

Figure 7A:
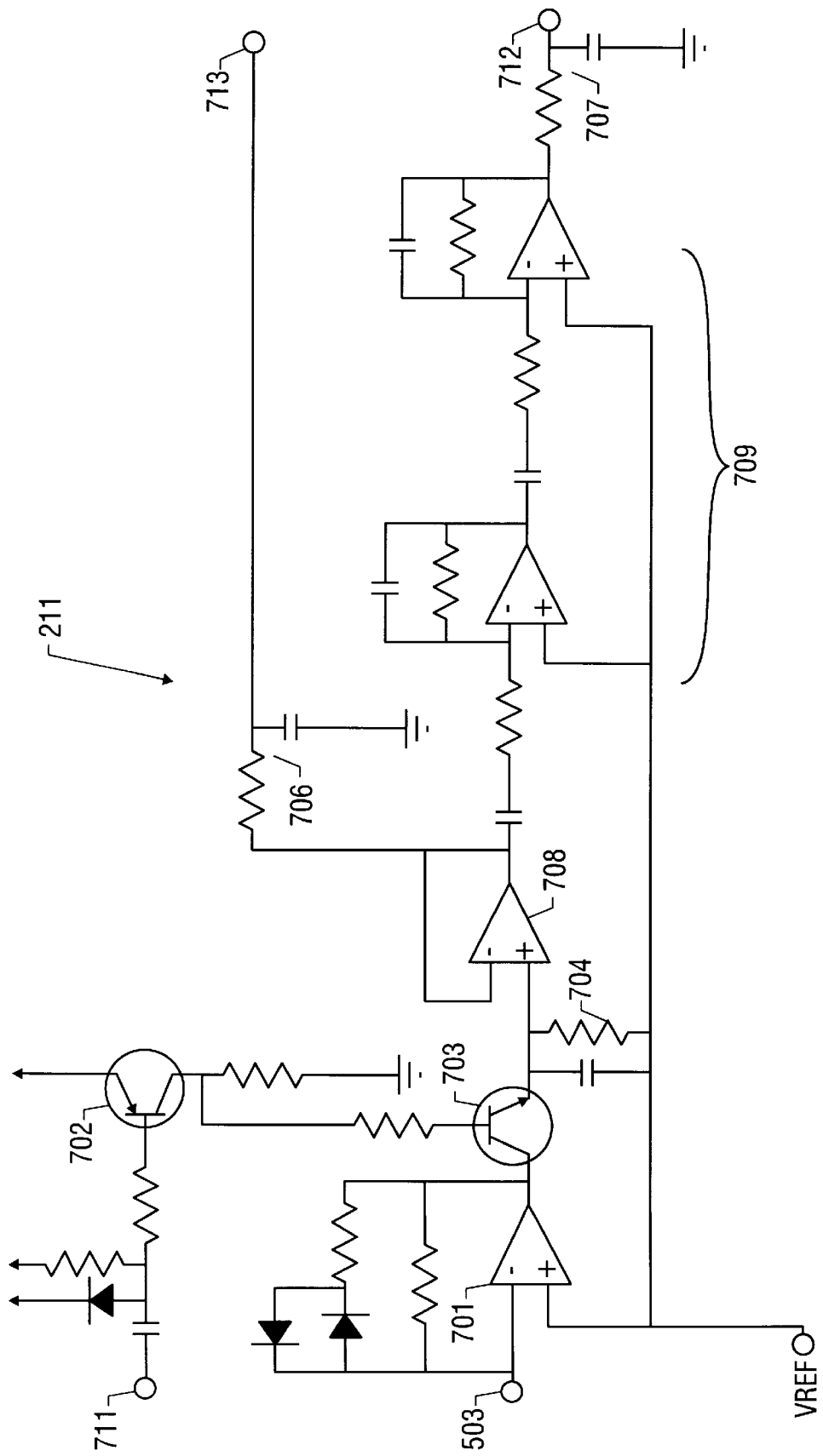
FIG. 7($a$) is the ultrasonic receiver signal conditioning circuit of the present invention.
Figure 7B:
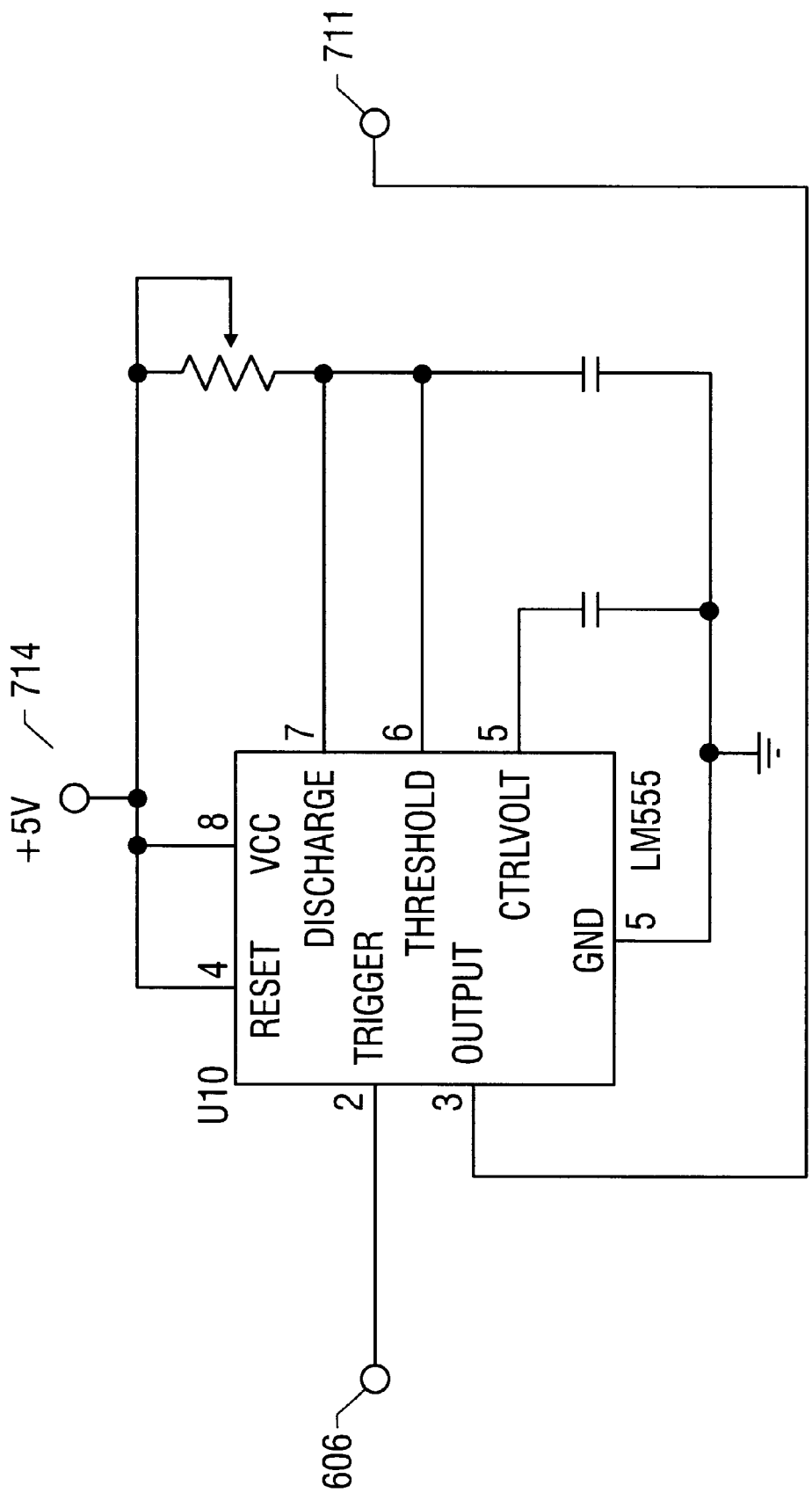

The ultrasonic receiver signal conditioning circuit 211 is shown in FIG. 7(*a*) and includes a variable gain op amp circuit 701, a PNP transistor circuit 702, an NPN transistor circuit 703, three RC circuits 704, 706, 707, an op amp buffer circuit 708 and a two stage op amp circuit 709. The inputs to ultrasonic receiver signal conditioning circuit 211 are the Doppler-shifted analog ultrasonic receiver signal 503 and a digital sampling point signal 711. The outputs of ultrasonic receiver signal conditioning circuit 211 are the demodulated, filtered analog ultrasonic receiver signal 712 and an analog ultrasonic sampling point signal 713.

Variable gain op amp circuit 701 is an ultrasonic receiver preamplifier circuit. The input to this circuit is the modulated analog ultrasonic receiver signal 503. The output of this circuit is an amplified, modulated analog ultrasonic receiver signal. Circuit 701 uses diodes in the negative feedback path to switch in parallel with a resistor, thus decreasing the overall gain for large signal excursions, and preventing hard-limiting of the amplifier in the event of excessive continuous wave receiver signals. The resulting nonlinear transfer characteristic is advantageous when the sensor is installed in a confined space where wall reflections cause a large amount of acoustic energy to be directed into the ultrasonic receiver.

PNP transistor circuit 702 is a zero crossing phase lock loop sampling point circuit. The input to circuit 702 is a digital sampling point signal 711 generated by the digital microcontroller 229. The output of circuit 702 is an analog sampling signal used to drive the synchronous demodulator circuit 703. Circuit 702 varies the position (or phase) of the sampling point on the ultrasonic receiver waveform under control of digital microcontroller 229. This prevents the loss of motion information due to large signal levels. For optimum sensitivity, the synchronous sample point on the ultrasonic receiver waveform should lie as close to the zero crossing as possible.

NPN transistor circuit 703 is a synchronous demodulator circuit. The two inputs to circuit 703 are the amplified modulated analog ultrasonic receiver signal and the analog sampling point signal. The output of circuit 703 is the demodulated Doppler-shifted analog ultrasonic receiver signal. The NPN transistor in circuit 703 is arranged in a series pass configuration and is driven by the analog sampling point signal generated by PNP transistor circuit 702.

RC circuit 704 is an envelope detector circuit. The input to RC circuit 704 is the Doppler-shifted analog ultrasonic receiver signal. The output of RC circuit 704 is the filtered, demodulated Doppler-shifted analog ultrasonic receiver signal. RC circuit 704 acts as an envelope detector and filters out the ultrasonic carrier while preserving the low frequency Doppler shift signal information.

Op amp buffer circuit 708 serves to increase the drive capability of the synchronous demodulator circuit 703. The input to circuit 708 is the filtered, demodulated Doppler-shifted analog ultrasonic receiver signal. The output of circuit 708 is the increased drive, filtered, demodulated Doppler-shifted analog ultrasonic receiver signal.

RC circuit 706 is a lowpass filter circuit. The input to RC circuit 706 is the increased drive, filtered, demodulated Doppler-shifted analog ultrasonic receiver signal. The output of RC circuit 706 is the increased drive, lowpass filtered, demodulated Doppler-shifted analog ultrasonic receiver signal. The output of circuit 708 is lowpass filtered to remove contributions due to motion in the environment, leaving a DC signal that represents the receiver carrier amplitude at the ultrasonic sample point. This signal is sampled by the digital microcontroller 229 through signal 711 to yield the analog ultrasonic sampling point signal 713.

Two stage op amp circuit 709 is a bandpass filter circuit. The input to circuit 709 is the increased drive, filtered, demodulated Doppler-shifted analog ultrasonic receiver signal. The output of circuit 709 is the increased drive, bandpass filtered, demodulated Doppler-shifted analog ultrasonic receiver signal. The pass band of circuit 709 is designed to pass the Doppler-shifted signal for motions of interest.

RC circuit 707 is an anti-aliasing filter circuit. The input to RC circuit 707 is the increased drive, bandpass filtered, demodulated Doppler-shifted analog ultrasonic receiver signal. The output of RC circuit 707 is the anti-aliased, increased drive, bandpass filtered, demodulated Doppler-shifted analog ultrasonic receiver signal. The output signal 712 is sampled by the digital microcontroller 229 A/D circuitry and processed using a variety of digital signal processing techniques as discussed in detail below.

FIG. 7(*b*) is an exemplary embodiment of a circuit that may be used in combination with the circuit of FIG. 7(*a*) to affect sampling of the Doppler shifted ultrasonic signal without the use of microcontroller 229 to generate the sampling signal. The circuit of FIG. 7(*b*) is based on a commercially available 555 timer circuit 714 and peripheral circuitry. The input to the timer circuit 714 is the same as the input 606 to the transmitter signal conditioning circuit shown in FIG. 6, and the output of the timer circuit 714 is connected to the sampling point signal input 711 to the ultrasonic receiver signal conditioning circuit of FIG. 7(*a*).

Figure 8:
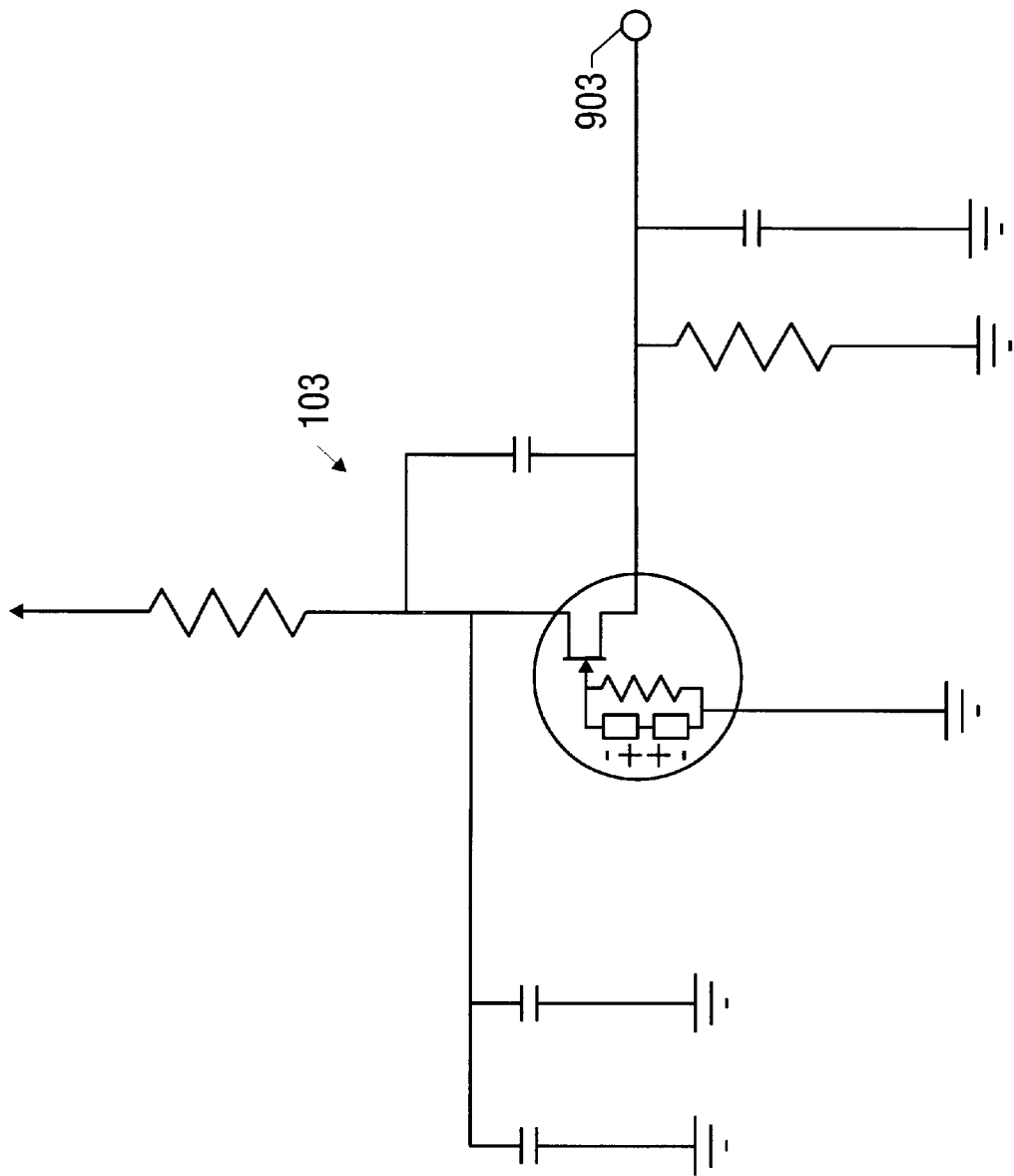
FIG. 8 is the infrared sensor circuit of the present invention.

An exemplary embodiment of the infrared sensor circuit 103 is shown in FIG. 8 and includes a dual element pyroelectric infrared motion sensor circuit. The input to infrared sensor circuit 103 is infrared electromagnetic radiation. The output of infrared sensor circuit 103 is an electrical signal indicative of motion.

A variety of commercial infrared motion sensors are available. An acceptable example is the Heimann LHi 878 dual element pyroelectric infrared motion sensor. This sensor is designed to detect motion of human body radiation in the range of electromagnetic wavelengths of 5 to 14 micrometers. Other infrared sensors would also be acceptable.

Figure 9:
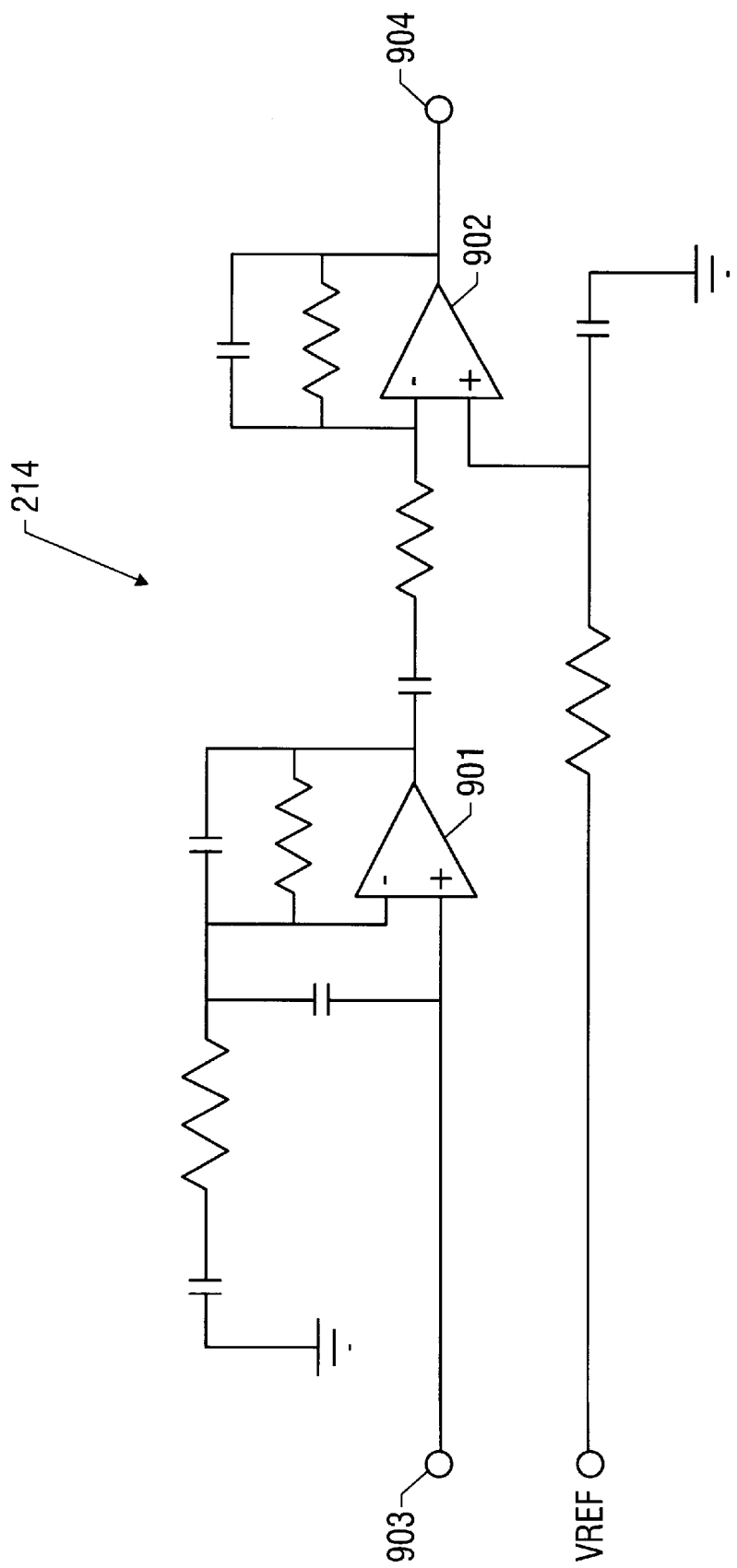
FIG. 9 is the infrared signal conditioning circuit of the present invention.

An exemplary embodiment of the infrared signal conditioning circuit 214 is shown in FIG. 9 and includes two cascaded op amp bandpass circuits 901, 902. The input 903 to infrared signal conditioning circuit 214 is the electrical PIR sensor signal indicative of motion. The output 904 of infrared signal conditioning circuit 214 is a bandpass filtered infrared sensor signal indicative of motion. The output signal 904 of this circuit is sampled by A/D circuitry within the digital microcontroller 229 and processed using a variety of digital signal processing techniques discussed below.

Figure 10:
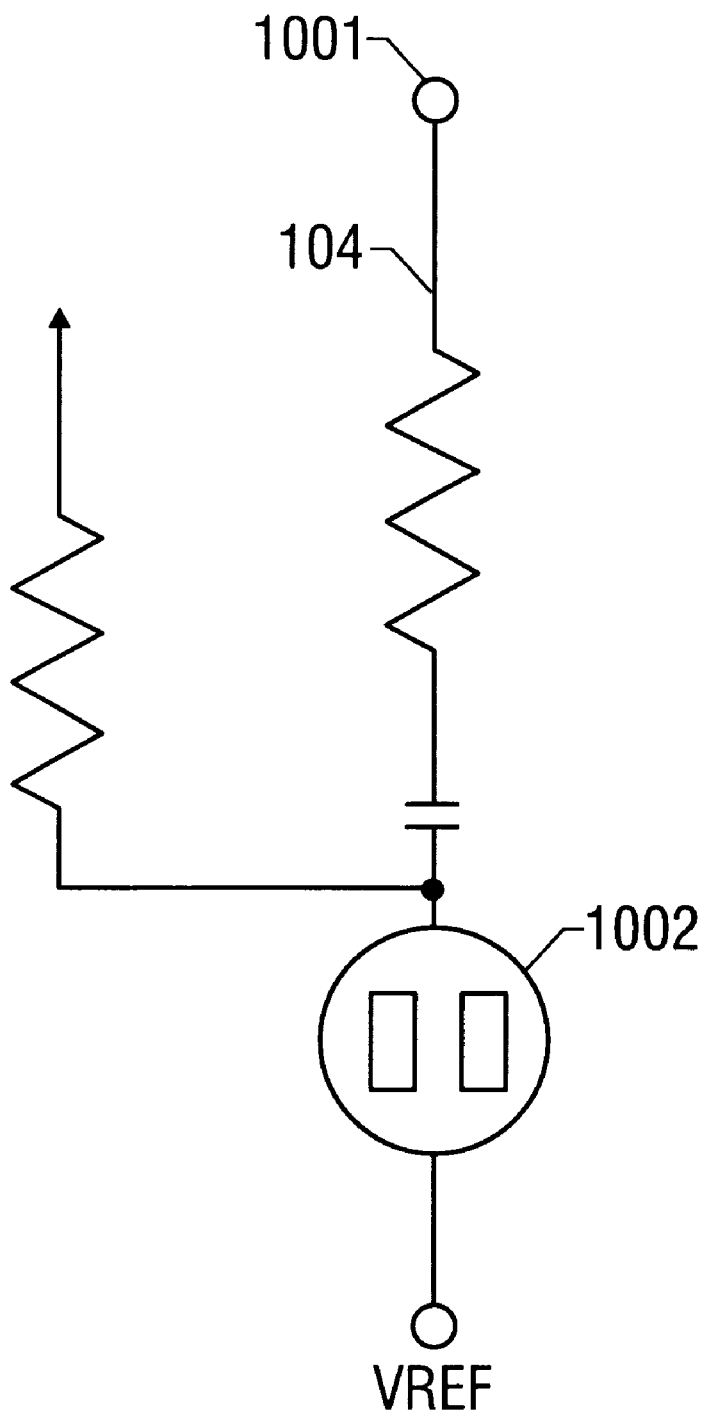
FIG. 10 is the acoustic sensor circuit of the present invention.

An exemplary embodiment of the acoustic sensor circuit 104 is shown in FIG. 10 and includes an audio acoustic sensor 1002 and surrounding circuitry. The input to acoustic sensor circuit 104 is sound energy. The output 1001 is an electrical signal indicative of occupancy such as human speech and sounds generated by human occupants.

A variety of commercial acoustic sensors 1002 are available. An acceptable example is the Panasonic WM-52BM electret condenser microphone cartridge. It includes a high voltage internal electret membrane, metal electrode and a field effect transistor (FET). Frequency range extends from 20–16,000 Hz.

Figure 11:
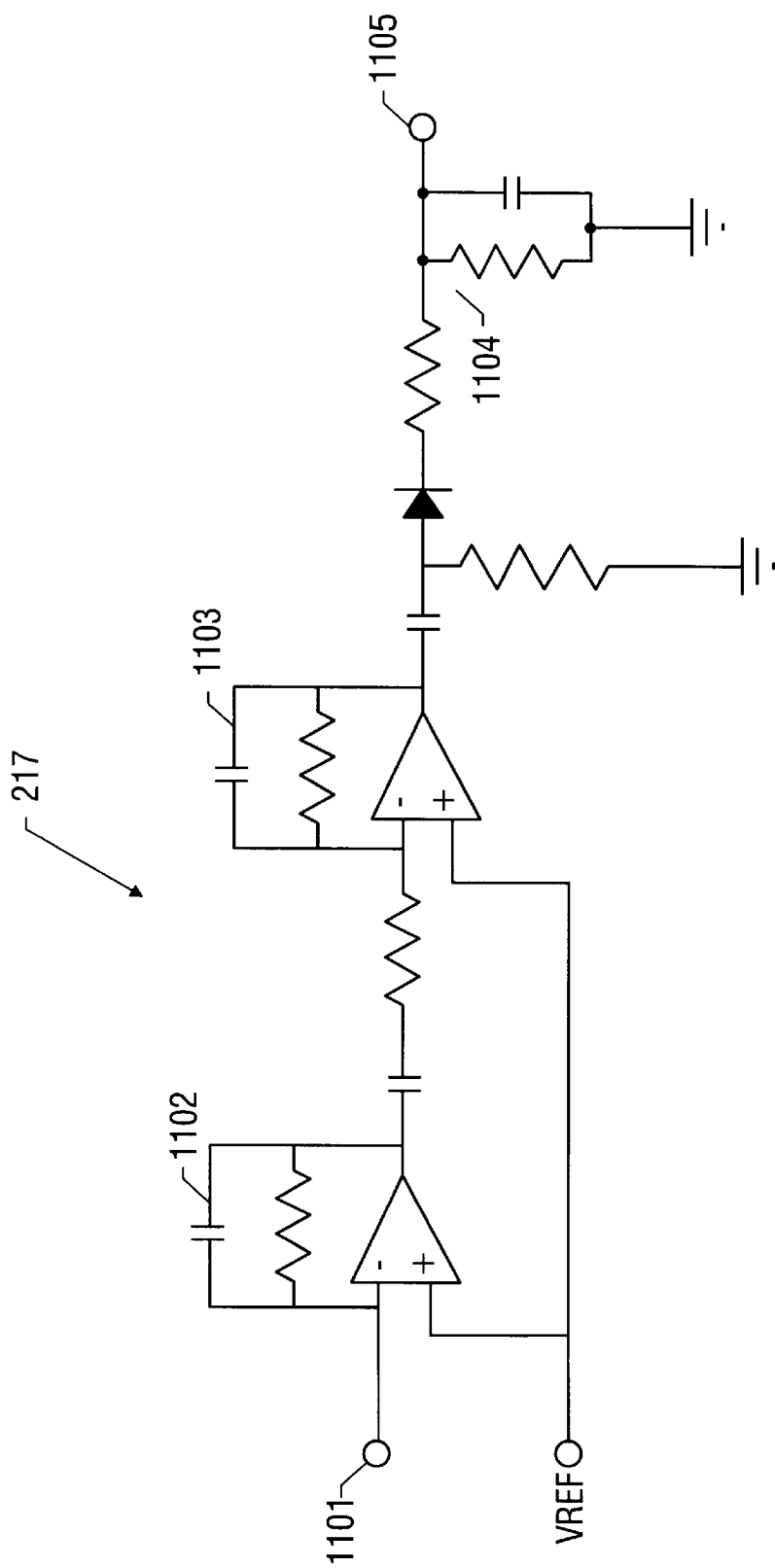
FIG. 11 is the acoustic signal conditioning circuit of the present invention.

An exemplary embodiment of the acoustic signal conditioning circuit 217 is shown in FIG. 11 and includes two cascaded op amp band pass circuits 1102 and 1103 followed by a fast attack, slow decay peak detector 1104. The input 1101 to acoustic signal conditioning circuit 217 is the electrical acoustic sensor signal indicative of occupancy 1001. The output 1105 of the acoustic signal conditioning circuit 217 represents the magnitude of acoustic energy. The output signal of this circuit is sampled by A/D circuitry within the digital micro controller 229 and processed using a variety of digital signal processing techniques discussed in detail below.

Figure 12:
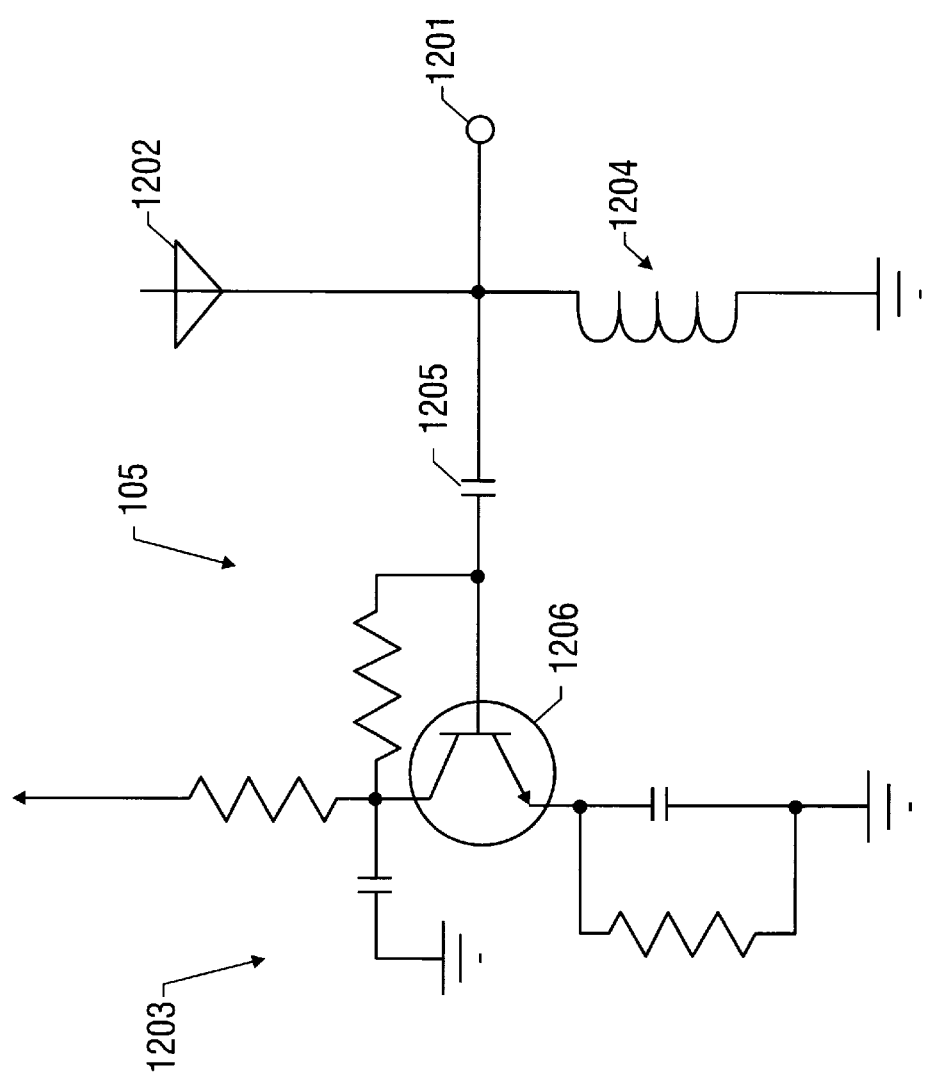
FIG. 12 is the microwave transmitter/receiver circuit of the present invention.

An exemplary embodiment of the microwave sensor circuit 105 is shown in FIG. 12, and includes a microwave antenna 1202 and an oscillator circuit 1203. Circuit 105 combines the transmitting and receiving elements into one antenna 1202. The antenna 1202, inductor 1204, capacitor 1205 determine oscillator frequency and with NPN transistor circuit 1206 form the oscillator and transmitter. The output impedance of the transmitter is high enough not to significantly reduce reflected signal reception. The input to microwave sensor circuit 105 is electromagnetic energy reflected from the observed space. The output 1201 is an amplitude modulated radio frequency signal indicative of motion. A variety of constructions for antenna 1202 are available from wave guides to simple wire.

Figure 13:
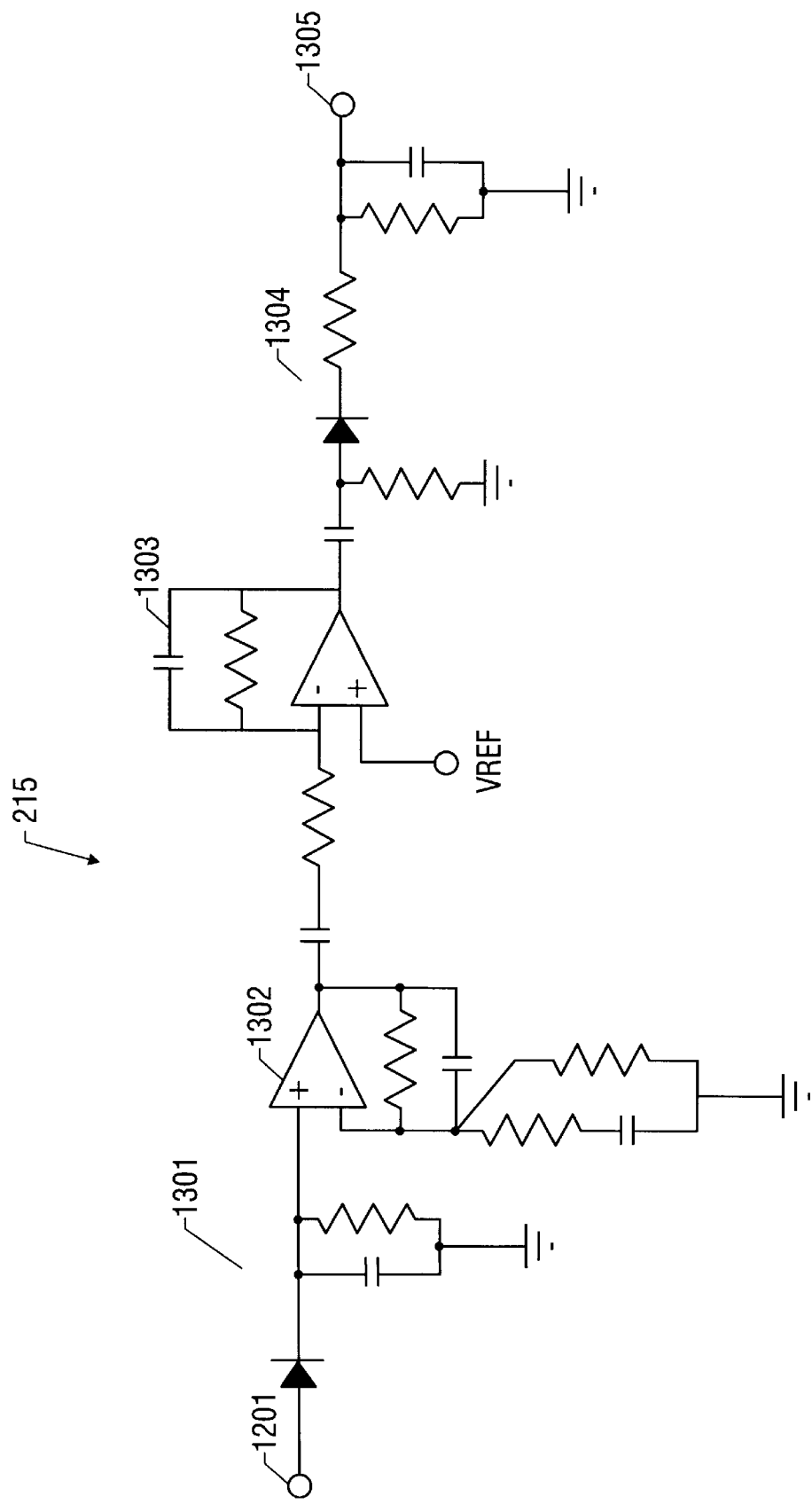
FIG. 13 is the microwave signal conditioning circuit of the present invention.

An exemplary embodiment of the microwave signal conditioning circuit 215 is shown in FIG. 13 and includes two cascaded op amp band pass circuits 1302 and 1303, followed by a fast attack, slow decay peak detector 1304. The input 1201 to microwave signal conditioning circuit 215 is the electrical microwave sensor signal indicative of motion. The output 1305 of microwave signal conditioning circuit 215 represents the magnitude of received Doppler microwave energy. The output signal 1305 is sampled by A/D circuitry within the digital micro controller 229 and processed using a variety of digital signal processing techniques discussed in detail below.

Figure 14:
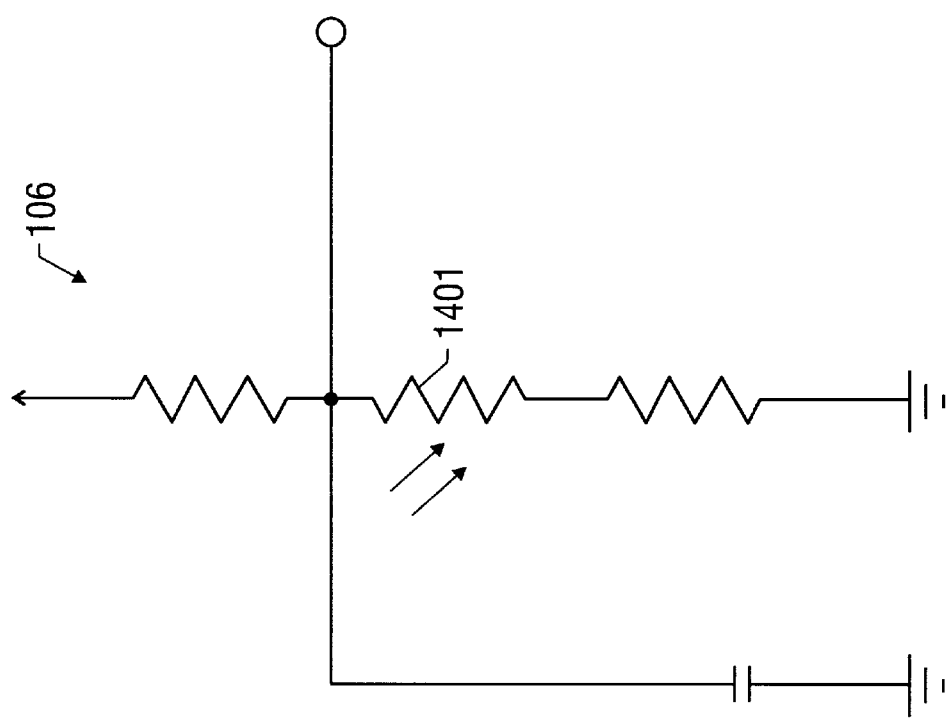
FIG. 14 is the photo cell sensor circuit of the present invention.

An exemplary embodiment of the photo cell sensor circuit 106 is shown in FIG. 14 and is comprised of a visible light photo sensor 1401 and supporting circuitry. The input to photo cell sensor circuit 106 is visible electromagnetic radiation. The output of photo cell sensor circuit 106 is an electrical signal indicative of ambient light. A variety of commercially available photo cells are available for use as light photo sensor 1401, including, for example, the Vactec VT90N4 photoconductive cell sensor.

Photo cell signal conditioning circuit 219 may be, for example, an RC lowpass filter. The input to this RC lowpass filter is the electrical photo cell sensor signal indicative of ambient light. The output of this RC lowpass filter is a lowpass filtered photo cell sensor signal indicative of ambient light. The output signal of photo cell signal conditioning circuit 219 is sampled by A/D circuitry within the digital microcontroller 229 and processed using a variety of digital signal processing techniques as described in detail below.

Ultrasonic motion indicator circuit 223 and infrared motion indicator circuit 224 may each be comprised of LEDs driven by digital microcontroller 229. The outputs of these indicators 223 and 224 are lights indicating that the ultrasonic or infrared portion of the sensor has detected motion above user-specified thresholds. In the preferred embodiment, the ultrasonic activation threshold and the infrared activation threshold are used only for the purpose of driving the ultrasonic motion indicator and infrared motion indicator and are not used by the digital sensor fusion detection algorithm to determine occupancy.

The electrical load switching and dimming control interface circuit 226 may take many forms and typically includes a conventional transistor-based relay driver circuit and relay that interfaces digital microcontroller 229 with an electrical load that is operated at a higher voltage than the power supplied to microcontroller 229. Provisions may be made to control any number of electrical loads. Incandescent light loads may be controlled by a simple relay, while fluorescent lighting may be controlled using dimming ballasts or other electrical load dimming devices in a known manner.

In accordance with one embodiment of the present invention, the digital microcontroller circuit 229 may be an 8-bit CMOS microcontroller with A/D converter for sophisticated communication and control of the sensor. An acceptable commercially available microcontroller is an 8-bit low-cost, high-performance Microchip PIC 16C73 A fully-static, EEPROM-based 28-pin CMOS microcontroller, however, other microcontrollers or microprocessors may also be acceptable. The microcontroller clock frequency in an exemplary embodiment is either 8.0 MHz or 9.83 MHz depending on the desired ultrasonic frequency. The preferred device has an advanced RISC-like Harvard architecture and includes a large register set, an eight-level deep hardware stack and supports multiple internal and external interrupt sources. The device has 192 bytes of RAM and 22 I/O pins. It also has a variety of on-chip peripherals including five 8-bit A/D channels, three timer/counters modules, two capture/compare/pulse width modulation (PWM) modules and two serial ports. The synchronous serial port of the device can be configured as either a 3-wire serial peripheral interface device or a two-wire Inter-Integrated Circuit (I$^2$C) bus device. The serial communications interface can be configured as either a synchronous or an asynchronous device. The device offers four oscillator options and includes a highly reliable watchdog timer to provide protection against software malfunctions.

Although the hardware aspects of the present invention have been described with reference to a particular exemplary embodiment, it will be understood that addition, deletions and changes may be made to the exemplary embodiment without departing from the scope of the present invention The software used to control the operation of digital microcontroller 229 in accordance with one embodiment of the invention includes two primary routines, the main (foreground) routine and the interrupt (background) routine.

The main foreground routine initializes the sensor and then enters the main loop that periodically displays the status of the sensor and resets the microcontroller's watch dog timer. The background interrupt routine is executed on a regular, periodic basis and performs most of the sensor's major functions.

The various operational functions of the sensor are separated into tasks such as the sensor task, MUX task, LED task, etc. Each of these high-level tasks may be further broken down into a sequence of smaller tasks. For example, the sensor task may be broken down into the ultrasonic sensor task, the PIR sensor task, the acoustic sensor task, and the photo sensor task Each task may be enabled by setting that task's enable flag. Similarly, each task may be disabled by clearing that task's enable flag.

Figure 15:
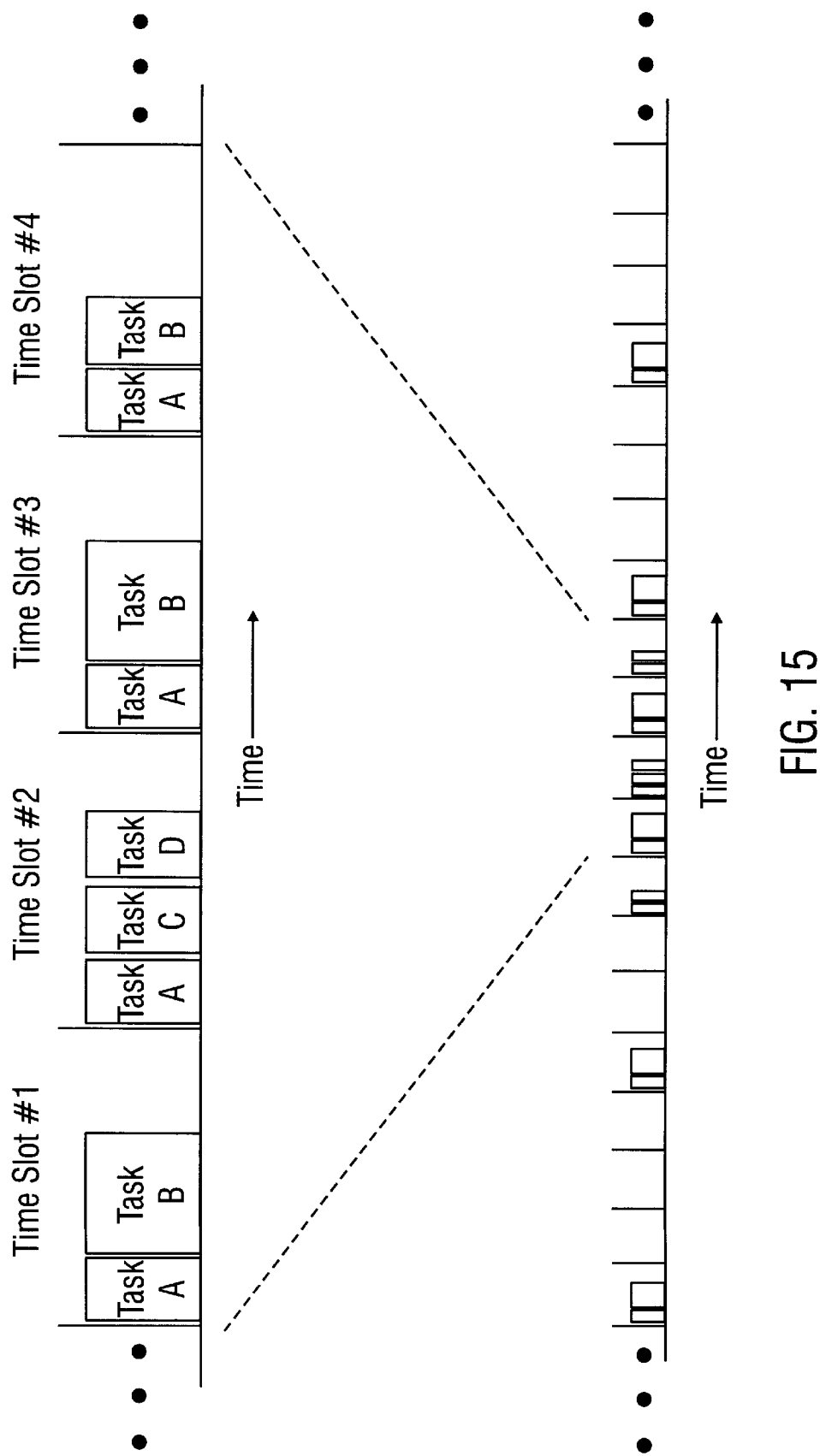
FIG. 15 is the software time division multiplexing scheme used for task allocation of the present invention.
Figure 16A:
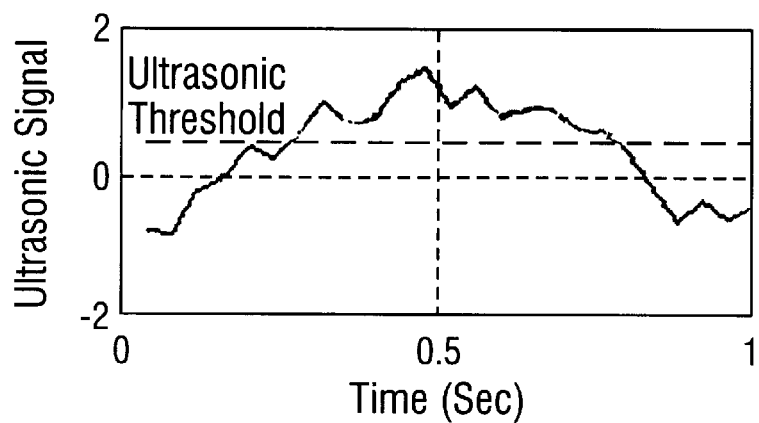
FIGS. 16($a$)–($f$) are graphs illustrating prior art dual technology occupancy detection using the Boolean AND function.
Figure 16B:
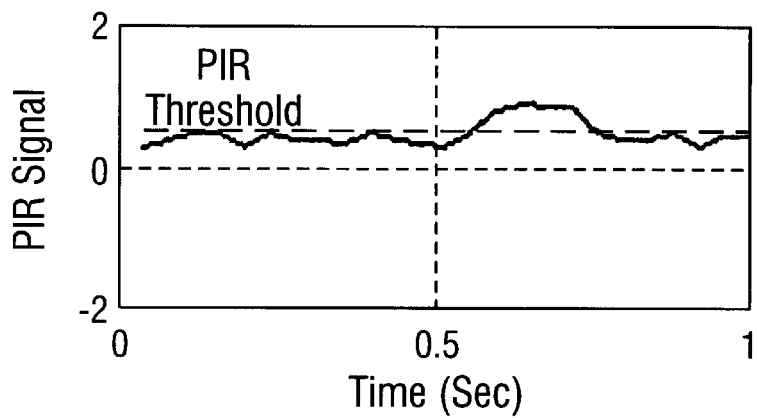
Figure 16C:
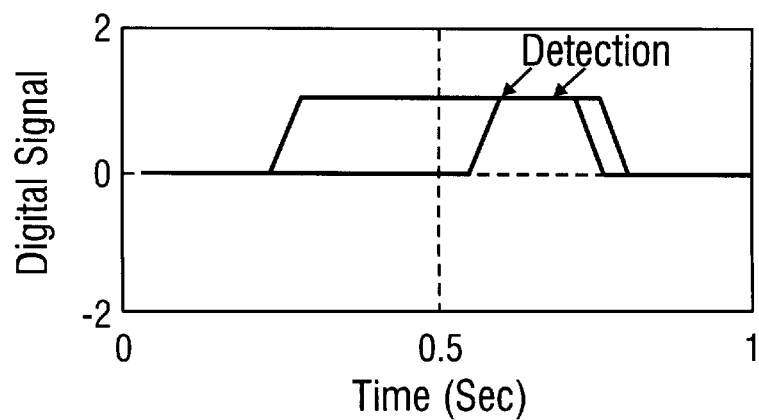
Figure 16D:
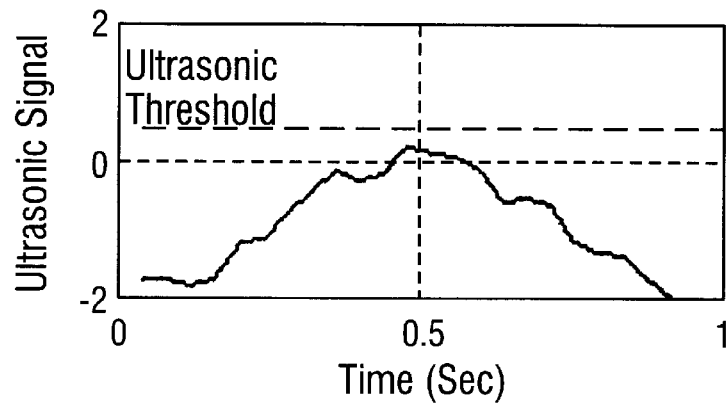
Figure 16E:
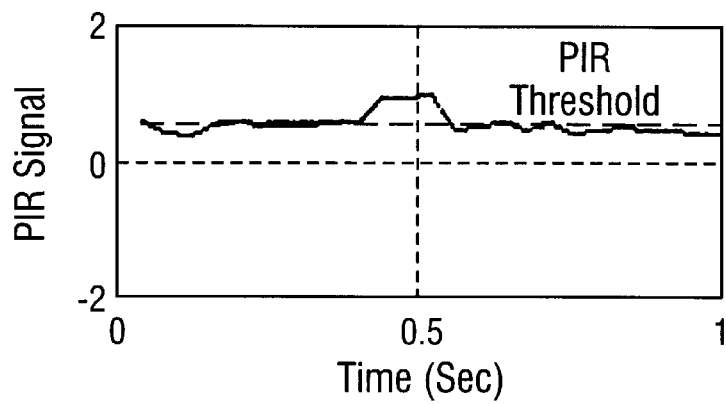
Figure 16F:
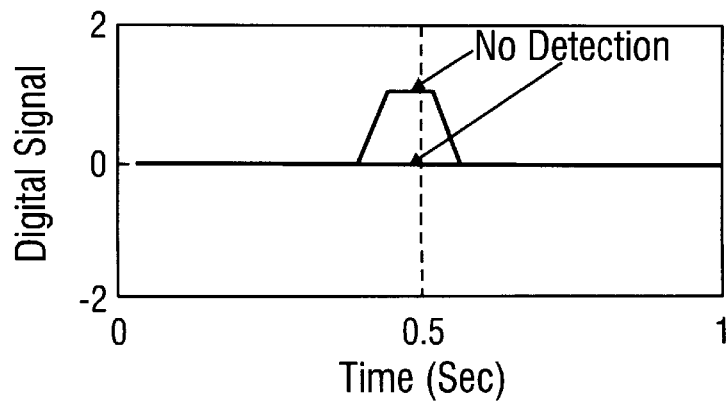

One of the timer/counter peripherals within digital microcontroller 229 is used to interrupt microcontroller 229 on a regular, periodic basis. This scheme allows the instruction bandwidth of microcontroller 229 to be evenly divided into a number of execution time slots as shown in FIG. 15. This time-division multiplexing scheme is used to run the various sensor tasks at different periodic intervals. For example, the sensor's display status task is run once every two minutes while the sensor's second task is run once a second. By counting interrupts (time slots) and balancing the load of each task, the various sensor tasks can be multiplexed in time to keep the microcontroller evenly loaded. For simplicity, the present implementation uses 256 time slots, each time slot having a duration of 1 millisecond.

The early multi-technology occupancy sensors utilized a separate activation threshold for each sensor technology in order to generate a separate digital occupancy signal for each sensor technology. Typically, whenever a given sensor signal was greater than or equal to the activation threshold value for that technology, the digital occupancy estimator signal for that sensor technology was a logical one. Whenever that sensor signal was below the activation threshold value for that technology, the sensor's digital occupancy estimator signal for that sensor technology was a logical zero. The various digital occupancy estimator signals of each sensor technology were then combined using classical Boolean (digital) logic in order to generate a digital composite occupancy estimator signal.

For example, consider a dual technology sensor that used ultrasonic and infrared sensors and combined their digital outputs using the AND logic function. Expressed symbolically, the digital output of each of the sensors and the overall digital output of the dual technology occupancy sensor would be:

ultrasonic sensor digital output =

$$\begin{cases} 0 \text{ if ultrasonic sensor output level} < \text{ultrasonic threshold} \\ 1 \text{ if ultrasonic sensor output level} \geq \text{ultrasonic threshold} \end{cases}$$

infrared sensor digital output =

$$\begin{cases} 0 \text{ if infrared sensor output level} < \text{infrared threshold} \\ 1 \text{ if infrared sensor output level} \geq \text{infrared threshold} \end{cases}$$

occupancy sensor digital output =

AND(ultrasonic digital output, infrared digital output)

In general, these early multi-technology sensors exhibited a sensitivity-false alarm tradeoff depending on which Boolean logic function was used to combine the individual digital occupancy estimator signals. If the various individual digital occupancy estimator signals were combined using the Boolean OR function, the overall sensitivity of the sensor increased at the expense of an increased incidence of false trips. If the various individual digital occupancy estimator signals were combined using the Boolean AND function, the overall incidence of false trips decreased at the expense of decreased sensor sensitivity. Since each technology had its own separate activation threshold, these prior art sensors were often unable to reliably detect motion in complex marginal cases where one or more technologies observed signal levels just below the user-defined threshold level.

An example of this situation for a prior art dual technology sensor is shown in FIGS. 16 (a)–(f). FIG. 16(a) depicts a typical ultrasonic sensor signal that occasionally exceeds the ultrasonic activation level threshold. FIG. 16(b) depicts a typical passive infrared sensor signal that also occasionally exceeds the passive infrared activation level threshold. FIG. 16(c) depicts the corresponding individual digital occupancy estimator signals. When the two individual digital occupancy estimator signals are combined using the Boolean AND function, the sensor's digital composite occupancy estimator signal (not shown) indicates that occupancy has been detected. In contrast, FIGS. 16(d)–(f) depict a more complex situation. FIG. 16(d) depicts an ultrasonic sensor signal that is close to the ultrasonic activation level threshold but never exceeds the ultrasonic activation level threshold. FIG. 16(e) depicts a typical passive infrared sensor signal that occasionally exceeds the passive infrared activation level threshold. FIG. 16(f) depicts the corresponding individual digital occupancy estimator signals. When the two individual digital occupancy estimator signals are combined using the Boolean AND function, the sensor's digital composite occupancy estimator signal (not shown) indicates that occupancy has not been detected.

While these prior art multi-technology-based occupancy sensors showed improved performance over single technology occupancy sensors, they were still unable to sense occupancy in the more complex marginal sensor signal level situations.

In contrast, the multi-technology sensor-fusion-based occupancy sensor of the present invention does not generate a separate digital occupancy signal for each sensor technology. Instead, the multi-technology sensor-fusion method of the present invention takes the various sensor output signals and forms a composite occupancy estimator signal. This composite occupancy estimator signal is then compared with a composite activation threshold value. Whenever the composite occupancy estimator signal is greater than or equal to the composite activation threshold value, the sensor's digital composite occupancy signal is a logical one. Whenever the composite occupancy estimator signal is below the composite activation threshold value, the sensor's digital composite occupancy signal is a logical zero.

For example, consider a dual technology sensor-fusion-based occupancy sensor in accordance with the present invention that uses ultrasonic and infrared sensors and combines their outputs using an arbitrary generalized non-linear function. Expressed symbolically, the composite occupancy estimator signal and the overall digital composite occupancy signal of the dual technology sensor-fusion-based occupancy sensor is:

composite output = $f$(ultrasonic output, infrared output)

occupancy sensor digital output =

$$\begin{cases} 0 \text{ if composite output level} < \text{composite threshold} \\ \overline{0 \text{ if composite output level} \le \text{composite threshold}} \end{cases}$$

where, f(, , , . . . , ) denotes an arbitrary generalized function of N variables (i.e., one variable for each sensor technology). Note that for the dual technology sensor of the present invention with (N=2), the function f(, ) may be an arithmetic sum, a weighted arithmetic sums, or an arbitrary non-linear function of the variables expressed either algorithmically or in tabulated form. The algorithmic form is more amenable to mathematical analysis whereas the tabulated form has distinct advantages from a microprocessor implementation point of view.

One embodiment of the present invention utilizes an arithmetic sum based occupancy detection algorithm to implement a sophisticated multi-technology sensor fusion detection scheme. This algorithm increases the overall probability of occupancy detection while simultaneously lowering the overall probability of false tripping. In a dual technology sensor using ultrasonic and PIR sensors, the invention combines the outputs of the ultrasonic and PIR sensors to produce a composite occupancy estimator that is compared to a composite threshold to determine occupancy. This produces a highly sensitive yet highly reliable occupancy sensor that can detect minor motion in more complex marginal sensor signal level situations.

Figure 17:
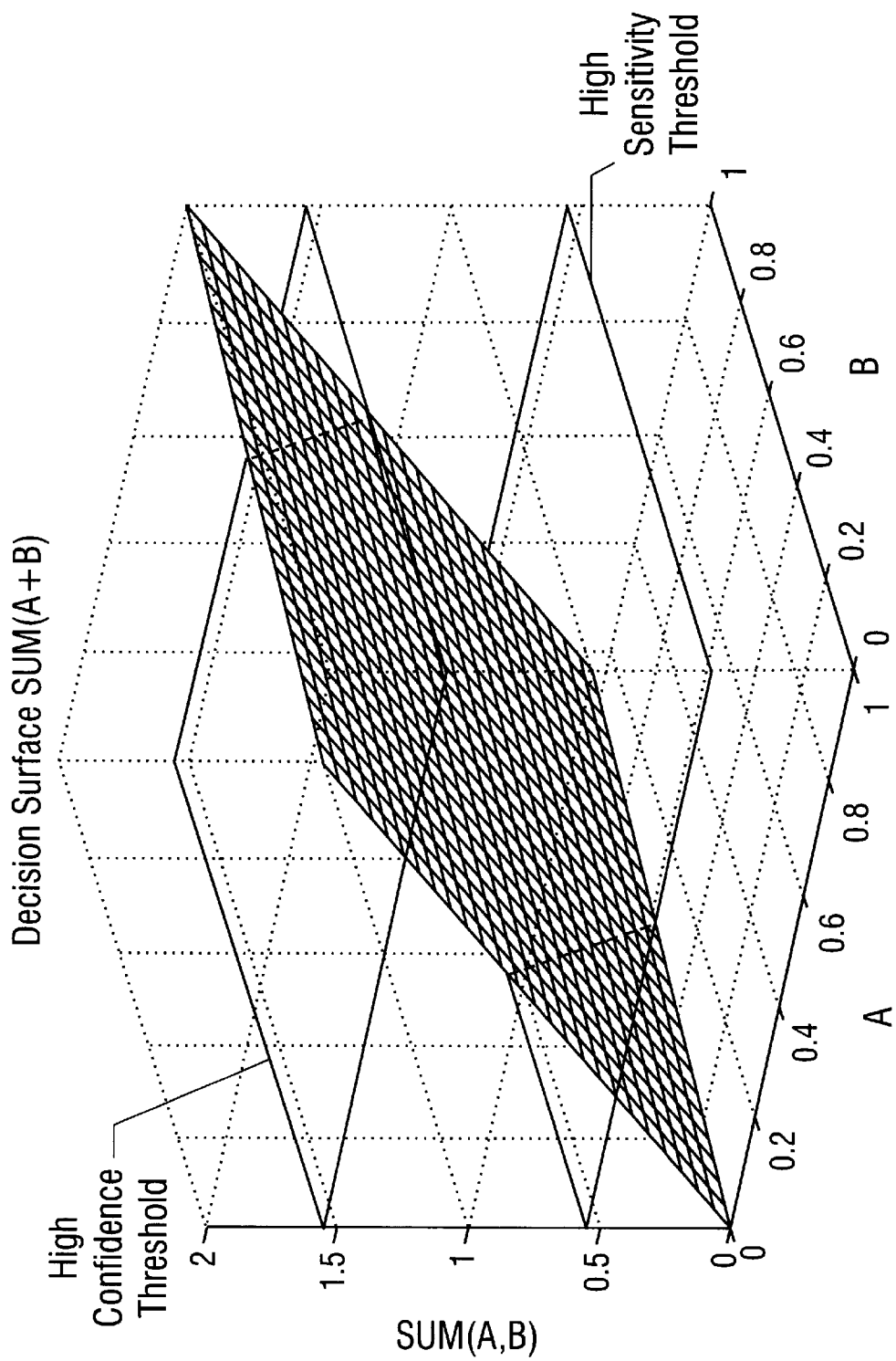
FIG. 17 is a decision surface for the arithmetic sum formula in accordance with the present invention.
Figure 18A:
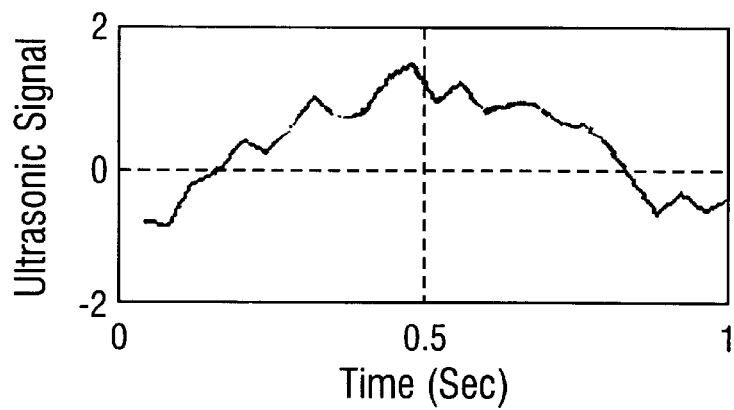
FIGS. 18($a$)–($f$) are graphs illustrating dual technology occupancy detection in accordance with the present invention.
Figure 18B:
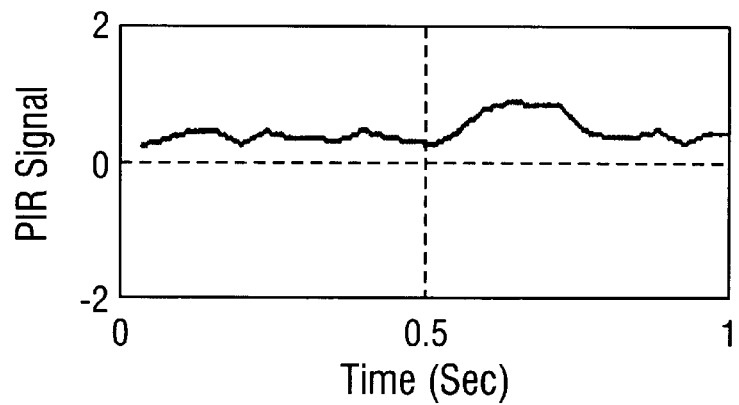
Figure 18C:
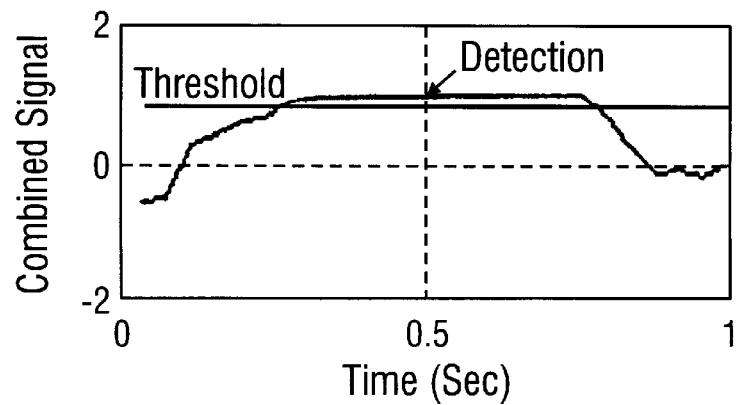
Figure 18D:
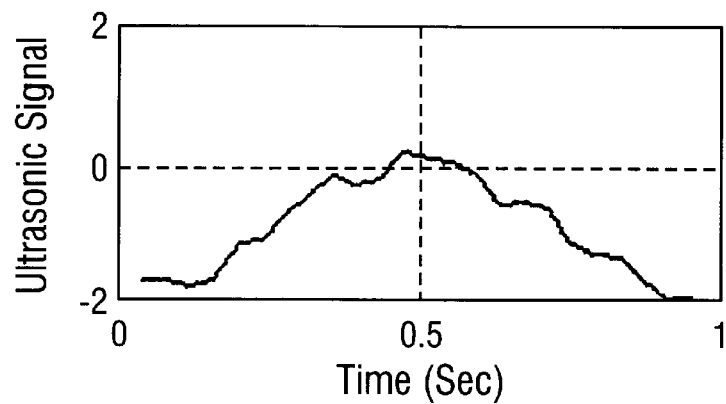
Figure 18E:
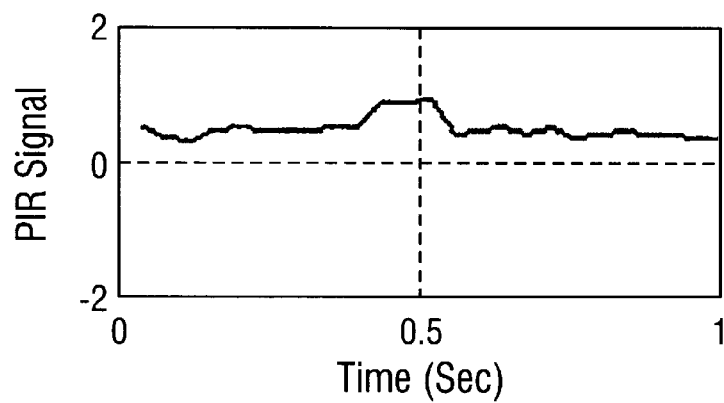
Figure 18F:
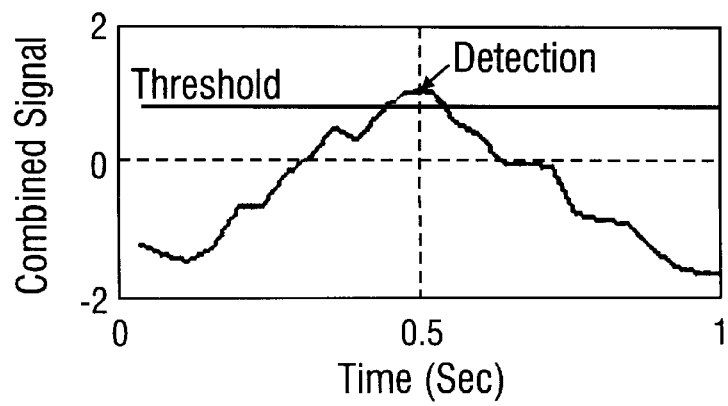

A plot of the two-dimensional arithmetic sum surface is shown in FIG. 17. When the arithmetic sum is greater than the activation threshold shown in FIG. 17, a load is activated. Once activated, the load remains activated when the arithmetic sum is greater than the maintenance threshold shown in FIG. 17. By combining these signals prior to thresholding, sub-threshold signal levels are able to contribute useful information to the decision process. This allows the sensor to effectively utilize sensor signal values that are high enough to be indicative of occupancy but too low to indicate certain occupancy according to a given single sensing technology. In an exemplary embodiment of the invention, the computation and evaluation of the composite occupancy estimator signal is performed separately for HIGH CONFIDENCE and HIGH SENSITIVITY modes using fixed-point arithmetic.

An example of this situation for a dual technology occupancy sensor according to the present invention is shown in FIGS. 18 (a)–(f). FIG. 18(a) depicts a typical ultrasonic sensor signal. FIG. 18(b) depicts a typical passive infrared sensor signal. Note that neither of the individual sensor technologies have a separate activation threshold. FIG. 18(c) depicts the sensor's composite occupancy estimator signal and the sensor's composite activation threshold level. When the two individual sensor signals are combined using an arithmetic sum function, the sensor's composite occupancy estimator signal suggests that occupancy has been detected whenever its value exceeds the sensor's composite activation threshold level. FIGS. 18(d)–(f) depict a more complex situation. FIG. 18(d) depicts a weak ultrasonic sensor signal. FIG. 18(e) depicts a typical passive infrared sensor signal. FIG. 18(f) depicts the sensor's composite occupancy estimator signal and the sensor's composite activation threshold level. When the two individual sensor signals are combined using an arithmetic sum function, the sensor's composite occupancy estimator signal suggests that occupancy has again been detected. It should be noted that the prior art multi-technology occupancy sensor was unable to detect occupancy in this situation (FIGS. 16 (d)–(f)).

An example of a more complex occupancy function of two variables is the function $$f(x,y) = \min(1, (K_x^* x P + K_y^* y P)^{1/P})$$

Figure 19:
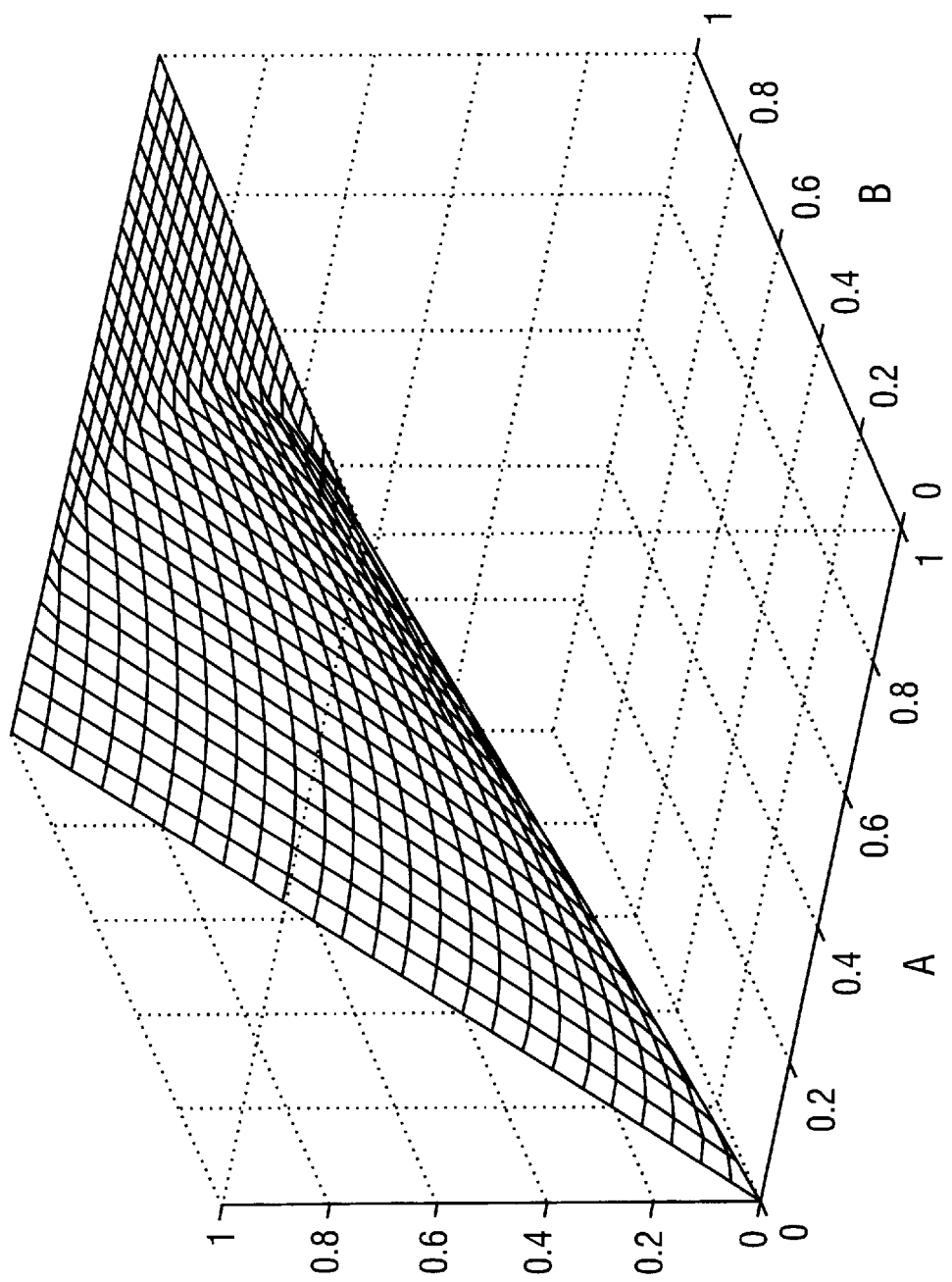
FIG. 19 is a decision surface for the Yager Union function (K=1, p=2) in accordance with the present invention.

This function produces what is known as the Yager Union decision surface. A condition may occur where either sensing technology alone assures reliable detection of occupancy when its associated occupancy estimator signal occurs at a relatively high level. Additionally, the occurrence of moderate levels of both the occupancy estimators together may be a reliable indication of occupancy. In this case, a composite occupancy estimator is required that indicates occupancy when the component occupancy estimators occur together at relatively low levels, or individually at relatively high levels. An example of the given function with $K_x = K_y = 1$ and p=2 is shown in FIG. 19. This function combines the component occupancy estimators to form a composite occupancy estimator as desired.

Figure 20:
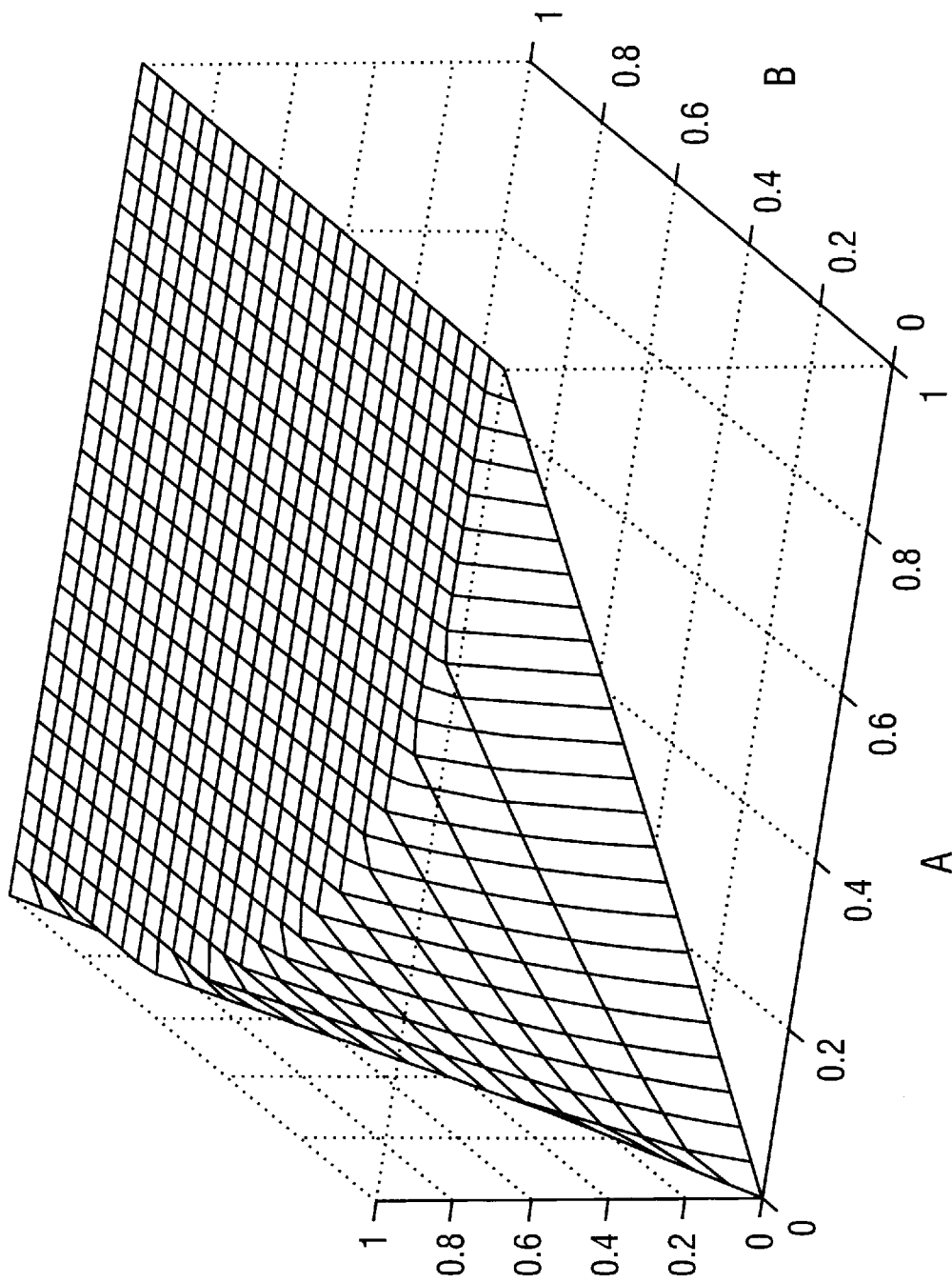
FIG. 20 is a decision surface for the Yager Union function (K=1, p=0.5) in accordance with the present invention.

A condition may occur that requires a relatively high degree of confidence in the occupancy estimate, and where the component occupancy estimators are generally reliable when taken together, but where the component occupancy estimators are generally unreliable taken alone. In this case, a composite occupancy estimator is required that indicates occupancy with a moderate level of indication from both component occupancy estimators, but rejects even large signals from the component occupancy estimators individually. An example of the given function with $K_x = K_y = 1$ and p=0.5 is shown in FIG. 20. This function combines the component occupancy estimators to form the desired composite occupancy estimator.

Other functions may also be acceptable to combine the individual component occupancy estimators to produce a composite estimator signal, and the specification of theses exemplary functions does not limit the scope of the invention. In addition, although the exemplary functions are described using two occupancy estimators produced by two occupancy sensing technologies, this is due primarily to the ease of illustration using two estimators. However, it will be understood that a composite occupancy estimator may be derived from any number of individual occupancy estimators. For example, PIR, ultrasonic and microwave sensing technologies may be used to produce three individual component occupancy estimators that are then combined using a desired function (for example, algebraic sum, weighted sum, Yager Union, and the like) to produce a composite occupancy estimator.

The Yager Union function requires a significant computational resource to evaluate analytically, more than may be available in real time from a cost effective microprocessor. FIGS. 21 and 22 depict the same functional relationships as in FIGS. 19 and 20, but expressed in a discrete tabular form for fast efficient table lookup. In order to achieve different functional characteristics, the microprocessor may have multiple such tables to choose from, corresponding to different occupancy environment situations. These tables may then be selected adaptively or before hand. Additionally, the tables may be dynamic, and periodically recalculated according to the adaptation rules of the sensor automatic adjustment algorithm. This is possible, even with a limited computational resource, because the adaptation is an occasional low speed process, unlike the function evaluation, that must be executed at a high repetition rate in order to achieve fast response to occupancy signals. The Yager Union function is offered as an exemplary embodiment of the table look up aspect of the present invention, it will be understood that other mathematical functions used to calculate the composite signal may also be stored as a table.

The present invention may also include a number of adaptive features. When enabled, the following sensor variables are adapted as a function of time: ultrasonic sensor lights ON sensitivity setting; ultrasonic sensor lights OFF sensitivity setting; infrared sensor sensitivity setting; timer delay setting, infrared noise level estimate, smallest ultrasonic motion level estimate and a time between motion estimate.

The adaptation of the sensor's various sensitivity settings is generally referred to automatic sensitivity adjustment (ASA). The adaptation of the sensor's timer delay setting is generally referred to as automatic timer adjustment (ATA).

At power on reset, the various ultrasonic and infrared sensitivity settings and the timer delay setting are initialized according to the user-specified potentiometer settings (FIG. 3, 316, 317, 319). Automatic adjustments to the ultrasonic and infrared sensitivity settings and the sensor's timer delay setting are implemented as deviations from the user-specified potentiometer settings. As a result, any change to a potentiometer value results in an immediate change to the sensor adapted characteristic. The sensor continues to adapt based on both the potentiometer setting and the adapted adjustment value.

To accomplish ASA, a variety of situations automatically modify the sensor's ultrasonic, PIR and acoustic sensitivity settings, including: false-on event, false-on-stay-on event, false-off event, lights stay on-with no major occupancy event, lights stay on-with major occupancy event, occupancy cycle detection and utilization adjustment, infrared noise level adjustment, acoustic background noise level adjustment and smallest ultrasonic motion level adjustment. ASA can be accomplished in single technology or multiple technology sensors.

Figure 23:
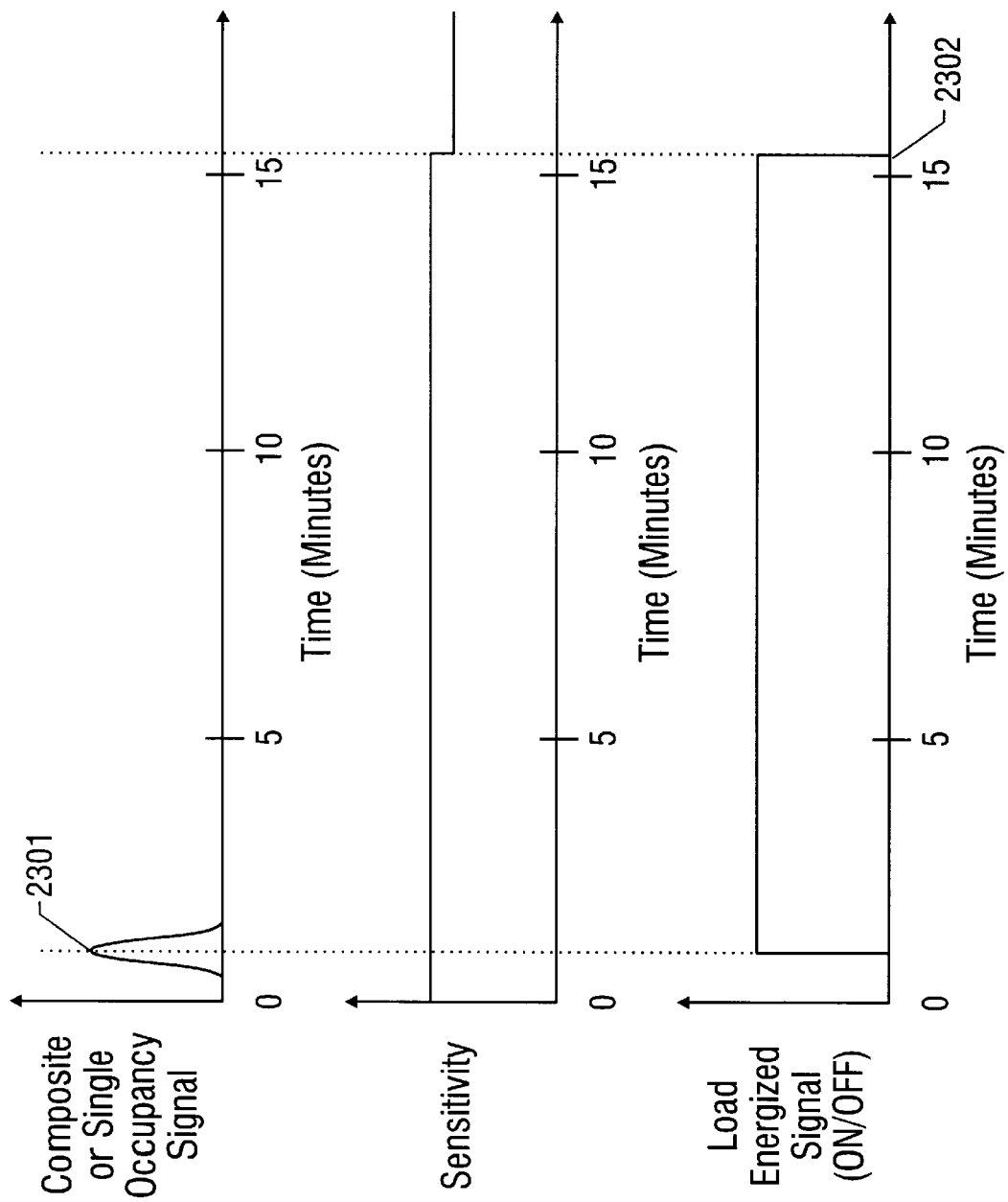
FIG. 23 is a time line depicting the adaptation of sensor sensitivity for a false-on event in accordance with the present invention.

A false-on event occurs when the sensor's load(s) are initially de-energized, energized for a short period of time (for example, 0–8 seconds longer than timer delay setting), and then de-energized again. FIG. 23 describes a false-on adaptation event. The timer setting in this example is 15 minutes, occupancy is detected at 2301 only for a very short period of time (less than 15 seconds) and the load is energized. Because occupancy was not detected for 15 minutes after load was initially energized, lights turn off at 2302 and sensitivity is reduced (2303). A false-on event causes the sensor's ultrasonic, PIR, microwave, or acoustic sensitivity to be reduced.

Figure 24:
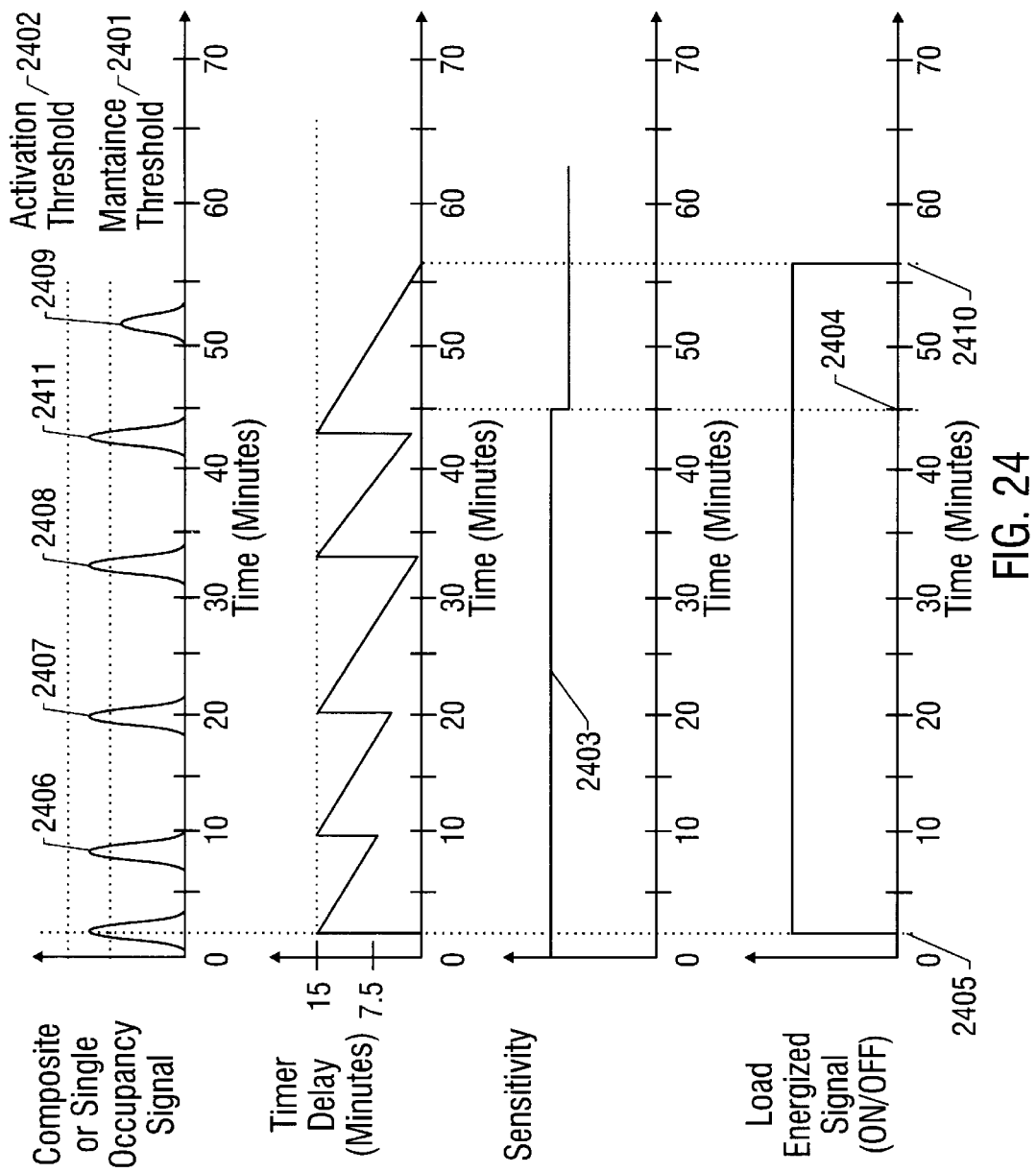
FIG. 24 is a time line depicting the adaptation of sensor sensitivity for a hallway strike false-on-stay-on event in accordance with the present invention.

A false-on-stay-on event occurs when sensor's load(s) are initially de-energized then energized for multiple timer settings without the occupancy signal ever exceeding activation threshold. FIG. 24 describes a false-on-stay-on adaptation event for a sensor that is sensing occupancy incorrectly through an open door into a hallway. Every time someone passes by the door, occupancy is detected. In this example, the timer is set at 15 minutes, occupancy is detected 2405, timer is reset and the load energized. Before the timer expires, occupancy is again detected 2406, 2407, 2408 and 2411 as someone passes by the door. After each occurrence, the timer is reset. This pattern of detecting occupancy without the signal exceeding the activation threshold 2402 continues for more than three timeout periods or 45 minutes 2404 and the sensitivity 2403 is reduced. Now when persons pass by the open door 2409 the sensor does not detect occupancy and the load is then de-energized 2410, 15 minutes after occupancy was last detected.

Figure 25:
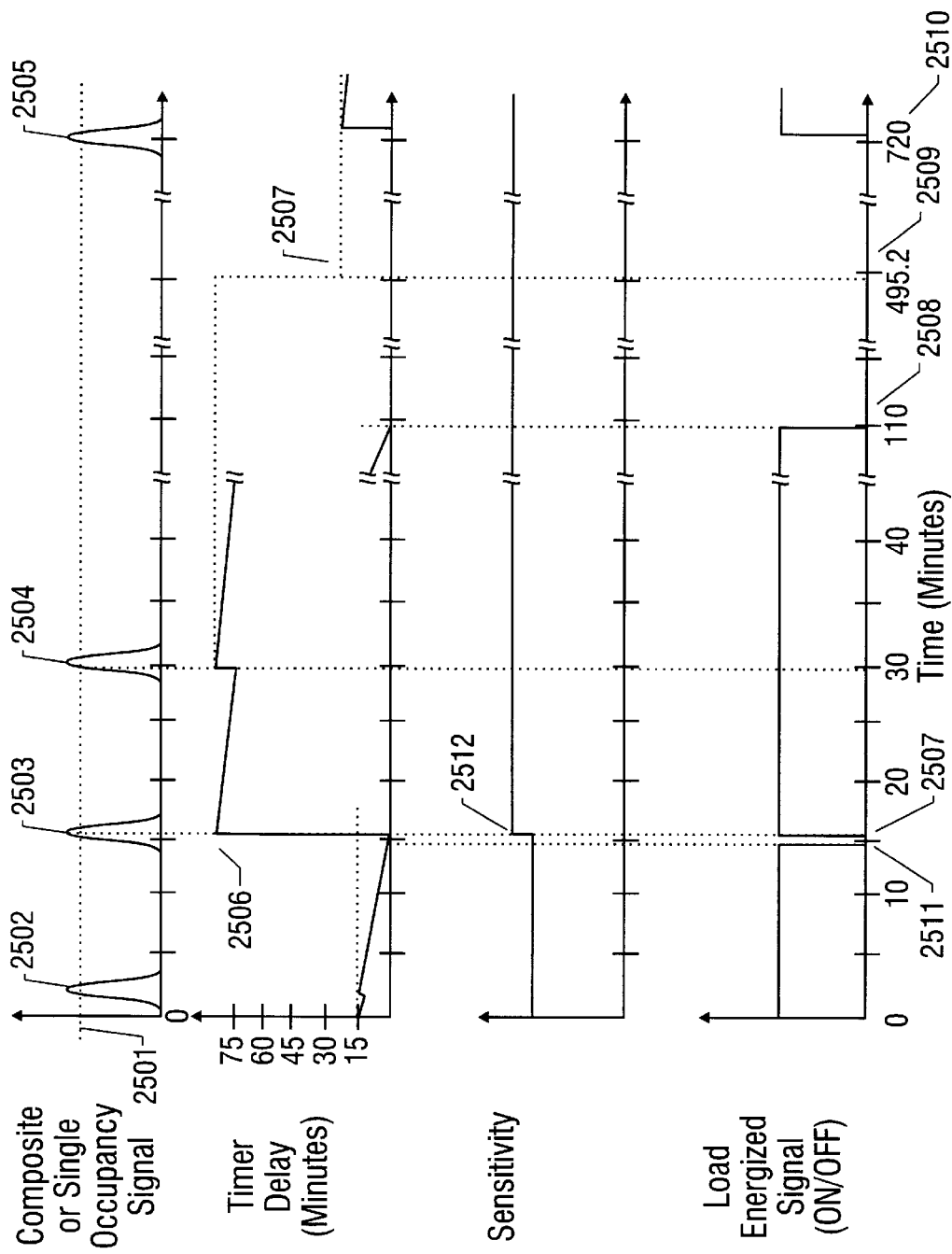
FIG. 25 is a time line depicting the adaptation of sensor sensitivity for a false-off event in accordance with the present invention.

A false-off event occurs when the sensor's load(s) are initially energized when the occupancy signal is greater than the activation threshold 2801, then de-energized for a short period of time (for example, 0 to 15 seconds), and then energized again. FIG. 25 describes a false-off adaptation event for a sensor controlling room lights. The sensor detects occupancy at 2502 and the is timer is reset to 15 minutes. At 2511, the timer expires and load is de-energized. The occupant then reactivates the lights 2507 with occupancy signal 2503 within 15 seconds of load(s) de-energizing. At 2507, the sensitivity and timer are increased to 2512 and 2506 respectively. The timer is temporarily increased to 80 (5+60+15=80) minutes at 2506 (for example, 5 is the increase in timer value after false-off event, 60 is the temporary additional increase in timer value for the next eight hours and 15 minutes was the timer value before false-off event). Occupancy detection 2504 resets the timer and after 80 minutes, the load(s) de-energize at 2508. Eight hours after false-off event occurred 2509, the timer is reduced to 20 minutes 2513. When occupancy 2505 is next detected at 2510, the timer is reset to 20 minutes and load(s) energized.

Figure 26:
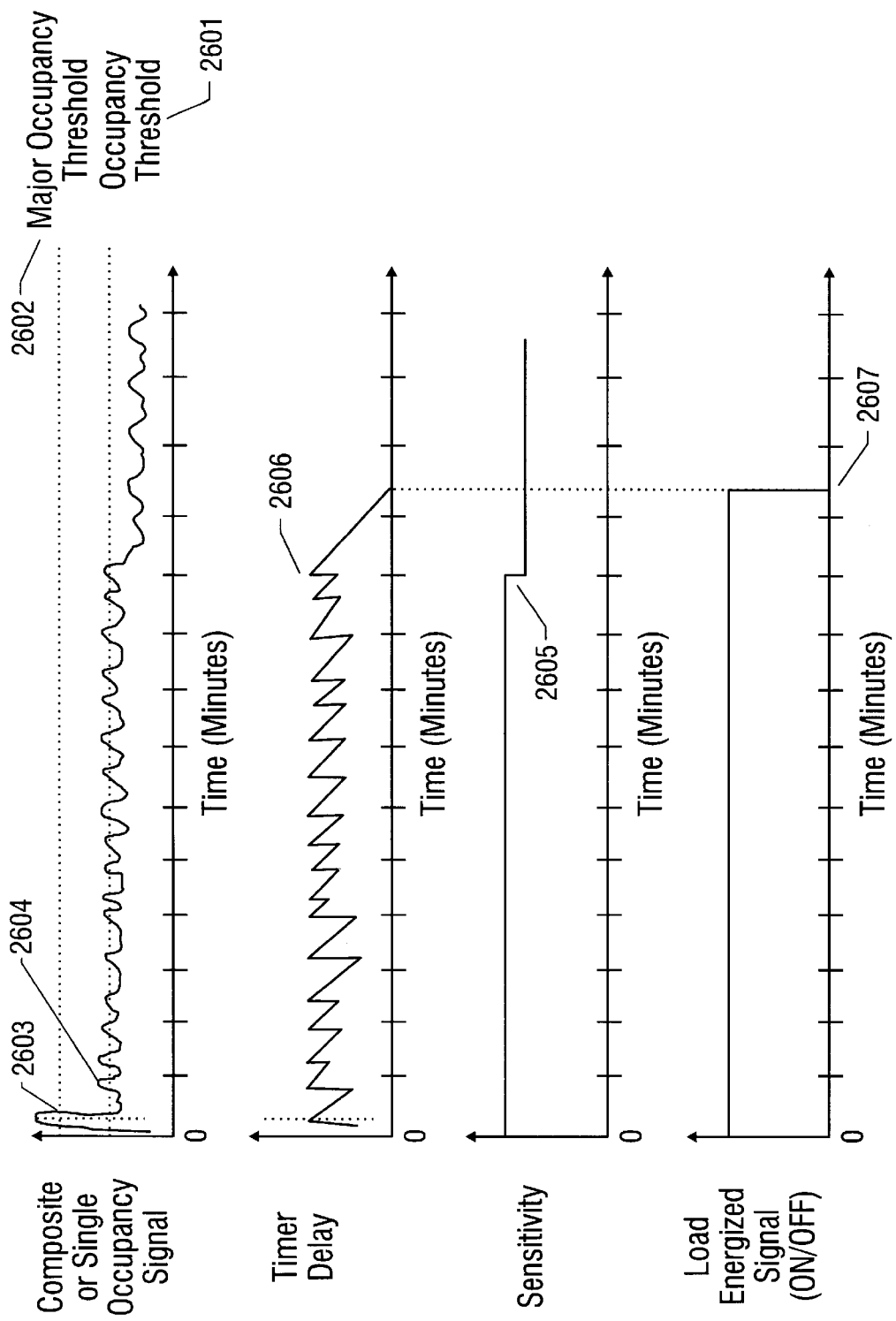
FIG. 26 is a time line depicting a stay on with no major activity.

Lights stay on-no activation event occurs when load(s) are energized constantly for multiple timer settings and occupancy signals never exceed activation threshold. FIG. 26 describes a lights stay on-no activation adaptation event. The sensor detects major occupancy 2603 when the occupancy signal exceeds the activation threshold 2602 (for example, a person just stood up and left the area), the timer is reset and the load(s) remain energized. The occupancy threshold is constantly exceeded for the next 120 minutes by small disturbances 2604 (for example, air noise, sensor electrical noise, etc . . . ) with no signals exceeding 2602 activation threshold. Sensitivity 2605 is reduced and now these small disturbances don't reset the timer and the load de-energizes at 2607.

Figure 27:
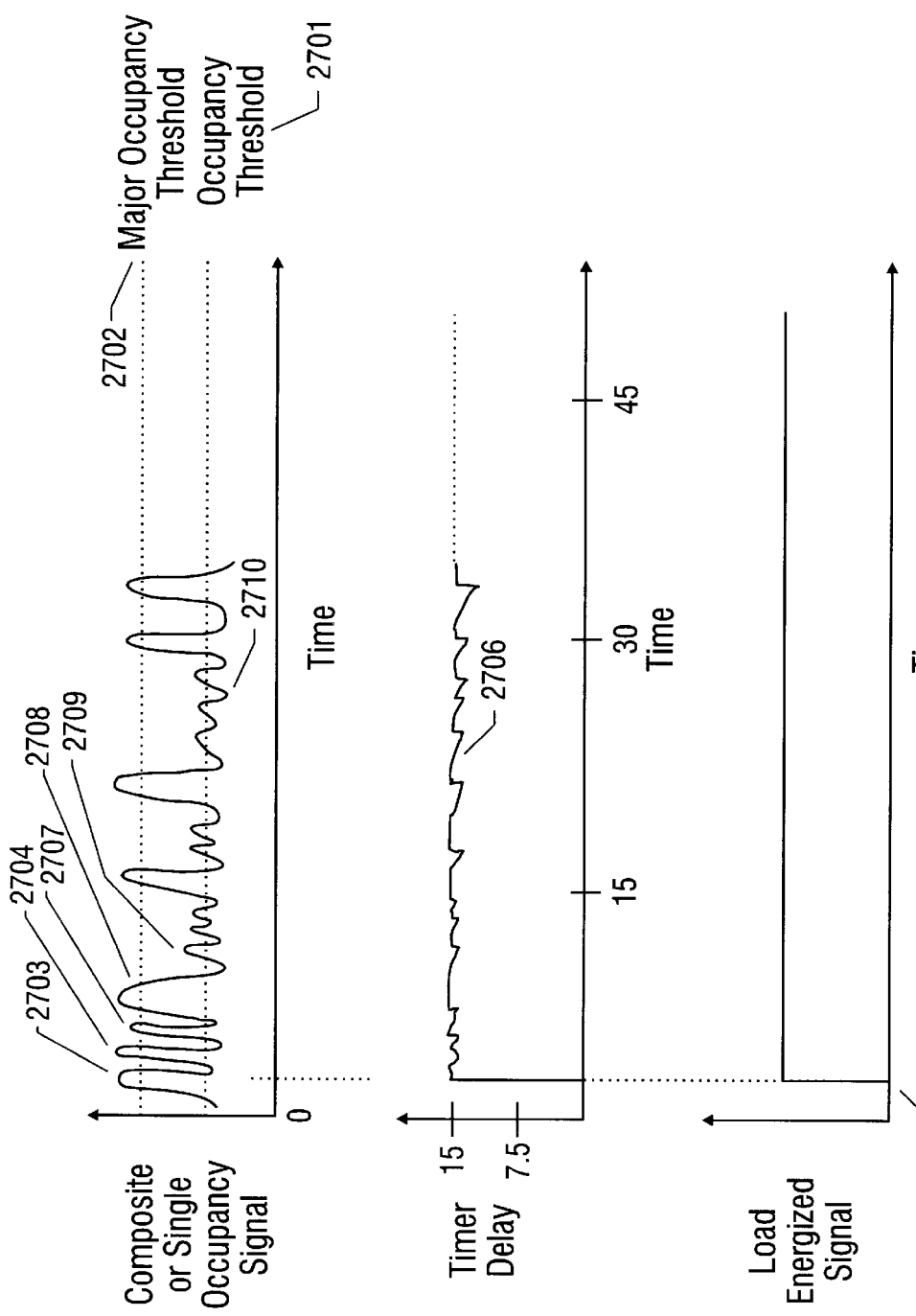
FIG. 27 is a time line depicting a stay-on-multiple-activation event

Lights stay on-with major occupancy event occurs when load(s) are energized constantly for multiple timer settings and occupancy signal exceeds activation threshold. Several conditions can cause this event for example, the sensor is mounted close to a powerful air register, sensor mounted close to door and sensor pointed in the wrong direction and sensor mounted in correct application but sensitivity is way out of adjustment. FIG. 27 describes a lights stay on- with major occupancy adaptation event. Occupancy signal 2703 exceeds occupancy threshold 2701 and load(s) are energized at 2705. In quick succession, occupancy signals 2704, 2707, 2708 and 2709 occur with 2704, 2707 and 2708 crossing the activation threshold 2702. Quick succession of occupancy signals constantly reset timer 2706. Even in very active occupancy areas where sensor is adjusted and applied correctly, signal 2710 will settle down for short periods of time.

Using only a single technology sensor, for example ultrasonic, it is difficult to differentiate a very active room with lots of people verses a sensor mounted close to a powerful air register. However if multiple technologies are used, a much better opportunity is provided to adapt correctly, identify if the sensor is mounted close to a powerful air register or identify incorrect sensor application. Two examples are presented showing a dual technology ultrasonic and PIR sensors. In both cases the room is unoccupied. One sensor is mounted correctly with a very high initial ultrasonic sensitivity setting and in the other example the sensor is mounted close to a powerful air register.

Figure 28:
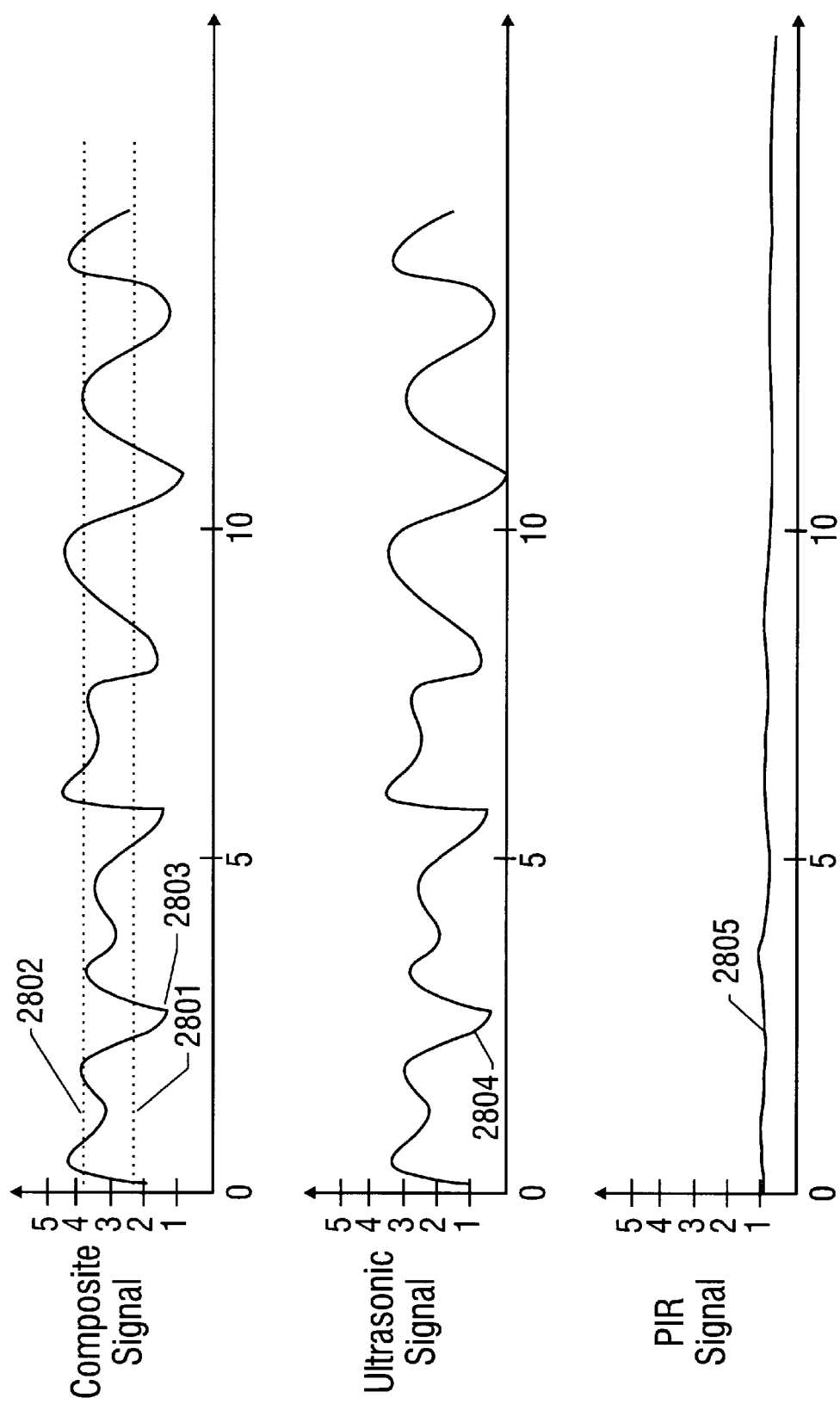
FIG. 28 is a time line depicting an expanded occupancy estimator signal for a stay-on-multiple-activation event.

FIG. 28 shows an expanded composite occupancy signal 2803 for ultrasonic and PIR detectors. Ultrasonic signal 2804 is very large and provides most of the signal contribution if an algebraic sum is used to combine the two signals. PIR signal 2805 is very quiet with very little signal variance. Since PIR is much more immune to air turbulence than ultrasonic it can be concluded that either the sensor is mounted close to an air register or the ultrasonic sensitivity is adjusted very high.

Figure 29:
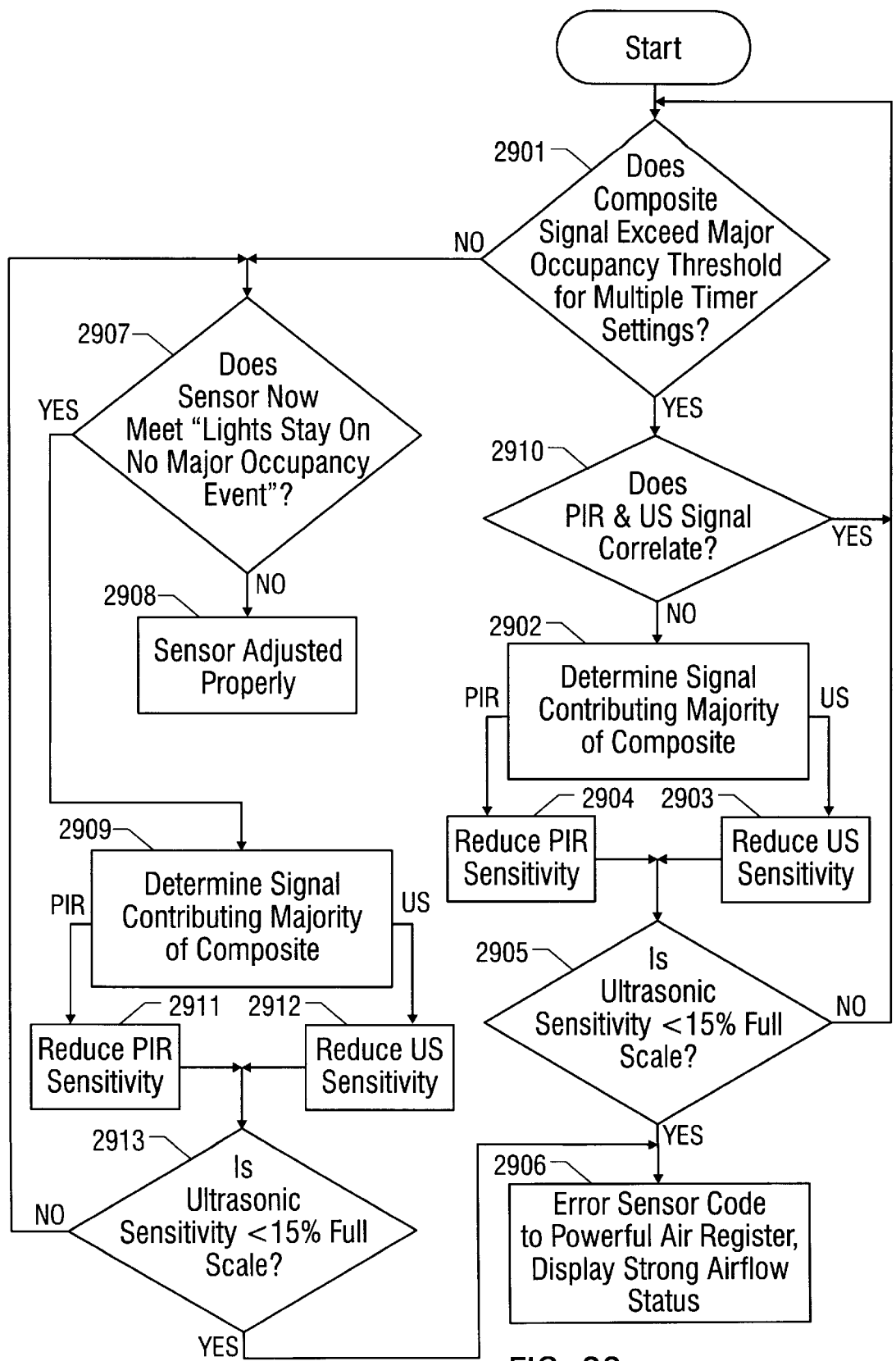
FIG. 29 is the stay-on-multiple-activation event and strong airflow analysis task flowchart for the present invention.

FIG. 29 shows an example algorithm to reduce the sensitivity of either PIR or ultrasonic signals. In 2901 it is determined if the composite signal exceeds the activation threshold for multiple timer settings. If this condition is satisfied, it is determined if the PIR and US signals are occasionally correlated (2910). If the sensor detects strong occupancy by both technologies at the same time, the area could be occupied. If signals do not correlate, it is determined which signal contributes most to composite occupancy signal (2902). In this example, ultrasonic sensitivity is reduced (2903). If ultrasonic sensitivity is reduced by more than 15% full scale (2905), the sensor is too close to a powerful air register and the sensor sends strong air flow status (2906). This is true because at low ultrasonic sensitivity levels it's coverage pattern is much smaller than the PIR pattern. Also, the PIR pattern is very dense and strong PIR occupancy signals would be received if the ultrasonic pattern area was occupied.

In situations where air flow is moderate or non-existent, after a couple of ultrasonic sensitivity reductions the composite signal fails (2901). The first time decision block 2907 is entered, the sensor is most likely in a "Lights stay on-no major motion detected" event. In block 2909, it is determined that ultrasonics are the major signal contributor and ultrasonic sensitivity is reduced in 2912. If ultrasonic sensitivity is less than 15% full scale (2913), the sensor is close to a powerful air register and the sensor sends strong air flow status 2906. If ultrasonics sensitivity is greater than 15% of full scale (2913), the loop is resumed until an error occurs (2906) or the sensor is properly adapted (2908).

Figure 30A:
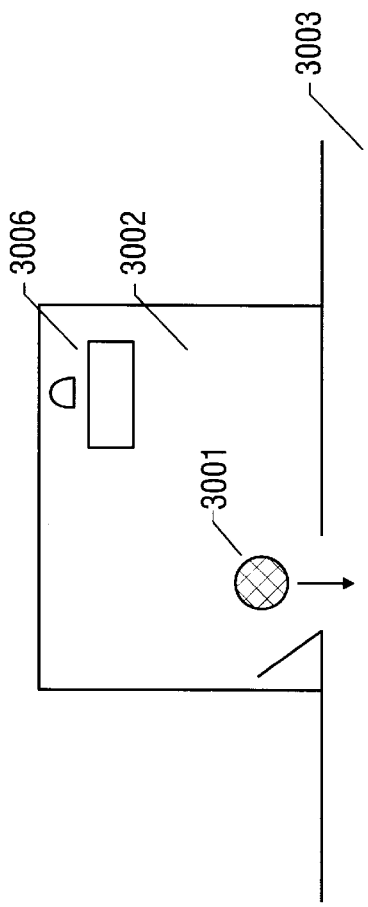
FIG. 30 is a diagram showing sensor installations that may result in adaptation of sensor sensitivity.
Figure 30B:
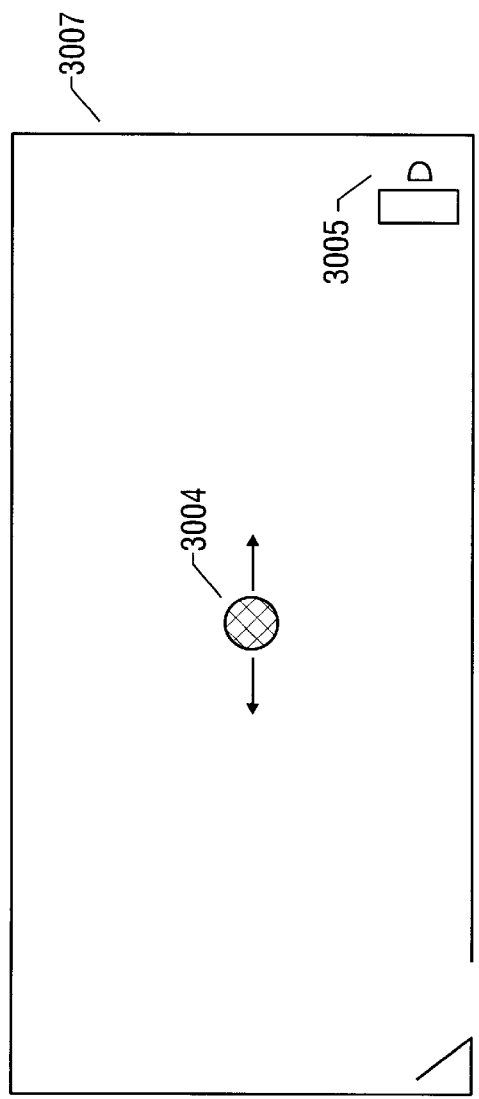

It can also be determined if the sensor is mounted incorrectly or put into an unacceptable application and flash the appropriate status information. FIGS. 30(*a*) and (*b*) show two applications where sensors 3001 and 3004 are improperly applied.

Sensor 3001 is mounted looking out the door in room 3002. As people walk past the door in hallway 3003 the lights will be tripped on. A variety of sensitivity reduction techniques, as previously discussed with reference to FIGS. 23–29, will significantly reduce sensitivity. Working at desk 3006 will not maintain electrical load(s) and will periodically de-energized. The sensitivity will increase from "false-off" adaptation event. When the space is unoccupied, the sensitivity will decrease. This cycling will be detected and an application error status message will be displayed.

Sensor 3004 is mounted in a very large room 3007. This room is much larger than the coverage pattern sensor 3004 can provide. Working at desk 3005 will increase sensitivity from "false-off" adaptation events. Eventually, sensor 3004 sensitivity will be increased through a variety of sensitivity reduction techniques previously discussed for example some of these could be "false-on", "false-on-stay-on" or "lights stay on-no major motion" adaptation events will significantly reduce sensitivity. This cycling will be detected and an application error status message will be displayed.

Figure 31:
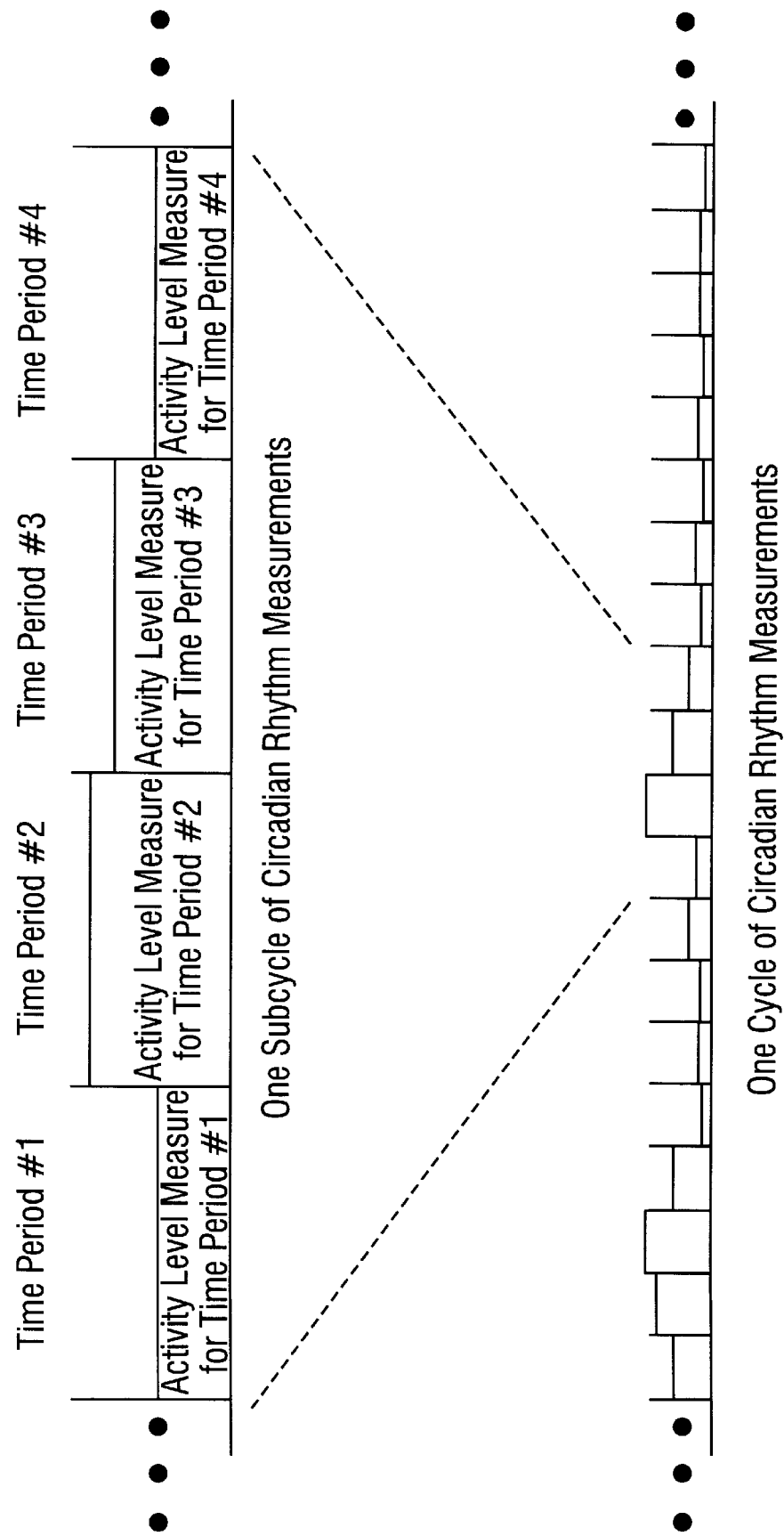
FIG. 31 is the occupancy cycle detection and utilization measurement method for the present invention.
Figure 32:
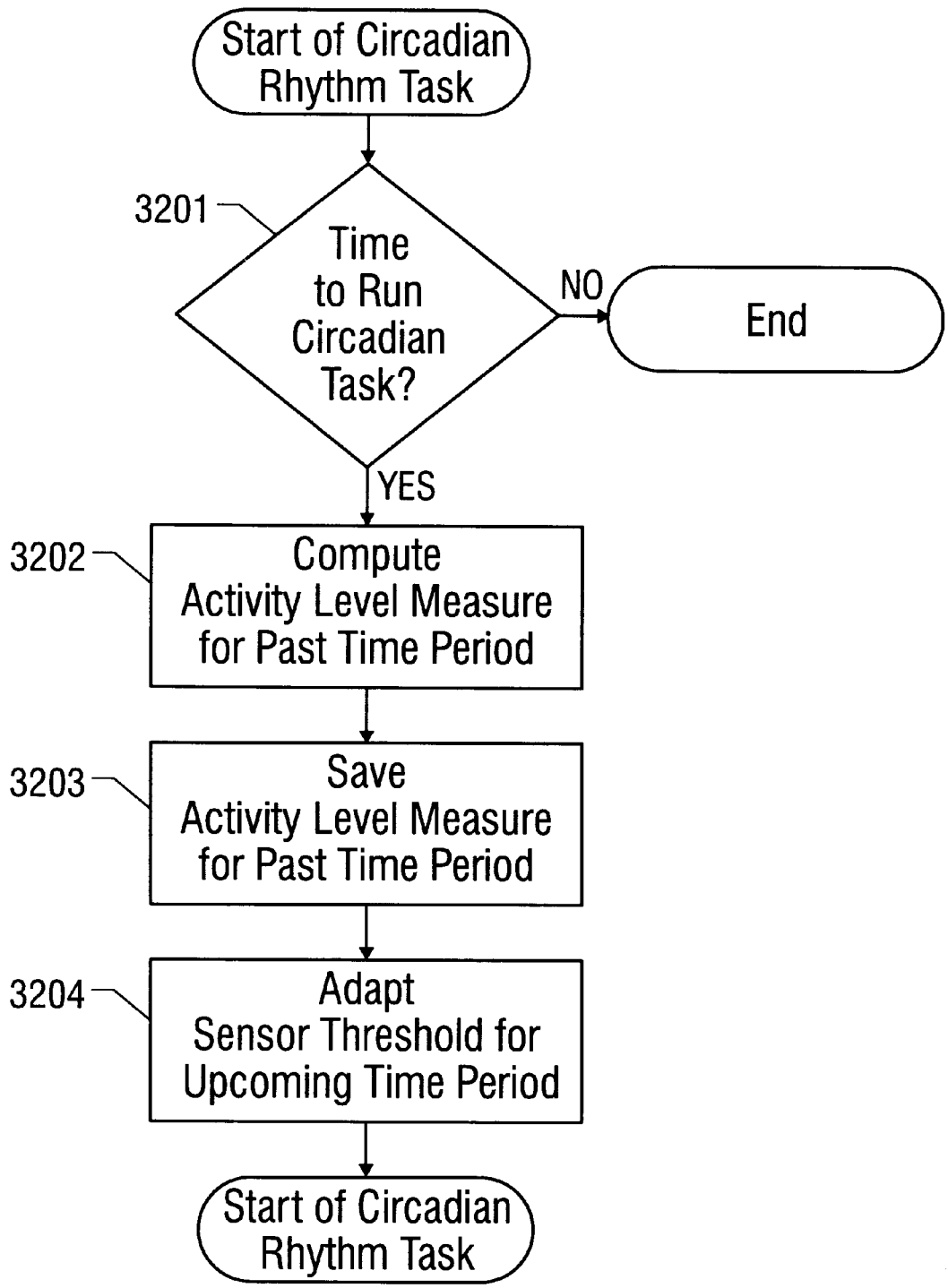
FIG. 32 is the occupancy cycle detection and utilization task flowchart for the present invention.

The occupancy cycle detection and utilization adjustment modifies the sensor's ultrasonic and infrared sensitivity settings based on the historical usage patterns of the area controlled by the sensor. FIG. 31 is a histogram that depicts the occupancy cycle detection and utilization measurement scheme of the present invention. The various sensitivity settings are slightly increased during time periods when the area is normally occupied. Similarly, the various sensitivity settings are slightly decreased during time periods when the area is normally unoccupied. FIG. 32 is a simplified occupancy cycle detection and utilization task for the present invention in flowchart form. In operation, when it is time to run the task (3201), the activity level for the immediately preceding time period is computed (3202). Then, the activity level is saved (3203). This preferably takes the form of an accumulation of newly computed activity with activity that has been computed and accumulated previously for the same time period. Thus, a histogram like that shown in FIG. 31 is built. Then, the sensor sensitivity is adjusted (3204) for the upcoming time period based upon the level of activity stored in the histogram for the next time period.

Figure 33:
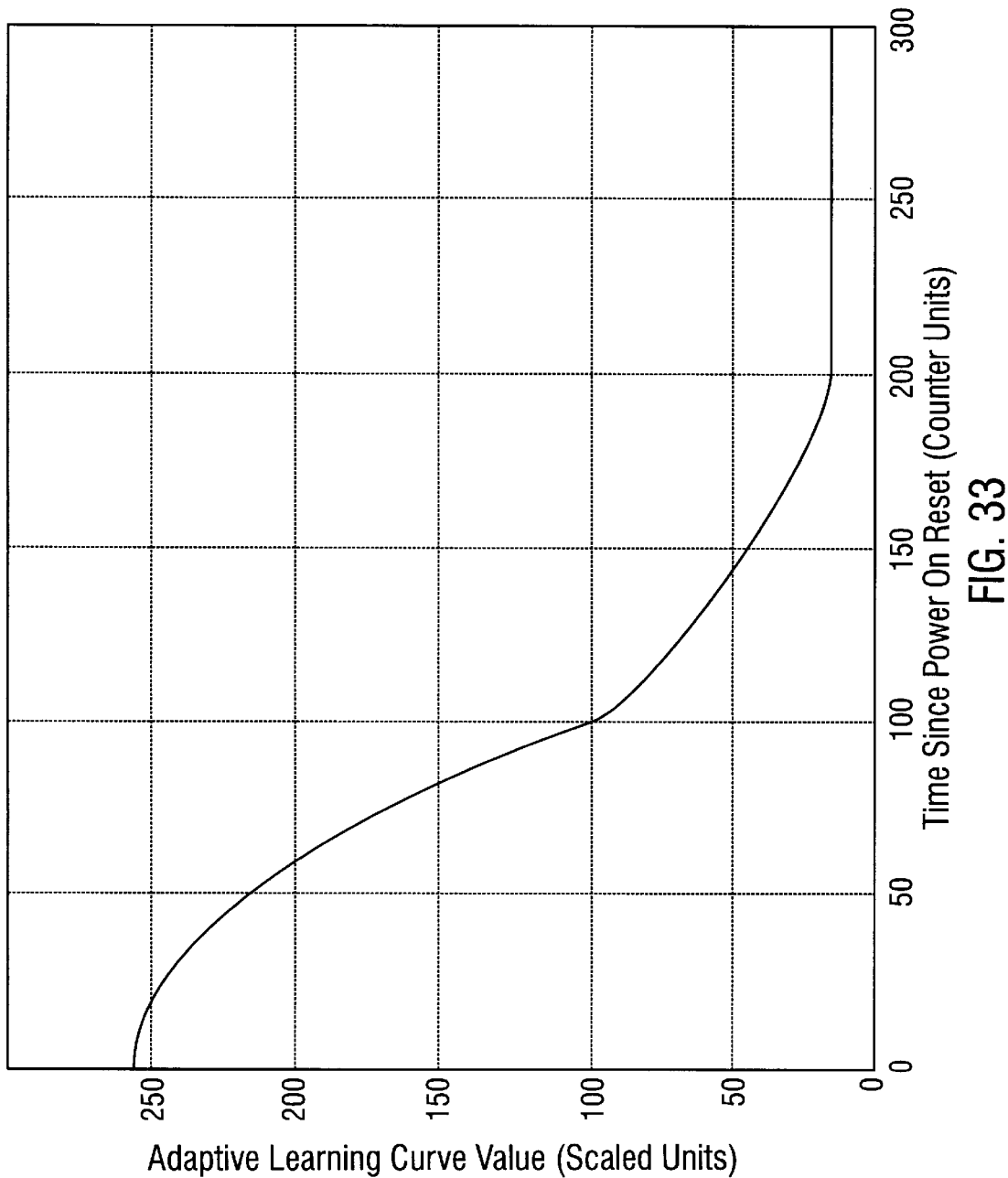
FIG. 33 is a typical learning curve describing the adaptive behavior of the present invention.

In accordance with one aspect of the present invention, a learning curve is used to adapt the sensor sensitivity and timer settings as a function of the elapsed time since the initial power on reset state, toggling of the sensor's Adaptation Reset switch 309 (FIG. 3) or continuous cycling in one of the previously discussed adaptation events. In general, each sensor technology has its own separate (and potentially different) learning curve. A typical learning curve plot is shown in FIG. 33. The shape of the learning curve implies that greatest incremental sensitivity and timer changes occur at the beginning of the learning curve cycle. As the elapsed time increases in the learning curve cycle, the adaptive behavior will gradually decrease until very small changes in sensitivity and timer settings will occur.

If the sensor's environment experiences a significant change long after power on reset state, the sensor may require some adjustment to operate properly in its new environment. In this unusual situation, the use may toggle the sensor's Adaptation Reset switch 309 (FIG. 3). This will reset all of the sensor's adaptive algorithms and reset to the beginning of the learning curve plot in FIG. 24. The sensor will then begin to adapt to its new environment according to its various learning curves.

Figure 34:
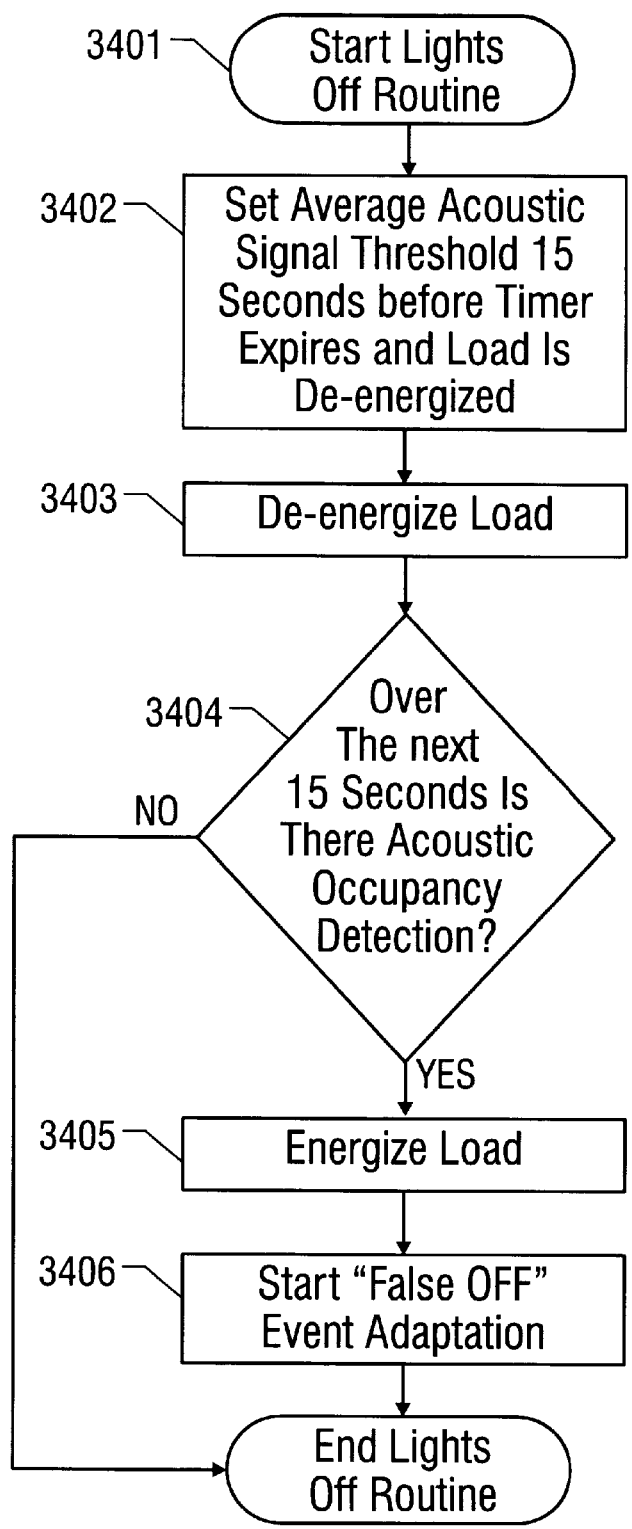
FIG. 34 is a "lights off" task flowchart when using an acoustic sensor to prevent "false off" for the present invention.

Controlling very large spaces with a minimum number of sensors or controlling areas that have unusual shapes can easily be accomplished by adding an acoustic detector. This new application method only enables the acoustic detector just before and after the load(s) are de-energized. This eliminates many of the disadvantages that dual technology PIR/Acoustic and Ultrasonic/Acoustic sensors have. When acoustic occupancy detectors are used alone or in dual technology configurations, load(s) are energized for much longer time periods because of incorrect occupancy detection due to external noises such as radios, fans, passing automobiles etc. In these devices, the acoustic detector is enabled continuously. In accordance with the present invention, as illustrated in, FIG. 34, the acoustic detector is only enabled 15 seconds before load(s) are de-energized 3402 and 15 seconds after. During the first 15 seconds, the acoustic sensor establishes an average acoustic occupancy threshold. After the load(s) are de-energized 3403 the acoustic detector is enabled for an additional 15 seconds 3404 and listens for acoustic occupancy such as human speech. If the acoustic occupancy threshold is exceeded, the load(s) are energized 3405 and start "false off" event adaptation timer begins 3406. The preferred embodiment of this acoustic detection method is to complement a single technology ultrasonic or PIR sensor or dual technology ultrasonic and PIR sensor.

Figure 35:
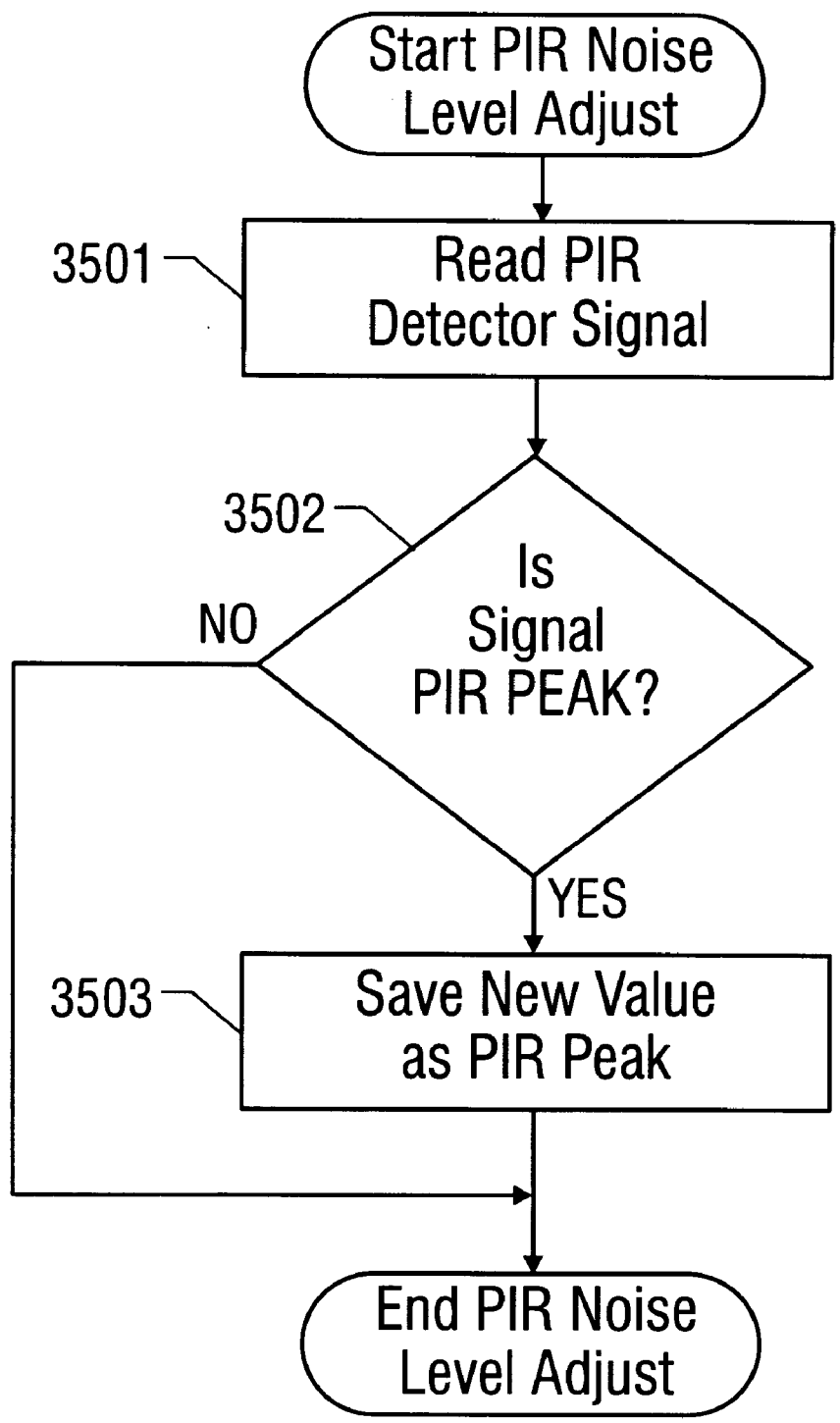
FIG. 35 is a PIR noise level adjustment task flowchart for the present invention.

Traditional analog PIR sensor manufactures provide a manual PIR gain adjustment or fix the gain during the manufacturing process. Providing a manual adjustment may lead to misadjustment. For example, the gain may be erroneously set so large that the sensor occasionally false trips on internally generated noise. Manufactures that provide fixed gain are not utilizing full detector sensitivity to allow for device tolerances in the PIR detector, filter and amplifier stages. FIG. 35 provides a method of recording PIR signal levels 3501 when load(s) are de-energized and areas unoccupied. New peak PIR values are stored 3503 and a new occupancy threshold offset can be calculated. Using this method, maximum PIR sensitivity settings can be calculated.

In accordance with one aspect of the present invention, the process of recording PIR signal levels while the area is unoccupied facilitates the estimation of the noise portion of the PIR signal. By determining the level of noise present in the PIR signal in an unoccupied space, an adaptation algorithm determines an optimal setting for the PIR sensitivity that provides maximum possible sensitivity while providing ample immunity against false trips due to the noise.

Figure 70:
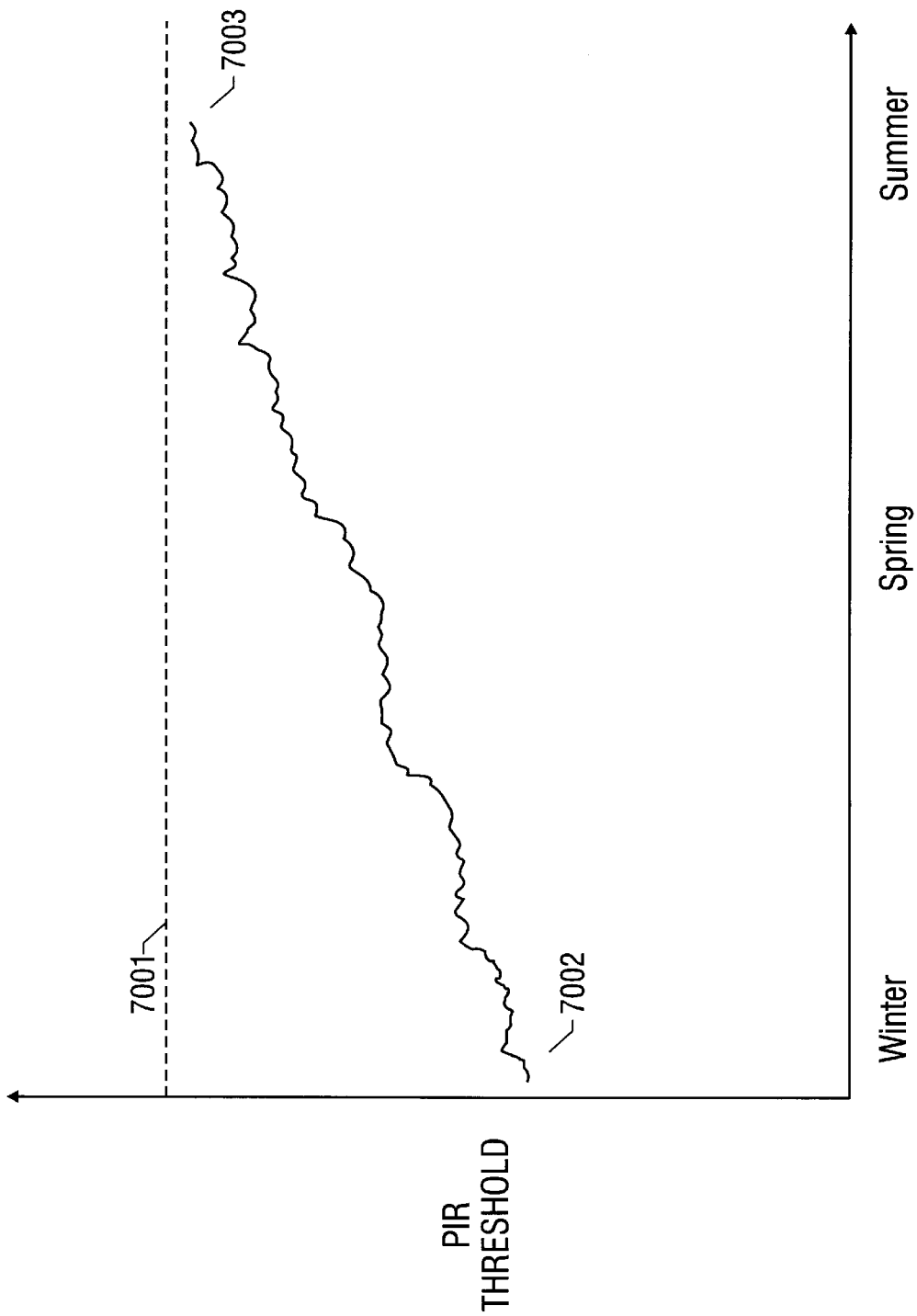
FIG. 70 is a graph showing seasonal variation of PIR noise.

In some situations, the sensitivity setting of the PIR sensor may be either too high or too low. Improper settings can result from either installer error or over-adaptation. Seasonal temperature changes can also affect the sensitivity of a PIR sensors. FIG. 70 demonstrates the seasonal variation of a PIR sensor. The sensor in this example has a fixed threshold 7001. During the winter months, the sensor has a low noise level 7002 well away from the threshold 7001. However, the noise level 7002 approaches the threshold 7001 with the onset of summer until the noise 7002 is so close to the threshold 7002, as shown in area 7003, it may begin to cause false trips.

Figure 71:
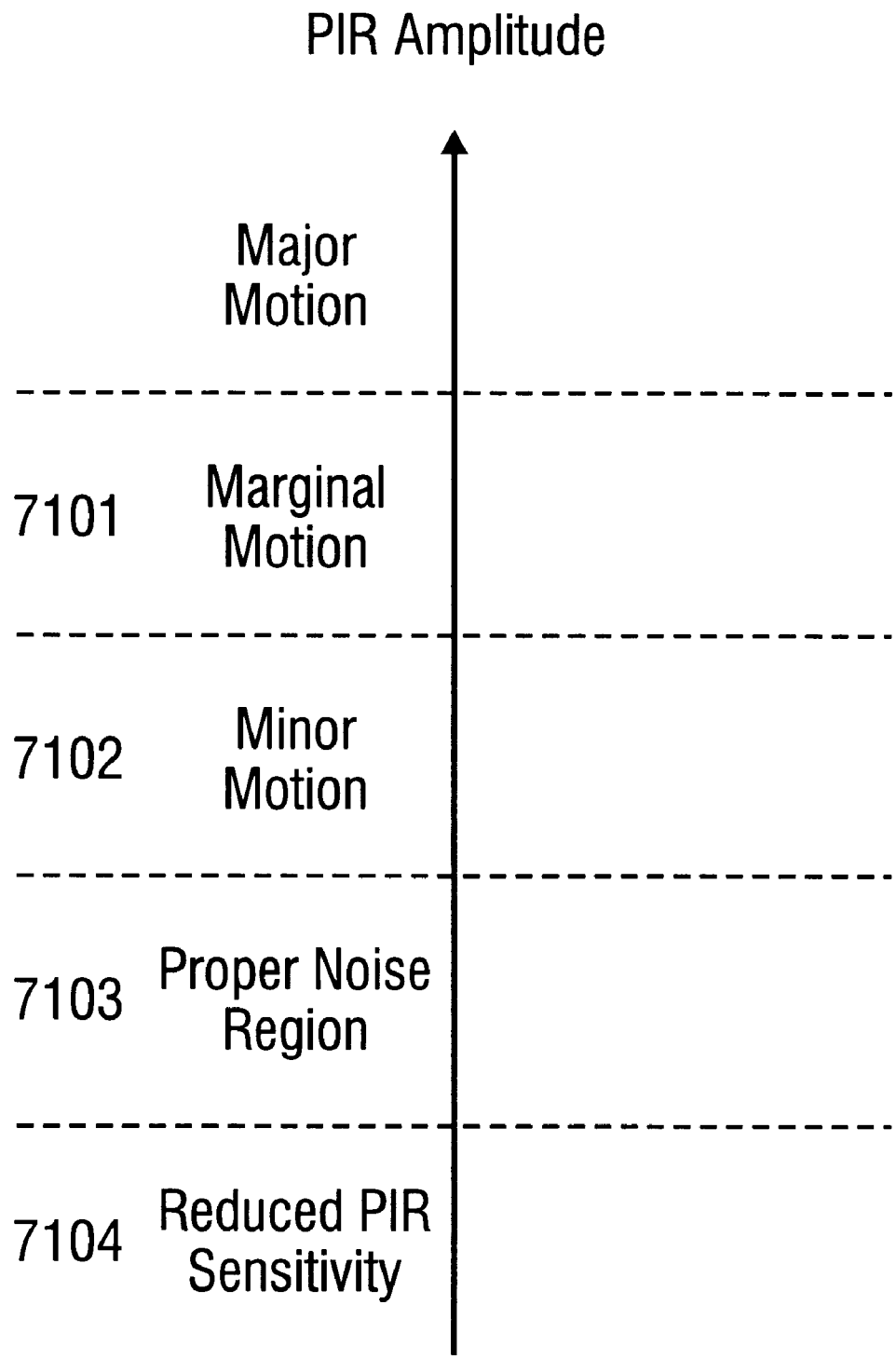
FIG. 71 is a graph of PIR thresholds.

A noise level too close to the threshold is undesirable. The composite occupancy estimator technique of the present invention complicates the choice of the best choice of threshold. Not only is it desirable to keep the PIR noise level a distance away from the threshold, the PIR noise should also be small enough so that the noise does not contribute to the composite occupancy estimator signal. Alternatively, the PIR threshold should not be set so high that the only PIR motion hits that contribute to the composite occupancy estimator are the extremely large ones. FIG. 71 demonstrates this point graphically. If the threshold is set too low, then the noise will be in the region of marginal motion 7101. It is preferable that the PIR noise level is located beneath the region of minor motion 7102 and above the region of reduced PIR sensitivity 7104.

Figure 48:
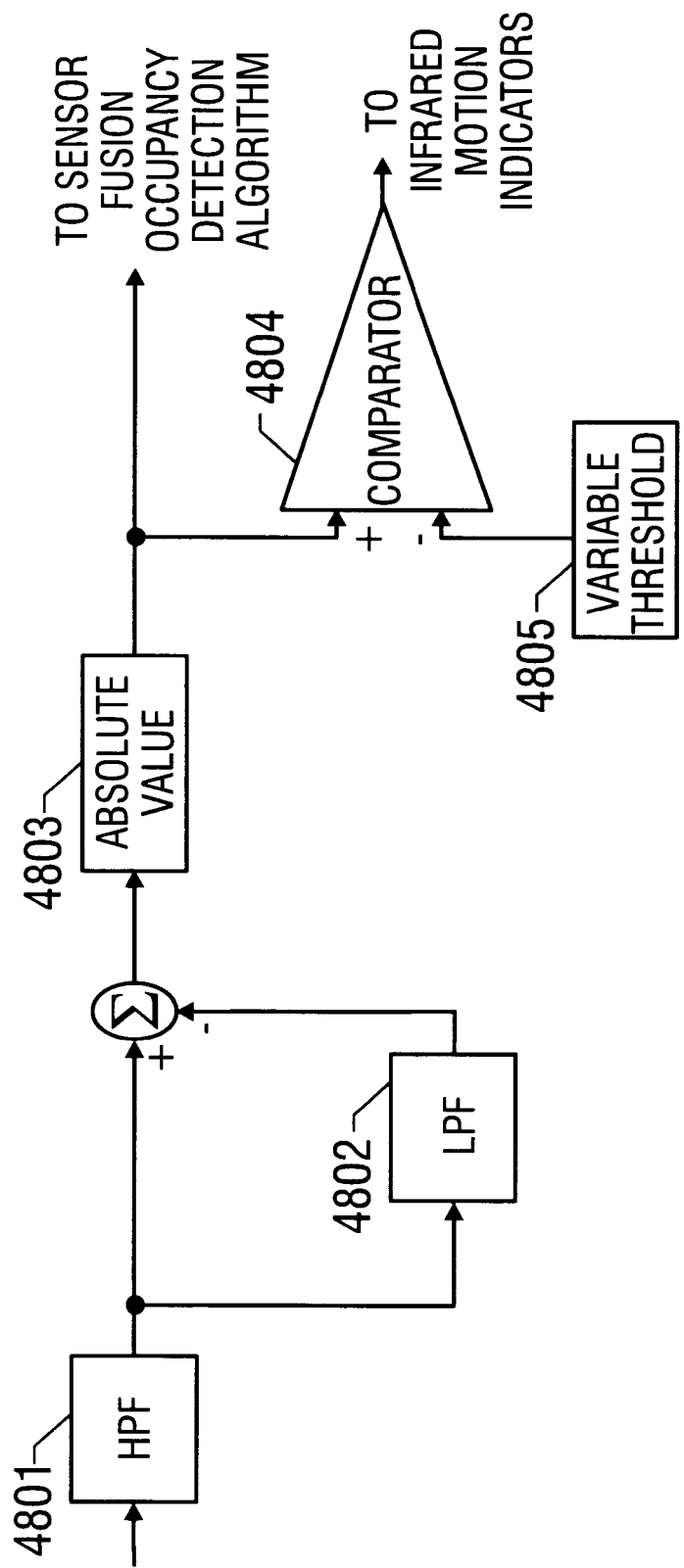
FIG. 48 is the infrared DSP task block diagram for the present invention.

In one exemplary embodiment of the invention, the microcontroller employs a PIR noise estimation algorithm that uses a statistical order filter (SOF) also referred to as a rank order filter to perform the estimation of the PIR noise level of the PIR output (output of block 4803, FIG. 48). In order to assure estimation of only PIR noise and not real PIR signals, noise estimation is performed only when the occupied flag is not set (determined by block 5201, FIG. 52). The SOF algorithm operates on a fixed number of samples of a signal. The algorithm sorts the array of samples in ascending or descending order and then outputs a weighted sum of the samples in the sorted array.

In the exemplary embodiment, the output of the SOF is chosen to be the maximum value of the signal because such a SOF can be efficiently implemented in a microcontroller. However, other choices would also be acceptable. Furthermore, filtering algorithms other than a SOF may be used. For example, noise estimation may be accomplished through the use of digital filters, integration, envelope detection, or simple averaging.

Figure 72:
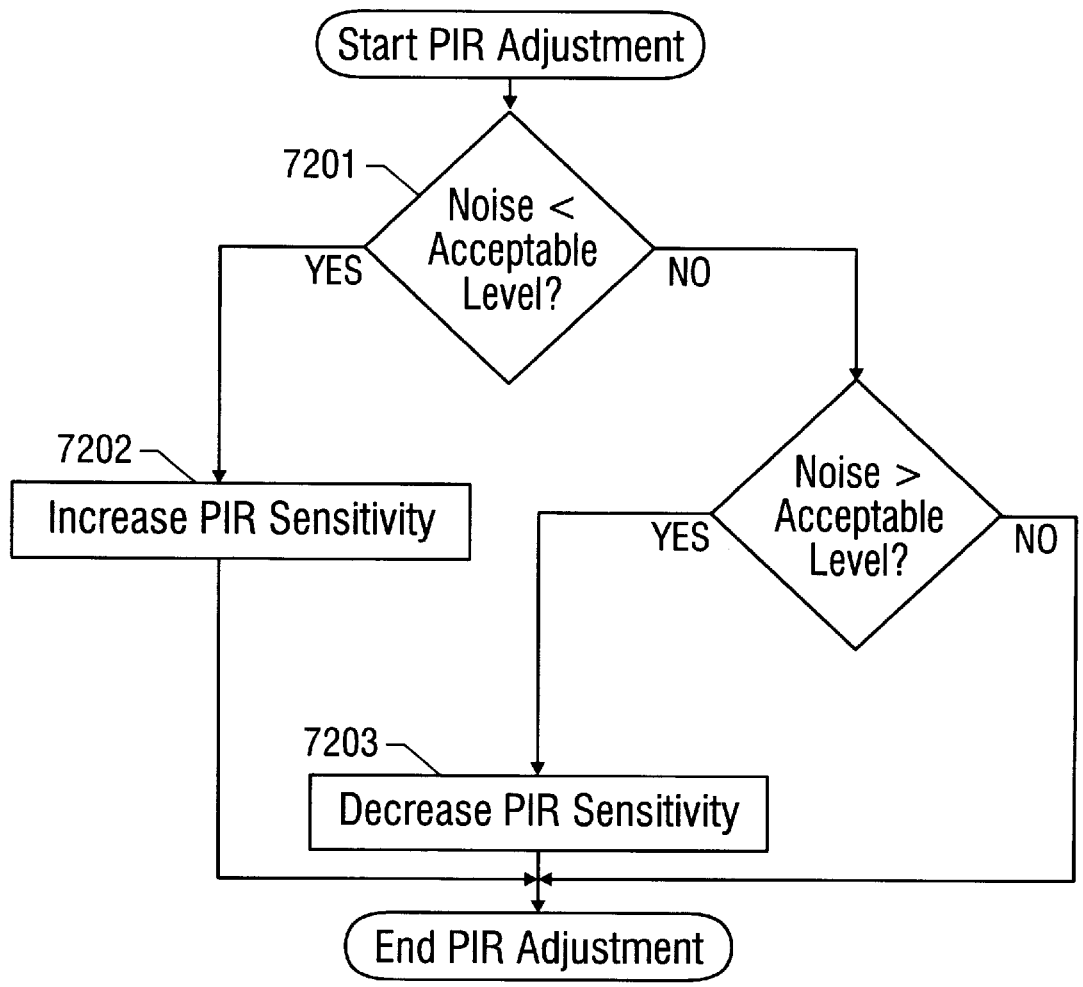
FIG. 72 is a PIR threshold adjustment flowchart of the present invention.

FIG. 72 is a flow chart of an exemplary algorithm that updates the PIR threshold in such a way that the noise level will move closer to the proper noise region 7103. In the exemplary embodiment, the microcontroller executes this routine every time occupancy begins. In particular, the estimation algorithm is invoked when the load is energized in step 5204 (FIG. 52) or in step 5304 (FIG. 53), and operates on signal samples taken before the load is energized. Estimated noise value is checked at 7201. If the estimated noise value is below the proper noise region 7103, then the algorithm increases the PIR sensitivity 7202. Alternatively, if the estimated noise value is above the proper noise region 7103, then the algorithm reduces the PIR sensitivity 7203. Eventually, the PIR sensitivity will be set to a value, that will place the noise in the proper region.

Ultrasonic detection technologies are most susceptible to strong air flow when turning loads on, as compared to steady state (maintaining loads on) or turning lights off. Overcoming false occupancy detection when air flow turns on or creating a "Air Puff" detector would be a major improvement in ultrasonic sensing technology. The most common way of improving ultrasonic performance is adding PIR or microwave detectors. While use of these additional sensing technologies improved overall sensor performance, they did not eliminate the deleterious effects of air flow is on the ultrasonic detector.

Sensors mounted next to an HVAC register can acoustically detect several things when air flow begins. First, the compressor turns on, second the air flow will typically exhibit a unique sound signature during startup and continuous operation. This unique sound signature may be a function of the building configuration, and the structures of the air diffuser and air duct.

Figure 36:
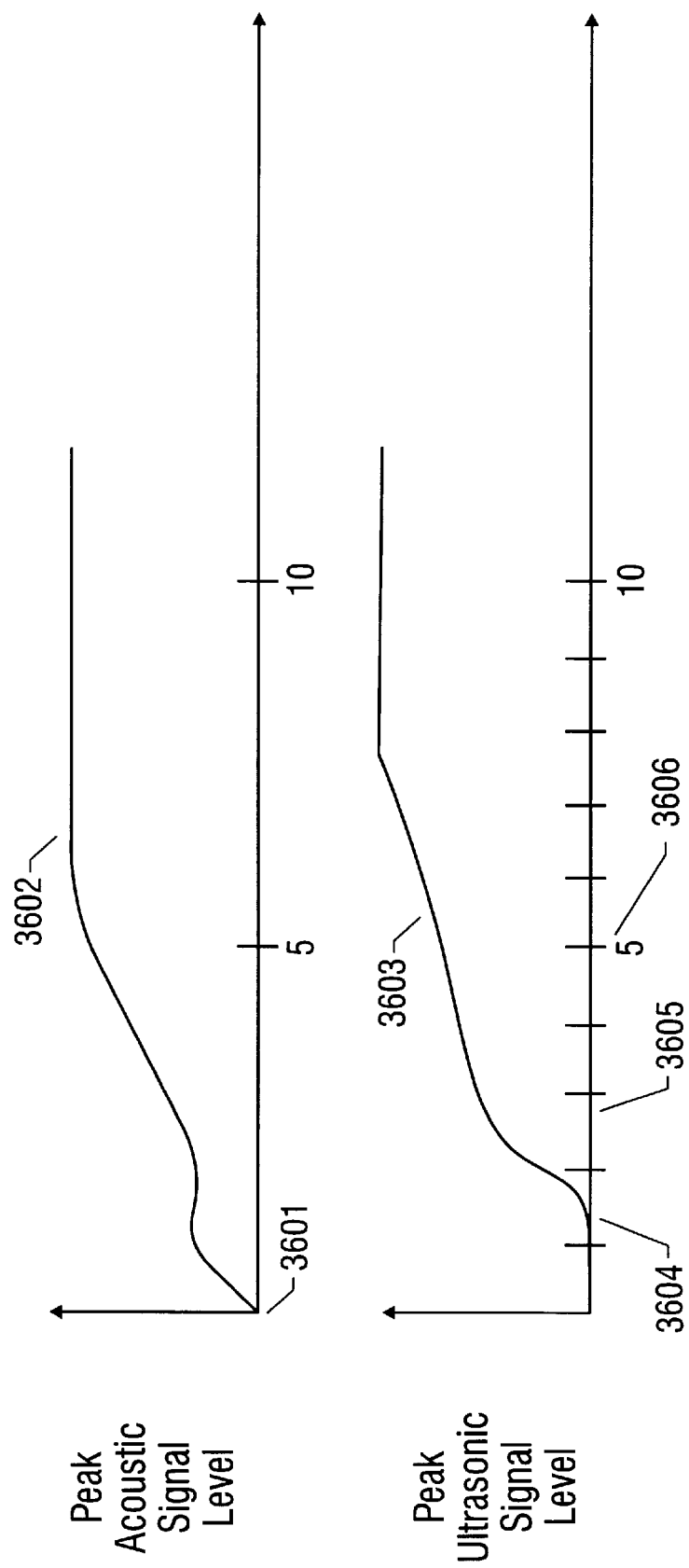
FIG. 36 is a time line illustrating the adjustment of ultrasonic sensitivity based on acoustic signal detection.

The closer the sensor is to the HVAC register, the greater the affect of air flow. An acoustic detector designed to monitor air flow sounds can be used to complement ultrasonic detector systems. FIG. 36 illustrates signal levels for a room that is empty, quiet and unoccupied when air flow turns on 3601, the acoustic sound energy 3602 is detected by the acoustic detector before the ultrasonic detector is affected. The ultrasonic detector detects signal 3603 at 3604. This air flow on transition from 3604 to 3605 is difficult for ultrasonic detectors to reject. The Doppler shift spectrum in this region is broad and robust. Using the acoustic detector to temporarily inhibit or reduce ultrasonic sensitivity from 3601 to 3606 eliminates the ultrasonic detector from creating a "false-on" event.

Figure 37:
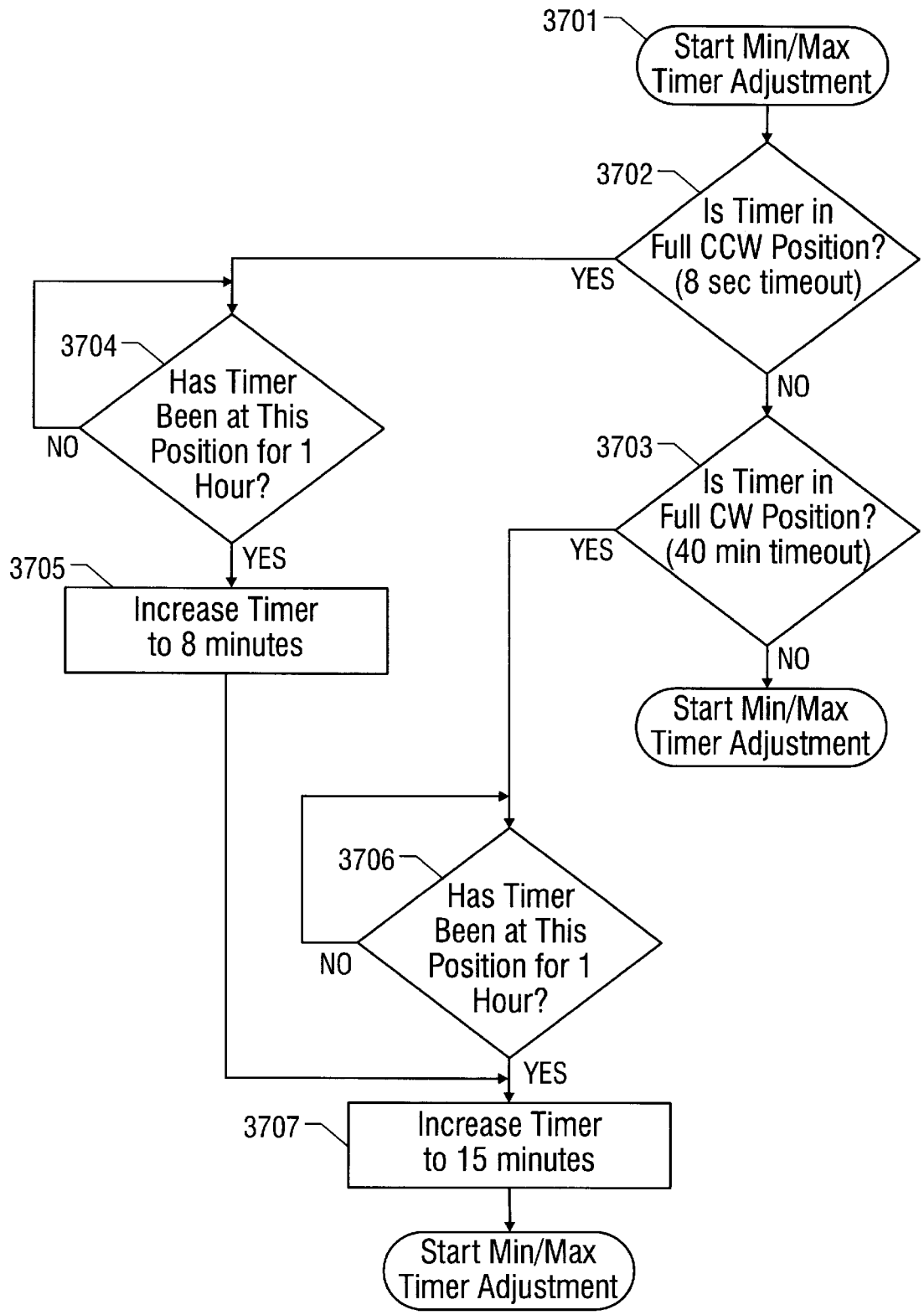
FIG. 37 is a timer adjustment task flowchart for the present invention.

The sensor's timer supports a number of special modes intended to address a variety of user needs such as to allow the sensor's installer to force a short time-out period for purposes of sensitivity adjustment, to avoid short timer settings in normal operation, and to avoid a long load-energized period with no motion if the sensor's circuit breaker is cycled. If the sensor is powered up with the timer adjustment potentiometer (319, FIG. 3) in the fully-CCW position, or if the timer adjustment potentiometer is adjusted to the fully CCW position after being at another setting, the sensor enters an 8-second timeout test mode. If the timer is adjusted from the fully-CCW position to another setting, the timer exits the 8-second timeout test mode and returns to normal operation. As an aid to the installer, the flowchart of FIG. 37 illustrates what happens if the sensor's timer is left in minimum timeout (8-second) or maximum timeout (32 minutes) setting for more than an hour. If the timer is at minimum (full CCW) the timer is set at 7 minutes (3702, 3704 and 3705). If the timer is at maximum (full CW) the timer is set at 15 minutes (3703, 3706 and 3707).

To accomplish ATA, a variety of situations modify the sensor's timer delay setting.

Figure 38:
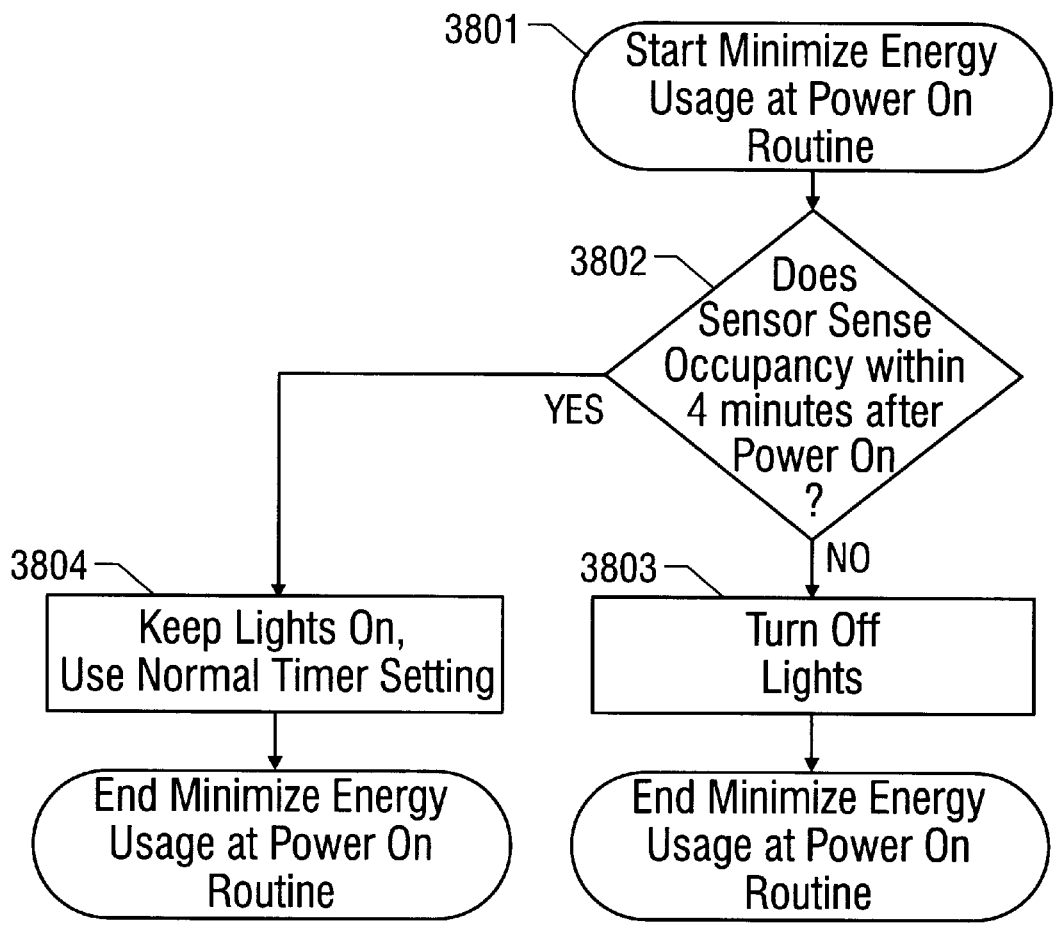
FIG. 38 is a minimize energy usage at power-up task flowchart for the present invention.

A false off event shown, for example, in FIG. 25, will slightly increase the timer delay setting. In addition, as shown in FIG. 38, the sensor also incorporates a minimize energy usage algorithm that checks for occupancy within the first two minutes after power up 3802. If motion is detected, keep lights on and use normal timer setting 3804. If motion is not detected, turn lights off 3803. This feature solves the problem if power is interrupted by utility failure or a general area shut down during the evening and power is subsequently restored. Conventional sensors power on and begin a complete time-out cycle, typically leaving the lights on needlessly for twenty minutes.

Figure 39:
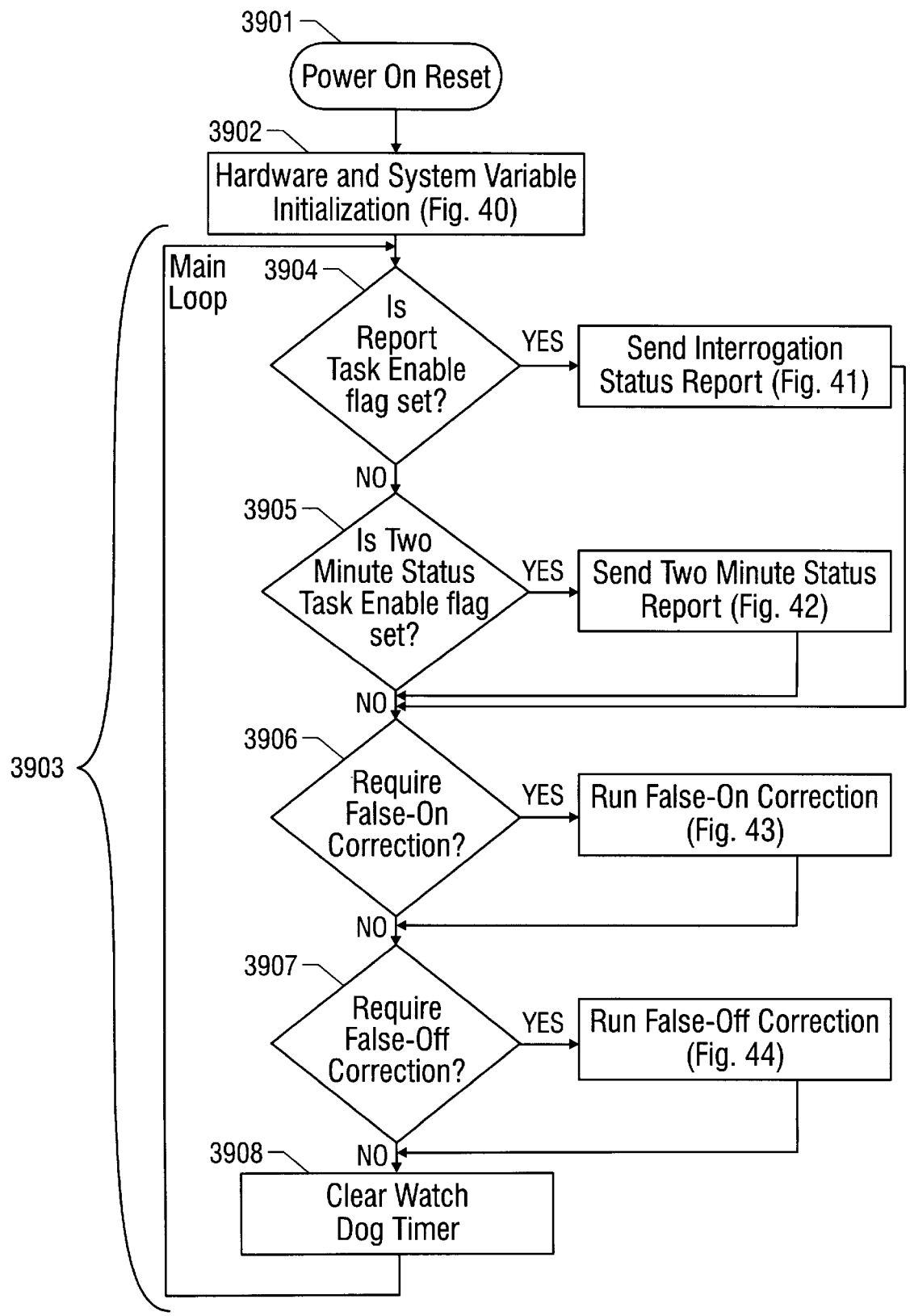
FIG. 39 is the main (foreground) routine flowchart of the present invention.

A flowchart of the main software routine of an exemplary embodiment of the present invention is shown in FIG. 39. In practice, the flowcharts depicted in FIGS. 32 and 39–69 are encoded in an appropriate programming language and loaded into the program memory of digital microcontroller 229 (FIG. 2), to cause digital microcontroller to control the operation of the apparatus of the present invention to perform the methods of the present invention.

Referring to FIG. 39, upon power on reset (3901), the digital microcontroller's various timer, counter, serial port and high speed 8-bit A/D converter peripherals are set up and the various sensor variables are initialized (3902). The microcontroller 229 then enters the occupancy sensor's main loop (3903). The sensor's main loop initially checks to see if either the manual interrogate status flag or the two minute status flag is enabled (3904, 3905). If so, the appropriate status report task is executed. The sensor then checks to see if a sensor false-on event or false-off event has occurred (3906, 3907). If either event has occurred, the appropriate correction task is executed. Finally, at the bottom of the main loop, the microcontroller's watch dog timer (WDT) is reset (3908). This timer is used to reset the microcontroller 229 to the power on reset state in the event of a software malfunction.

Figure 43:
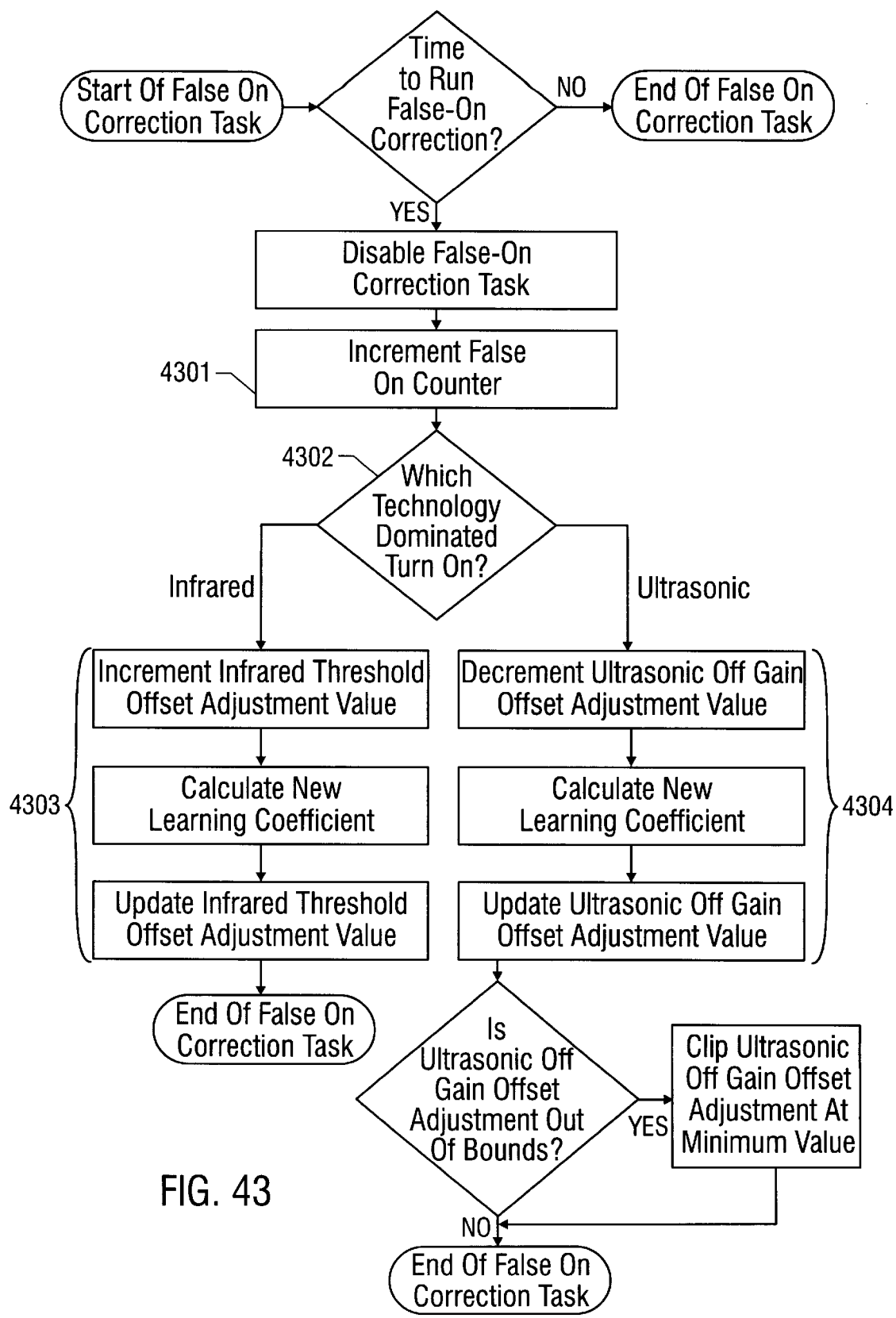
FIG. 43 is the false-on correction task flowchart of the present invention.
Figure 44:
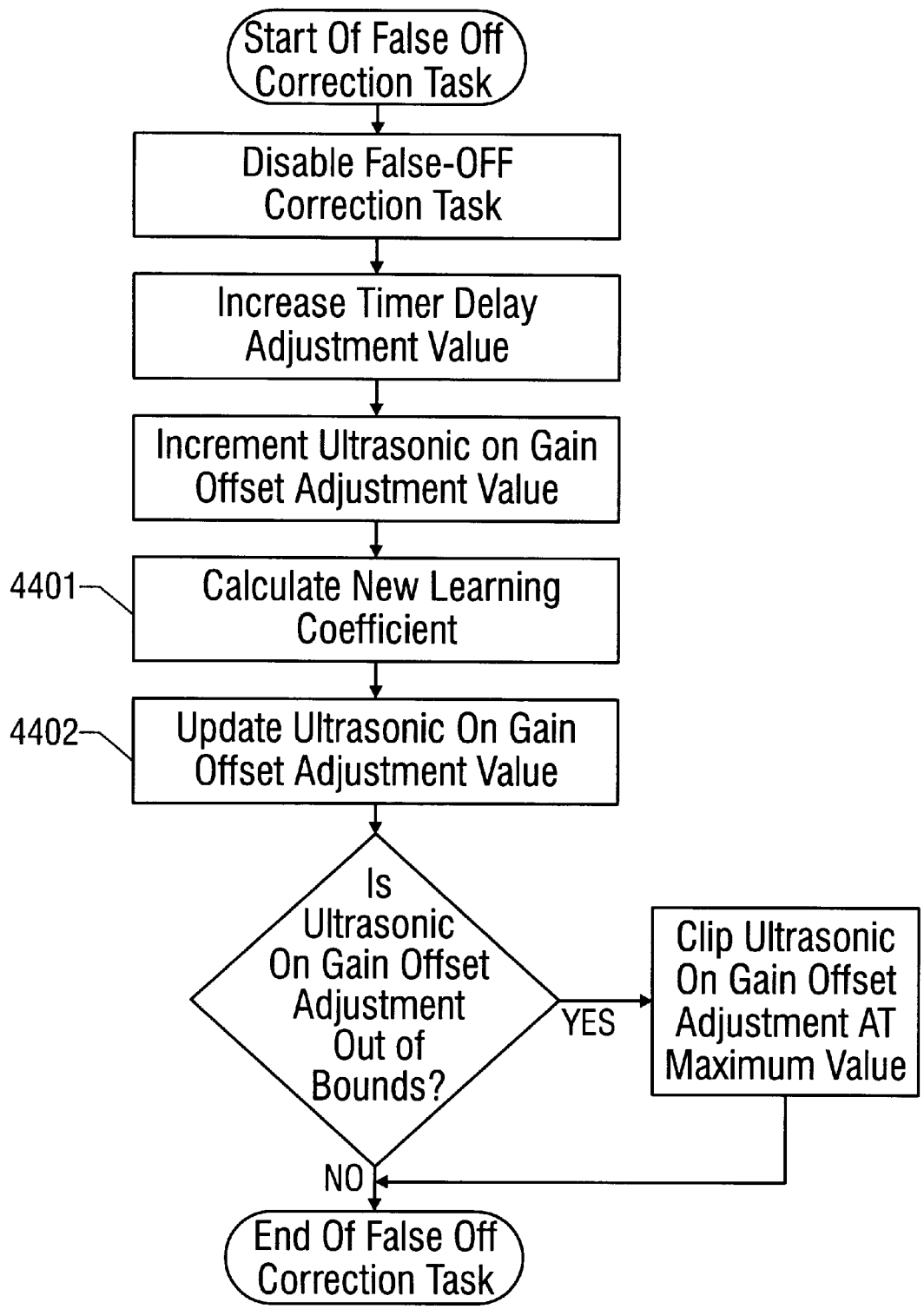
FIG. 44 is the false-off correction task flowchart of the present invention.

Thus, the main routine shown in FIG. 39 includes the following major software tasks that are described in detail in the figures indicated: hardware and system variable initialization task (FIG. 40); interrogation status report task (FIG. 41); two minute status report task (FIG. 42); false-on correction task (FIG. 43); and false-off correction task (FIG. 44).

Figure 40:
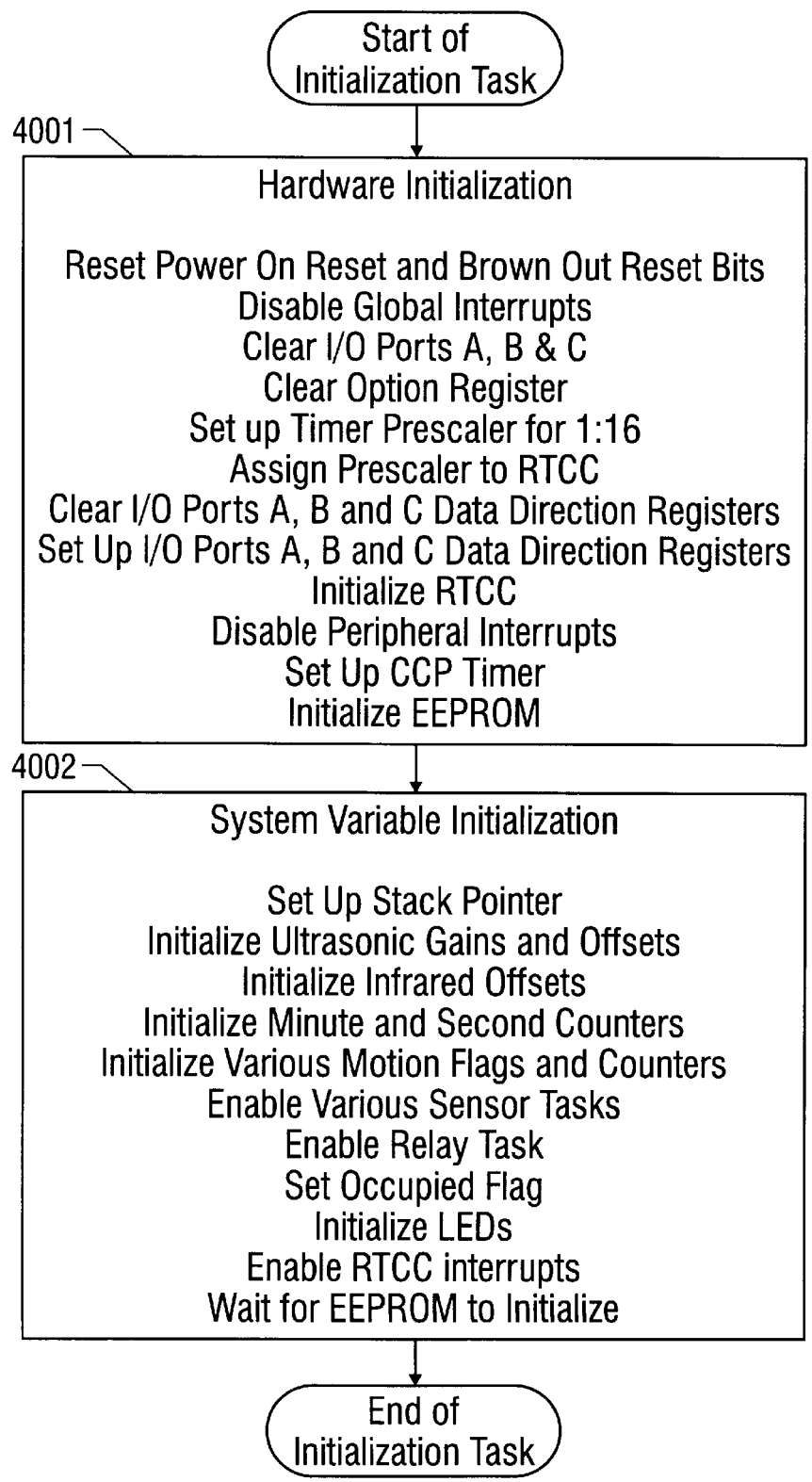
FIG. 40 is the hardware and system variable initialization routine flowchart of the present invention.

A flowchart of the hardware and system variable initialization task for the present invention is shown in FIG. 40. The hardware and system variable initialization task is executed on power up to configure the sensor for normal operation.

Initially the system on-chip and off-chip hardware is configured (4001). Specifically, the power on reset and brown out reset bits are reset. Global interrupts are disabled. The A, B and C I/O ports are cleared. The option register is cleared. The timer prescalar is set for 1:16 and is then assigned to the real time clock/counter (RTCC) peripheral. The various I/O port data direction registers are cleared and then set as required for normal operation. The RTCC timer count down value is set. All peripheral interrupts are disabled. The second CCP timer is set up. Finally, the serial EEPROM is initialized.

Next, the system variables of the occupancy sensor are initialized (4002 ). Specifically, a stack pointer is set up. The various ultrasonic gains, thresholds and offset values are initialized. The various infrared offset values are initialized. The minute and second counters are initialized. The various motion flags and motion counters are initialized. The primary sensor tasks are enabled except for the sensor task. The occupied bit is set. The various sensor LED registers are initialized. The RTCC interrupts are enabled. A variable delay is executed until the serial EEPROM initialization has been completed. A single EEPROM location is read to determine if the EEPROM has had sensor information previously stored in it. If it has, the contents of the EEPROM are read and the various sensor variables are restored. If the EEPROM has not had sensor information previously stored in it, the current sensor variables are stored in the EEPROM. Finally, the sensor task is enabled.

Figure 41:
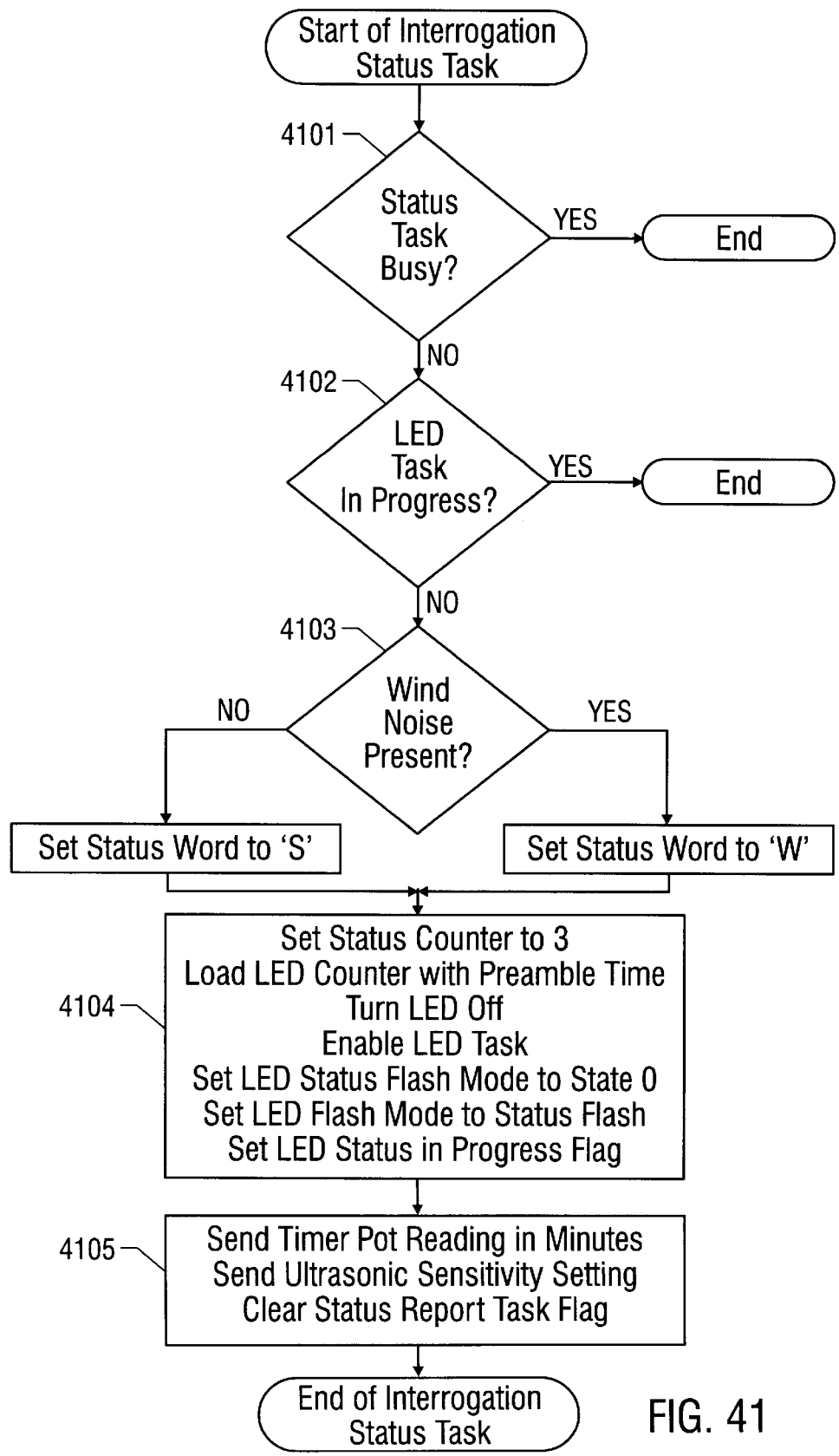
FIG. 41 is the interrogation status report routine flowchart of the present invention.

A flowchart of the interrogation status report task for the present invention is shown in FIG. 41. The interrogation status report task displays the status of the sensor in response to a user's interrogation of the sensor. If a status task is not currently in progress (4101), and if the LED task is not busy (4102), ultrasonic sensor 102 (FIG. 2) is checked to determine if wind noise is present (4103). Control then passes to block 4104, and then on to block 4105.

Figure 42:
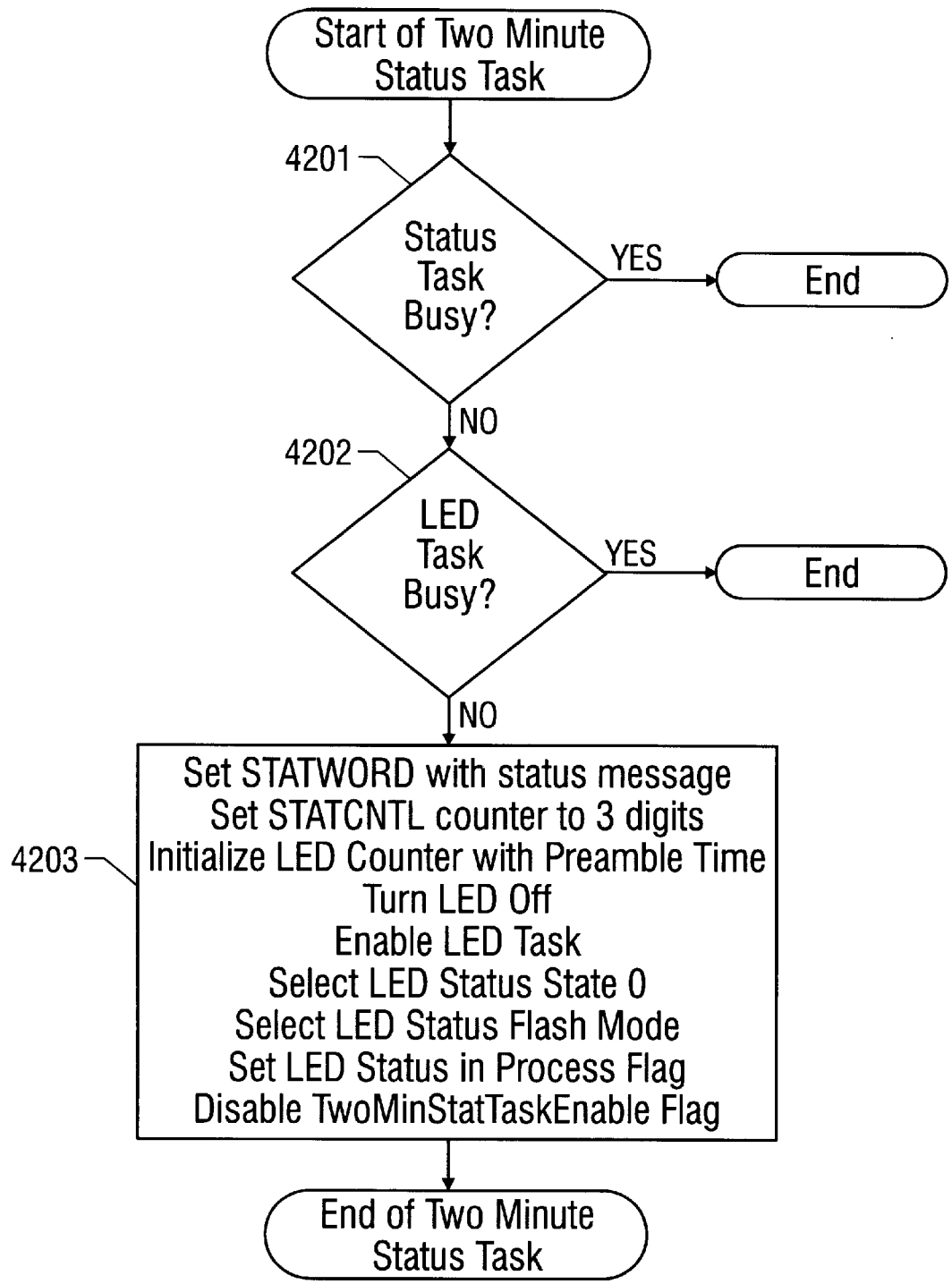
FIG. 42 is the two minute status report routine flowchart of the present invention.

A flowchart of the two minute status report task for the present invention is shown in FIG. 42. The two minute status report task displays the status of the sensor at periodic two minute intervals. If a status task is not currently in progress 4201), and if the LED task is not busy (4202), control passes to block 4203 where the sensor's status is stored in the sensor status message word and the sensor's status digit counter is initialized. The LED blink preamble time is stored in the LED counter and the LED is turned off. The LED task is enabled and the LED status state initialized. The LED status flash mode is set and the LED status in process flag is set. Finally, the TwoMinStatTaskEnable flag is set.

A flowchart of the false-on correction task for the present invention is shown in FIG. 43. The false-on correction task attempts to correct sensor false-on events by increasing the threshold required for the detection of motion. Initially a false-on event counter is incremented (4301). Then the sensor determines which technology dominated the false-on event (4302). A new adaptive learning coefficient is computed and the appropriate threshold offset is adjusted (4303, 4304).

A flowchart of the false-off correction task for the present invention is shown in FIG. 44. The false-off correction task attempts to correct sensor false-off events by decreasing the ultrasonic threshold required for the detection of motion. A new adaptive learning coefficient is computed and the appropriate threshold offset is adjusted.

Figure 45:
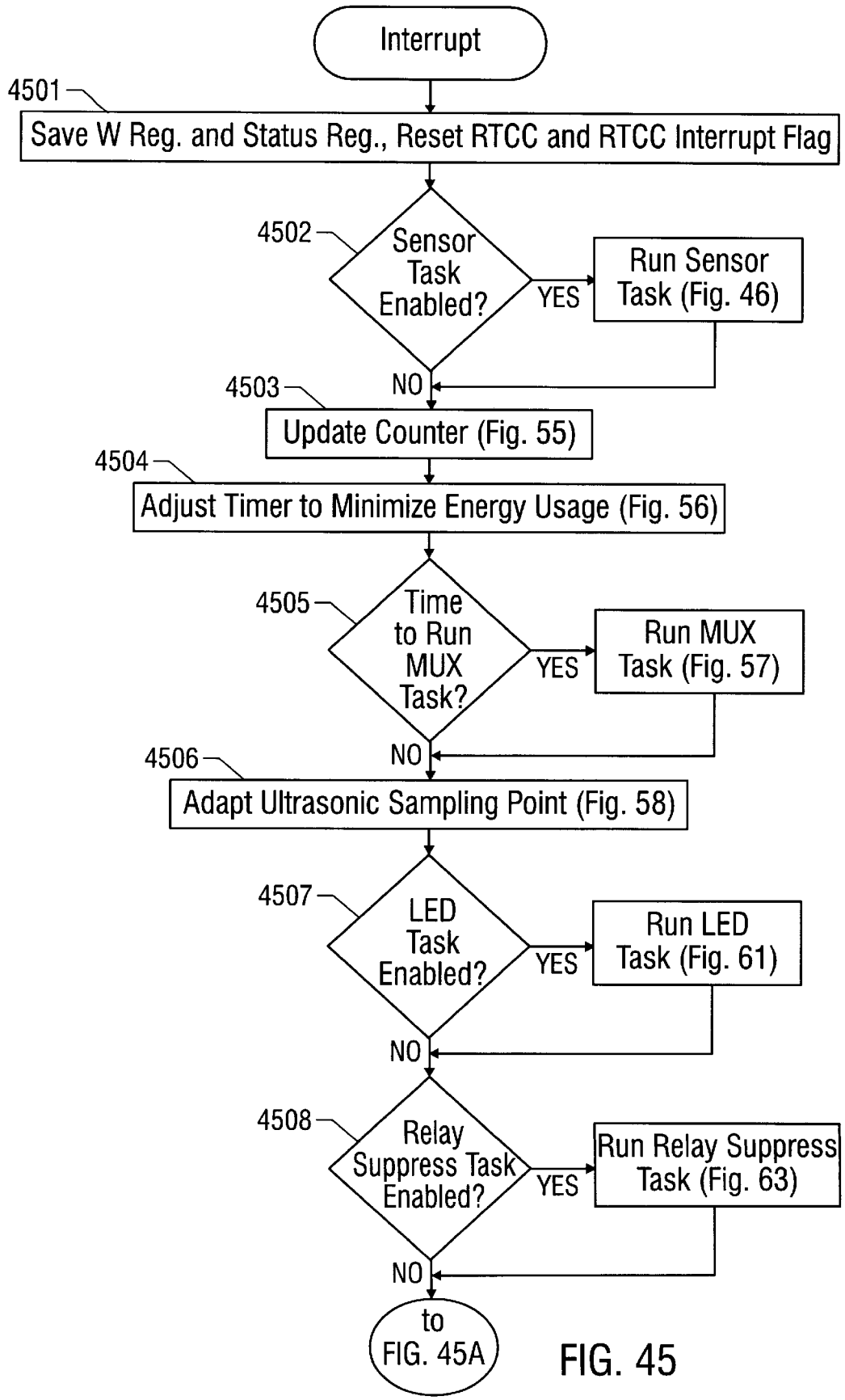
FIG. 45 is the interrupt (background) routine flowchart for the present invention.
Figure 45A:
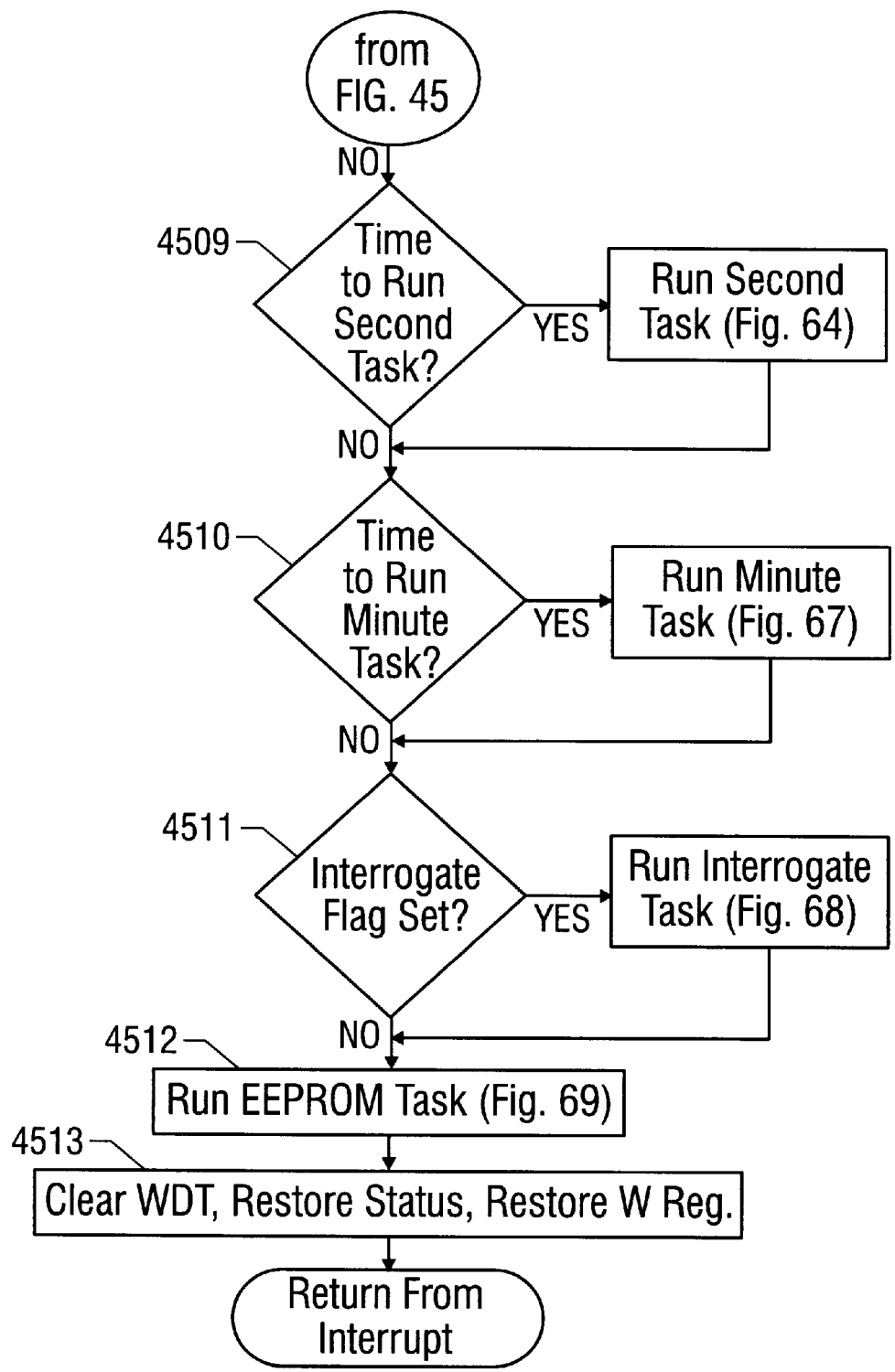

A flowchart of the occupancy sensor's interrupt software routine for the present invention is shown in FIG. 45. Upon interrupt, the contents of the 8-bit W accumulator register and Status register in microcontroller 229 are saved (4501). The timer/counter peripheral that generated the interrupt is reset and the microcontroller's interrupt flag is cleared (4501). The sensor task is executed if it is enabled (4502). The various occupancy sensor counters are updated (4503). The sensor's timer delay is adjusted to minimize energy consumption (4504). The multiplexer (MUX) task is run if it is enabled (4505). The ultrasonic sensor's sampling point is adapted (4506). Next, the LED task is run if it is enabled (4507). The relay suppress task is then run if it is enabled (4508). The second and minute tasks are then executed if enabled (4509, 4510). If the interrogate task is enabled it is executed (4511). The sensor's EEPROM task is then executed (4512). Finally, the microcontroller's watch dog timer (WDT) is cleared and the W register and the status register contents are restored (4513).

Figure 55:
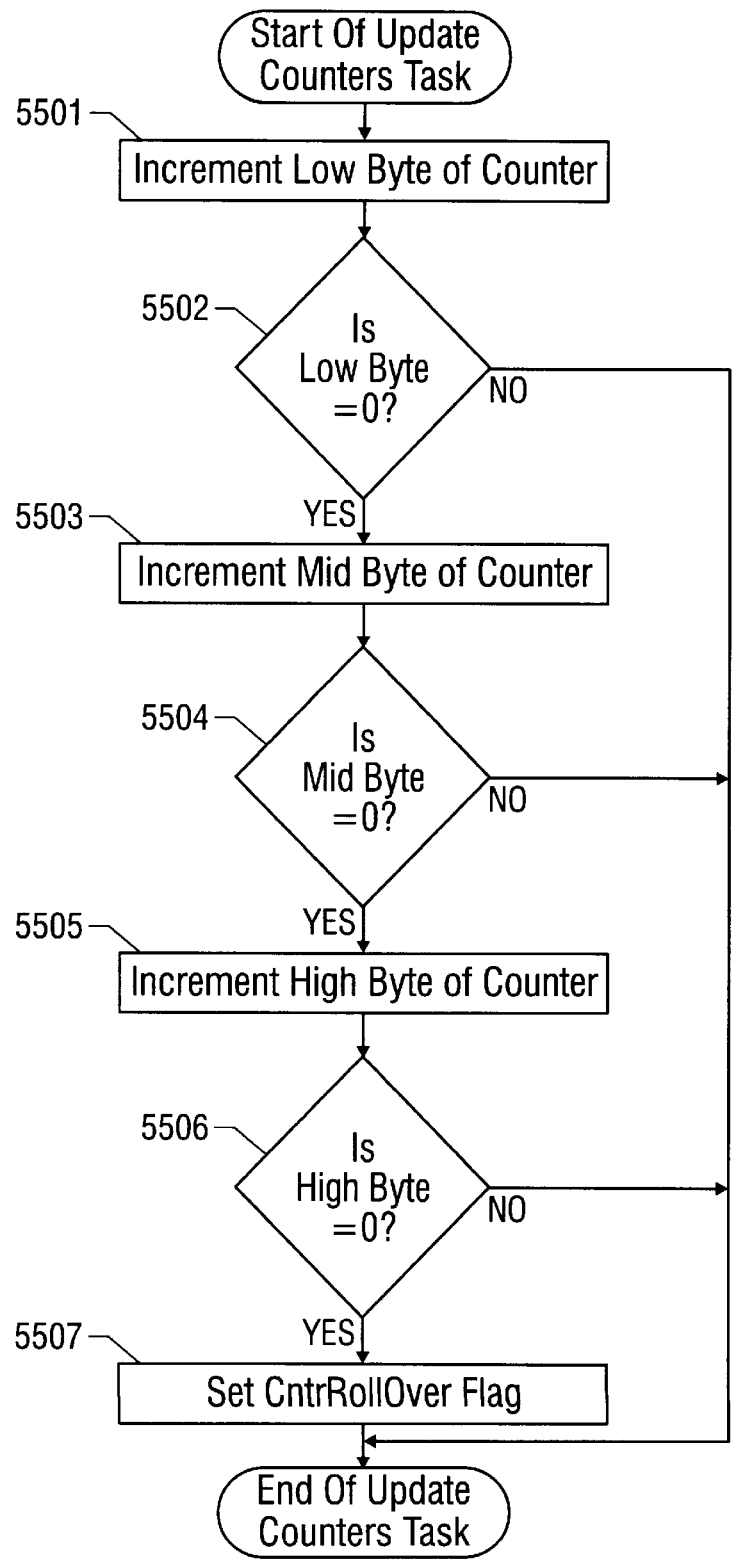
FIG. 55 is the update counters task flowchart for the present invention.
Figure 56:
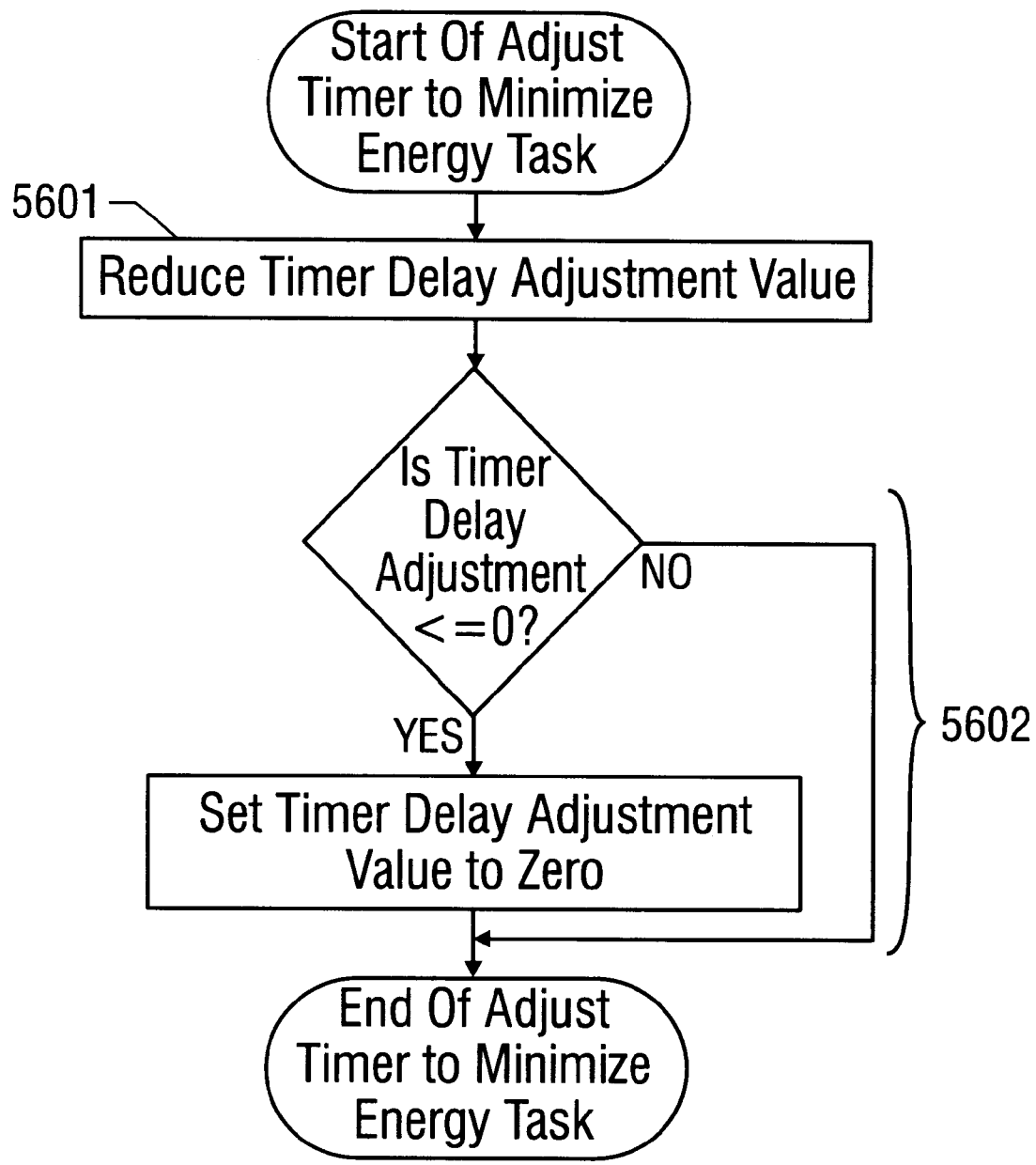
FIG. 56 is the adjust timer to minimize energy usage task flowchart for the present invention.
Figure 57:
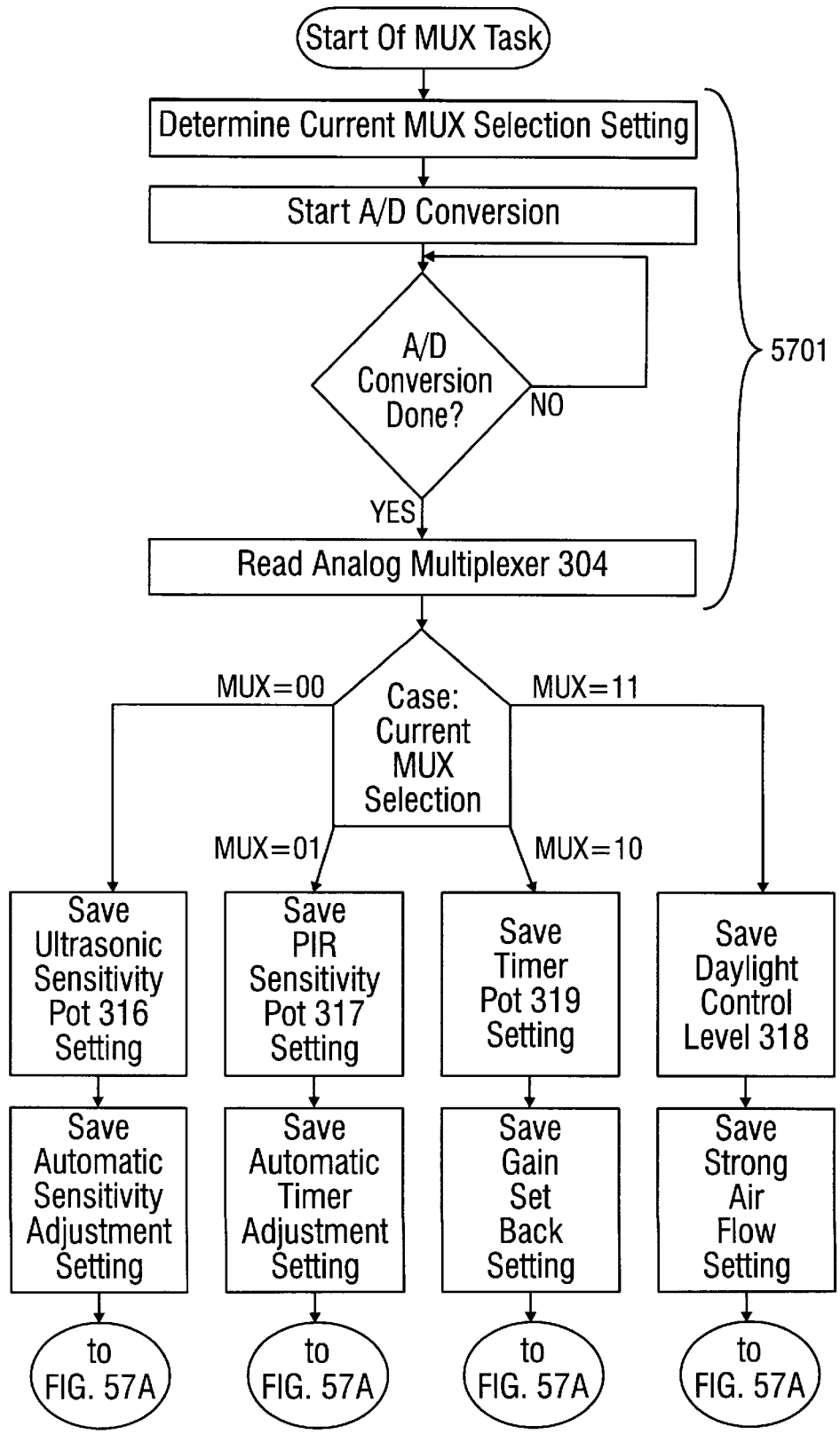
FIG. 57 is the MUX task flowchart for the present invention.
Figure 57A:
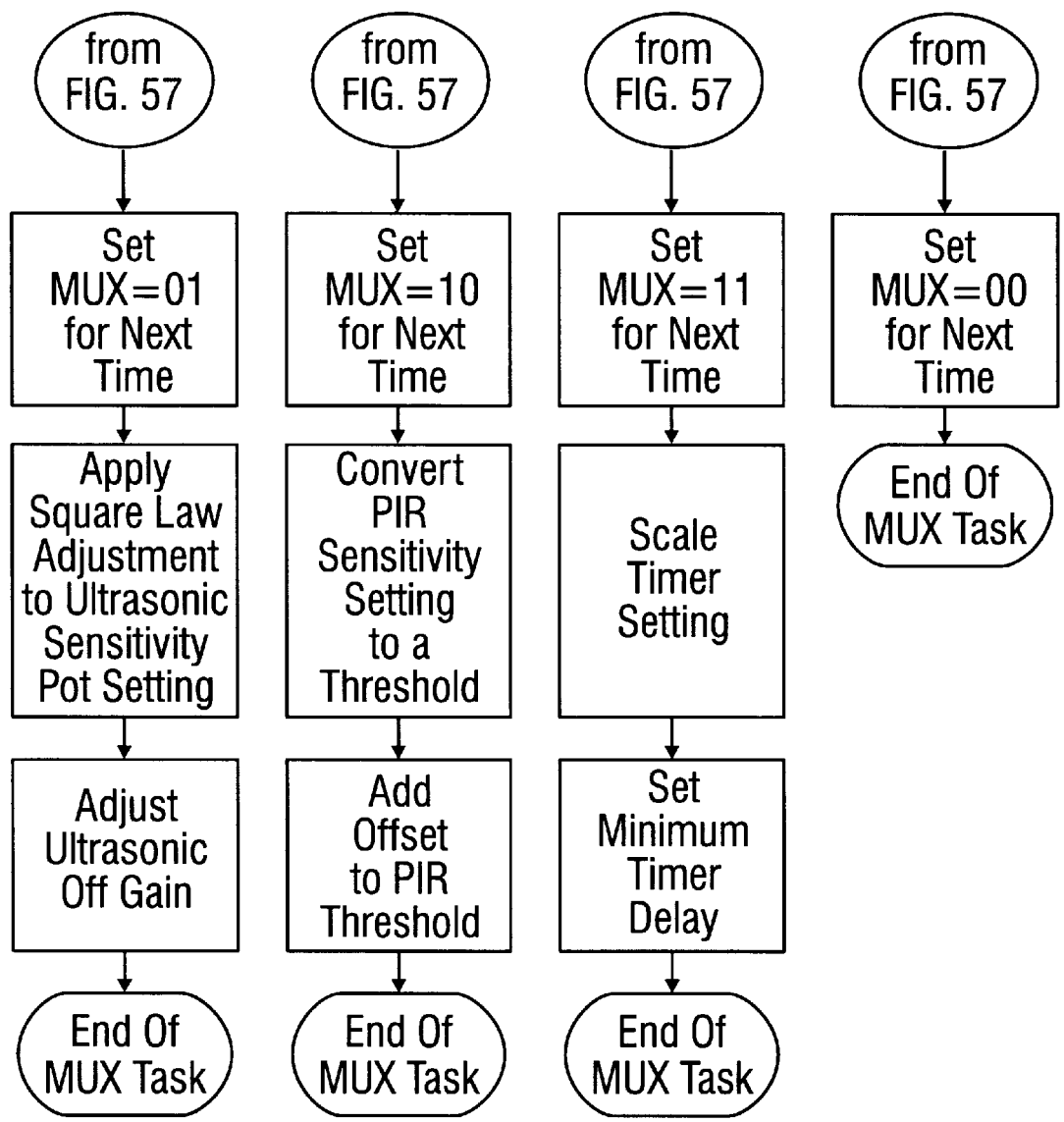
Figure 58:
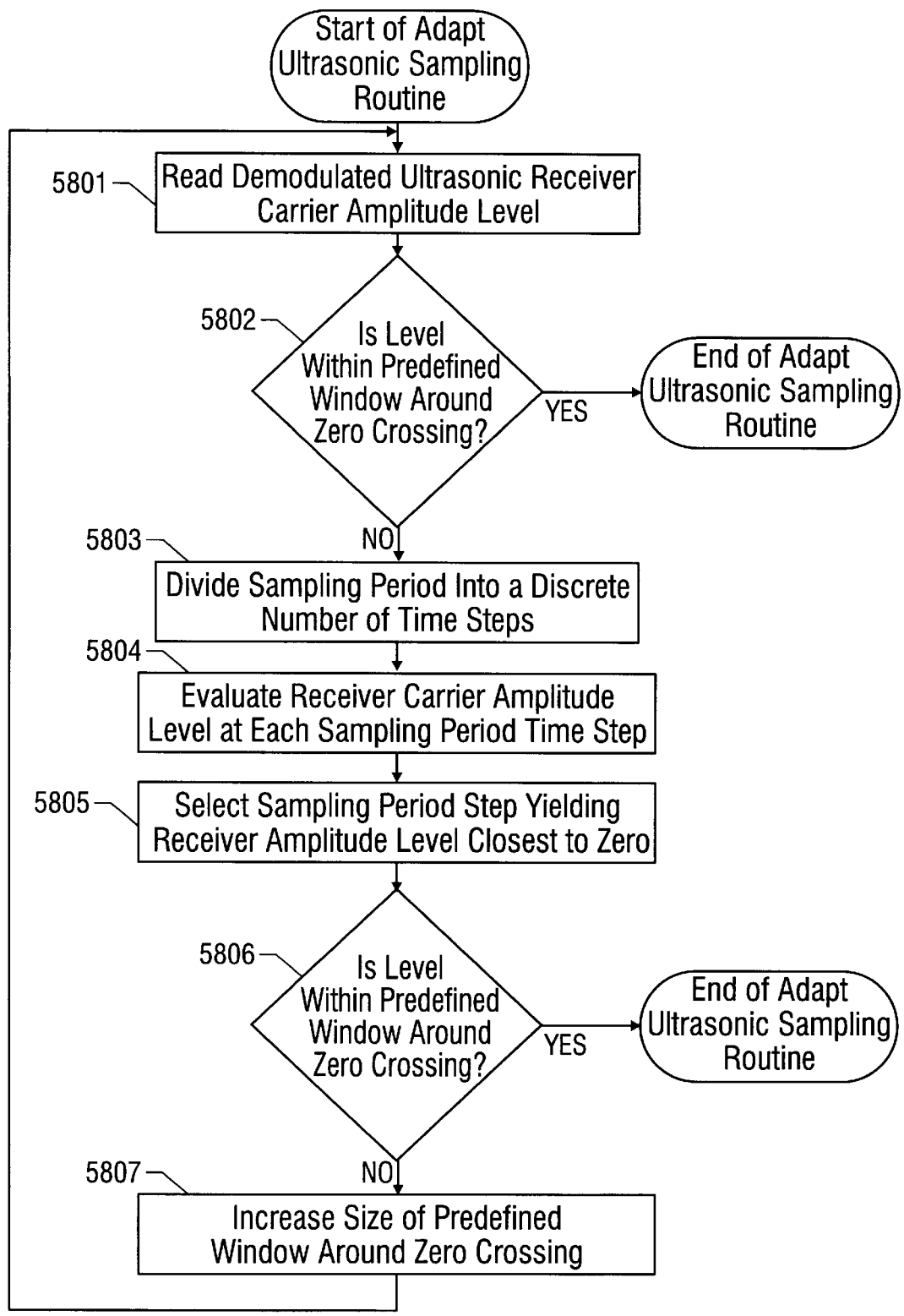
FIG. 58 is the adapt ultrasonic sampling routine flowchart for the present invention.
Figure 59:
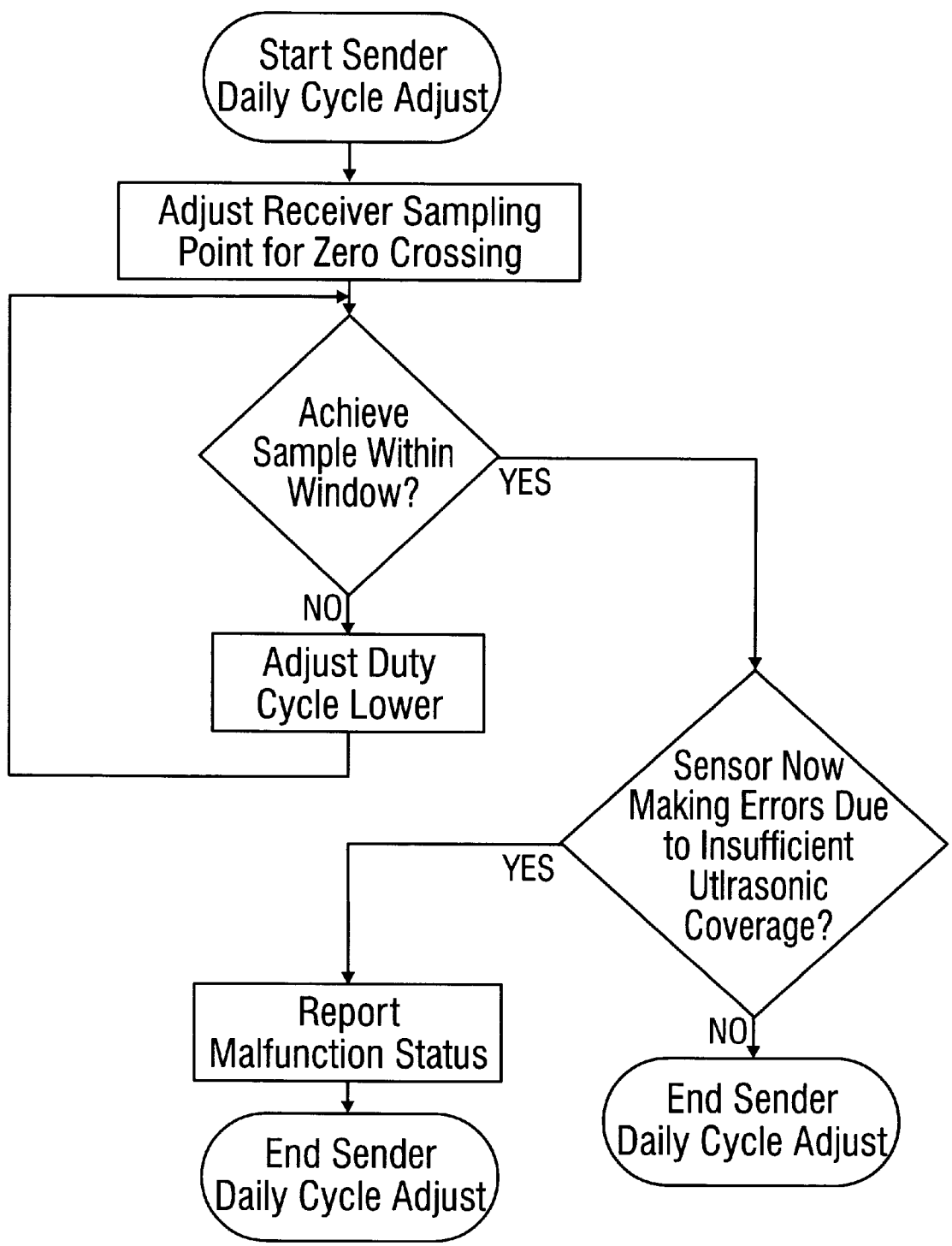
FIG. 59 is a flowchart of the ultrasonic transmitter duty cycle adjustment method of the present invention.
Figure 68:
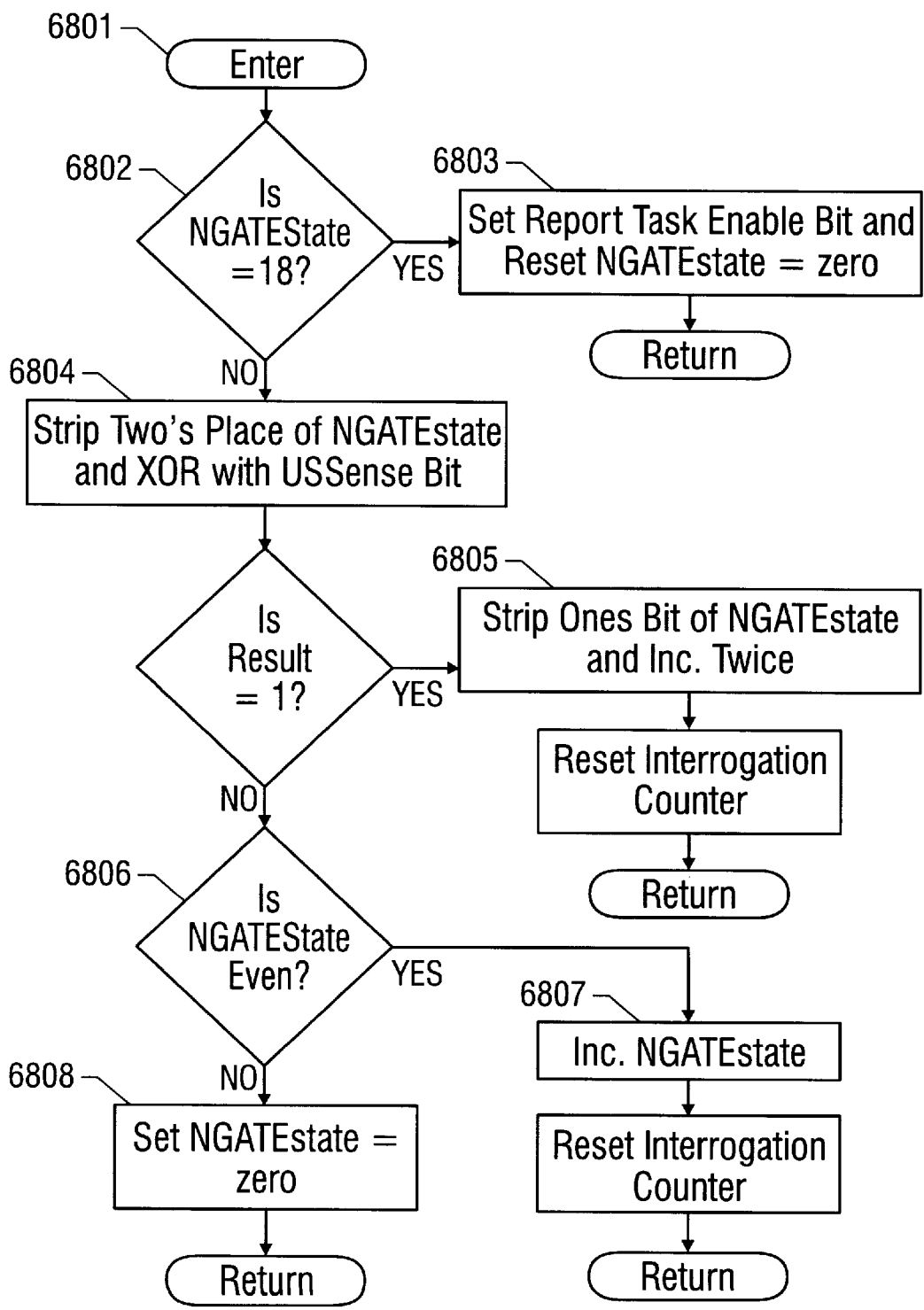
FIG. 68 is the interrogate task flowchart for the present invention.
Figure 69:
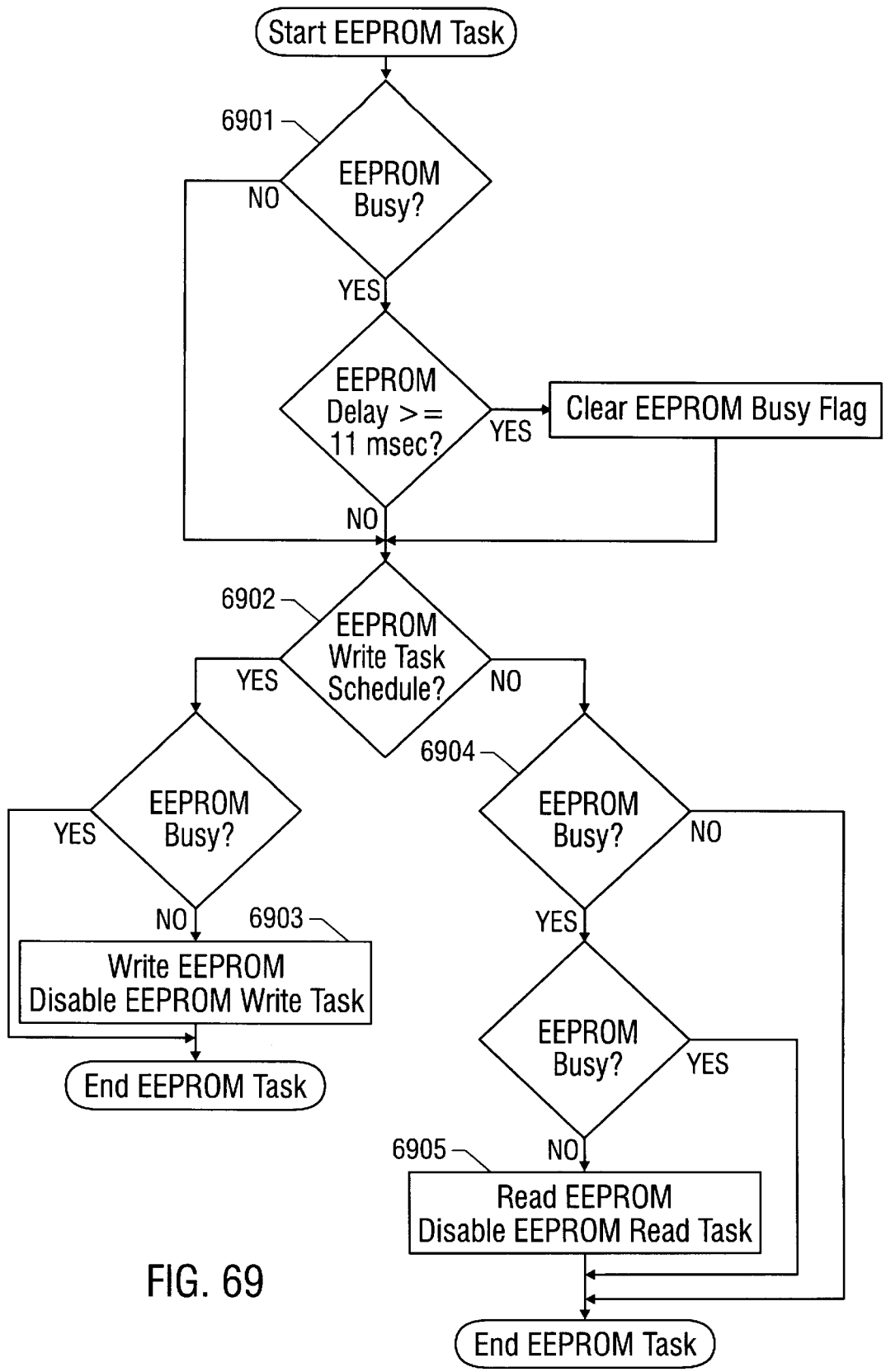
FIG. 69 is the EEPROM task flowchart for the present invention.

Thus, the interrupt routine shown in FIG. 45 includes the following major software tasks that are described in detail in the figures indicated: sensor task (FIGS. 46–54); update counters task (FIG. 55); adjust timer to minimize energy usage task (FIG. 56); MUX task (FIG. 57); adapt ultrasonic sampling point task (FIG. 58); LED task (FIG. 61); relay suppress task (FIG. 63); second task (FIG. 64); minute task (FIG. 66); interrogate task (FIG. 68); and EEPROM task (FIG. 69). Each of these interrupt routine software tasks is described in detail below.

Figure 46:
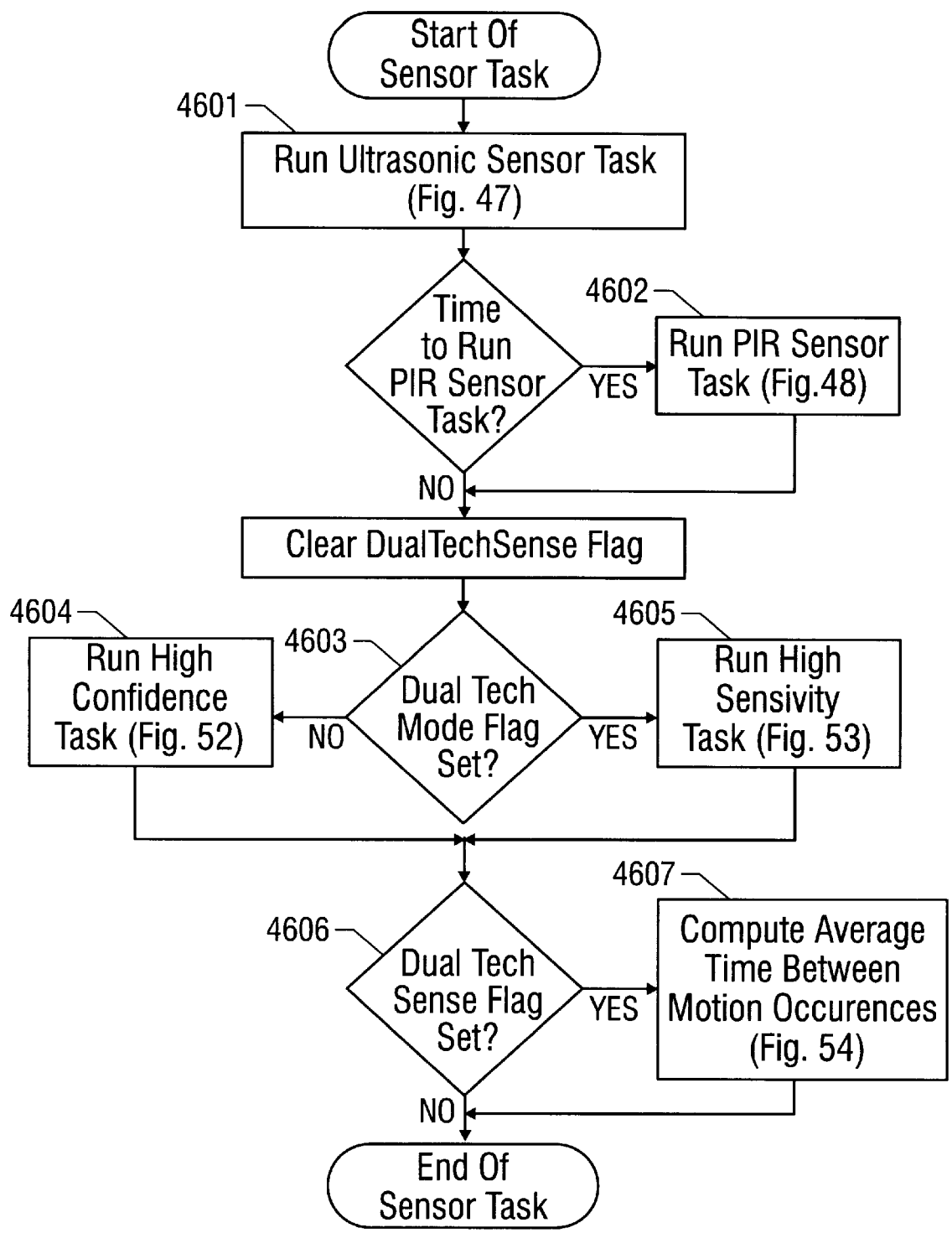
FIG. 46 is the sensor or task flowchart for the present invention.

The sensor task inputs and processes data from each of the various sensor technologies. A flowchart of the sensor task of the present invention is shown in FIG. 46. First the ultrasonic task is executed (4601, shown in detail in FIG. 47). Next, the PIR task is executed if it is the proper time to run it (4602, shown in detail in FIG. 48). If the dual tech mode flag is set (4603) according to the state of user switch 307 (FIG. 3), the dual technology HIGH CONFIDENCE task is run (4604, shown in detail in FIG. 52). Otherwise, the dual technology HIGH SENSITIVITY task is run (4605, shown in detail in FIG. 53). Finally if the dual technology sense flag is set (4606), the average time between motion task is executed (4607, shown in detail in FIG. 54).

Figure 47:
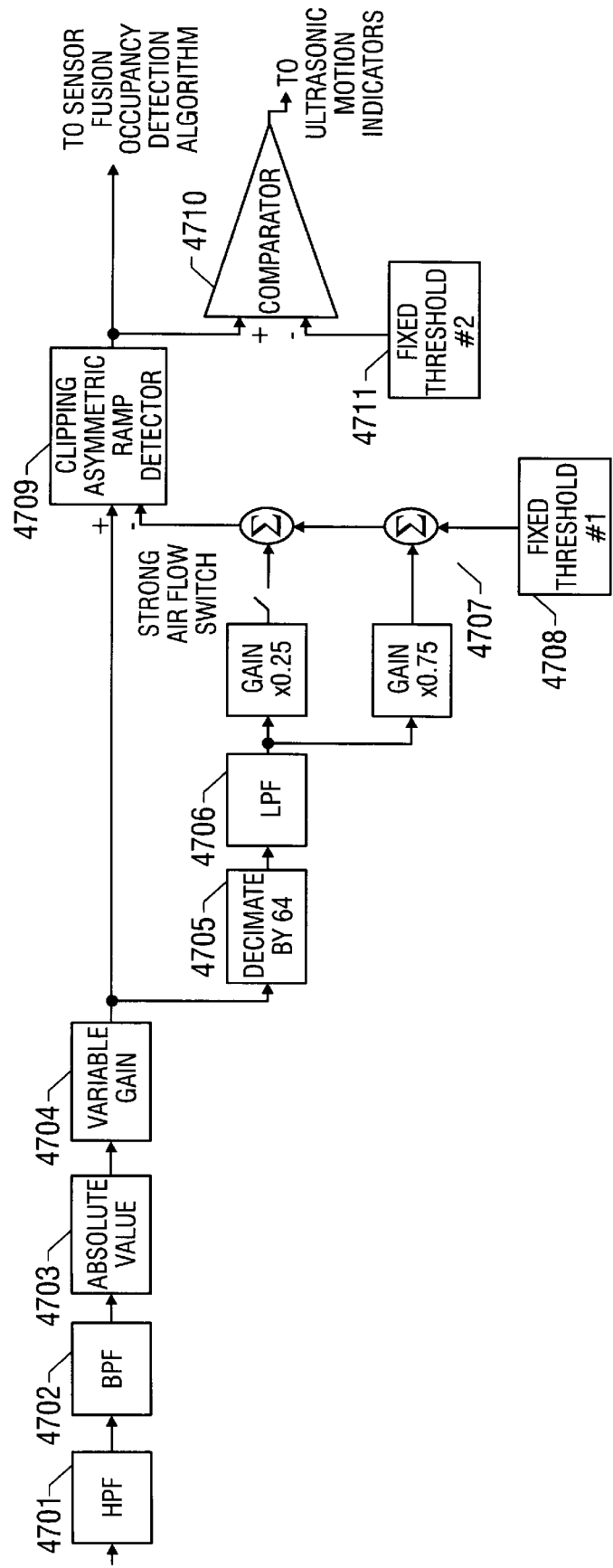
FIG. 47 is the ultrasonic DSP task block diagram for the present invention.

The ultrasonic task inputs data from the ultrasonic sensor and processes that data using an ultrasonic DSP algorithm. An exemplary ultrasonic DSP algorithm is shown schematically in FIG. 47. Although the ultrasonic DSP algorithm is represented as hardware components in FIG. 47, the algorithm is actually embodied in software. Referring to FIG. 47, first, the ultrasonic data is sampled using a sampling frequency $f_s$ of approximately 1,000 Hz. The ultrasonic data is initially passed through a low order digital highpass filter 4701. The digital ultrasonic data is then passed through a low order digital bandpass filter 4702. Next, the absolute value of the ultrasonic data signal is computed (4703) and passed through a variable gain stage 4704. The gain of stage 4704 is derived from the setting of user-specified ultrasonic sensitivity potentiometer 316 (FIG. 3). The output of the variable gain stage 4704 is then decimated by factor of 64 ($f_s$=~16 Hz) 4705, and passed through a low order digital lowpass filter 4706. Low pass filter 4706 has a cutoff frequency of approximately 2.5 Hz. The output of Low pass filter 4706 is multiplied by a variable factor, 4707, depending on the presence of strong air flow. If the strong air flow option switch 311 (FIG. 3) is ON indicating the presence of strong air flow, the signal is multiplied by a factor of 1.0. Otherwise the signal is multiplied by a factor of 0.75. A fixed offset value 4708 is added to the result that is then fed into the negative (−) input of a clipping asymmetric ramp detector 4709. The positive (+) input of ramp detector 4709 is connected to the output of the variable gain stage 4704. Whenever the positive input of ramp detector 4709 is greater than the negative input, the output of ramp detector 4709 increases by 512. Conversely, whenever the negative input of ramp detector 4709 is greater than the positive input, the output of ramp detector 4709 decreases by 128. The output of the ultrasonic DSP block is passed through a digital pulse stretcher to increase the time duration of the peaks in the ultrasonic signal. This technique slightly increases the probability of detection of small time duration events by stretching the ultrasonic signal peaks in time until the infrared sensor responds to the corresponding event, and is described in detail below with reference to FIGS. 49, 50 and 51. After pulse stretching, the output of ramp detector 4709 is passed to the sensor's fusion detection occupancy algorithm, as shown in more detail in the flow chart of FIGS. 52 and 53. Finally, the output of ramp detector 4709 is compared (4710) to a user-specified ultrasonic sensor activation threshold (4711). If the signal is above that threshold, the ultrasonic motion indicator(s) will be activated.

The PIR task inputs data from the infrared sensor and processes that data using a passive infrared DSP algorithm. An exemplary PIR DSP algorithm is shown schematically in FIG. 48. Although the PIR DSP algorithm is represented as hardware components in FIG. 48, the algorithm is actually embodied in software. Referring to FIG. 48. The PIR data is sampled using a sampling frequency $f_s$ of approximately 32 Hz. The PIR data is initially passed through a low order digital highpass filter 4801. The digital PIR data is then passed through a low order digital lowpass filter 4802. Next, the PIR difference signal is computed by subtracting the output of the PIR low pass filter 4802 from the output of the PIR high pass filter 4801. Next, the absolute value of the PIR difference signal is computed 4803. The absolute value of the PIR difference signal is then pulse stretched in a manner similar to that done with the ultrasonic signal, and passed to the sensor's multi-technology sensor fusion detector (FIGS. 52 and 53) to determine occupancy. Finally, the absolute value of the PIR difference signal is compared 4804) to a user-specified PIR activation threshold (4805). If this signal is above the threshold, the infrared motion indicator(s) will be activated.

As mentioned above with reference to FIGS. 47 and 48, pulse stretching is applied in both the ultrasonic and PIR DSP algorithms. This is desirable because valid occupancy signals from multiple technologies may occur nearly, but not exactly simultaneously. For instance, ultrasonic motion detectors are preferentially sensitive to motion along the direction to the sensor, while infrared are more sensitive to motion perpendicular to the direction to the sensor. Under normal circumstances, the movements of an occupant of the controlled space may vary between the directions toward and perpendicular to the sensor, resulting in occupancy estimator signals that peak at different times.

Figure 49:
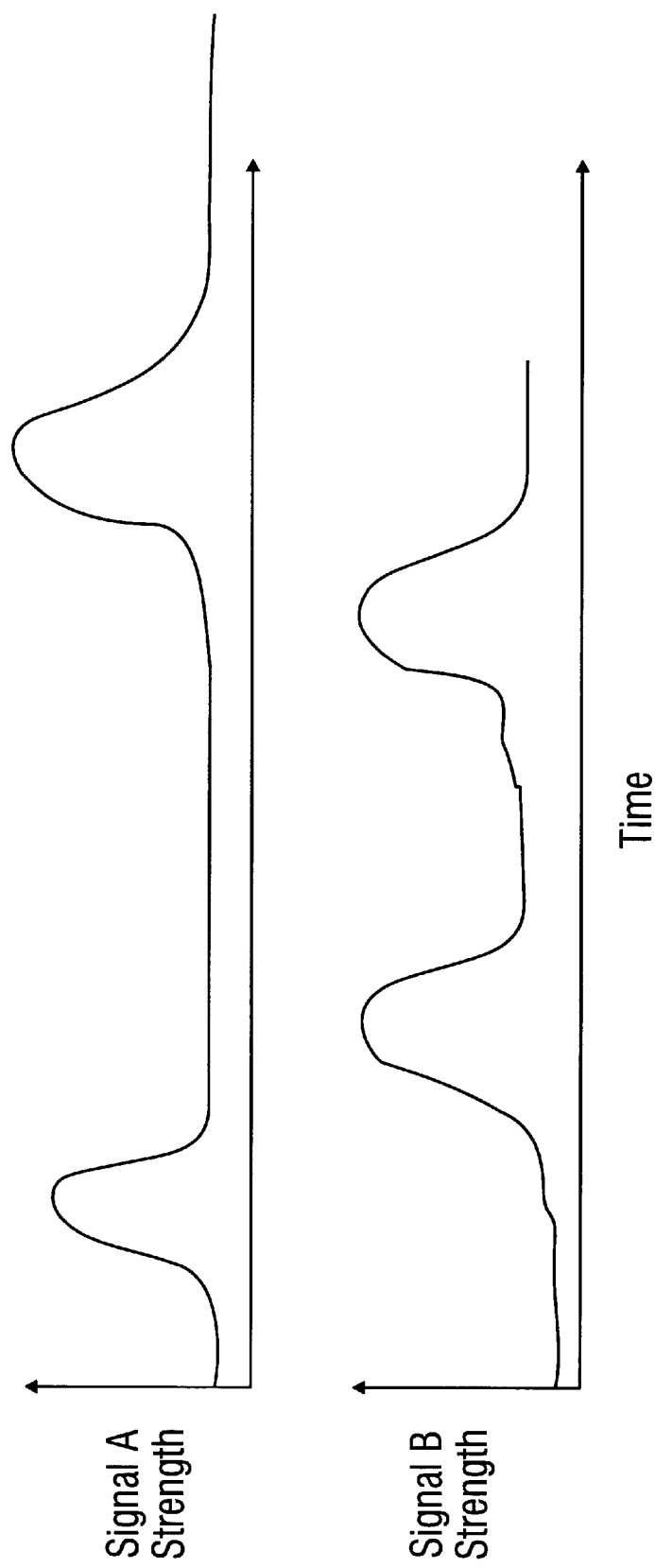
FIG. 49 is a time line of two unstretched occupancy signals
Figure 50:
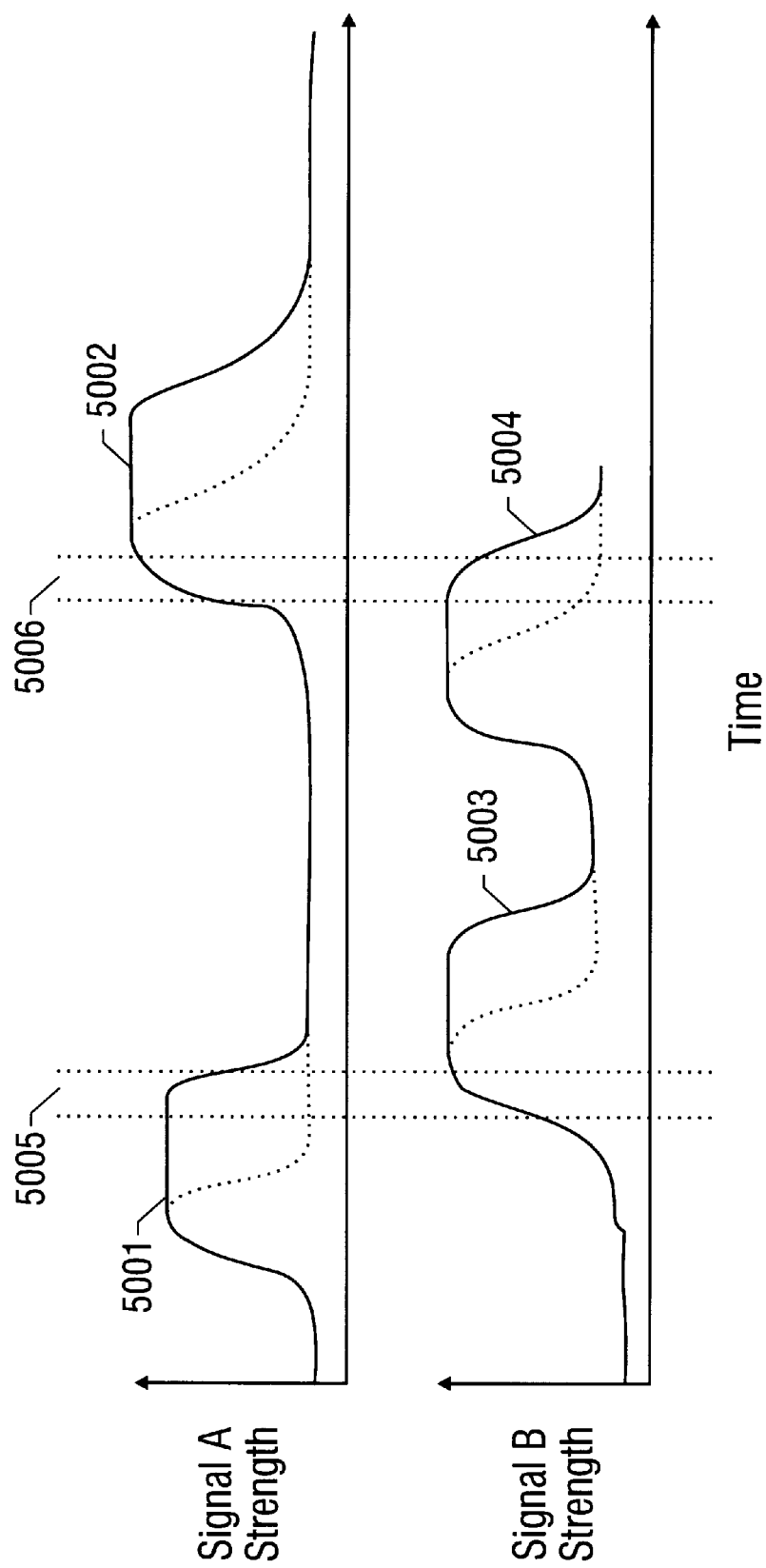
FIG. 50 is a time line of two stretched occupancy signals

The need for pulse stretching is illustrated in FIG. 49. Without pulse stretching, motion signals from detection technology 1 and 2 occur at different times and are generally not coincident in time. In this case a composite occupancy estimator will not indicate occupancy, despite the near coincidence of signals from the individual detection technologies. The result of stretching these signals is shown in FIG. 50. In this case the stretch of signal 1 (5001) brings it into temporal coincidence (5005) with signal 2 in the first case, and the stretch of signal 2 (5002) brings it into temporal coincidence (5006) with signal 1 in the following case. Now the signals overlap, and a composite occupancy estimator will indicate occupancy.

Figure 51:
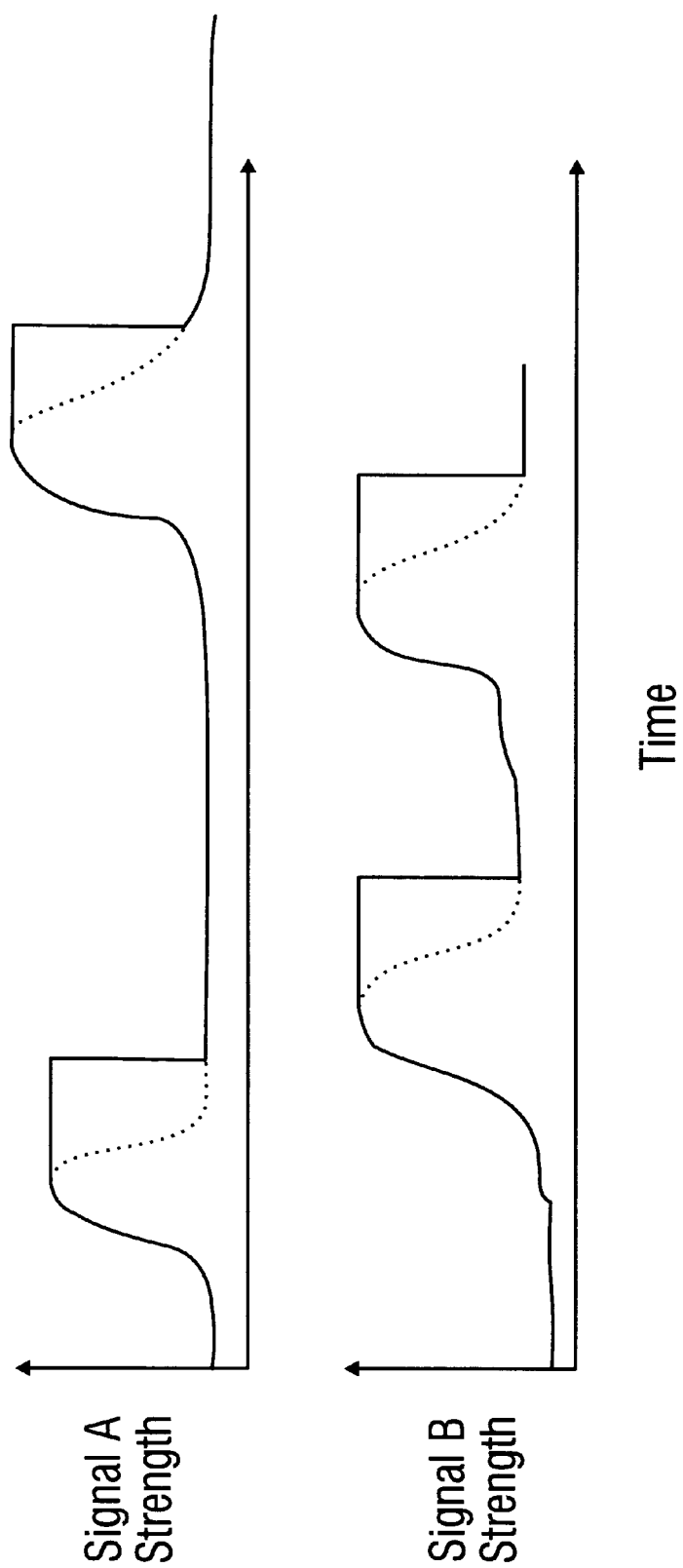
FIG. 51 is a time line of two peak stretched occupancy signals

Pulse stretching as shown in FIG. 50 generally requires a circular buffer large enough to store a number of samples equal to the stretch time period divided by the sample rate. It also requires a search algorithm to find the maximum value within the buffer, that becomes the current stretched signal value. An alternative implementation is to recognize the local maximum of a signal, and stretch only the maximum value. This implementation requires a lesser computational resource, and the storage of only two values, the signal maximum value, and its stretch ending time. The result of this pulse stretching implementation is shown in FIG. 51.

Figure 52:
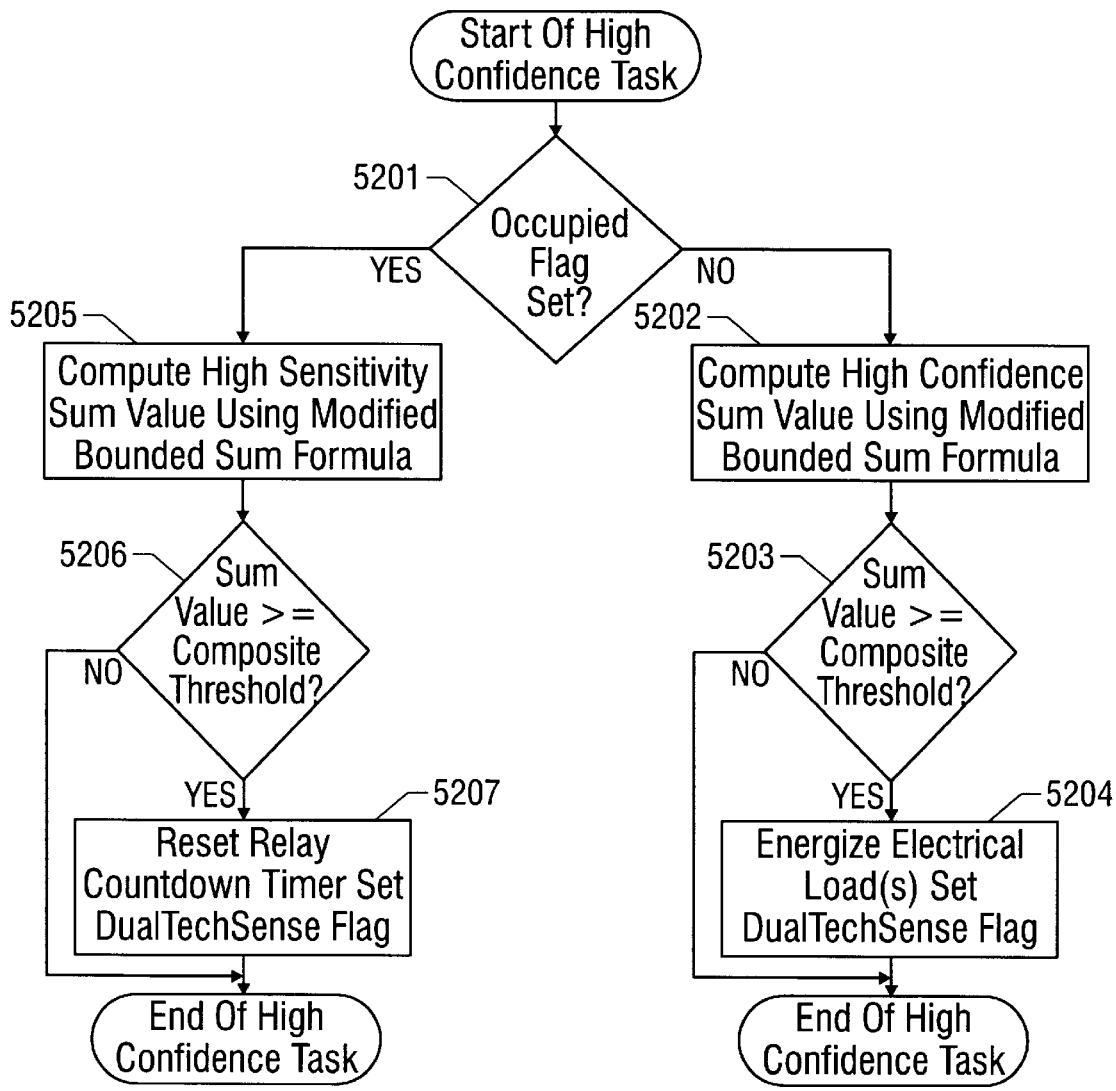
FIG. 52 is the HIGH CONFIDENCE task flowchart for the present invention.

The HIGH CONFIDENCE task implements the sensor's HIGH CONFIDENCE occupancy detection mode. A flowchart of the sensor's HIGH CONFIDENCE task is shown in FIG. 52. If the area covered by the occupancy sensor is not currently occupied (5201), a composite occupancy estimator is computed using an arithmetic sum formula (5202). If the resulting value is above the predetermined composite activation threshold (5203), the sensor's electrical load(s) are energized and the DualTechSense flag is set (5204).

If the area covered by the occupancy sensor is currently occupied, a composite occupancy estimator is computed using an arithmetic sum formula (5205). If the resulting composite occupancy estimator value is above the predetermined composite maintenance threshold (5206), the sensor's relay countdown timer is reset and the DualTechSense flag is set (5207).

Figure 53:
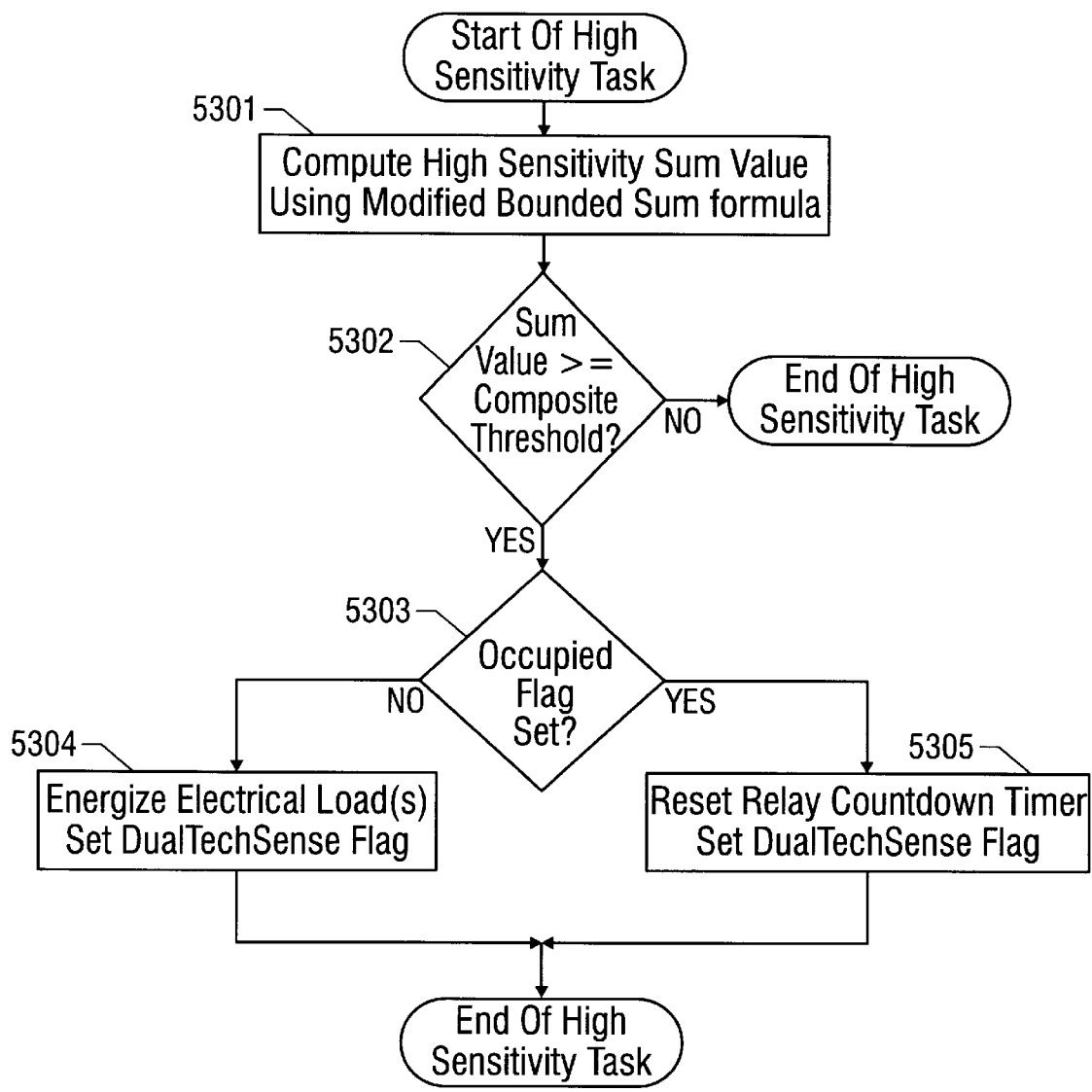
FIG. 53 is the HIGH SENSITIVITY task flowchart for the present invention.

The HIGH SENSITIVITY task implements the sensor's HIGH SENSITIVITY occupancy detection mode. A flowchart of the sensor's HIGH SENSITIVITY task is shown in FIG. 53. Initially, an composite occupancy estimator is computed using an arithmetic sum formula (5301). If the resulting value is above the predetermined composite maintenance threshold (5302), the sensor checks to see if the area covered by the sensor is currently occupied (5303). If the area covered by the occupancy sensor is not currently occupied, the sensor's electrical load(s) are energized and the DualTechSense flag is set (5304). If the area covered by the occupancy sensor is currently occupied, the sensor's relay countdown timer is reset and the DualTechSense flag is set (5305).

Figure 54:
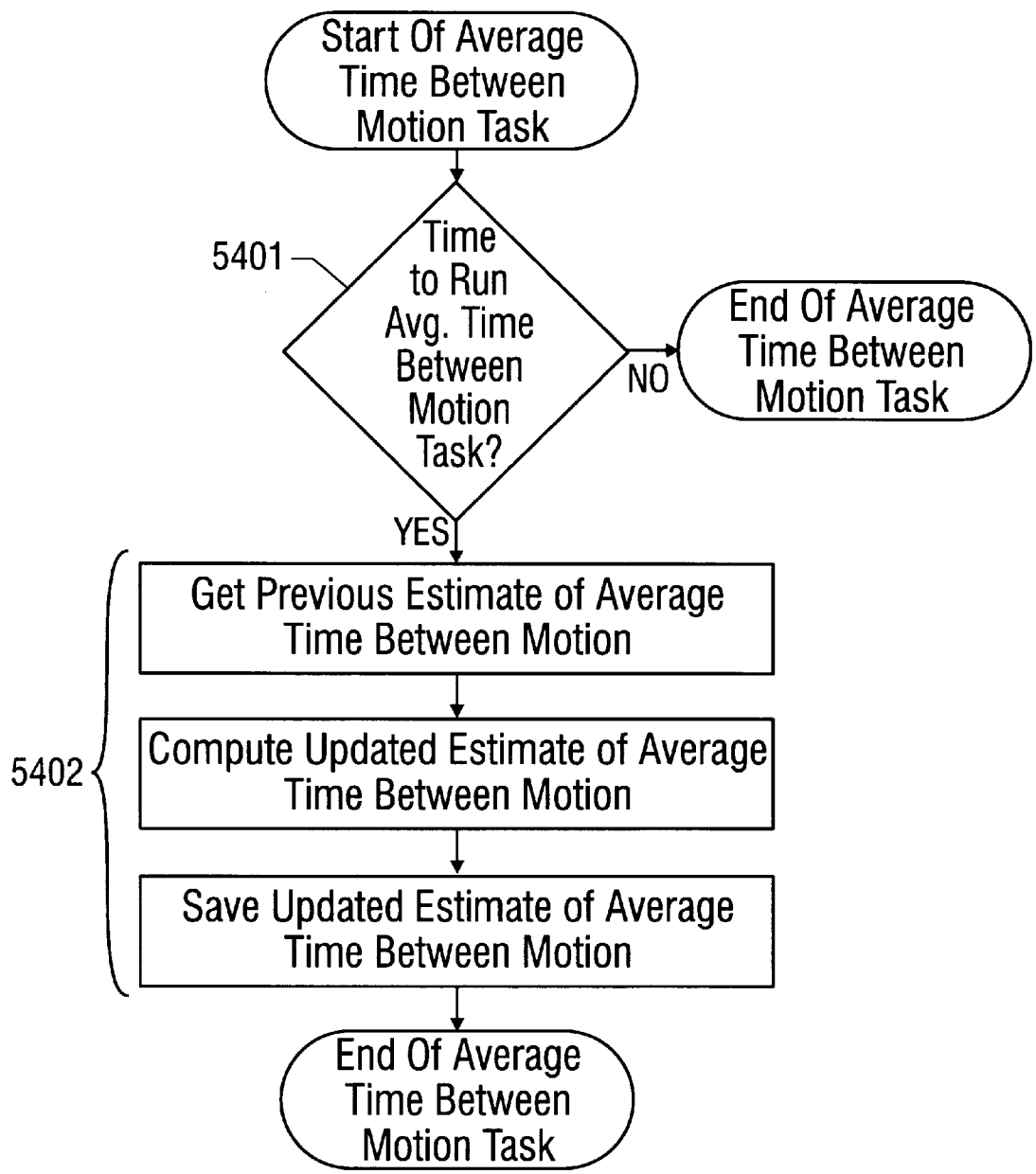
FIG. 54 is the average time between motion routine flowchart for the present invention.

The average time between motion task estimates the average time between motion. A flowchart of the average time between motion task of the present invention is shown in FIG. 54. If it is time to run this task (5401), the previous estimate of the average time between motion is updated and saved (5402). This information is used as a cue for the various adaptive sensor algorithms.

The update counters task updates the primary three byte interrupt counter used in the occupancy sensor. A flowchart of the update counters task of the present invention is shown in FIG. 55. The low byte of the counter is first incremented (5501). If zero (5502), the middle counter byte is incremented (5503). If zero (5504), the high byte of the counter is incremented (5505). If the high byte is zero (5506), a counter roll over flag is set (5507).

The adjust timer to minimize energy usage task implements the power up timer adjust algorithm. A flowchart of the adjust timer to minimize energy usage task of the present invention is shown in FIG. 56. The adjust timer to minimize energy usage task acts to reduce the time out on an ongoing basis. The amount of reduction depends upon the current value of the time delay potentiometer 319 (FIG. 3). In the illustrated embodiment, the amount of timer reduction is done according to the following formulas:

If time out$\geq$60 minutes, reduce by 30 minutes/4.66 hours,

If time out$\geq$30 minutes, reduce by 5 minutes/4.66 hours,

If time out$\geq$15 minutes, reduce by 1 minutes/4.66 hours,

If time out$\geq$10 minutes, reduce by 30 seconds/4.66 hours,

Otherwise, reduce timer by 2 seconds/4.66 hours

Initially, the timer delay adjustment value is reduced (5601). The timer delay adjustment value is then clipped at zero (5602).

The MUX task reads the status of the various user-selected mode option switches (discussed in detail above with reference to FIG. 3), and saves the results in the various sensor variables and flags. A flowchart of the MUX task is shown in FIG. 57. The MUX task initially sets the A and B MUX controls to cause MUX 304 (FIG. 3) to read the ultrasonic sensitivity potentiometer setting and the ASA switch setting (MUX=00). On the next pass, the MUX 304 reads the PIR sensitivity potentiometer setting and the ATA switch setting (MUX=01). On the next pass, the MUX 304 reads the timer pot setting and GSB switch setting (MUX=10). Finally, on the fourth pass, the MUX 304 reads the photo cell potentiometer setting and the strong air flow switch setting (MUX=11). This sequence of four MUX states is then sequentially repeated on a periodic basis.

The adapt ultrasonic sampling point task adjusts the ultrasonic sampling point to prevent the loss of motion information due to ultrasonic analog front end receiver signal saturation. A flowchart of the adapt ultrasonic sampling point task of the present invention is shown in FIG. 58. The sample point setting algorithm adjusts the sample point to achieve a receive carrier amplitude level at the sample point that is as close to zero crossing (VREF voltage) as possible. The sample point is adjusted by varying the timer value that sets the sample point within the carrier period.

When the sensor is initially powered, the sample point is adjusted to a default initialization value that is correct for the sensor in a nominal situation. The receive carrier sample point value is tested (5801), and if found to lie within a window about zero crossing (5802), no change to the sample point is made. If the receive carrier sample point value is found to be outside the desired window (5802), the sample point is precessed in discrete steps (5803), until the receive carrier sample point value is within the window(5804). The sample point is further perturbed to search out the value that is closest to zero crossing (5805). This becomes the synchronous demodulator sample point.

If it is impossible to find a sample point that results in a carrier value within the window (5806), the allowable window size is increased (5807), and the sample point search is made again. This process is repeated until the window has been increased to the point of receiver preamplifier saturation. In the event that the sensor is installed so close to a reflecting wall that there is no sample point that may be found that does not saturate the receiver preamplifier, the sample point search has failed, and the sensor reports this via the status reporting feature. Alternatively, the sensor may adjust the carrier send output level.

Specifically, when an ultrasonic sensor is installed within a small space, reverberant energy from the close walls may cause the sensor receive preamplifier to saturate. This saturation may be extreme beyond the ability of the sample point search algorithm FIG. 58 to find a satisfactory sample point within the granularity of the sample point timer adjustment. The correct response to this situation is to decrease the transmitter power, since the small space will be adequately covered. In another situation an ultrasonic sensor may be installed in a large space, but too close to an acoustic reflecting surface, resulting in receiver preamplifier saturation extreme beyond the ability of the sample point search algorithm to find a satisfactory sample point. The correct response in this situation is to decrease the transmitter power, unless this causes the sensor to emit insufficient acoustical energy to effectively survey the space. If this is the case, the sensor is unable to achieve a satisfactory drive level that both avoids preamplifier saturation and effectively surveys the space, so the sensor signals its inability to perform in a satisfactory manner by reporting a malfuction. This prompts service personnel to review the sensor installation and move it away from the acoustic reflector that is causing the saturation problem. This process is detailed in FIG. 59.

The receive carrier sample point value is periodically retested while the sensor is in operation. In the event that the sample point is recognized to be outside the window, and is found to lie consistently outside the window, indicating a change in the sensor mounting, the sample point search is reinitiated. The search results in a new smaple point.

Figure 60:
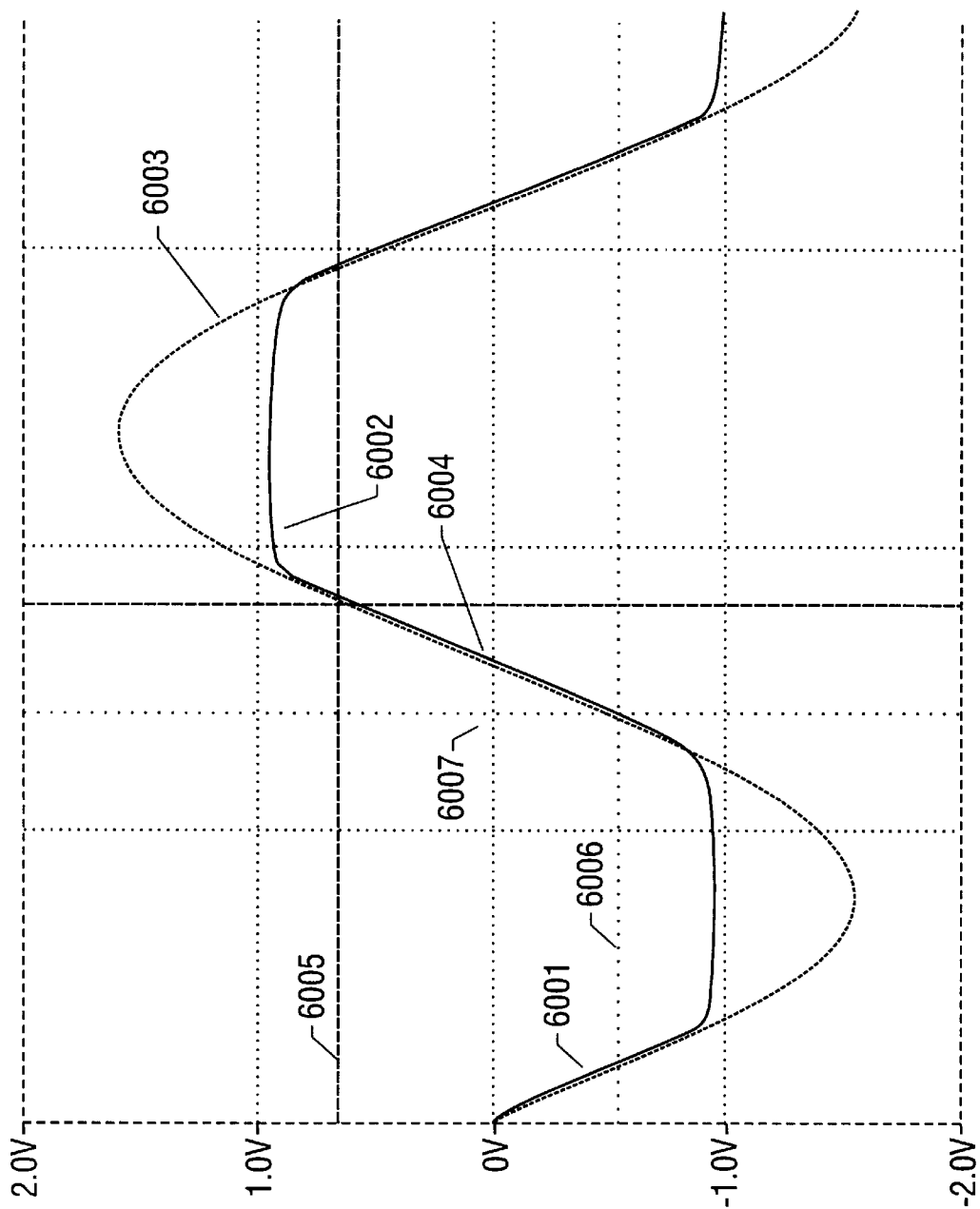
FIG. 60 is s time line of input receiver saturation

FIG. 60 depicts the situation of waveform saturation. Time is shown on horizontal axis, and the waveform at the preamplifier output is shown as a function of time. Point 6001 on the waveform indicates the preamplifier output at a voltage below the positive saturatio limit. Point 6002 is the preamplifier output in saturation, where it cannot achieve the ideal waveform value of point 6003. Point 6004 is the ideal sample point at the zero crossing of the preamplifier signal. The region bounded by 6005 and 6006 is a voltage window around zero crossing within which the sample point should ideally lie to avoid the preamplifier saturation characteristic. The region bounded by 6007 and 6008 is the corrsponding window in time within which the sample point must lie in order to achieve a sample point voltage within region 6005.

Figure 61:
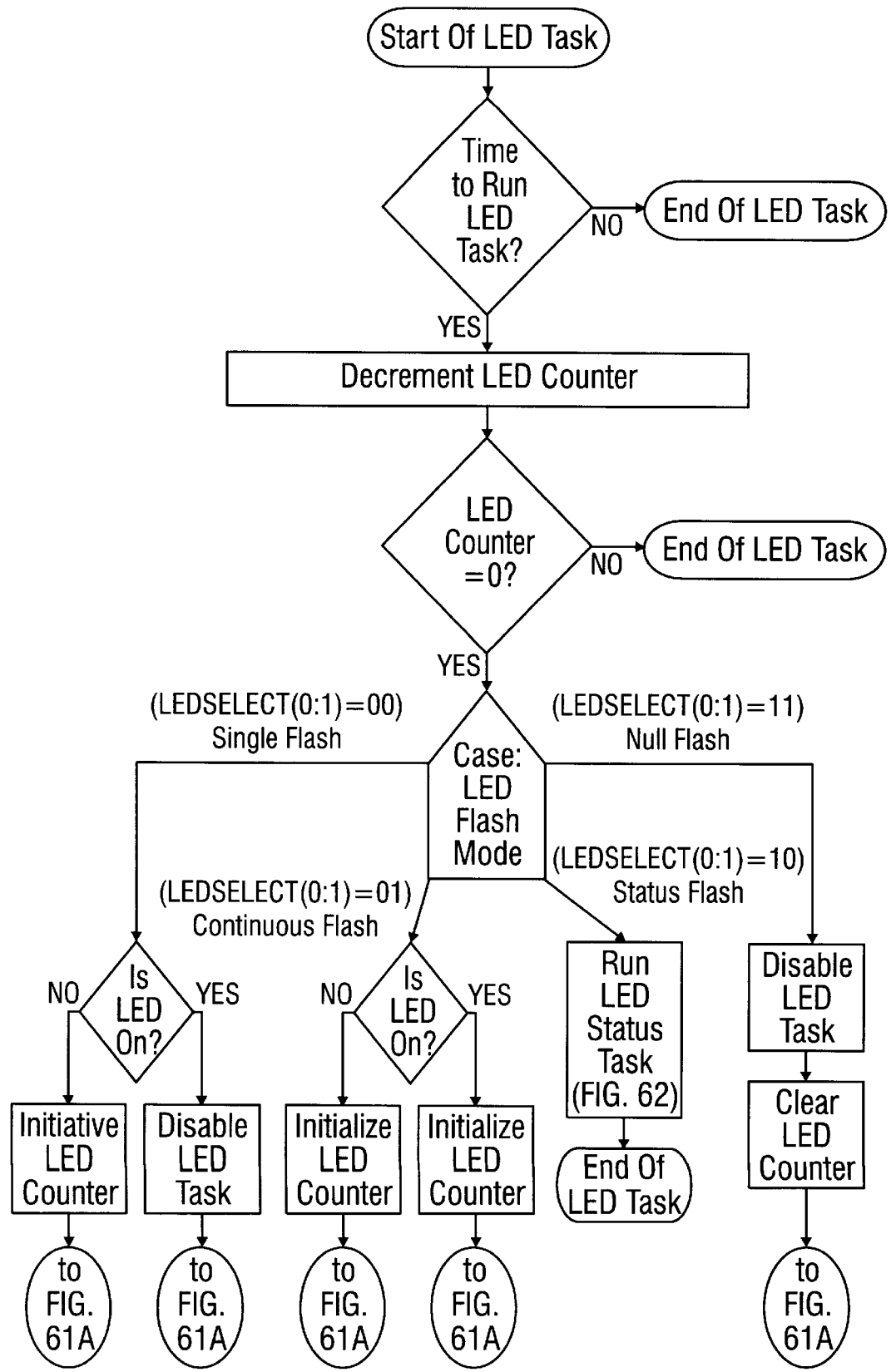
FIG. 61 is the LED task flowchart for the present invention.
Figure 61A:
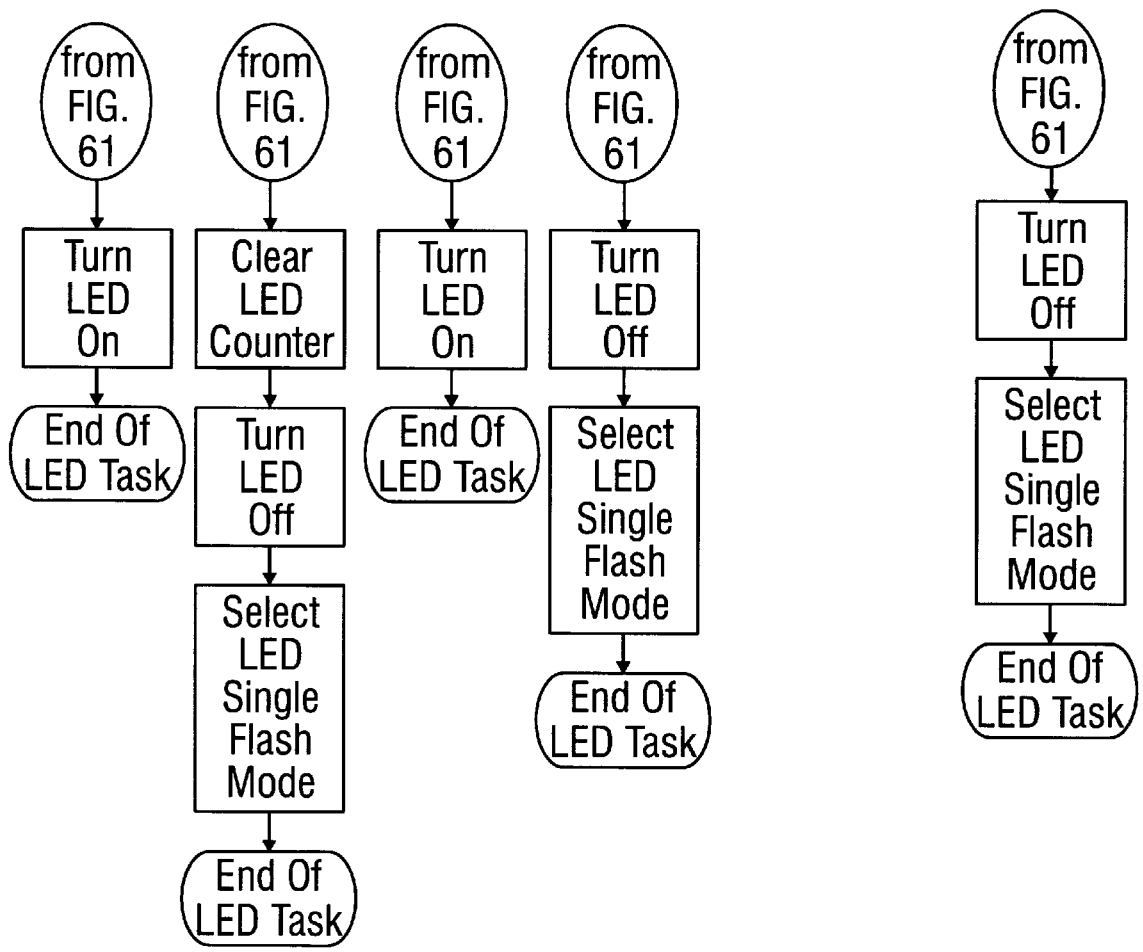

The LED task determines the LED flash mode and then flashes the various sensor LEDs in the appropriate fashion. A flowchart of the LED task is shown in FIG. 61. In the exemplary embodiment there are four different LED flash modes: single flash mode, continuous flash mode, status flash mode, and null flash mode. The LED single flash mode flashes the LED on and off a single time. The LED continuous flash mode flashes the LED on and off continuously. The LED status flash mode flashes the current status of the sensor, and is discussed in more detail with reference to FIG. 62(*a*). The LED null flash mode may be used for testing.

Figure 62A:
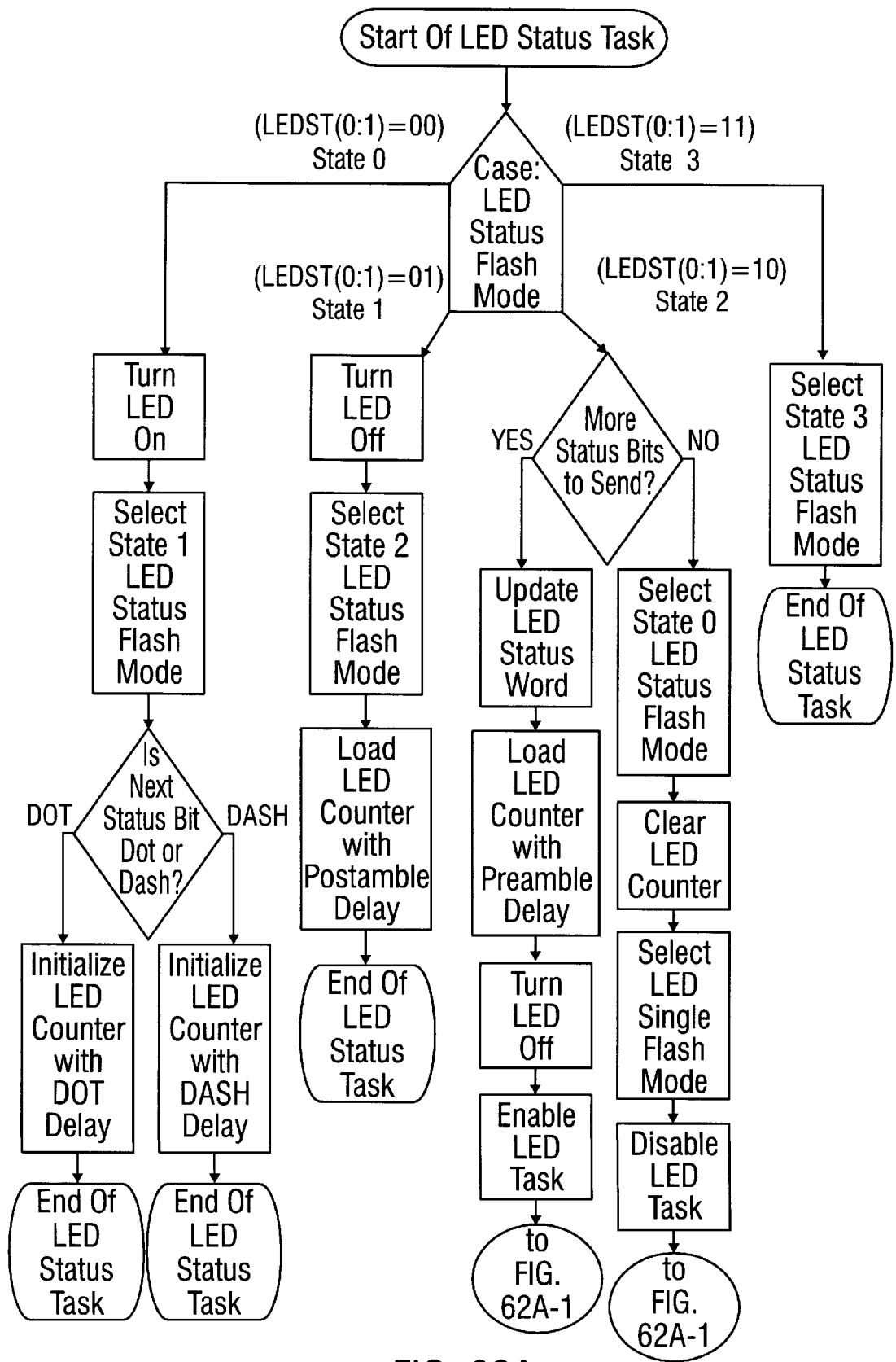
FIG. 62(a) is the LED status task flowchart for the present invention.
Figures 1, 62A:
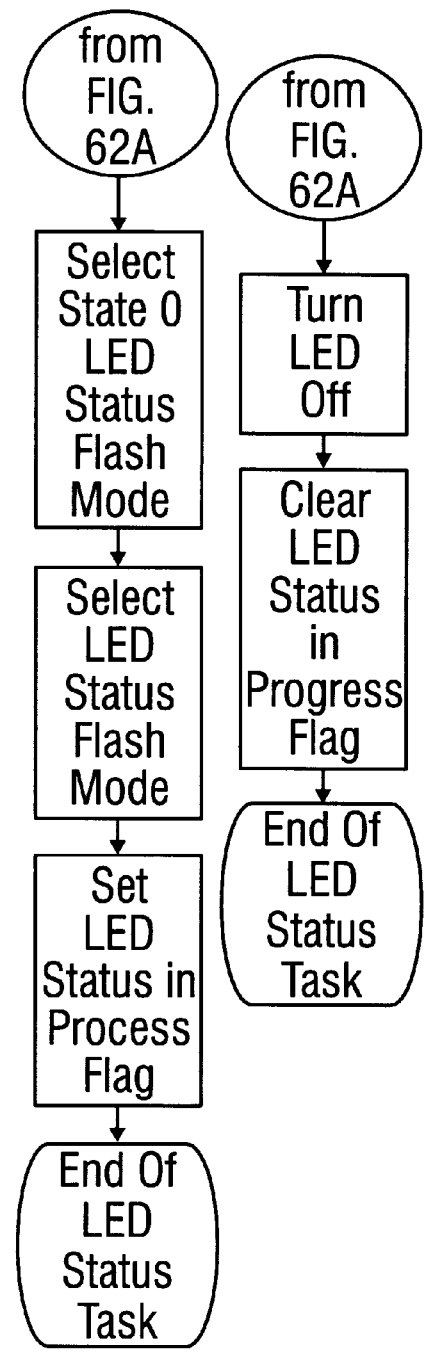
Figure 62B:
FIG. 62(b) is an example of a status report according to the present invention.

The LED status task manages the overall operation of the LEDs in order to output the status of the various sensor registers and its overall status. A flowchart of the LED status task of an example of the present invention is shown in FIG. 62(*a*).

Each status register value and the overall status of the sensor are converted into a sequence of Morse code dots and dashes, or other coding scheme. The LED status routine keeps track of the various dot and dash characters and makes sure the complete status information is sent. An exemplary status report is shown with reference to FIG. 62(*b*). The status report takes the form of a series of short and long LED flashes that, in the exemplary embodiment are in Morse code. The report is preceded by a preamble 6201 and then by one or more data fields. For example, after the preamble, the general status (6202) of the sensor may be reported. General status my be, for example, normal, windy (for a windy installation), failed or any other status that is useful. In the example of FIG. 62(*b*), the general status is followed by the delay timer setting in minutes (6203) and the ultrasonic sensitivity setting (6204). Thus, in the example given, the status of the sensor is normal ("S"), the delay timer is set for 16 minutes, the ultrasonic sensitivity setting is 10 and the PIR sensitivity is set to 8. Other types of information may also be displayed, including by way of example, PIR sensitivity setting and microwave sensitivity setting.

Figure 66:
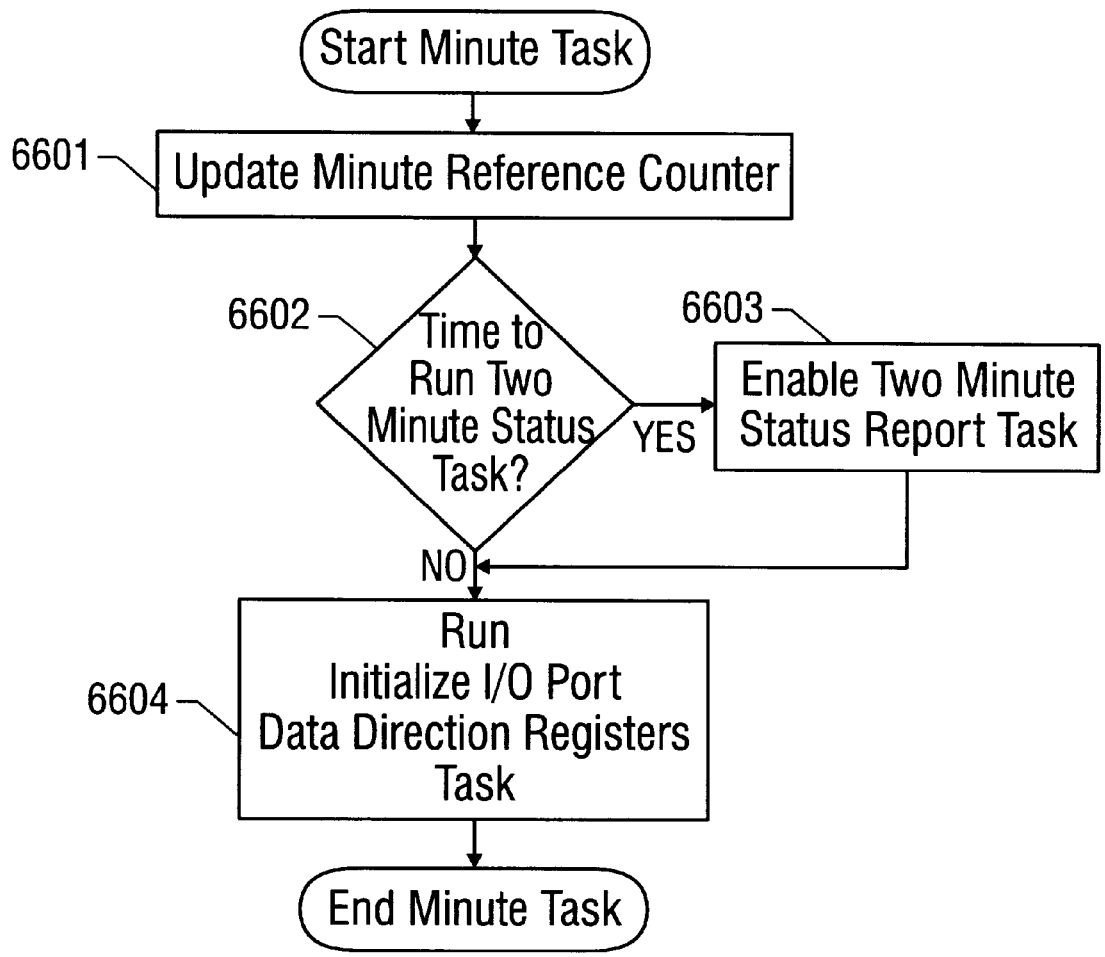
FIG. 66 is the minute task flowchart for the present invention.

As described below in detail with reference to FIGS. 66 and 68, status may be reported periodically, without user intervention, or it may be reported in response to user interrogation. In the former case, a shorted status report may be given (for example, only the general sensor status), whereas a more complete status report may be given in response to user interrogation. FIGS. 61 and 62 (*a*) and (*b*) illustrate various possibilities for using LEDs to provide status information on the sensor. The specific information provided may be of any useful nature, and is not limited to any specific type of sensor status information.

Figure 63:
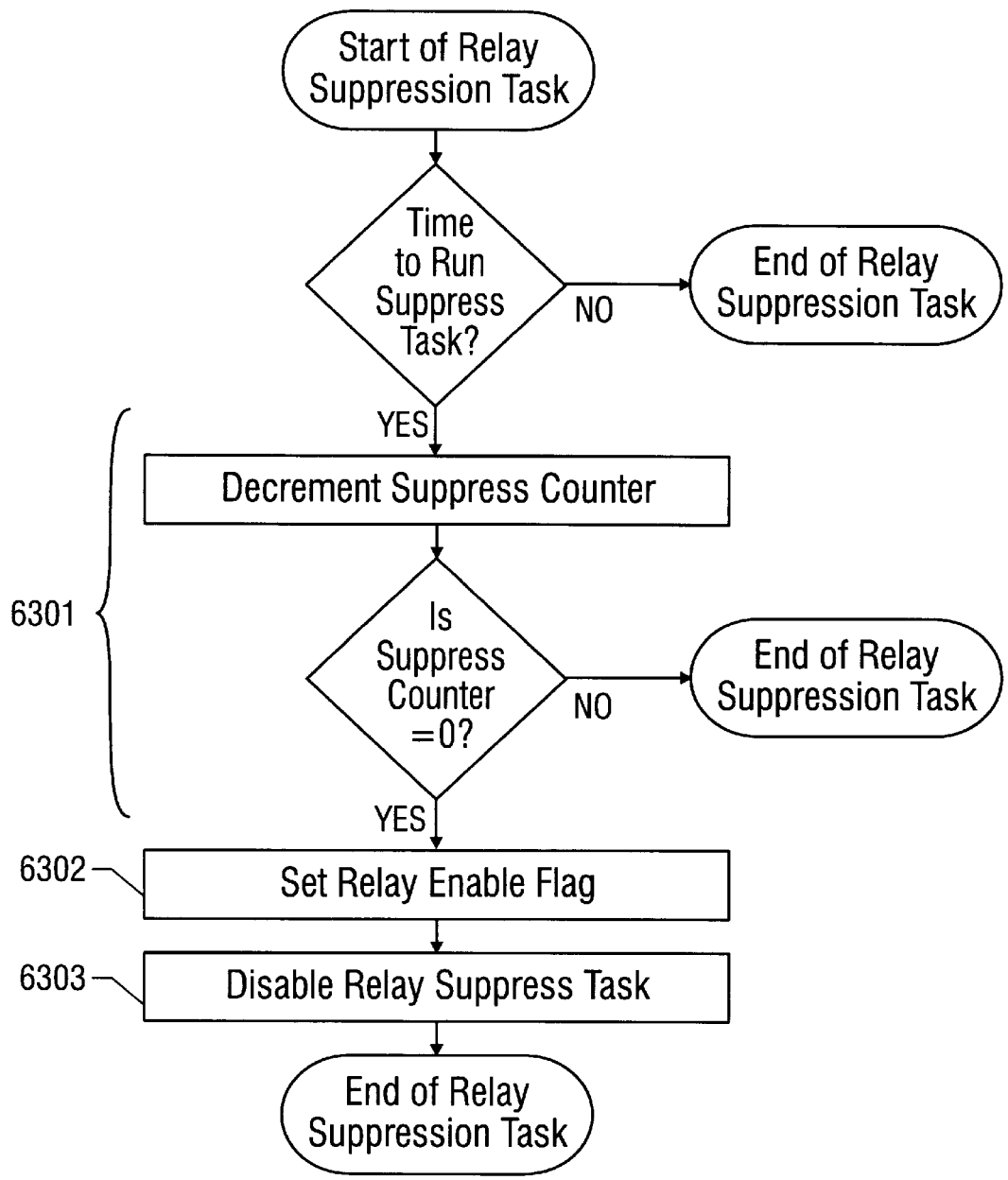
FIG. 63 is the relay suppress task flowchart for the present invention.

The sensor's relay suppress task disables the sensor's relay for a predetermined period of time. A flowchart of the relay suppress task of the present invention is shown in FIG. 63. This routine is used to prevent sensor false triggering by large voltage spikes from the sensor's relay.
Once the relay's predetermined suppression time has elapsed (6301), the relay task enable flag is set (6302),and the relay suppress task enable flag is cleared (6303).

Figure 64:
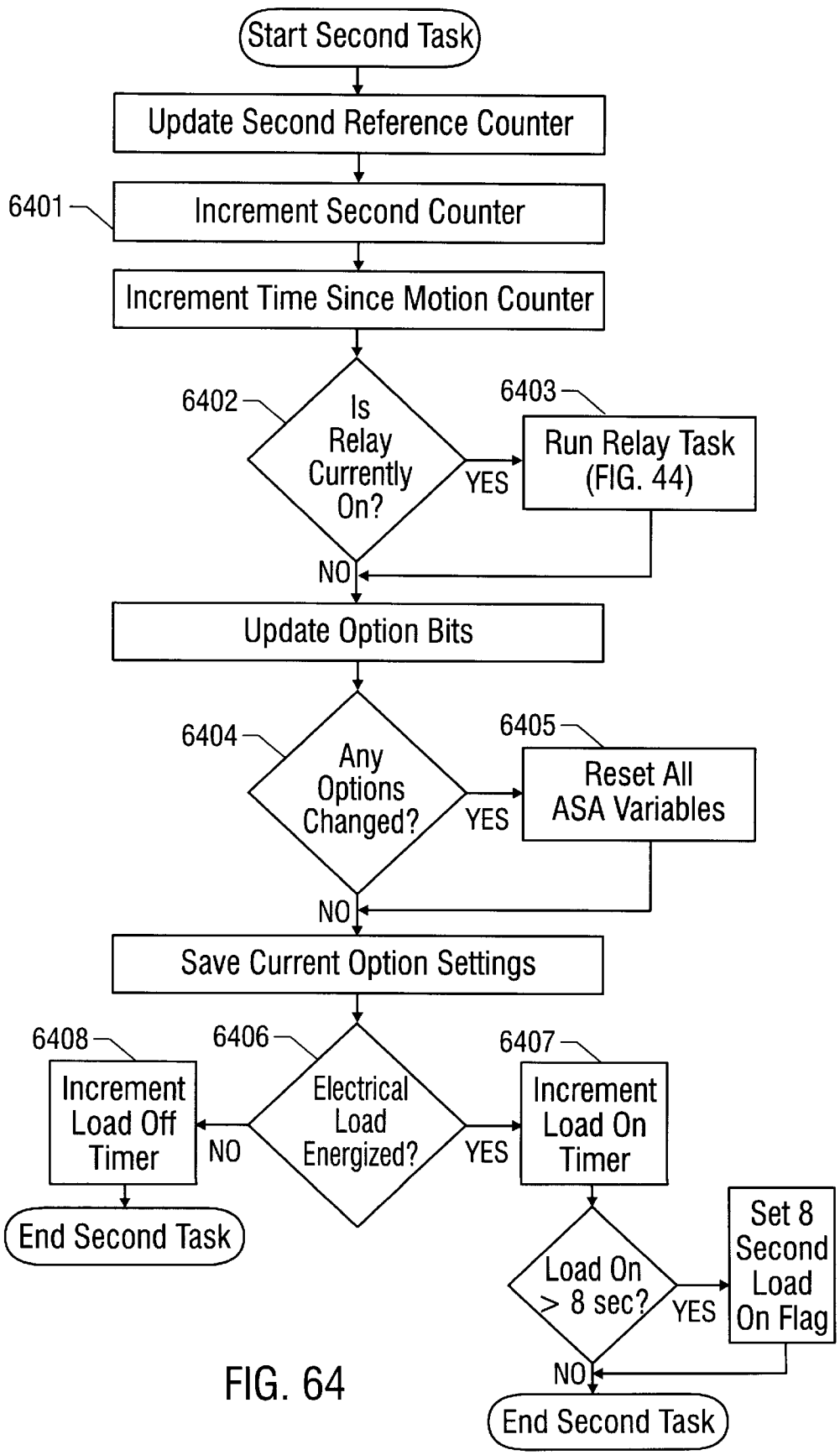
FIG. 64 is the second task flowchart for the present invention.

The sensor's second task is run once a second. A flowchart of the sensor's second task is shown in FIG. 64. This task initially increments the seconds counter (6401). If the relay is currently on (6402), the relay task is executed (6403). If any user-specified mode options have changed (6404), the various auto-sensitivity adjust (ASA) variables are reset (6405). Finally, if the sensor's electrical load(s) are energized (6406), the energized load counter is incremented (6407). If the sensor's electrical load(s) are off, the de-energized load counter is incremented (6408).

Figure 65:
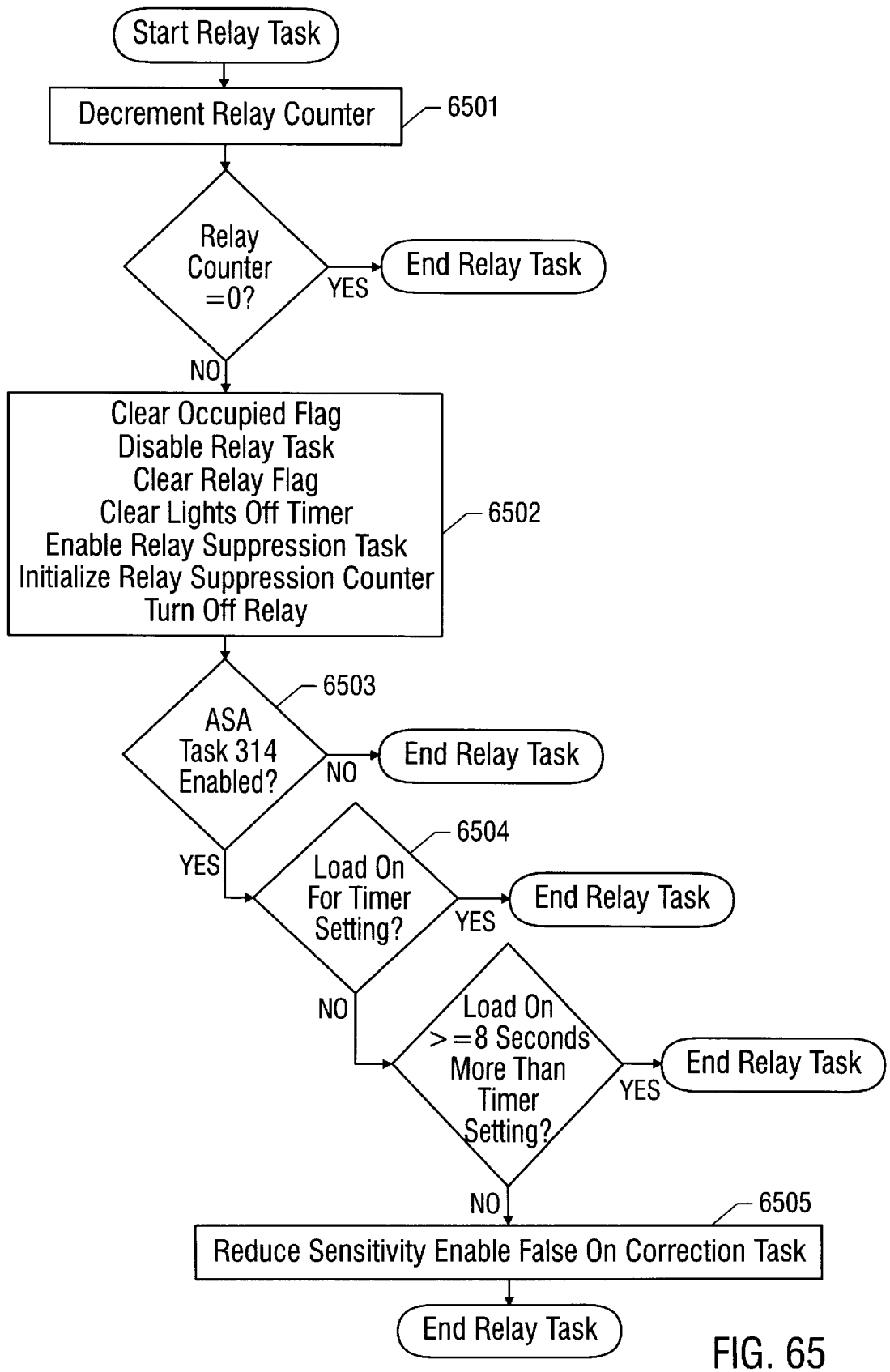
FIG. 65 is the relay task flowchart for the present invention.

The relay task decrements the sensor's relay counter. A flowchart of the relay task of the present invention is shown in FIG. 65.

After decrementing the sensor's relay counter (6501), the relay task turns off the sensor's relay if the relay counter has reached zero (6302). If the relay counter has not reached zero, the relay suppression task is ended. If the ASA task is enabled (6503), and the lights were previously on for about the same time as the sensor's timer delay setting (6504), the ultrasonic and PIR sensitivities are reduced and the false on correction task is enabled (6505).

The sensor's minute task is run once a minute. A flowchart of the minute task of the present invention is shown in FIG. 66. This task initially increments the minutes counter (6601). If it is time to run the two minute status task (6602), the two minute status task enable flag is set (6603). Finally, the initialize I/O port data direction registers task is executed (6604).

Figure 67:
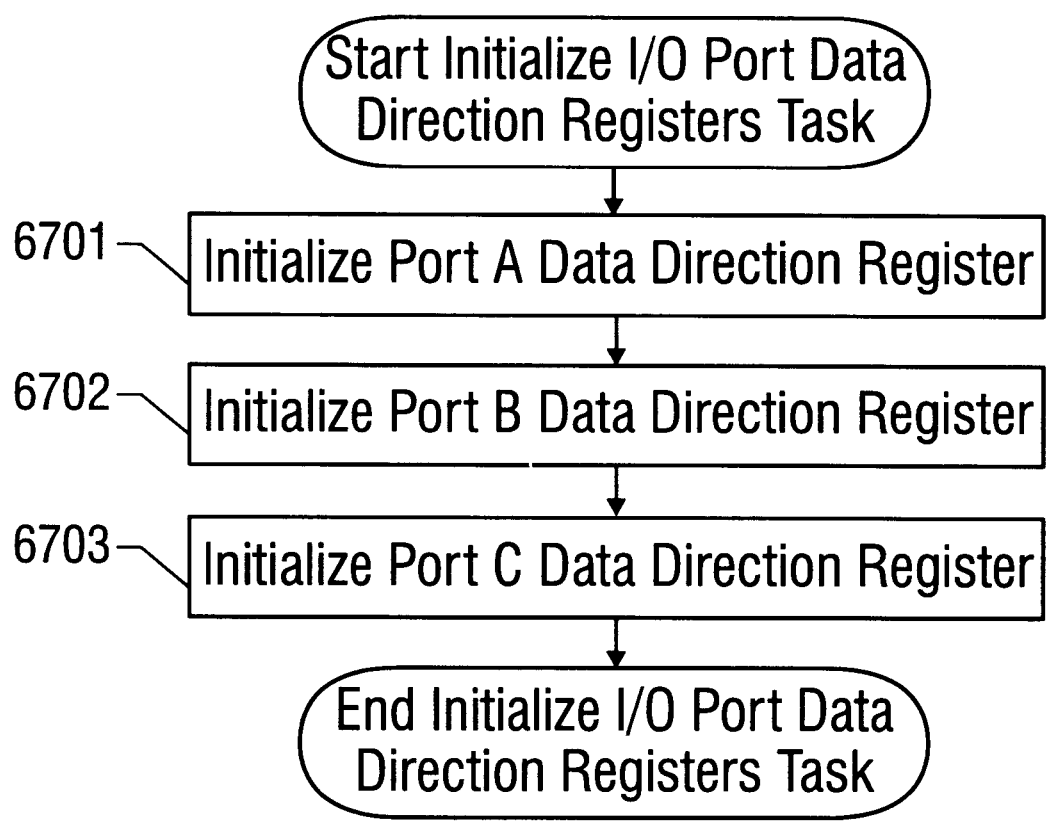
FIG. 67 is the initialize I/O port data direction registers task flowchart for the present invention.

The initialize I/O port data direction registers task periodically resets the I/O ports on the digital microcontroller 229 (FIG. 2). A flowchart of the initialize I/O port data direction registers task is shown in FIG. 67. The Port A (6701), Port B (6702), and Port C (6703) data direction reregisters are periodically reset to ensure proper operation.

The sensor's interrogate task is used to command the sensor into a special mode of operation (for example, a status reporting mode) by using the motion sensing capabilities of the sensor and without the need for adding a mode selection switch. In the exemplary embodiment, the special mode is invoked by the detection of five successive hand waves by the user. A flowchart of the interrogate task of the present invention is shown in FIG. 68. This task is implemented as an eighteen state machine. The state counter (NGATEstate) is monitored at a rate determined by the interrogation counter STATcnt reaches zero (6801). If the state counter ever reaches a value of eighteen, the interrogation has been successfully requested (6802), so the bit allowing the sensor status to be displayed is set and the state counter is set to zero (6803). If the state counter is less than eighteen, the state of the USSense is used to modify the state counter. The two's place bit of the state counter is XOR'ed with the USSense bit (6804) to determine if the state counter should be incremented to the next even state. If the USSense bit contains the desired value, the state is incremented twice and the STATcnt is set equal to FF (6805). If the USSense bit doesn't contain the desired value, the state is evaluated (6806). If NGATEstate is even it is incremented once, and the STATcnt is set equal to FF(6807). This branch of program flow creates all of the odd states. If NGATEstate is odd, NGATEstate is set to zero (6808) By this method, the sensor may be switched from normal mode to status reporting mode using the motion detecting functions of the sensor, and without the need for adding a status mode selection switch.

The sensor's EEPROM task reads and writes data to the sensor's EEPROM. A flowchart of the EEPROM task is shown in FIG. 69. If the EEPROM is not busy (6901), and an EEPROM write task is scheduled (6902), the EEPROM task writes the various sensor variables to the sensor's EEPROM (6903), and then clears the EEPROM write task flag. If the EEPROM is not busy (6901), an EEPROM write task is not scheduled (6902), and an EEPROM read task is scheduled (6904), the EEPROM task reads the various sensor variables from the sensor's EEPROM and then clears the EEPROM read task flag (6905).

Although the description above contains many specifics, these should not be construed as limiting the scope of the invention but as merely providing illustrations of some of the presently preferred embodiments of this invention. For example, the sensor might use one or more subsets of the various detection technologies described above. Similarly, the sensor might use a different digital microcontroller, a different ultrasonic transducer or a different ultrasonic transducer frequency from the exemplary embodiment. Thus the scope of this invention and the method of operating the same should be determined by the appended claims and their legal equivalents and should not be limited to the example embodiments described above.

Table 3 provides a correlation between the attached source code appendix, and the flowcharts of FIGS. 39–69 and 72. The source code appendix is written in the assembly language, and is an example of programming for the digital microcontroller used in the exemplary embodiment to practice the present invention. Other programs may be used without departing from the scope of the invention.

TABLE 3

Source Code Label References for Primary Sensor Tasks

| Figure Number | Description of Routine | Code Label |
|---|---|---|
| 39 | Main (Foreground) Routine | main |
| 40 | Hardware and Variable Initialization Task | 02init |
| 41 | Interrogation Status Report Task | statussend |
| 42 | Two Minute Status Report Task | twominstatus |
| 43 | False On Correction Task | fixfalson |
| 28 | False Off Correction Task | fixfalsoff |
| 45 | Interrupt (Background) Routine | inta |
| 47 | Ultrasonic DSP Task | ultrasonictask |
| 48 | Infrared DSP Task | runPIR |
| 52 | HIGH CONFIDENCE Task | dtdecidenorm |
| 53 | HIGH SENSITIVITY Task | dtHSscheme |
| 55 | Update Counters Task | cntrupdt |
| 56 | Adjust Timer to Minimize Energy Usage Task | reducetimer |
| 57 | MUX Task | runMUXT |
| 61 | LED Task | LEDTASK |
| 62 | LED Status Task | statusled |
| 63 | Relay Suppress Task | suppress |
| 64 | Second Task | SECONDtask |
| 65 | Relay Task | relaytask |
| 66 | Minute Task | mcnt |
| 67 | Initialize I/O Port Data Direction Registers | setTrisRegs |
| 68 | Interrogate | handleSTAT |
| 69 | EEPROM Task | eepromwait |
| 72 | IR Noise Estimate Adaptation | INEMonitorPIRDetector |

```
;
; o2dt32.asm
; COPYRIGHT (C) MYTECH CORP. 1996, 1997
;
carrier set      1
;---------------------------------------------------------------------------------
; The 32Khz carrier
;---------------------------------------------------------------------------------
timvala set      H'067'        ; 0x100–0x67=0x99
                               ; 999.837hz —>
                               ; (fosc/4)/(12 instr+0x98*16)
                               ; the factor of 16 comes from
                               ; the use of the prescaler
tmr2val set      H'04a'        ; 75 decimal, this gives 32Khz carrier
                               ; 32.768Khz=(fosc/4)/75
           include    "o2dt.asm"
           LIST       C=160,N=80,F=INHX8M,P=16C74,R=HEX
           TITLE      "Omni II Dual Technology Sensor"
           SUBTITL    "COPYRIGHT (C) MYTECH CORP. 1996, 1997"
;--------------------------------------------------------
; o2dt.asm                                              -
;                                                       -
; Source code for the Multi-Tech sensor (N=2)           -
; Copyright (C) MYTECH Corp. 1996, 1997                 -
; 7-25-96 JJF                                           -
;                                                       -
;--------------------------------------------------------
           include    "c:\dev\mytech\pic16c74.inc"
           include    "c:\dev\mytech\support.inc"
;
; FLOATOFFSET causes the threshold to be
; offset by ¼ of the average PD output.
;
FLOATOFFSET      set    1
ADAPT            set    1
```

-continued

```
AutoTimerAdj      set     0
useGSB            set     1
useUS             set     1
useIR             set     1
carrier           set     1       ; 0:25Khz;1:32Khz;2:40Khz
useLCD            set     0       ; includes the code for the lcd debug
useDA             set     0       ; includes the code for the da debug
;------------------------------------------------------------
                  ;-------------------------------------------
                  ; we begin page 0 allocations here   -
                  ;-------------------------------------------
                  include    "c:\dev\mytech\o2ctlreg.inc"
                  include    "c:\dev\mytech\o2dtregs.inc"
                  include    "c:\dev\eeprom\o2eeprom.inc"
                  CBLOCK
                             FONREF     ; false-on correction wait counter
                             CHAR       ; used by LCD
                  ENDC
                  ;-------------------------------------------
                  ; we begin page 1 allocations here   -
                  ;-------------------------------------------
                  include    "c:\dev\mytech\adaptreg.inc"
                  CBLOCK
                             STATCNTL
                             STATWORD
                             usPot
                             pirPot
                             FONCNT
                             FOFFCNT
                             lcdcntr    ; used by lcd
                  ENDC
;*******************************
                  if         useDA==1
                  include    "c:\dev\mytech\doutd.inc"
                  endif
                  org        0x1c0
                  include    "c:\dev\mathlib\mathlib.asm"
                  include    "filter.asm"
                  include    "c:\dev\mytech\ledtask.asm"    ; LED task
                  include    "c:\dev\mytech\relaytsk.asm"   ; relay countdown task
                  include    "c:\dev\eeprom\o2e2prom.asm"
                  include    "c:\dev\mytech\muxtask.asm"
                  include    "o2dtinit.asm"
                  include    "dtustask.asm"                 ; ultrasonic sensor task
                  include    "dtirtask.asm"                 ; pir sensor task
;                 include    "c:\dev\mytech\o2lodplr.asm"
                  include    "c:\dev\mytech\o2stat.asm"
                  include    "o2adapt.asm"
                  include    "o2sermon.asm"
                  if         useLCD==1
                  #define    TEMP       MTEMP5
                  include    "c:\dev\lcd\omni2lcd.asm"
                  endif
o2start
;*******************************
; The hardware setup is done here. The
; timers are setup and started.
;*******************************
                  o2init
main
                  movlw      high       noserrpt
                  movwf      PCLATH
                  btfss      CBITS1,7
                  goto       noserrpt
                  bcf        CBITS1,7
                  movlw      high       serrpt
                  movwf      PCLATH
                  call       serrpt
noserrpt
                  if         useLCD==1
                  movlw      high       nolcdreport
                  movwf      PCLATH
                  btfss      CBITS2,3
                  goto       nolcdreport
                  bcf        CBITS2,3
;                 movlw      high       lcdreport
;                 movwf      PCLATH
;                 call       lcdreport
;                 lcdreport
```

-continued

```
nolcdreport
          endif
          ;----------------------------------------------------------
          ; send the interrogation status report if necessary   -
          ;----------------------------------------------------------
          movlw     high      noireport
          movwf     PCLATH
          btfss     ReportTaskEnable
          goto      noireport
          movlw     high      statussend
          movwf     PCLATH
          call      statussend
          ; to prevent the seldom, but possible, event
          ; of an interrogation and a 2 min report from
          ; occurring at the same time
          movlw     high      no2minreport
          movwf     PCLATH
          goto      no2minreport
noireport
          ;----------------------------------------------------------
          ; send the 2 minute status report if it is time     -
          ;----------------------------------------------------------
          movlw     high      no2minreport
          movwf     PCLATH
          btfss     TwoMinStatTaskEnable
          goto      no2minreport
          movlw     high      twominstatus
          movwf     PCLATH
          call      twominstatus
no2minreport
          if        ADAPT==1
          ;----------------------------------------------------------
          ; run the false-on correction if necessary    -
          ;----------------------------------------------------------
          movlw     high      nofalseon
          movwf     PCLATH
          btfss     SBITS,6
          goto      nofalseon
          movlw     high      fixfalseon
          movwf     PCLATH
          call      fixfalseon
          usePage1
          incf      FONCNT,F
          usePage0
nofalseon
          ;----------------------------------------------------------
          ; run the false-off correction if necessary   -
          ;----------------------------------------------------------
          movlw     high      nofalseoff
          movwf     PCLATH
          btfss     SBITS,5
          goto      nofalseoff
          movlw     high      fixfalseoff
          movwf     PCLATH
          call      fixfalseoff
          usePage1
          incf      FOFFCNT,F
          usePage0
nofalseoff
          endif
          movlw     high      novarstore
          movwf     PCLATH
          btfss     SBITS,1             ; is it time to store var's?
          goto      novarstore          ; no
          bcf       SBITS,1             ; disable task
          StoreVarsE2                   ; store the var's
novarstore
mend
          clrwdt
          movlw     high      main
          movwf     PCLATH
          goto      main
;--------------------------------------------------------------------
          org       0
          movlw     high      o2start
          movwf     PCLATH
          goto      o2start             ; reset vector
;----Interrupt Routine (comes here at 1 KHz)
          org       4                   ; interrupt vector location
```

-continued

```
inta
        movwf   TEMPW           ; save w in TEMPW
        swapf   STATUS,W        ; get status (swapf doesn't alter status bits)
        usePage0
        movwf   TEMPS           ; save status in TEMPS
        movf    PCLATH,W
        movwf   TMPPCH
        movf    FSR,W
        movwf   TMPFSR
        movlw   timvala         ; reset RTCC
        movwf   RTCC
        bcf     INTCON,T0IF     ; reset RTCC interrupt flag
        clrf    PCLATH          ; set up page
;----------------------------------------------------------------------
; check the drvrstat pin (PORTC 5) if currently occupied    -
;----------------------------------------------------------------------
        movlw   high    drvrstatchkend
        movwf   PCLATH
        btfss   Occupied
        goto    drvrstatchkend
        btfsc   DriverStatus
        goto    drvrstatchkend  ; since drvrstat is high, then relay driver OK
; we have a problem
        bcf     PORTB,2         ; turn off the relay
        bsf     DriverFailure
        bcf     Occupied
drvrstatchkend
;----------------------------------------------
; run the sensor task if it is enabled    -
;----------------------------------------------
        btfss   SBITS,0
        goto    skipsnsr
        movlw   high    ultrasonictask
        movwf   PCLATH
        call    ultrasonictask
        clrf    PCLATH          ; reset page after call
;---------------------------------------
; do the pir routine every 32ms    -
;---------------------------------------
dopir
        movf    CCNT0,W
        addlw   1               ; time slice offset
        andlw   H'1f'
        btfss   STATUS,Z        ; pir sensor runs at 1Khz/32
        goto    dtdecision
        movlw   high    runPIR
        movwf   PCLATH
        call    runPIR
        clrf    PCLATH          ; reset page after call
dtdecision
;------------------------------------------------------
; This is where we do the composition of     -
; individual technologies to determine        -
; occupancy. We'll handle this differently    -
; depending on the state of the lights and    -
; feature select switches                     -
;------------------------------------------------------
        btfsc   Occupied        ; if occupied use the normal decision algorithm
        goto    dtdecidenorm
; when not occupied for less than ~15sec, always use the HS algorithm
        movf    LOFFTIMEHI,W
        btfss   STATUS,Z        ; if lofftimehi!=0, then >15sec for sure.
        goto    dtdecidenorm
        movf    LOFFTIMELO,W
        andlw   H'f0'           ; if any of upper 4 bits, then >15sec for sure
        btfss   STATUS,Z
        goto    dtdecidenorm
        movlw   high    dtHSscheme
        movwf   PCLATH
        call    dtHSscheme
        clrf    PCLATH
        goto    enddtdecide
dtdecidenorm
        bcf     DualTechSense
        btfsc   options,0
        goto    dtHSmotion
        movlw   high    dtHCscheme
        movwf   PCLATH
        call    dtHCscheme
```

-continued

```
              clrf       PCLATH
              goto       enddtdecide
dtHSmotion
              movlw      high       dtHSscheme
              movwf      PCLATH
              call       dtHSscheme
              clrf       PCLATH              ; reset page
enddtdecide
              ;---------------------------------------------------
              ; we need to compute an average of the    -
              ; time between motion occurences. This    -
              ; quantity is then used as a cue for the  -
              ; ASA algorithm.                          -
              ;---------------------------------------------------
              btfss      DualTechSense
              goto       skipsnsr
              usePage1
              movf       timesincemothi,W
              iorwf      timesincemotlo,W
              usePage0
              btfsc      STATUS,Z            ; ignore this motion occurrence
              goto       cntrupdt            ; if it is less than 1sec since the
                                             ; previous one.
              ;----------------------------------------------------------------------
              ; we'll add code here for looking at the time since motion  -
              ;----------------------------------------------------------------------
              usePage1
              movf       timesincemothi,W
              usePage0
              movwf      TEMP7
              usePage1
              movf       timesincemotlo,W
              subwf      maxtimesincemotlo,W
              usePage0
              movwf      TEMP6
              btfss      STATUS,C            ; borrow?
              incf       TEMP7,F             ; yes
              movf       TEMP7,W
              usePage1
              subwf      maxtimesincemothi,W
              btfsc      STATUS,C            ; borrow?
              goto       cntrupdt            ; no
              ;----------------------------------------------------------------------
              ; the most recent timesincemot is greater than previous max   -
              ; so we need to update the max and manipulate timeradj(?)     -
              ;----------------------------------------------------------------------
              movf       timesincemothi,W
              movwf      maxtimesincemothi
              movf       timesincemotlo,W
              movwf      maxtimesincemotlo
              ; no timer manipulation for now
skipsnsr
cntrupdt
              usePage0
              ;-----------Update Counters----------
              incf       CCNT0,F             ; increment counter low bits (1ms)
              btfss      STATUS,Z            ; zero?
              goto       t1klbl1             ; no...
              incf       CCNT1,F             ; increment counter low mid bits (every 256ms)
              btfss      STATUS,Z            ; zero?
              goto       t1klbl1             ; no...
              incf       CCNT2,F             ; increment counter high mid bits (every 65.536sec)
              btfss      STATUS,Z            ; zero?
              goto       t1klbl1             ; no...
              incf       CCNT3,F             ; yes, increment counter high bits (every 4.66hrs)
              btfsc      STATUS,Z            ; if CCNT3 rolls over,
              bsf        CntrRollOver        ; set the flag
              ;---------------------------------------------------------------
              ; here we add the hooks for manipulating the timer
              ;---------------------------------------------------------------
              movlw      high       reducetimer
              movwf      PCLATH
              call       reducetimer
              clrf       PCLATH
              ;------------------------------------------------------------------------
              ; we also need to store the adaptation variables in EEPROM    -
              ;------------------------------------------------------------------------
              bsf        SBITS,1
t1klbl1       nop
```

-continued

```
                btfsc       FourMinOnBit
                goto        morethan4
                movlw       H'fc'                   ; mask off upper 6 bits
                andwf       CCNT2,W
                btfss       STATUS,Z                ; if any of lower 2 bits set, then power on for
                bsf         FourMinOnBit            ; for more than 4min, set the appropriate bit
morethan4
                ;-----------------------------------------------------
                ; The muxtask gets called at a 16ms rate   -
                ; The effective sample rate of the A/D     -
                ; readings coming through is 15hz.         -
                ;-----------------------------------------------------
                movf        CCNT0,W
                addlw       3                       ; time slice offset
                andlw       H'0f'
                btfss       STATUS,Z
                goto        nomux
                movlw       high        runMUXT
                movwf       PCLATH
                call        runMUXT
                clrf        PCLATH                  ; reset the page
nomux
;               movlw       high        lowfdoppler
;               movwf       PCLATH
;               call        lowfdoppler
;               clrf        PCLATH
                movlw       99h                     ; 1001 1001 enable channel3 a/d again
                movwf       ADCON0                  ; (This is the receiver a/d.)
                                                    ; We switch it now so the mux will settle
                                                    ; in time for the reading.
                ; We will clock the LED every 4ms
;               movlw       high        skipled
;               movwf       PCLATH                  ; don't forget to setup the goto's!!!
                btfss       SBITS,2                 ; is LED scheduled to run?
                goto        skipled                 ; no. so skip task.
                movlw       high        LEDTASK
                movwf       PCLATH
                call        LEDTASK
                clrf        PCLATH
skipled
                btfss       CBITS3,7                ; is green LED scheduled to run?
                goto        skipgled                ; no. so skip task.
                if useDA==0
                movlw       high        gLEDTASK
                movwf       PCLATH
                call        gLEDTASK
                clrf        PCLATH
                endif
skipgled
                btfss       Suppress
                goto        nosprs
                movlw       high        suppress
                movwf       PCLATH
                call        suppress
                clrf        PCLATH                  ; reset page
nosprs
SECONDtask
                movlw       high        endSECOND
                movwf       PCLATH
                movf        SECONDreflo,W
                subwf       CCNT0,W                 ; CCNT0-SECONDreflo
                btfss       STATUS,Z
                goto        endSECOND
                movf        SECONDrefhi,W           ; movf only affects the Z bit
                btfss       STATUS,C                ; did the subtract borrow?
                incf        SECONDrefhi,W           ; yes.(SECONDrefhi borrows from CCNT1)
                subwf       CCNT1,W                 ; CCNT1-SECONDrefhi
                btfss       STATUS,Z
                goto        endSECOND
                ; setup for the next second
                movlw       H'e8'
                addwf       SECONDreflo,F
                btfsc       STATUS,C
                incf        SECONDrefhi,F
                movlw       H'03'
                addwf       SECONDrefhi,F           ; 03e8h is 1000d
                incf        SECONDLO,F
                btfsc       STATUS,C
                incf        SECONDHI,F              ; SECONDHI:SECONDLO increments every 1.0s
```

-continued

```
                btfss       Occupied
                goto        secrelay
                usePage1
                incf        timesincemotlo,F
                btfsc       STATUS,Z
                incf        timesincemothi,F
                usePage0
secrelay
                movlw       high        relaytask
                movwf       PCLATH
                btfsc       SBITS,3                 ; is the relay on?
                call        relaytask               ; yes, so service the countdown task.
                clrf        PCLATH
                ; read the option bits
                bcf         options,0
                btfss       DTSwitch                ; invert switch logic
                bsf         options,0
                bcf         options,1
                btfss       LEDOverride             ; invert switch logic
                bsf         options,1
                bcf         options,2
                btfss       AdaptReset              ; invert switch logic
                bsf         options,2
                ; determine if the options have been changed
                usePage1
                movf        lastoption,W
                andlw       H'7f'                   ; mask off bit 7
                usePage0
                movwf       TEMPLO
                movlw       H'7f'                   ; mask off bit 7
                andwf       options,W
                subwf       TEMPLO,W
                btfsc       STATUS,Z
                goto        no1secasareset
                ;--------------------------------------------------------
                ; options changed, so reset the asa variables     -
                ; need to verify this feature                     -
                ;--------------------------------------------------------
                clrf        usonadj
                clrf        usoffadj
                clrf        iroffadj
                clrf        timeradjlo
                clrf        timeradjhi
                clrf        CCNT3
                bcf         CntrRollOver
                ;!!!!!!!!!
                ; should we add code to reset e2prom var's????
                ;!!!!!!!!!
no1secasareset
                movf        options,W
                usePage1
                movwf       lastoption
                usePage0
                ;---------------------------------------------------------------
                ; when a driver failure has been declared, we should    -
                ; periodically clear the bit, this prevents the         -
                ; sensor from having permanent failure.                 -
                ;---------------------------------------------------------------
                movlw       high        secdrvrchkend
                movwf       PCLATH
                movlw       H'03'                   ; check every 4sec
                andwf       SECONDLO,W
                btfss       STATUS,Z
                goto        secdrvrchkend
                btfsc       DriverFailure
                bcf         DriverFailure
secdrvrchkend
                ;----------------------------------------
                ; this is used for the lcd report    -
                ;----------------------------------------
                btfss       SECONDLO,0
                bsf         CBITS2,3
                ;----------------------------------------
                ; this is for the serial report    -
                ;----------------------------------------
                movlw       H'07'                   ; every 8sec
                andwf       SECONDLO,W
                btfsc       STATUS,Z
                bsf         CBITS1,7
```

-continued

```
              movlw      high       ltsoff
              movwf      PCLATH
              btfss      CBITS1,2          ; are the lights on?
              goto       ltsoff            ; no. goto lights off SECOND
ltson
              incf       LONTIMELO,F
              btfsc      STATUS,Z
              incf       LONTIMEHI,F
              movf       LONTIMELO,W       ; have the lights been on 8+sec?
              andlw      H'f8'             ; only if any of upper 5 bits set
              btfss      STATUS,Z
              bsf        CBITS2,6          ; yes, so set the 8sec lights on flag
              goto       endSECOND
ltsoff
              incf       LOFFTIMELO,F
              btfsc      STATUS,Z
              incf       LOFFTIMEHI,F
              if         useGSB==1
                  movf       LOFFTIMELO,W
                  andlw      H'e0'         ; if any of upper 3 bits set
                  btfsc      STATUS,Z      ; then lights off > 30 sec
                  goto       ltsoffnogsb
                  ; when the gsb switch is turned on, we need
                  ; to set usgain to the offgain value which
                  ; is .75 of the ongain value corresponding
                  ; to the square law mapped pot setting
                  movf       usoffgain,W
                  btfsc      GSBEnable     ; is gsb turned on?
                  movwf      usgain        ; yes.
ltsoffnogsb
              endif
endSECOND
mcnt          movlw      high       endmcnt
              movwf      PCLATH
              movf       mcntref,W
              subwf      SECONDLO,W
              btfss      STATUS,Z
              goto       endmcnt
              ; setup for the next minute
              movlw      D'60'
              addwf      mcntref,F
              incf       mcntlo,F          ; mcntlo increments once every minute
              btfsc      STATUS,C
              incf       mcnthi,F
              ;----------------------------------------------------------------
              ; no two minute status when the LED override switch is on    -
              ;----------------------------------------------------------------
              btfsc      NoLEDFlag
              goto       skip2minstatus
              btfss      mcntlo,0          ; do status every other minute
              bsf        TwoMinStatTaskEnable
skip2minstatus
              ;----------------------------------------------------------------
              ; Per Microchip advice, we need to periodically reset    -
              ; the TRIS registers
              ;----------------------------------------------------------------
              movlw      high       setTrisRegs
              movwf      PCLATH
              call       setTrisRegs
              clrf       PCLATH
              ;----------------------------------------------------------------
              ; When in installer test mode, we need to come out of   -
              ; it after an hour. Increment and Check ITMClk.         -
              ;----------------------------------------------------------------
              movlw      high       min_noitm
              movwf      PCLATH
              btfss      InstallerTestMode
              goto       min_noitm
              incf       ITMClk,F
              movlw      D'60'
              subwf      ITMClk,W          ; W = ITMClk - 60
              btfss      STATUS,C          ; if borrow, then <60 min in test mode
              goto       min_noitm         ; the subtract borrowed
              ; get out of test mode
              bcf        InstallerTestMode
min_noitm
              ;----------------------------------------------------------------
              ; in order to get a better estimator of the ir noise    -
              ; level, we maintain a running max of the noise. Once   -
```

-continued

```
                ; every minute this running max is compared with the   -
                ; current ir noise estimate. The largest is the new    -
                ; noise estimate of the ir circuit.                    -
                ;---------------------------------------------------------
                usePage1
                movf      irRecentMax,W
                usePage0
                movwf     TEMP8
                usePage1
                movf      irNoiseEst,W
                usePage0
                movwf     TEMP7
                movlw     high      max
                movwf     PCLATH
                call      max
                clrf      PCLATH
                usePage1
                movwf     irNoiseEst
                movlw     H'80'
                movwf     irRecentMax
                usePage0
endmcnt
                ;---------------------------------------------------
                ; service the interrogate task if necessary    -
                ;---------------------------------------------------
                movlw     high      nostat
                movwf     PCLATH
                btfss     Interrogating
                goto      nostat
statcntr
                decfsz    NTRGATEcnt
                goto      nostat
dostat
                movlw     high      handleNTRGATE
                movwf     PCLATH
                call      handleNTRGATE
nostat
                ;---------------------------------------------------------------
                ; The eeprom code is placed in the interrupt routine so     -
                ; that it will not be disturbed by interrupts, otherwise    -
                ; interrupts may have to be disabled during eeprom read/write.  -
                ;---------------------------------------------------------------
                movlw     high      eepromwrite
                movwf     PCLATH
eepromwait
                btfss     E2FLAG,1
                goto      eepromwrite
                movlw     high      eepromdlyend
                movwf     PCLATH
                movf      CCNT0,W
                subwf     E2DLY,W
                btfsc     STATUS,Z          ; is it exactly 11ms?
                goto      eepromdlyend      ; yes
                btfss     STATUS,C          ; if not, did the subtract borrow (more than 11ms)
eepromdlyend
                bcf       E2FLAG,1          ; yes
eepromwrite
                movlw     high      eepromread
                movwf     PCLATH
                btfss     EEPROMWTASK       ; is an eeprom write scheduled?
                goto      eepromread        ; no...
                movlw     high      endeeprom
                movwf     PCLATH
                btfsc     E2FLAG,1          ; is the EEPROM still writing?
                goto      endeeprom         ; yes
                movlw     high      WRBYTE
                movwf     PCLATH
                call      WRBYTE
                bcf       EEPROMWTASK
                movlw     high      endeeprom
                movwf     PCLATH
                goto      endeeprom         ; if we have just written, then we can't
                                            ; read for ~11ms so jump over read task
eepromread
                movlw     high      endeeprom
                movwf     PCLATH
                btfss     EEPROMRTASK
                goto      endeeprom
                btfsc     E2FLAG,1          ; is the EEPROM still writing?
```

```
                    goto       endeeprom        ; yes
                    movlw      high    RDBYTE
                    movwf      PCLATH
                    call       RDBYTE
                    bcf        EEPROMRTASK
endeeprom
endi                clrwdt
                    movf       TMPFSR,W
                    movwf      FSR
                    movf       TMPPCH,W
                    movwf      PCLATH
                    swapf      TEMPS,W
                    movwf      STATUS           ; restore status
                    swapf      TEMPW,F          ; swap value in TEMPW
                    swapf      TEMPW,W          ; restore w register
retfi               retfie                      ; return from interrupt
dtHC                ;------------------------------------------------------
                    ; To do the high confidence operation, we     -
                    ; use a modified bounded sum operator.        -
                    ;------------------------------------------------------
                    movlw      high    dtHC0
                    movwf      PCLATH
                    movf       ustruth,W
                    addwf      pirtruth,W
                    movwf      TEMP6            ; TEMP6 = truth
                    movlw      H'60'            ; 0x60 is the lower truth limit
                    subwf      TEMP6,F
                    btfss      STATUS,C         ; borrow?
                    goto       dtHC0            ; yes, so no motion for sure
                    movf       TEMP6,W
                    btfsc      TEMP6,7
                    movlw      H'7f'
                    return
dtHC0
                    clrw
                    return
dtHS                movlw      high    dtHSmax
                    movwf      PCLATH
                    movf       ustruth,W
                    addwf      pirtruth,W
                    movwf      TEMP9
                    btfsc      TEMP9,7
                    goto       dtHSmax          ; if overflow return 7fh
;                   movlw      07fh
                    return
dtHSmax
                    movlw      H'07f'
                    return
dtHCscheme
                    btfsc      Occupied         ; are we currently occupied?
                    goto       stilloccup       ; yes...see if lights on timer should be reset
                    movlw      high    dtHC
                    movwf      PCLATH
                    call       dtHC             ; w = HC(ustruth,pirtruth)
                    movwf      TEMP9
                    ;------------------------------------------------------
                    ; We want the truth to be >= limit
                    ;------------------------------------------------------
amoccuptst
                    movlw      high    amoccup_yes
                    movwf      PCLATH
                    movf       TEMP9,W
                    sublw      H'040'           ; 40h - W
                    btfsc      STATUS,Z         ; is the truth exactly what we want?
                    goto       amoccup_yes      ; yes...space is occupied
                    btfsc      STATUS,C         ; is the truth > limit
                    return                      ; no...space not occupied
                    ;------------------------------------------------------
                    ; We have determined that the lights should    -
                    ; be turned on.                                -
                    ;------------------------------------------------------
amoccup_yes
                    movlw      high    turnOnLights
                    movwf      PCLATH
                    call       turnOnLights     ; turn on lights + bookkeeping
                    clrf       PCLATH
                    bsf        DualTechSense
                    return
```

-continued

```
stilloccup
                ;-----------------------------------------------------
                ; Since we are currently occupied we use    -
                ; the high sensitivity operation            -
                ;-----------------------------------------------------
                movlw       high        dtHS
                movwf       PCLATH
                call        dtHS
                movwf       TEMP9
stilloccuptst
                ;-----------------------------------------------------
                ; We want the truth to be >= limit
                ;-----------------------------------------------------
                movlw       high        dt1occup_yes
                movwf       PCLATH
                movf        TEMP9,W
                sublw       H'07f'                  ; limit - W
                btfsc       STATUS,Z                ; is the truth exactly what we want?
                goto        dt1occup_yes            ; yes...reset the relay
                btfsc       STATUS,C                ; is the truth > than limit
                return                              ; no...
                ;-----------------------------------------------------
                ; We have determined that the lights should   -
                ; be kept on.                                  -
                ;-----------------------------------------------------
dt1occup_yes
                movlw       high        setrelay
                movwf       PCLATH
                call        setrelay                ; this will simply reset the
                                                    ; relay countdown timer
                bsf         DualTechSense
dt1end          return
dtHSscheme
                movlw       high        dtHS
                movwf       PCLATH
                call        dtHS
                movwf       TEMP9
                ;-----------------------------------------------------
                ; We want the truth to be >= limit
                ;-----------------------------------------------------
                movlw       high        dt2occup_yes
                movwf       PCLATH
                movf        TEMP9,W
                sublw       H'07f'                  ; limit - W
                btfsc       STATUS,Z                ; is the truth exactly what we want?
                goto        dt2occup_yes            ; yes...reset the relay
                btfsc       STATUS,C                ; is the truth > than limit
                return                              ; no...
                ;-----------------------------------------------------
                ; We have determined that motion is present   -
                ;-----------------------------------------------------
dt2occup_yes
                btfsc       Occupied                ; are we currently occupied?
                goto        dt2stilloccup           ; yes...lights on timer should be reset
                movlw       high        turnOnLights
                movwf       PCLATH
                call        turnOnLights
                clrf        PCLATH
                bsf         DualTechSense
                return
dt2stilloccup
                movlw       high        setrelay
                movwf       PCLATH
                call        setrelay                ; this will simply reset the
                                                    ; relay countdown timer
                bsf         DualTechSense
dt2end          return
                END
; pic16c74.inc
; COPYRIGHT (C) MYTECH CORP. 1996, 1997
;----- STATUS Bits -----------------------------------------------------------------------------
IRP             EQU         H'0007'
RP1             EQU         H'0006'
RP0             EQU         H'0005'
NOT_TO          EQU         H'0004'
NOT_PD          EQU         H'0003'
Z               EQU         H'0002'
DC              EQU         H'0001'
C               EQU         H'0000'
```

-continued

| | | | |
|---|---|---|---|
| W | EQU | H'0000' | |
| F | EQU | H'0001' | |
| INDF | equ | 00h | |
| RTCC | equ | 01h | |
| PCL | equ | 02h | |
| STATUS | equ | 03h | |
| FSR | equ | 04h | |
| PORTA | equ | 05h | |
| PORTB | equ | 06h | |
| PORTC | equ | 07h | |
| PORTD | equ | 08h | |
| PORTE | equ | 09h | |
| TRISA | equ | 05h | |
| TRISB | equ | 06h | |
| TRISC | equ | 07h | |
| TRISD | equ | 08h | |
| TRISE | equ | 09h | |
| PCLATH | equ | 0ah | |
| ADCON0 | equ | 1fh | |
| ADCON1 | equ | 1fh | ; must be in page 1 |
| ADRES | equ | 1eh | |
| INTCON | equ | 0bh | |
| OPTREG | equ | 01h | ; must be in page 1 |
| PIR1 | equ | 0ch | |
| PIE1 | equ | 0ch | ; must be in page 1 |
| PIR2 | equ | 0dh | |
| PIE2 | equ | 0dh | ; must be in page 1 |
| TMR1L | equ | 0eh | |
| PCON | equ | 0eh | ; must be in page 1 |
| TMR1H | equ | 0fh | |
| T1CON | equ | 10h | |
| TMR2 | equ | 11h | |
| T2CON | equ | 12h | |
| PR2 | equ | 12h | ; must be in page 1 |
| SSPBUF | equ | 13h | |
| SSPADD | equ | 13h | ; must be in page 1 |
| SSPCON | equ | 14h | |
| SSPSTAT | equ | 14h | ; must be in page 1 |
| CCPR1L | equ | 15h | |
| CCPR1H | equ | 16h | |
| CCP1CON | equ | 17h | |
| RCSTA | equ | 18h | |
| TXSTA | equ | 18h | ; must be in page 1 |
| TXREG | equ | 19h | |
| SPBRG | equ | 19h | ; must be in page 1 |
| RCREG | equ | 1ah | |
| CCPR2L | equ | 1bh | |
| CCPR2H | equ | 1ch | |
| CCP2CON | equ | 1dh | |
| ;----- INTCON Bits (except ADC/Periph) ----------------------------------------------------------------- | | | |
| GIE | EQU | H'0007' | |
| PEIE | equ | H'06' | |
| T0IE | EQU | H'0005' | |
| INTE | EQU | H'0004' | |
| RBIE | EQU | H'0003' | |
| T0IF | EQU | H'0002' | |
| INTF | EQU | H'0001' | |
| RBIF | EQU | H'0000' | |
| ;----- OPTION Bits ------------------------------------------------------------------------------------- | | | |
| NOT_RBPU | EQU | H'0007' | |
| INTEDG | EQU | H'0006' | |
| T0CS | EQU | H'0005' | |
| T0SE | EQU | H'0004' | |
| PSA | EQU | H'0003' | |
| PS2 | EQU | H'0002' | |
| PS1 | EQU | H'0001' | |
| PS0 | EQU | H'0000' | |
| ;----- ADCON0 Bits ------------------------------------------------------------------------------------- | | | |
| ADCS1 | EQU | H'0007' | |
| ADCS0 | EQU | H'0006' | |
| CHS2 | EQU | H'0005' | |
| CHS1 | EQU | H'0004' | |
| CHS0 | EQU | H'0003' | |
| GO | EQU | H'0002' | |
| GO_DONE | EQU | H'0002' | |
| ADON | EQU | H'0000' | |
| ;----- ADCON1 Bits ------------------------------------------------------------------------------------- | | | |
| PCFG2 | EQU | H'0002' | |
| PCFG1 | EQU | H'0001' | |

```
PCFG0           EQU         H'0000'
;----- PIE1 and PIR1 ADC Bits
;--------------------------------------------------------------------------------
ADIE            EQU         H'0006'
ADIF            EQU         H'0006'
TXIF            EQU         H'04'
RCIF            EQU         H'05'
;----- I2C Bits for PIR1 and PIE1---------------------------------
SSPIE           equ         H'03'       ;PIE1
SSPIF           equ         H'03'       ;PIR1
^Z
; support.inc
; COPYRIGHT (C) MYTECH CORP. 1996, 1997
;
LSB                         equ         0
#define__C                  STATUS,C
;*********************
;
; John's macro's
;*********************
;
usePage0        macro
                bcf         STATUS,5                ; select page 0
                endm
usePage1        macro
                bsf         STATUS,5                ; select page 1
                endm
; all uses of this macro depend on
; no changes to W
disableInts     macro
                bcf         INTCON,GIE              ; disable global interrupts
                endm
; all uses of this macro depend on
; no changes to W
enableInts      macro
                bsf         INTCON,GIE              ; enable global interrupts
                endm
;
;
;
;
;
;
; all uses of this macro depend on
; no changes to W
enterCritical   macro
                disableInts
                endm
; all uses of this macro depend on
; no changes to W
exitCritical    macro
                enableInts
                endm
; push — push the contents of W onto
; the stack and dec the stack pointer.
; Thw W register is not affected.
pushw           macro
                movwf       INDF
                decf        FSR,F
                endm
; pop — get the value pointed to by the
; stack and inc the stack pointer. The
; value is returned in W.
popw            macro
                movf        INDF,W
                incf        FSR,F
                endm
i16lsrw         macro       hireg,loreg
                rlf         hireg,W
                rrf         hireg,F
                rrf         loreg,W
                endm
i16lsr          macro       hireg,loreg
                rlf         hireg,W
                rrf         hireg,F
                rrf         loreg,F
                endm
i16lsl          macro       hireg,loreg
                bcf         STATUS,C
                rlf         loreg,F
                rlf         hireg,F
                endm
```

-continued

```
chkof     macro
          btfsc     STATUS,C
          incf      overflow
          endm
chkuf     macro
          btfss     STATUS,C
          incf      underflow
          endm
jmpl      macro     addr
          movlw     high      addr
          movwf     PCLATH
          goto      addr
          endm
icall     macro     addr
          movwf     INDF
          movlw     high      addr
          movwf     PCLATH
          movf      INDF,W
          call      addr
          endm
;
; o2ctlreg.inc
; COPYRIGHT (C) MYTECH CORP. 1996, 1997
; control registers for the Omni II
;
; 7-22-96 JJF
;----------------------------------------------------------------------------------------------------
;----------------------------------------------------------------------------------------------------
          CBLOCK   0x20
                   TEMPW          ; this exists at both 20h and a0h
                   TEMPS
                   TMPPCH
                   TMPFSR
                   CCNT0          ; 1ms ticks
                   CCNT1          ; 256 ms ticks
                   CCNT2          ; 65.536sec ticks
                   CCNT3          ; 16777.216sec ticks
                                  ; 279.62min=4.66hr ticks
                                  ; max ctr is 1188hours(49.5days)
                   CBITS1         ; bit  0: 1-US sense motion
                                  ;      1: 1-PIR sense motion
                                  ;      2: 1-occupied bit
                                  ;      3: 1-US ON
                                  ;      4: 1-PIR ON
                                  ;      5: 1-power on for 60+ minutes
                                  ;      6: 1-Installer Test Mode enable
                                  ;      7: used with Serial Debug Report
                   CBITS2         ; bit  0: 1-US dominant;0-IR dominant
                                  ;      1: 1-lights off 1+sec flag
                                  ;      2: 1-Counter has rolled over
                                  ;      3: used with LCD Debug
                                  ;      4: 1-GSB enable flag
                                  ;      5: 1-False-Off Timer return state
                                  ;      6: 1-False-Off timer return enabled
                                  ;      7: 1-DRVRSTAT Failure!!!
                   CBITS3         ; bit  0: 1-sensitivity too high
                                  ;      1: 1-Two minute status report enabled
                                  ;      2: 1-EEPROM write task enabled
                                  ;      3: 1-EEPROM read task enabled
                                  ;      4: 1-ASA reset signal
                                  ;      5: 1-interrogate task enabled
                                  ;      6: 1-interrogation report task enabled
                                  ;      7: 1-Green LED task enabled
                   SBITS          ; bit  0: 1-sensor task enabled
                                  ;      1: 1-Store Vars task enabled
                                  ;      2: 1-Red LED task enabled
                                  ;      3: 1-lights-on countdown
                                  ;      4: 1-relay suppress enable
                                  ;      5: 1-false off correction
                                  ;      6: 1-false on correction
                                  ;      7: 1-periodic ASA
                   TEMPLO         ; These temp registers are for use
                   TEMPHI         ; in the interrupt routine ONLY!
                   TEMP6          ; ''
                   TEMP7          ; ''
                   TEMP8          ; ''
                   TEMP9          ; ''
                   MTEMP          ; These temp registers are for use
                   MTEMP1         ; in the main loop ONLY!
```

-continued

```
                MTEMP2              ; ' '
                MTEMP3              ; ' '
                MTEMP4
                MTEMP5
                TMRPOTHI            ; the lights on timer setting in seconds
                TMRPOTLO
                timeradjhi
                timeradjlo
                SECONDHI            ; this is the 1 second counter
                SECONDLO
                SECONDrefhi         ; the reference for the 1sec counter
                SECONDreflo         ; relative to the 1ms counter, when
                                    ; SECONDHI:SECONDLO increments, ie once/sec,
                                    ; SECONDrefhi:SECONDreflo is set to 1000 +
                                    ; CCNT1:CCNT0.(CCNT0 increments every ms)
                relaylo             ; this is the relay task counter. it is
                relayhi             ; decremented once every second.
                sprscnt             ; this is the relay suppress counter.
                mcnthi              ; the minute counter
                mcntlo
                mcntref             ; the minute counter reference, relative
                                    ; to the second counter.
                LOFFTIMEHI
                LOFFTIMELO
                LONTIMEHI
                LONTIMELO
                options             ; bits 0-2: dual tech mode
                                    ; bit 3: strong air compensation
                                    ; bit 4: ASA enable
                                    ; bit 5: ATA enable
                                    ; bit 6: GSB enable
                                    ; bit 7: dt motion sense
                NTRGATEcnt
                NTRGATEstate
                FCOUNT              ; generic lowpass corner freq. control
                ITMClk              ; installer test mode clock (minutes)
                lastTimer           ; for determining test mode entry/exit
        ENDC
;
; convenient macros for bit addresses
;
#define Occupied                CBITS1,2
#define RelayEnable             CBITS2,1
#define Relay                   PORTB,2
#define DLCRelay                PORTA,2
#define USSense                 CBITS1,0
#define IRSense                 CBITS1,1
#define GreenLEDEnable          CBITS3,7        ; the task enable bit
#define GreenLED                PORTA,4
#define TwoMinStatTaskEnable    CBITS3,1
#define EEPROMWTASK             CBITS3,2
#define EEPROMRTASK             CBITS3,3
#define Interrogating           CBITS3,5
#define ReportTaskEnable        CBITS3,6
#define Suppress                SBITS,4
#define StrongAirCompensate     options,3
#define ASAEnable               options,4
#define ATAEnable               options,5
#define GSBEnable               options,6
#define NoLEDFlag               options,1
#define FourMinOnBit            CBITS1,5
#define InstallerTestMode       CBITS1,6
#define ASATimerReturn          CBITS2,6
#define ASATimerReturnState     CBITS2,5
#define CntrRollOver            CBITS2,2
#define DTSwitch                PORTB,0
;#define DTSwitch2              PORTB,6
;#define DTSwitch3              PORTB,7
#define LEDOverride             PORTB,6
#define AdaptReset              PORTB,7
#define DriverStatus            PORTC,5
#define DriverFailure           CBITS2,7

; o2dtregs.inc
;
; register allocations for the dual tech sensor
; COPYRIGHT (C) MYTECH CORP. 1996, 1997
        include     "c:\dev\mytech\o2usregs.inc"
        include     "c:\dev\mytech\o2irregs.inc"
```

-continued

```
            CBLOCK
                        pirtruth
                        ustruth
                        LightLevel      ; the photocell A/D reading
            ENDC
#define DualTechSense   options,7
;
; o2irregs.inc
; COPYRIGHT (C) MYTECH CORP. 1996, 1997
; register allocations for the Omni II PIR Sensor
;
;--------------- globals ---------------
            CBLOCK
;                       PIRadin         ; PIR
                        PIRLPLO         ; PIR
                        PIRLPHI         ; PIR
                        PIRthresh
                        iroffadj
                        PIRAVGLO
                        PIRAVGHI
                        pirdecision
                        irpscnt
                        gLEDST          ; Green LED state
                        gLEDSELECT      ; Green LED function select
                        gLEDCNTR        ; Green LED TASK counter
                        ENDC
;
; o2usregs.inc
; COPYRIGHT (C) MYTECH CORP. 1996, 1997
; register allocations for the Omni II US sensor
;
            CBLOCK
                        w2hi            ; filter state memory
                        w2lo
                        w1hi
                        w1lo
                        AD1LPLO
                        AD1LPHI
;                       lfdlplo
;                       lfdlphi
;                       lfdtemp
                        usgain          ; the currently used gain setting,
                        usongain
                        usonadj
                        usoffadj        ; the ASA algorithm alters this variable.
                                        ; it is added to usoffgain.
                        usoffgain       ; the gain when the lights are off
                        decimlo
                        decimhi
                        RECTAVGlo
                        RECTAVGhi
                        integhi         ; the 16bit integrator output
                        integlo
                        usdecision
                        uspscnt         ; pulse stretch cnt
                        LEDST           ; Red LED state
                        LEDSELECT       ; Red LED function select
                        LEDCNTR         ; Red LED TASK counter
                        ENDC
VC1hi       set         w1hi
VC1lo       set         w1lo
IL1hi       set         w2hi
IL1lo       set         w2lo
;
; o2asareg.inc
; COPYRIGHT (C) MYTECH CORP. 1996, 1997
; register allocations for the Omni II
; ASA algorithm.
;
            CBLOCK      0xb0
                        usLearnCoef
                        irLearnCoef
                        timerLearnCoef
                        irNoiseEst
                        irRecentMax
                        avgtimesincemot
                        timesincemotlo
                        timesincemothi
                        maxtimesincemotlo
```

-continued

```
                    maxtimesincemothi
                    lastoption
                    dominantTech
                    uspulsecnt0
                    uspulsecnt1
                    uspulsemax
                    usminpulse
                    usminpw0
                    usminpw1
            ENDC
            CBLOCK
                    E2FLAG    ; Common flag bits register
                    E2BUF     ; Bit buffer
                    E2ERR     ; Error code (to indicate bus status)
                    E2ADDR    ; Address register
                    DATAI     ; Stored data input register
                    DATAO     ; Stored data output register
                    E2WBUF    ; Write buffer
                    E2RBUF    ; Read buffer
                    E2CNT     ; Bit counter
                    E2DLY     ; Delay variable
;                   SLAVE
            ENDC
FLAG    set         E2FLAG
EEPROM  set         E2BUF
ERCODE  set         E2ERR
ADDR    set         E2ADDR
TXBUF   set         E2WBUF
RXBUF   set         E2RBUF
COUNT   set         E2CNT
;#define            SLAVE     B'10101110'    ; eeprom address in I2C space
;#define            SLAVE     B'10100000'
;************************************************
;
; Convenient Stuff for addressing bits
;************************************************
;
; FLAG Bits
;
ERRORFLG EQU    0                   ; Error flag
;
; EEPROM Bits
;
DI      EQU     7                   ; EEPROM input
DO      EQU     6                   ; EEPROM output
;******************************************
; PIC I2C Pin Assignments
;******************************************
SDA     EQU     4                   ; RC4, data in/out
SCL     EQU     3                   ; RC3, serial clock
;SDA    EQU     6
;SCL    EQU     7
;
; mathlib.asm
; COPYRIGHT (C) MYTECH CORP. 1996, 1997
; 10-3-96 JJF
;
;---------------------------------------------------------------
; Bin2BCD — This routine converts the 8bit          -
; binary value in W to a 3 digit BCD value          -
; in the registers MTEMP3:MTEMP2:MTEMP1.            -
; MTEMP1 is the least significant digit.           -
;---------------------------------------------------------------
Bin2BCD
            clrf      MTEMP2
            clrf      MTEMP3
            movwf     MTEMP1
bin2bcdlbl1
            movlw     D'10'
            subwf     MTEMP1,W       ; MTEMP1 - 10
            btfss     STATUS,C
            goto      bin2bcdlbl2
            movwf     MTEMP1
            incf      MTEMP2
            goto      bin2bcdlbl1
bin2bcdlbl2
            movlw     D'10'
            subwf     MTEMP2,W       ; MTEMP2 - 10
            btfss     STATUS,C
            goto      bin2bcdlbl3
            movwf     MTEMP2
```

-continued

```
              incf     MTEMP3
              goto     bin2bcdlbl2
bin2bcdlbl3
              retlw    0
;-----------------------------------------------------------
; filter.asm -
; COPYRIGHT (C) MYTECH CORP. 1996, 1997
;-----------------------------------------------------------
;------------------------------------------------------------------
; genlp — generic lowpass filter
; Inputs: FSR — points to low byte of
;                filter state
;         FCOUNT — divide count which
;                  sets the corner freq
;                  values are 1–7.
;         TEMP9:TEMP7 — 16bit input sample
;
; corner frequency is approximately:
;         (fs/2pi)*ln(2^FCOUNT/(2^FCOUNT-1))
;------------------------------------------------------------------
genlp
              movf     INDF,W
              movwf    TEMPLO
              incf     FSR,F              ; point to high byte
              movf     INDF,W
              decf     FSR,F              ; return pointer to low byte
              movwf    TEMPHI
              comf     TEMPLO,F
              incf     TEMPLO,F
              btfsc    STATUS,Z
              decf     TEMPHI,F
              comf     TEMPHI,F           ; -lpstate
              movf     TEMP7,W
              addwf    TEMPLO,F
              btfsc    STATUS,C
              incf     TEMPHI,F
              movf     TEMP9,W
              addwf    TEMPHI,F           ; TEMPHI:TEMPLO has input - lpstate
              movlw    high    genlploop
              movwf    PCLATH
genlploop
              rlf      TEMPHI,W
              rrf      TEMPHI,F
              rrf      TEMPLO,F
              decfsz   FCOUNT,F
              goto     genlploop
              movf     TEMPLO,W
              addwf    INDF,F
              incf     FSR,F              ; point to high byte
              btfsc    STATUS,C
              incf     INDF,F
              movf     TEMPHI,W
              addwf    INDF,F             ; lpstate is updated to
                                          ; lps[n] = x[n] + (x[n] - lps[n-1]/(FCOUNT+1))
              return
;----------------------------------------------------
; highpass -                                -
; Input: ADVAL - 8bit input sample          -
; Output: TEMPHI:TEMPLO 16 output           -
;--------------------------------------------------
; This filter is implemented by first       -
; computing the lowpass of the input        -
; sample and then computing the output      -
; via input-lowpass(input)                  -
; we remove the dither term as well         -
;--------------------------------------------------
highpass          macro
              ; TEMP9 already contains the raw us doppler signal
              ; just place the dither term in TEMP7
              movlw    H'a0'
              movwf    TEMP7
              movlw    high    genlp
              movwf    PCLATH
              movf     FSR,W
              movwf    TMPFSR
              movlw    2
              movwf    FCOUNT
              movlw    AD1LPLO
              movwf    FSR
```

-continued

```
        call    genlp           ; lowpass(ADVAL) in AD1LPHI:AD1LPLO
        movf    TMPFSR,W
        movwf   FSR
;-----------------------------------------------------
; calculate ADVAL - lowpass(ADVAL)
;-----------------------------------------------------
        movf    AD1LPHI,W
        movwf   TEMPHI
        movf    AD1LPLO,W
        movwf   TEMPLO
        comf    TEMPLO,F
        incf    TEMPLO,F        ; negate ad1lp
        btfsc   STATUS,Z        ; zero bit
        decf    TEMPHI,F
        comf    TEMPHI,F        ; -ad1lp in TEMPHI, TEMPLO
        movf    TEMP9,W
        addwf   TEMPHI,F        ; ad1-ad1lp in TEMPHI, TEMPLO
        endm
;       return
;-----------------------------------------------------------------
; bpf — the appropriate filter is chosen based
; on the value of the 'carrier' flag, which is
; set at compile time.
;
; Inputs: TEMP8:TEMP6 — 16bit input sample
; Outputs: TEMPHI:TEMPLO — 16bit output sample
;-----------------------------------------------------------------
        if carrier==0
;-----------------------------------------
; fc ~ 100
; Direct Form II Implementation
;-----------------------------------------
bpf
        rlf     TEMP8,W
        rrf     TEMP8,F
        rrf     TEMP6,F
        rlf     TEMP8,W
        rrf     TEMP8,F
        rrf     TEMP6,F
        rlf     TEMP8,W
        rrf     TEMP8,F
        rrf     TEMP6,F
        comf    w2hi,F
        comf    w2lo,F
        incf    w2lo,F
        btfsc   STATUS,Z
        incf    w2hi,F          ; -w(n-2)
        movf    w2lo,W
        movwf   TEMPLO
        movf    w2hi,W
        movwf   TEMPHI          ; -w(n-2) in TEMP
        i16lsr  w2hi,w2lo       ; ½
        movf    w2lo,W
        movwf   TEMP7
        movf    w2hi,W
        movwf   TEMP9           ; T9-7 = -1/2w(n-2)
        i16lsr  w2hi,w2lo       ; ¼
        i16lsr  w2hi,w2lo       ; ⅛
        movf    w2lo,W
        addwf   TEMP7,F
        btfsc   STATUS,C
        incf    TEMP9,F
        movf    w2hi,W
        addwf   TEMP9,F         ; T9-7 = -w(n-2) (½+⅛)
        i16lsr  w2hi,w2lo       ; 1/16
        movf    w2lo,W
        addwf   TEMP7,F
        btfsc   STATUS,C
        incf    TEMP9,F
        movf    w2hi,W
        addwf   TEMP9,F         ; T9-7 = -w(n-2) (½+⅛+1/16)
        movf    w1hi,W          ; shift state memory
        movwf   w2hi
        movf    w1lo,W
        movwf   w2lo
        movf    w1lo,W
        addwf   TEMP7,F
        btfsc   STATUS,C
        incf    TEMP9,F
```

-continued

```
        movf    w1hi,W
        addwf   TEMP9,F         ; T9-7 = (1)w(n-1)-w(n-2) (½+⅛+1/16)
        i16lsr  w1hi,w1lo       ; ½w(n-1)
        i16lsr  w1hi,w1lo       ; ¼
        movf    w1lo,W
        addwf   TEMP7,F
        btfsc   STATUS,C
        incf    TEMP9,F
        movf    w1hi,W
        addwf   TEMP9,F         ; w(n-1) (1+¼)-w(n-2) (...)
        i16lsr  w1hi,w1lo       ; ⅛
        movf    w1lo,W
        addwf   TEMP7,F
        btfsc   STATUS,C
        incf    TEMP9,F
        movf    w1hi,W
        addwf   TEMP9,F         ; w(n-1) (1+¼+⅛)-w(n-2) (...)
        movf    TEMP6,W
        addwf   TEMP7,F
        btfsc   STATUS,C
        incf    TEMP9,F
        movf    TEMP8,W
        addwf   TEMP9,W         ; w(n)=x(n)+w(n-1) (...)-w(n-2) (...)
        movwf   w1hi
        movf    TEMP7,W
        movwf   w1lo
        movf    w1lo,W
        addwf   TEMPLO,F
        btfsc   STATUS,C
        incf    TEMPHI,F
        movf    w1hi,W
        addwf   TEMPHI,F        ; TEMP
        bcf     STATUS,C
        rlf     TEMPLO,F
        rlf     TEMPHI,F
        return
        endif                   ;25Khz bpf
        if carrier==1
;------------------------------------------
; fc ~ 128                      -
; Direct Form II Implementation -
;------------------------------------------
bpf
        rlf     TEMP8,W
        rrf     TEMP8,F
        rrf     TEMP6,F
        rlf     TEMP8,W
        rrf     TEMP8,F
        rrf     TEMP6,F
        rlf     TEMP8,W
        rrf     TEMP8,F
        rrf     TEMP6,F
        comf    w2hi,F
        comf    w2lo,F
        incf    w2lo,F
        btfsc   STATUS,Z
        incf    w2hi,F          ; -w(n-2)
        movf    w2lo,W
        movwf   TEMPLO
        movf    w2hi,W
        movwf   TEMPHI          ; -w(n-2) in TEMP
        i16lsr  w2hi,w2lo       ; ½
        movf    w2lo,W
        movwf   TEMP7
        movf    w2hi,W
        movwf   TEMP9           ; T9-7 = -½w(n-2)
        i16lsr  w2hi,w2lo       ; ¼
        i16lsr  w2hi,w2lo       ; ⅛
        i16lsr  w2hi,w2lo       ; 1/16
        i16lsr  w2hi,w2lo       ; 1/32
        movf    w2lo,W
        addwf   TEMP7,F
        btfsc   STATUS,C
        incf    TEMP9,F
        movf    w2hi,W
        addwf   TEMP9,F         ; T9-7 = -w(n-2) (½+1/32)
        i16lsr  w2hi,w2lo       ; 1/64
        movf    w2lo,W
        addwf   TEMP7,F
```

-continued

```
          btfsc      STATUS,C
          incf       TEMP9,F
          movf       w2hi,W
          addwf      TEMP9,F        ; T9-7 = -w(n-2) (½+1/32+1/64)
          movf       w1hi,W         ; shift state memory
          movwf      w2hi
          movf       w1lo,W
          movwf      w2lo
          movf       w1lo,W
          addwf      TEMP7,F
          btfsc      STATUS,C
          incf       TEMP9,F
          movf       w1hi,W
          addwf      TEMP9,F        ; T9-7 = (1)w(n-1)-w(n-2) (½+1/32+1/64)
          i16lsr     w1hi,w1lo      ; ½w(n-1)
          movf       w1lo,W
          addwf      TEMPLO,F
          btfsc      STATUS,C
          incf       TEMPHI,F
          movf       w1hi,W
          addwf      TEMPHI,F       ; TEMP = w(n-1) (½)-w(n-2)
          i16lsr     w1hi,w1lo      ; ¼
          i16lsr     w1hi,w1lo      ; ⅛
          movf       w1lo,W
          addwf      TEMP7,F
          btfsc      STATUS,C
          incf       TEMP9,F
          movf       w1hi,W
          addwf      TEMP9,F        ; w(n-1) (1+⅛)-w(n-2) (½+1/32+1/64)
          movf       TEMP6,W
          addwf      TEMP7,F
          btfsc      STATUS,C
          incf       TEMP9,F
          movf       TEMP8,W
          addwf      TEMP9,W        ; w(n)=x(n)+w(n-1) (1+⅛)-w(n-2) (½+1/32+1/64)
          movwf      w1hi
          movwf      TEMP9
          movf       TEMP7,W
          movwf      w1lo
          i16lsr     TEMP9,TEMP7    ; w(n) (½)
          movf       TEMP7,W
          addwf      TEMPLO,F
          btfsc      STATUS,C
          incf       TEMPHI,F
          movf       TEMP9,W
          addwf      TEMPHI,F       ; TEMP = w(n) (½)+w(n-1) (½)-w(n-2)
          bcf        STATUS,C
          rlf        TEMPLO,F
          rlf        TEMPHI,F
          return
          endif                     ; 32Khz bpf
          if carrier==2
;------------------------------------------
; fc ~ 160                          -
; Direct Form II Implementation     -
;------------------------------------------
bpf
          rlf        TEMP8,W
          rrf        TEMP8,F
          rrf        TEMP6,F
          rlf        TEMP8,W
          rrf        TEMP8,F
          rrf        TEMP6,F
          rlf        TEMP8,W
          rrf        TEMP8,F
          rrf        TEMP6,F
          comf       w2hi,F
          comf       w2lo,F
          incf       w2lo,F
          btfsc      STATUS,Z
          incf       w2hi,F         ; -w(n-2)
          movf       w2lo,W
          movwf      TEMPLO
          movf       w2hi,W
          movwf      TEMPHI         ; -w(n-2) in TEMP
          i16lsr     w2hi,w2lo      ; ½
          movf       w2lo,W
          movwf      TEMP7
          movf       w2hi,W
```

```
                movwf       TEMP9           ; T9-7 = -½w(n-2)
                i16lsr      w2hi,w2lo       ; ¼
                movf        w2lo,W
                addwf       TEMP7,F
                btfsc       STATUS,C
                incf        TEMP9,F
                movf        w2hi,W
                addwf       TEMP9,F         ; T9-7 = -w(n-2) (½+¼)
                i16lsr      w2hi,w2lo       ; ⅛
                i16lsr      w2hi,w2lo       ; 1/16
                movf        w2lo,W
                addwf       TEMP7,F
                btfsc       STATUS,C
                incf        TEMP9,F
                movf        w2hi,W
                addwf       TEMP9,F         ; T9-7 = -w(n-2) (½+¼+1/16)
                movf        w1hi,W          ; shift state memory
                movwf       w2hi
                movf        w1lo,W
                movwf       w2lo
                movf        w1lo,W
                addwf       TEMP7,F
                btfsc       STATUS,C
                incf        TEMP9,F
                movf        w1hi,W
                addwf       TEMP9,F         ; T9-7 = (1)w(n-1)-w(n-2) (½+¼+1/16)
                i16lsr      w1hi,w1lo       ; ½w(n-1)
                movf        w1lo,W
                addwf       TEMPLO,F
                btfsc       STATUS,C
                incf        TEMPHI,F
                movf        w1hi,W
                addwf       TEMPHI,F        ; TEMP = w(n-1) (½)-w(n-2)
                movf        TEMP6,W
                addwf       TEMP7,F
                btfsc       STATUS,C
                incf        TEMP9,F
                movf        TEMP8,W
                addwf       TEMP9,W         ; w(n)=x(n)+w(n-1) (1)-w(n-2) (½+¼+1/16)
                movwf       w1hi
                movwf       TEMP9
                movf        TEMP7,W
                movwf       w1lo
                i16lsr      TEMP9,TEMP7     ; w(n) (½)
                movf        TEMP7,W
                addwf       TEMPLO,F
                btfsc       STATUS,C
                incf        TEMPHI,F
                movf        TEMP9,W
                addwf       TEMPHI,F        ; TEMP = w(n) (½)+w(n-1) (½)-w(n-2)
                bcf         STATUS,C
                rlf         TEMPLO,F
                rlf         TEMPHI,F
                return
                endif                       ; 40Khz bpf
;
; ledtask.asm
; Copyright (C) 1996, 1997 Mytech
;
; the omni2 led task and flasher routines
; orig: jjf
                #if useUS
; When the counter hits 0
; LEDTBL is "call'ed". LEDTBL uses the LEDST 4-7
; register to determine which led function to
; jump to. LEDST 0-3 are used by the led functions
; as state information.
LEDTASK
                movlw       high        endled
                movwf       PCLATH
                movf        CCNT0,W
                andlw       H'03'
                btfss       STATUS,Z        ; every 4ms
                goto        endled
                decf        LEDCNTR,F
                btfss       STATUS,Z        ; has task counter reached zero?
                goto        endled          ; no, skip the rest.
                movlw       high        LEDTBL
                movwf       PCLATH
```

-continued

```
                call        LEDTBL
endled
                return
LEDTBL
                ; bits 0-3 of LEDSELECT are LED 'function ptr'
                movlw       high       LEDTBLJMP
                movwf       PCLATH
                movlw       003h
                andwf       LEDSELECT,W
                movwf       TEMPLO
                bcf         STATUS,C
                rlf         TEMPLO,F
                bcf         STATUS,C
                rlf         TEMPLO,W
                addlw       low        LEDTBLJMP
                btfsc       STATUS,C
                incf        PCLATH,F
                movwf       PCL
LEDTBLJMP
                movlw       high       sglflash
                movwf       PCLATH
                goto        sglflash
                nop
                movlw       high       nullflash
                movwf       PCLATH
                goto        nullflash
                nop
                movlw       high       statusled
                movwf       PCLATH
                goto        statusled
                nop
;               movlw       high       contflash1
;               movwf       PCLATH
;               goto        contflash1
;               nop
                retlw       0ffh
initnullflash
                movlw       H'40'
                movwf       LEDCNTR
                movlw       H'01'
                movwf       LEDSELECT
                clrf        LEDST
                bsf         SBITS,2            ; schedule LED task
                bcf         PORTB,1            ; turn LED off
                return
nullflash
                clrf        LEDST
                clrf        LEDSELECT
                clrf        LEDCNTR
                bcf         SBITS,2
                bcf         PORTB,1
                return
sglflash
; the state of the single flash led is held in bit 0 of LEDST.
; 0: initial dead spot for relay
; 1: on
                btfsc       LEDST,0            ; what state are we in?
                goto        sgfstop            ; just finished state 1, so stop
                movlw       080h               ; just finished state 0, need to
                movwf       LEDCNTR            ; set 'on' time
                bsf         PORTB,1            ; turn LED on
                bsf         LEDST,0
                return
sgfstop
                bcf         SBITS,2            ; unschedule LED task
                clrf        LEDST
                clrf        LEDCNTR
                clrf        LEDSELECT
                bcf         PORTB,1            ; turn LED off
                return
initsgf
                btfsc       SBITS,2            ; if led is already running just return
                return
                movlw       H'00'              ; set LED task to state 0(off)
                movwf       LEDST
                clrf        LEDSELECT          ; set function 0 (single flash)
                movlw       32h                ; set initial 100ms dead time
                movwf       LEDCNTR
                bsf         SBITS,2            ; schedule LED task
```

-continued

```
             bcf      PORTB,1         ; turn LED off
             return
             if 0
contflash1
; continuous on-off using 512ms ticks
; 0: led off
; 1: led on
             btfsc    LEDST,0         ; what state are we in?
             goto     cf1down         ; just finished state 1, so back to 0
             movlw    0ffh            ; just finished state 0, need to
             movwf    LEDCNTR         ; set 'on' time
             bsf      PORTB,1         ; turn LED on
             bsf      LEDST,0         ; set state to '1'
             return
cf1down
             movlw    0ffh            ;
             movwf    LEDCNTR
             bcf      PORTB,1         ; turn LED off
             clrf     LEDST           ; set state to '0'
             return
initcf1
             movlw    0ffh            ; set initial time
             movwf    LEDCNTR
             bsf      SBITS,2         ; schedule LED task
             bcf      PORTB,1         ; turn LED off
             movlw    H'00'           ; set LED task to state 0(off)
             movwf    LEDST
             movlw    H'03'
             movwf    LEDSELECT       ; set 'func ptr': 1 (continuous 512ms flash)
             return
             endif
statusled
             movlw    high     statusledjmp
             movwf    PCLATH
             movlw    H'03'
             andwf    LEDST,W
             movwf    TEMP6
             bcf      STATUS,C
             rlf      TEMP6,F
             bcf      STATUS,C
             rlf      TEMP6,W
             addlw    statusledjmp
             btfsc    STATUS,C
             incf     PCLATH,F
             movwf    PCL
statusledjmp
             movlw    high     statusled0
             movwf    PCLATH
             goto     statusled0
             nop
             movlw    high     statusled1
             movwf    PCLATH
             goto     statusled1
             nop
             movlw    high     statusled2
             movwf    PCLATH
             goto     statusled2
             nop
             movlw    high     statusled3
             movwf    PCLATH
             goto     statusled3
statusled0
             bsf      PORTB,1         ; turn on led
             bsf      LEDST,0         ; set state to 1
             movlw    H'80'           ; load the led task
             usePage1
             btfss    STATWORD,0      ; counter based on
             movlw    H'20'           ; the value of the bit
             usePage0
             movwf    LEDCNTR         ; being displayed
             return
statusled1
             bcf      PORTB,1         ; turn off led
             bcf      LEDST,0
             bsf      LEDST,1         ; set state to 2
             movlw    H'40'
             movwf    LEDCNTR         ; load cntr with postamble time
             return
```

-continued

```
statusled2
        ;
        usePage1
        movlw   H'07';              ; mask off upper 5 bits
        andwf   STATCNTL,W          ; to see if more bits
        usePage0
        movwf   TEMP6
        movlw   high    statusledmore
        movwf   PCLATH
        decfsz  TEMP6               ; did we reach zero
        goto    statusledmore       ; no
        ; we reached zero,
        usePage0
        clrf    LEDST
        clrf    LEDCNTR
        clrf    LEDSELECT
        bcf     SBITS,2
        bcf     PORTB,1
        usePage1
        bcf     STATCNTL,7
        usePage0
        return
statusled3
        ; this is a dummy state, we'll handle large digit count msg's here
        usePage0
        bsf     LEDST,0             ; set state to 3
        return
statusledmore
        usePage1
        movlw   H'f8'               ; mask off low 3 bits
        andwf   STATCNTL,F
        usePage0
        movlw   H'7'                ; don't forget to put updated count in cntl reg
        andwf   TEMP6,W
        usePage1
        iorwf   STATCNTL,F          ; 'or' in the cnt...preserve upper 5 bits
        usePage0
        bcf     STATUS,C
        usePage1
        rrf     STATWORD,F          ; roll the new bit
        usePage0
statusledinit
        movlw   H'80'
        movwf   LEDCNTR             ; load cntr with preamble time
        bcf     PORTB,1
        bsf     SBITS,2
        clrf    LEDST               ; set state to 0
        movlw   H'02'
        movwf   LEDSELECT
        usePage1
        bsf     STATCNTL,7          ; set status-in-process flag
        usePage0
        return
        #endif
        #if     useIR
gLEDTASK
        usePage0
        movlw   high    endgled
        movwf   PCLATH
        movf    CCNT0,W
        addlw   2                   ; time slice offset
        andlw   H'03'
        btfss   STATUS,Z            ; every 4ms
        goto    endgled
        decf    gLEDCNTR,F
        btfss   STATUS,Z            ; has task counter reached zero?
        goto    endgled             ; no, skip the rest.
        movlw   high    gLEDTBL
        movwf   PCLATH
        call    gLEDTBL
endgled
        return
gLEDTBL
        ; bits 0-3 of gLEDSELECT are LED 'function ptr'
        movlw   00fh
        andwf   gLEDSELECT,W
        addwf   PCL
        goto    gmfflash
;       goto    contflash1
```

-continued

```
;               goto        pflash1
;               goto        pflash2
gmfflash
; the state of the single flash led is held in bit 0 of LEDST.
; 0: initial dead spot for relay
; 1: on
                btfsc       gLEDST,0            ; what state are we in?
                goto        gmfstop             ; just finished state 1, so stop
                movlw       0ffh                ; just finished state 0, need to
                movwf       gLEDCNTR            ; set 'on' time
                movlw       H'0ef'
                andwf       PORTA,F
;               bsf         PORTA,4             ; turn LED on
                bsf         gLEDST,0
                return
gmfstop
                bcf         CBITS3,7            ; unschedule LED task
                clrf        gLEDST
                clrf        gLEDCNTR
                clrf        gLEDSELECT
                movlw       H'010'
                iorwf       PORTA,F
;               bcf         PORTA,4             ; turn LED off
                return
initgmf
                btfsc       CBITS3,7            ; if led is already running just return
                return
                movlw       H'00'               ; set LED task to state 0(off)
                movwf       gLEDST
                clrf        gLEDSELECT          ; set function 0 (single flash)
                movlw       02h                 ; set initial 100ms dead time
                movwf       gLEDCNTR
                bsf         CBITS3,7            ; schedule LED task
                movlw       H'010'
                iorwf       PORTA,F
;               bcf         PORTA,4             ; turn LED off
                return
                #endif
;
; relaytsk.asm
; COPYRIGHT (C) MYTECH CORP. 1996, 1997
; relaytask -
; This task is called once every second. It handles
; the countdown timer for the relay.
relaytask
                movlw       high        endrelay
                movwf       PCLATH
                movlw       01
                subwf       relaylo,F
                btfss       STATUS,C
                decf        relayhi,F
                movf        relaylo,W
                iorwf       relayhi,W           ; if relayhi&relaylo are both zero
                btfss       STATUS,Z            ; then the counter has just timed out.
                goto        endrelay
                ; The relay counter has just reached zero
                ; turn off the lights and set appropriate flags.
reloff          bcf         Occupied            ; occupied bits off
                bcf         RelayEnable         ; lights off for less than x sec
                bcf         SBITS,3             ; disable this task
                clrf        LOFFTIMELO
                clrf        LOFFTIMEHI
                bsf         Suppress            ; enable suppress task
                ; we need a mechanism to switch between 2 values
                movlw       H'08'               ; this gives ~3/8 sec US blindspot
                ;movlw      H'17'               ; this gives ~3sec IR blindspot
                movwf       sprscnt
                bcf         Relay               ; relay off
                bcf         DLCRelay            ; dlc relay off
                if ADAPT==1
                movlw       high        endrelay
                movwf       PCLATH
                btfss       ASAEnable
                goto        endrelay
                movlw       high                endrelayfalseon
                movwf       PCLATH
                ; check to see if lights were only on for around the amount
                ; of time the pot is set for. by definition, LONTIME>=TMRPOT
                movf        LONTIMELO,W
```

```
                movwf       TEMP7
                movf        LONTIMEHI,W
                movwf       TEMP9
                movf        TMRPOTLO,W
                subwf       TEMP7,F         ; lobyte[LONTIMELO – TMRPOTLO]
                btfss       STATUS,C        ; did the subtract borrow?
                decf        TEMP9,F         ; yes
                movf        TMRPOTHI,W
                subwf       TEMP9,F         ; hibyte[LONTIMEHI [– 1] – TMRPOTHI]
                btfss       STATUS,Z        ; if the high byte isn't zero
                goto        endrelayfalseon ; then LONTIME>TMRPOT+8 for sure.
                movlw       H'f8'
                andwf       TEMP7,W         ; is the difference>=8?
                btfss       STATUS,Z
                goto        endrelayfalseon ; yes?
                ; The lights were on for less than 8 seconds more than the
                ; timer pot setting. This is very likely indicative of a
                ; false trip. The sensitivity should be reduced.
                btfsc       InstallerTestMode   ; if in test mode, no false-on
                goto        endrelayfalseon
                movf        mcntlo,W
                addlw       2
                movwf       FONREF
                bsf         SBITS,6         ; schedule false trip correction
                movlw       high    endrelay
                movwf       PCLATH
                goto        endrelay
endrelayfalseon
                ;-----------------------------------------------------------------------
                ; this was not a false on, so we need to look at the min   -
                ; motion pulse while the lights were on. If it was         -
                ; sufficiently large we can back off the sensitivity.      -
                ;-----------------------------------------------------------------------
                usePage1
                movlw       high    endrelay
                movwf       PCLATH
                btfss       usminpulse,6    ; is it greater than 40h?
                goto        endrelay        ; no, so don't adjust.
                usePage0
                decf        usonadj,F       ; just down by 1 for now.
                endif
endrelay
                usePage0
                movf        usoffgain,W
                movwf       usgain
                return
turnOnLights
                btfss       RelayEnable     ; is the relay enabled?
                return                      ; nope...
                movlw       high    setrelay
                movwf       PCLATH
                call        setrelay        ; note that if the lights are already
                                            ; on, this will simply reset the timer.
                bsf         Occupied        ; set occupied bit
                clrf        LONTIMELO
                clrf        LONTIMEHI
                clrf        timesincemotlo
                clrf        timesincemothi
                if ADAPT==1
                        ; we need to determine which technology was most
                        ; dominant on the motion hit. in a tie, choose
                        ; us since it is naturally dominant. One or both
                        ; of irdecision and usdecision will be >0.
                        bsf         CBITS2,0        ; choose us dominant
                        btfsc       pirdecision,7   ; is irdecision >0?
                        goto        turnonlbl1      ; no, so it must be us
                        bcf         CBITS2,0        ; choose ir dominant
                        btfsc       usdecision,7    ; is usdecision>0?
                        goto        turnonlbl1      ; no, so it must be ir
                        ; they're both>0 so compare to find greatest
                        movf        usdecision,W
                        subwf       pirdecision,W   ; ir – us
                        btfsc       STATUS,Z        ; are they equal?
                        goto        turnonlbl1      ; yes.
                        btfss       STATUS,C        ; is us>ir
                        bsf         CBITS2,0        ; yes.
turnonlbl1
                        ; now save the appropriate quantity from the
                        ; dominant technology sensor
```

-continued

```
                movf    usdecision,W
                btfss   CBITS2,0
                movf    pirdecision,W
                usePage1
                movwf   dominantTech
                usePage0
                ; do the check for a possible false-off
                movlw   high    fshut
                movwf   PCLATH
                btfss   ASAEnable
                goto    fshut
                movlw   high    nofshut
                movwf   PCLATH
                movf    LOFFTIMEHI,F        ; the high byte must be zero
                btfss   STATUS,Z
                goto    nofshut
                movlw   H'0f'               ; 15sec
                subwf   LOFFTIMELO,W        ; w = lofftimelo – 15s
                btfsc   STATUS,C            ; if borrow, run false shut-off correction
                goto    nofshut             ; no borrow.
                ; we now need to handle the situation of the
                ; lights going out and false-on correction getting
                ; scheduled, then the lights being turned on
                ; immediately and false-off correction being scheduled
                ; To handle this, false-on correction is delayed for
                ; up to 2 minutes. If a false-off is detected AND
                ; false-on correction is currently scheduled, false-off
                ; correction wins the contradiction.
                movlw   high    fshut
                movwf   PCLATH
                btfsc   InstallerTestMode   ; if in test mode, no false-off
                goto    fshut
                bsf     SBITS,5
                btfss   SBITS,6             ; is false-on correction scheduled?
                goto    fshut               ; no
                ; false-on correction is scheduled...unschedule it.
                clrf    FONREF
                bcf     SBITS,6
                goto    fshut
nofshut
                ;---------------------------------------------------------------
                ; false shut-off correction is not necessary. We      -
                ; need to determine if an adjustment to the ir        -
                ; threshold is necessary. We look at the ir noise     -
                ; estimate. If it is sufficiently small then we can   -
                ; lower the threshold(increase sensitivity).          -
                ;---------------------------------------------------------------
                movlw   high    fshut
                movwf   PCLATH
                usePage1
                comf    irNoiseEst,W
                addlw   1                   ; –noise estimate in W
                andlw   H'f0'               ; is it greater than 15 below threshold?
                btfsc   STATUS,Z            ; if 'and' is 0, then noise is too large
                goto    fshut               ; noise estimate too large!
                usePage0
                decf    iroffadj,F          ; reduce threshold=increase sensitivity
fshut
                endif
                usePage1
                movlw   H'7f'
                movwf   usminpulse          ; init to max value
                usePage0
                return
;
; setrelay will set the relay task counter to count
; down from the proper number of 1s ticks. The
; counter is derived from secondcnt which increments
; every 1s (CCNT0 increments every 1ms).
setrelay
                btfss   RelayEnable         ; if the relay is enabled, turn on lights
                return                      ; otherwise forget about it.
srdoit          ; (re)load the relay countdown timer
                ; If less than 4 minutes since power on, timeout
                ; is 2 minutes, unless the timer pot is set at
                ; min in which case the timeout is 8 seconds
                ; for 1hr OR until the pot is moved away from min.
                ; Otherwise the min timeout is 8 minutes.
                ; When 8 second min timeout is being used, no timer
```

-continued

```
                ; adjustment is applied. This setting is usually
                ; indicative of some kind of test mode.
                btfss       InstallerTestMode
                goto        srnotitm
                ; we are in installer test mode, use 8 sec timeout
sruse8secmin
                movlw       H'08'                ; 8 second min timeout
                movwf       relaylo
                clrf        relayhi
                movlw       high      setrelaylbl2
                movwf       PCLATH
                goto        setrelaylbl2
srnotitm
                btfsc       FourMinOnBit
                goto        sruse8minutemin      ; use normal 8 minute timeout
                movlw       H'78'                ; setup for 2 min timeout
                movwf       relaylo
                clrf        relayhi
                movlw       high      sraddadj
                movwf       PCLATH
                goto        sraddadj
sruse8minutemin
                movlw       H'e0'                ; 8 minute min timeout
                movwf       relaylo
                movlw       H'01'
                movwf       relayhi
sraddadj
                movf        timeradjlo,W         ; add any timer adjustment
                addwf       relaylo,F
                btfsc       STATUS,C
                incf        relayhi,F
                movf        timeradjhi,W
                addwf       relayhi,F
setrelaylbl2
                ; turn on the relay if it isn't already on
                btfss       Relay
                bsf         Relay
                ; we need to add the check for daylight control
                ; should check LightLevel
                btfss       DLCRelay
                bsf         DLCRelay
                movf        usongain,W
                movwf       usgain
                ; if the lights are just being turned on, then
                ; there is some bookkeeping we want to do
                btfsc       Occupied             ; are lights already on?
                return                           ; yes, so skip the rest
                bsf         Occupied
                bsf         SBITS,3              ; enable the relay countdown task
                return
                if 0
;
; setrelay will set the relay task counter to count
; down from the proper number of 1s ticks. The
; counter is derived from secondcnt which increments
; every 1s (CCNT0 increments every 1ms).
setrelay
                btfss       RelayEnable          ; if the relay is enabled, turn on lights
                return                           ; otherwise forget about it.
srdoit
                ; (re)load the relay countdown timer
                ; if less than 60 minutes since power on, timeout
                ; is 2 minutes, unless the timer pot is set at min in
                ; which case the min timeout is 8 seconds; otherwise
                ; the min timeout is 8 minutes.
                ; When 8 second min timeout is being used, no timer
                ; adjustment is applied. This setting is usually
                ; indicative of some kind of test mode.
                btfsc       SixtyMinOnBit
                goto        sruse8minutemin      ; use normal 8 minute timeout
                movf        TMRPOTHI,W
                iorwf       TMRPOTLO,W
                btfsc       STATUS,Z             ; if both zero, then 'or' is zero
                goto        sruse8secmin
                movlw       H'78'                ; setup for 2 min timeout
                movwf       relaylo
                clrf        relayhi
                movlw       high      sraddadj
                movwf       PCLATH
```

-continued

```
                goto        sraddadj
sruse8secmin
                movlw       H'08'               ; 8 second min timeout
                movwf       relaylo
                clrf        relayhi
                movlw       high        setrelaylbl2
                movwf       PCLATH
                goto        setrelaylbl2
sruse8minutemin
                movlw       H'e0'               ; 8 minute min timeout
                movwf       relaylo
                movlw       H'01'
                movwf       relayhi
sraddadj
                movf        timeradjlo,W        ; add any timer adjustment
                addwf       relaylo,F
                btfsc       STATUS,C
                incf        relayhi,F
                movf        timeradjhi,W
                addwf       relayhi,F
setrelaylbl2
                ; turn on the relay if it isn't already on
                btfss       PORTB,2
                bsf         PORTB,2
                movf        usongain,W
                movwf       usgain
                ; if the lights are just being turned on, then
                ; there is some bookkeeping we want to do
                btfsc       Occupied            ; are lights already on?
                return                          ; yes, so skip the rest
                bsf         Occupied
                bsf         SBITS,3             ; enable the relay countdown task
                return
                endif
; suppress -
; This task is called at a 1ms rate. It handles the timed
; process of disabling the relay for a given period. When
; the timer reaches zero, the relay is enabled once again.
suppress
                movlw       high        endsuppress
                movwf       PCLATH
                movf        CCNT0,W
                andlw       H'7f'               ; do it every 128ms
                btfss       STATUS,Z
                goto        endsuppress
                decfsz      sprscnt,F
                goto        endsuppress
                bsf         RelayEnable         ; un-suppress relay
                bcf         Suppress            ; disable this task
endsuppress
                return
;*********************************************
; o2eeprom.asm
;
; Omni II E2BUF routines
;
; 8-16-96 JJF
;
; Portions from Microchip Example code
;*********************************************
;*********************************************
; in our application the slave address is always the same
; so we can save that register.
#define SLAVE B'10100000'
;*********************************************
E2Init          macro
                clrf        E2FLAG
                clrf        E2ERR
                movlw       B'00111011'         ; I2C master mode enabled
                movwf       SSPCON
                usePage1
                movf        PIE1,W
                andlw       B'11000111'         ; disable SSP interrupt & SPI INT's
                movwf       PIE1
                usePage0
                movf        PORTC,W
                andlw       B'11100111'
;               andlw       B'00111111'
                movwf       PORTC               ; Set SCL & SDA to low when not tri-stated
```

```
                usePage1
                movf       TRISC,W
                iorlw      B'11011000'
;               iorlw      B'11000000'         ; tristate the SCL and SDA
                movwf      TRISC
                usePage0
                endm
E2WriteValue         macro       address,value
                movlw      address
                movwf      E2ADDR
                movlw      value
                movwf      DATAO
                clrf       E2ERR
                bsf        EEPROMWTASK
                btfsc      EEPROMWTASK
                goto       $ - 1
                endm
E2WriteReg macro                 addr,reg
                movlw      addr
                movwf      E2ADDR
                movf       reg,W
                movwf      DATAO
                clrf       E2ERR
                bsf        EEPROMWTASK
                btfsc      EEPROMWTASK
                goto       $ - 1
                endm
E2WriteRegIndirect macro         addrreg,reg
                movf       addrreg,W
                movwf      E2ADDR
                movf       reg,W
                movwf      DATAO
                clrf       E2ERR
                bsf        EEPROMWTASK
                btfsc      EEPROMWTASK
                goto       $ - 1
                endm
E2Read macro         address
                movlw      address
                movwf      E2ADDR
                clrf       E2ERR
                bsf        EEPROMRTASK
                btfsc      EEPROMRTASK
                goto       $ - 1
                endm
E2ReadIndirect macro             address
                movf       address,W
                movwf      E2ADDR
                clrf       E2ERR
                bsf        EEPROMRTASK
                btfsc      EEPROMRTASK
                goto       $ - 1
                endm
StoreVarsE2          macro
                usePage0
                E2WriteReg      1,usonadj
                E2WriteReg      2,usoffadj
                E2WriteReg      3,iroffadj
                E2WriteReg      4,CCNT3
                clrw
                btfsc      CntrRollOver
                iorlw      H'01'                ; bit 0 is cntrrollover bit
                btfsc      ASATimerReturn
                iorlw      H'02'                ; bit 1 is asatimerreturn enable bit
                btfsc      ASATimerReturnState
                iorlw      H'04'                ; bit 2 is asatimerreturnstate bit
                movwf      MTEMP
                E2WriteReg      5,MTEMP
                E2WriteReg      6,timeradjlo
                E2WriteReg      7,timeradjhi
                usePage1
                movf       timerLearnCoef,W
                usePage0
                movwf      MTEMP
                E2WriteReg      8,MTEMP
                endm
;----------------------------------------------------------------------------------
```

-continued

```
;         BYTE-WRITE, write one byte to EEPROM device
;---------------------------------------------------------------------------------
;         Input    :   DATAO    = data to be written
;                      ADDR     = EEPROM data address
;                      SLAVE    = device address (1010xxx0)
;         Output   :   Data written to EEPROM device
;---------------------------------------------------------------------------------
WRBYTE
          bcf      STATUS,RP0
;         movf     SLAVE,W           ; Put SLAVE address
          movlw    SLAVE
          movwf    TXBUF             ; in xmit buffer
          call     BSTART            ; Generate START bit
          call     TX                ; Output SLAVE address
          bcf      STATUS,RP0
          movf     ADDR,W            ; Put WORD address
          movwf    TXBUF             ; in xmit buffer
          call     TX                ; Output WORD address
          bcf      STATUS,RP0
          movf     DATAO,W           ; Move DATA
          movwf    TXBUF             ; into buffer
          call     TX                ; Output DATA and detect acknowledgement
          call     BSTOP             ; Generate STOP bit
          usePage0
          movlw    D'11'             ; setup 11ms delay after write
          addwf    CCNT0,W
          movwf    E2DLY
          bsf      E2FLAG,1          ; enable eeprom wait task
          return
;---------------------------------------------------------------------------------
;         TRANSMIT 8 data bits subroutine
;---------------------------------------------------------------------------------
;         Input    :   TXBUF
;         Output   :   Data transmitted to EEPROM device
;---------------------------------------------------------------------------------
TX
          bcf      STATUS,RP0
          movlw    .8                ; Set counter for eight bits
          movwf    COUNT
TXLP
          bcf      EEPROM,DO         ; Default 0 bit out
          btfsc    TXBUF,7           ; If shifted bit = 0, data bit = 0
          bsf      EEPROM,DO         ; otherwise data bit = 1
          movlw    high     BITOUT
          movwf    PCLATH
          call     BITOUT            ; Send bit
          bcf      STATUS,RP0
          rlf      TXBUF             ; Rotate TXBUF left
          skpc                       ; f(6) ———> f(7)
          bcf      TXBUF,0           ; f(7) ———> carry
          skpnc                      ; carry ———> f(0)
          bsf      TXBUF,0
          movlw    high     TXLP
          movwf    PCLATH
          decfsz   COUNT             ; 8 bits done?
          goto     TXLP              ; No.
          movlw    high     BITIN
          movwf    PCLATH
          call     BITIN             ; Read acknowledge bit
          bcf      STATUS,RP0
          movlw    high     ERR
          movwf    PCLATH
          movlw    3
          btfsc    EEPROM,DI         ; Check for acknowledgement
          call     ERR               ; No acknowledge from device
          bcf      STATUS,RP0
          retlw    0
;---------------------------------------------------------------------------------
;         Single bit data transmit from PIC to serial EEPROM
;---------------------------------------------------------------------------------
;         Input    :   EEPROM register, bit DO
;         Output   :   Bit transmitted over I2C
;                      Error bits set as necessary
;---------------------------------------------------------------------------------
BITOUT
          movlw    high     BIT0
          movwf    PCLATH
          btfss    EEPROM,DO
          goto     BIT0
```

-continued

```
            bsf     STATUS,RP0
            bsf     TRISC,SDA       ; Output bit 0
            movlw   high    CLK1
            movwf   PCLATH
            movlw   2
            bcf     STATUS,RP0
            btfsc   PORTC,SDA       ; Check for error code 2
            goto    CLK1
            movlw   high    ERR
            movwf   PCLATH
            call    ERR
            movlw   high    CLK1
            movwf   PCLATH
            goto    CLK1            ; SDA locked low by device
BIT0
            bsf     STATUS,RP0
            bcf     TRISC,SDA       ; Output bit 0
            nop                     ; Delay
            nop
            nop
CLK1
            bsf     STATUS,RP0
            bsf     TRISC,SCL       ; Attempt to set SCL high
            movlw   high    BIT2
            movwf   PCLATH
            movlw   1               ; Error code 1
            bcf     STATUS,RP0
            btfsc   PORTC,SCL       ; SCL locked low?
            goto    BIT2            ; No.
            movlw   high    ERR
            movwf   PCLATH
            call    ERR             ; Yes, set error
BIT2
            nop                     ; Timing delay
            nop
            nop
            nop
            bsf     STATUS,RP0
            bcf     TRISC,SCL       ; Return SCL to low
            bcf     STATUS,RP0
            retlw   0
;----------------------------------------------------------------------
;           BYTE-READ, read one byte from serial EEPROM device
;----------------------------------------------------------------------
;           Input   :       ADDR    = source address
;                           SLAVE   = device address (1010xxx0)
;           Output  :       DATAI   = data read from serial EEPROM
;----------------------------------------------------------------------
RDBYTE
            bcf     STATUS,RP0
;           movf    SLAVE,W         ; Move SLAVE address
            movlw   high    BSTART
            movwf   PCLATH
            movlw   SLAVE
            movwf   TXBUF           ; into xmit buffer (R/W = 0)
            call    BSTART          ; Generate START bit
            movlw   high    TX
            movwf   PCLATH
            call    TX              ; Output SLAVE address. Check ACK.
            bcf     STATUS,RP0
            movf    ADDR,W          ; Move WORD address
            movwf   TXBUF           ; into xmit buffer
            movlw   high    TX
            movwf   PCLATH
            call    TX              ; Output WORD address. Check ACK.
            movlw   high    BSTART
            movwf   PCLATH
            call    BSTART          ; START READ (if only one device is
            bcf     STATUS,RP0      ; connected to the I2C bus)
;           movf    SLAVE,W
            movlw   SLAVE
            movwf   TXBUF
            bsf     TXBUF,0         ; Specify READ mode (R/W = 1)
            movlw   high    TX
            movwf   PCLATH
            call    TX              ; Output SLAVE address
            movlw   high    RX
            movwf   PCLATH
            call    RX              ; READ in data and acknowledge
```

-continued

```
          movlw     high      BSTOP
          movwf     PCLATH
          call      BSTOP               ; Generate STOP bit
          bcf       STATUS,RP0
          movf      RXBUF,W             ; Save data from buffer
          movwf     DATAI               ; to DATAI file register.
          return
;----------------------------------------------------------------------------
;         RECEIVE eight data bits subroutine
;----------------------------------------------------------------------------
;         Input     :         None
;         Output    :         RXBUF = 8-bit data received
;----------------------------------------------------------------------------
RX
          bcf       STATUS,RP0
          movlw     .8                  ; 8 bits of data
          movwf     COUNT
          clrf      RXBUF
;
RXLP
          rlf       RXBUF               ; Shift data to buffer
          skpc
          bcf       RXBUF,0             ; carry ———> f(0)
          skpnc
          bsf       RXBUF,0
          call      BITIN
          bcf       STATUS,RP0
          btfsc     EEPROM,DI
          bsf       RXBUF,0             ; Input bit =1
          decfsz    COUNT               ; 8 bits?
          goto      RXLP
          bsf       EEPROM,DO           ; Set acknowledge bit = 1
          call      BITOUT              ; to STOP further input
          retlw     0
;----------------------------------------------------------------------------
;         Single bit receive from serial EEPROM to PIC
;----------------------------------------------------------------------------
;         Input     :         None
;         Output    :         Data bit received
;----------------------------------------------------------------------------
BITIN
          bsf       STATUS,RP0
          bsf       TRISC,SDA           ; Set SDA for input
          bcf       STATUS,RP0
          bcf       EEPROM,DI
          bsf       STATUS,RP0
          bsf       TRISC,SCL           ; Clock high
          movlw     high      BIT1
          movwf     PCLATH
          movlw     1
          bcf       STATUS,RP0
          btfsc     PORTC,SCL           ; Skip if SCL is high
          goto      BIT1
          movlw     high      ERR
          movwf     PCLATH
          call      ERR
BIT1
          movlw     high      ACKOK
          movwf     PCLATH
          bcf       STATUS,RP0
          btfss     PORTC,SDA           ; Read SDA pin, for ACK low
          goto      ACKOK
          bsf       EEPROM,DI           ; DI = 1
ACKOK
          bsf       STATUS,RP0
          nop                           ; Delay
          nop
          nop
          bcf       TRISC,SCL           ; Return SCL to low
          bcf       STATUS,RP0
          retlw     0
;----------------------------------------------------------------------------
;         DELAY, Provide a 10.78mS delay
;----------------------------------------------------------------------------
;         Input     :         None
;         Output    :         None
;----------------------------------------------------------------------------
Delay
          bcf       STATUS,RP0
```

-continued

```
                movlw       7
                movwf       TEMP6
                clrf        TEMP7           ;clear last location
dly1
                nop
                movlw       high    dly1
                movwf       PCLATH
                decfsz      TEMP7           ;reduce count
                goto        dly1            ;Inner loop time = 1.54mS
                decfsz      TEMP6
                goto        dly1            ;Total time = 10.78mS
                retlw       0
;****************************************************
;       DELAY, Provide a 10.78mS delay...11ms
;****************************************************
E2Delay10ms
                movlw       D'11'
                addwf       CCNT0,W
                movwf       E2DLY
e2dly1
                movf        CCNT0,W
                subwf       E2DLY,W
                btfsc       STATUS,Z        ; is it exactly 11ms?
                goto        e2dlyend        ; yes
                btfsc       STATUS,C        ; did the subtract borrow (more than 11ms)
                goto        e2dly1          ; no...wait longer
e2dlyend
                return
;-----------------------------------------------------------------------------------------------------------------
;       START bit generation routine
;-----------------------------------------------------------------------------------------------------------------
;       input       : none
;       output      : initialize bus communication
;-----------------------------------------------------------------------------------------------------------------
;
;Generate START bit (SCL is high while SDA goes from high to low transition)
;and check status of the serial clock.
BSTART
                bsf         STATUS,RP0
                bsf         TRISC,SDA       ; Make sure SDA is high
                bsf         TRISC,SCL       ; Set clock high
                movlw       1               ; Ready error status code 1
                bcf         STATUS,RP0
                btfss       PORTC,SCL       ; Locked?
                call        ERR             ; SCL locked low by device, flag error
                bsf         STATUS,RP0
                bcf         TRISC,SDA       ; SDA goes low during SCL high
                nop                         ; Timing adjustment, 1uS @4MHz
                nop
                nop
                bcf         TRISC,SCL       ; Start clock train
                bcf         STATUS,RP0
                RETLW       0
;-----------------------------------------------------------------------------------------------------------------
;       STOP bit generation routine
;-----------------------------------------------------------------------------------------------------------------
;       Input       :       None
;       Output      :       Bus communication, STOP condition
;-----------------------------------------------------------------------------------------------------------------
;
;Generate STOP bit (SDA goes from low to high during SCL high state)
;and check bus conditions.
BSTOP
                bsf         STATUS,RP0
                bcf         TRISC,SDA       ; Return SDA to low
                bsf         TRISC,SCL       ; Set SCL high
                nop
                nop
                nop
                movlw       high    ERR
                movwf       PCLATH
                movlw       1               ; Ready error code 1
                bcf         STATUS,RP0
                btfss       PORTC,SCL       ; High?
                call        ERR             ; No, SCL locked low by device
                bsf         STATUS,RP0
                bsf         TRISC,SDA       ; SDA goes from low to high during SCL high
                movlw       high    ERR
                movwf       PCLATH
```

-continued

```
              movlw      4                    ; Ready error code 4
              btfss      TRISC,SDA            ; High?
              call       ERR                  ; No, SDA bus not release for STOP
              bcf        STATUS,RP0
              retlw      0
;----------------------------------------------------------------------------------------------------------------------
;             Two wire/I2C — CPU communication error status table and subroutine
;----------------------------------------------------------------------------------------------------------------------
;             input      :     W-reg           = error code
;             output     :     ERCODE          = error code
;                              FLAG(ERROR)     = 1
;
;             code             error status mode
;             ----             -----------------------------------------------------------------------
;             1    :           SCL locked low by device (bus is still busy)
;             2    :           SDA locked low by device (bus is still busy)
;             3    :           No acknowledge from device (no handshake)
;             4    :           SDA bus not released for master to generate STOP bit
;----------------------------------------------------------------------------------------------------------------------
;
;Subroutine to identify the status of the serial clock (SCL) and serial data
;(SDA) condition according to the error status table. Codes generated are
;useful for bus/device diagnosis.
ERR
              bcf        STATUS,RP0
              btfss      FLAG,ERRORFLG        ; If not first error, do not change code
              movwf      ERCODE               ; Save error code
              bsf        FLAG,ERRORFLG        ; Set error flag
              retlw      0
;
; MUXtsk.asm
; Copyright(C) 1996, 1997 Mytech
;
; test code for the external mux
; modified by:jdw
;
;reads the PORTB latch and uses RB3 and RB4 to select
;a location to record an a/d conversion from RA1
;and a bit read from RC0
;RB4  \   RB3  \    a/d loc.   \   bit loc.
; 0   \    0   \    MUXpot0    \   MUXdip,0
; 0   \    1   \    MUXpot1    \   MUXdip,1
; 1   \    0   \    MUXpot2    \   MUXdip,2
; 1   \    1   \    MUXpot3    \   MUXdip,3
; remember that the switches are electrically negative logic.
; we'll invert the logic when we read the switches.
runMUXT       movlw      H'09'                ;Fosc(1/32)
              movwf      ADCON0               ;next reading will be RA1
              clrf       TEMP8
              movf       PORTB,0              ;get RB3 and RB4
              andlw      H'18'
              movwf      TEMP8
              bcf        STATUS,C
              rrf        TEMP8,f
              bcf        STATUS,C
              rrf        TEMP8,f              ;look at current
              bcf        STATUS,C
              rrf        TEMP8,f              ;state of PortB latch
convM         bsf        ADCON0,2             ;start A/D conversion
              movlw      high       waitM
              movf       PCLATH
waitM         btfsc      ADCON0,2
              goto       waitM                ; wait on GO/DONE bit
adM           movf       ADRES,W
              addlw      H'80'
              movwf      TEMP6
              movlw      high       muxtblstart
              movwf      PCLATH
              bcf        STATUS,C
              rlf        TEMP8,F
              bcf        STATUS,C
              rlf        TEMP8,W              ; shift MUXclk up to jump 4 lines worth
              addlw      low        muxtblstart
              btfsc      STATUS,C
              incf       PCLATH,F
              movwf      PCL
muxtblstart
              movlw      high       mux00
              movwf      PCLATH
```

-continued

```
                goto        mux00
                nop
                movlw       high        mux01
                movwf       PCLATH
                goto        mux01
                nop
                movlw       high        mux10
                movwf       PCLATH
                goto        mux10
                nop
                movlw       high        mux11
                movwf       PCLATH
                goto        mux11
                nop
MUXend
mux00
                movf        TEMP6,W             ; record case 0 info.
                movwf       TEMP7               ; us sensivity pot
                bcf         ASAEnable
                btfss       PORTC,0             ; invert switch logic
                bsf         ASAEnable
                bsf         PORTB,3             ; set input 01 on MUX
                bcf         PORTB,4
; we need to apply the square law adjustment
; to the us sensitivity setting.
                movlw       high        gainlookup
                movwf       PCLATH
                movlw       H'80'
                addwf       TEMP7,F             ; make pot reading unipolar
                bcf         STATUS,C
                rrf         TEMP7,F
                bcf         STATUS,C
                rrf         TEMP7,F
                bcf         STATUS,C
                rrf         TEMP7,F
                bcf         STATUS,C
                rrf         TEMP7,W
                movwf       usongain
                usePage1
                movwf       usPot
                usePage0
                call        gainlookup
                movwf       usongain
                btfsc       Occupied
                movwf       usgain
                if          useGSB==0
                            movwf       usoffgain
                endif
                if          useGSB==1
                            movlw       high        muxnogsb
                            movwf       PCLATH
                            btfss       GSBEnable           ; if gsb switch is turned off,
                            goto        muxnogsb            ; then just set offgain to ongain
                            ;---------------------------------------------------------
                            ; otherwise we set offgain to .75 of ongain
                            ; the motivation is to prevent hallway falsing
                            ;---------------------------------------------------------
                            bcf         STATUS,C
                            rrf         usongain,W          ; ½ usongain in W
                            movwf       usoffgain           ; ½ usongain in usoffgain
                            bcf         STATUS,C
                            rrf         usoffgain,W         ; ¼ usongain in W
                            addwf       usoffgain,F         ; ¾ usongain in usoffgain
                            movlw       high        muxgsbend
                            movwf       PCLATH
                            goto        muxgsbend
muxnogsb
                            ; gsb is disabled
                            movf        usongain,W
                            movwf       usoffgain
muxgsbend
                            ; be sure to set usgain properly
                            movf        usongain,W
                            btfsc       Occupied
                            movwf       usgain
                            movf        usoffgain,W
                            btfss       Occupied
                            movwf       usgain
                endif
```

-continued

```
              return
mux01
              movf      TEMP6,W           ; record case 1 info.
              movwf     TEMP7             ; ir sensitivity pot
              bcf       ATAEnable
              btfss     PORTC,0           ; invert switch logic
              bsf       ATAEnable
              bcf       PORTB,3           ; set input 10 on MUX
              bsf       PORTB,4
              ; turn the pir sensitivity setting into
              ; a threshold.
              movlw     H'80'
              addwf     TEMP7,F           ; make pot reading unipolar
              movf      TEMP7,W
              usePage1
              movwf     pirPot
              rrf       pirPot,F
              rrf       pirPot,F
              rrf       pirPot,F
              rrf       pirPot,W
              andlw     H'0f'             ; mask off bits shifted in
              movwf     pirPot
              usePage0
              ;@@@@@ temp for pll testing
              ;         movf      TEMP7,W
              ;         movwf     lfdtemp
              ;@@@@@
              comf      TEMP7,F           ; since the pot is a sensitivity
                                          ; setting, it is intuitive for a
                                          ; large setting to give greater
                                          ; range. However, a greater range
                                          ; is more consistent with a smaller
                                          ; threshold, so we use the complement
                                          ; of the pot setting as the threshold.
              bcf       STATUS,C
              rrf       TEMP7,W           ; /2
              movwf     PIRthresh
              movwf     TEMP7
              bcf       STATUS,C
              rrf       TEMP7,F           ; /4
              bcf       STATUS,C
              rrf       TEMP7,F           ; /8
              bcf       STATUS,C
              rrf       TEMP7,W           ; /16
              subwf     PIRthresh,F
              movlw     H'0f'             ; we add an offset to the threshold
              addwf     PIRthresh,F       ; to get past the noise floor.
              return
mux10
              movf      TEMP6,W           ; record case 2 info.
              movwf     TEMP7             ; timer pot
              bcf       GSBEnable
              btfss     PORTC,0           ; invert switch logic
              bsf       GSBEnable
              bsf       PORTB,3           ; set input 11 on MUX
              bsf       PORTB,4
              ; we need to scale the timer pot reading to
              ; 1 sec units. The raw reading is in 8sec units
              ; so shifting by 3 will be necessary.
              movlw     H'80'
              addwf     TEMP7,F           ; make pot reading unipolar
              movf      TEMP7,W
              movwf     TMRPOTLO
              clrf      TMRPOTHI
              bcf       STATUS,C
              rlf       TMRPOTLO,F
              rlf       TMRPOTHI,F
              bcf       STATUS,C
              rlf       TMRPOTLO,F
              rlf       TMRPOTHI,F
              bcf       STATUS,C
              rlf       TMRPOTLO,F
              rlf       TMRPOTHI,F
;             movlw     H'E0'             ; 8 minute(480 sec.) min.
;             addwf     TMRPOTLO,F
;             btfsc     STATUS,C
;             incf      TMRPOTHI,F
;             movlw     H'01'
;             addwf     TMRPOTHI,F
```

-continued

```
        ;---------------------------------------------------------
        ; This is where we determine test mode entry   -
        ; via timer pot setting.                        -
        ;---------------------------------------------------------
                movlw       high        tmrmux_notitm
                movwf       PCLATH
                btfss       InstallerTestMode             ; are we in installer test mode?
                goto        tmrmux_notitm                 ; no
                ; we are in installer test mode
                movlw       H'fe'
                andwf       TEMP7,W
                btfsc       STATUS,Z                      ; is new pot reading > 1?
                return                                    ; not if 'and' is zero
                ; the timer pot has been increased to > 1
                bcf         InstallerTestMode
                clrf        ITMClk
tmrmux_notitm
                ; we are not in installer test mode, should we be
                movlw       high        tmrmuxend
                movwf       PCLATH
                movlw       H'fe'
                andwf       lastTimer,W                   ; is last timer > 1?
                btfsc       STATUS,Z                      ; not if 'and' = 0
                goto        tmrmuxend                     ; lastTimer <= 1
                movlw       H'fe'
                andwf       TEMP7,W                       ; is new timer < 2
                btfss       STATUS,Z                      ; yes if 'and' = 0
                goto        tmrmuxend                     ; new timer >= 2
                bsf         InstallerTestMode
                clrf        ITMClk
tmrmuxend
                movf        TEMP7,W                       ; new timer
                movwf       lastTimer
                return
mux11
                movf        TEMP6,W                       ; record case 3 info.
                movwf       LightLevel                    ; muxpot3
                bcf         StrongAirCompensate
                btfss       PORTC,0                       ; invert switch logic
                bsf         StrongAirCompensate
                bcf         PORTB,3                       ; set input 00 on MUX
                bcf         PORTB,4
                return
; o2dtinit.asm
; COPYRIGHT (C) MYTECH CORP. 1996, 1997
; initialization and setup code for Omni II
setTrisRegs
                usePage1
                movlw       B'11111001'
                movwf       PORTC                         ; set C1 & C2 to outputs; C3, C4, C1, C5,
                                                          ; C6 & C7 are set as inputs, setting C6 & 7 to output
s
                                                          ; causes USART to screw up on transmission
                movlw       0ebh                          ; per mfg instructions, reset PORTA to all
                movwf       TRISA
                movlw       B'11000001'
                movwf       TRISB
                usePage0
                return
o2init          macro
                usePage1
                bsf         H'8e',0                       ; reset power on reset bit
                bsf         H'8e',1                       ; reset brown out reset bit
                usePage0
                clrf        INTCON
                bcf         INTCON,GIE                    ; disable global interrupts
                clrf        PORTA                         ; clear ports prior to setting direction
                clrf        PORTB
                clrf        PORTC
                usePage1
                clrf        OPTREG                        ; clear OPTION register, tmr0src=fosc/4
                ; The prescaler has to be set according to the divisor needed
                ; to get the 1Khz sample rate.
                ; all carrier versions use a prescale of 16
                bsf         OPTREG,0                      ; prescale set to 1:16
                bsf         OPTREG,1
                bcf         OPTREG,3                      ; assign prescaler to RTCC
                bsf         OPTREG,7                      ; enable the weak pullups
                clrf        TRISB                         ; clear register prior to setting direction
```

-continued

```
            clrf        TRISC
            clrf        TRISA
            movlw       high        setTrisRegs
            movwf       PCLATH
            call        setTrisRegs
            usePage0
            clrf        INTCON
            movlw       timvala                 ; initialize RTCC
            movwf       RTCC
            movlw       99h                     ; 1001 1001 enable ain3 a/d
            movwf       ADCON0
            usePage1
            movlw       02h                     ; 0000 0000 set ra0-ra3 analog, vref=VDD
            movwf       ADCON1
            usePage0
            bcf         INTCON,GIE              ; disable global interrupts
            usePage1
            clrf        PIE1                    ; disable peripheral interrupts
            clrf        PIE2                    ; disable peripheral interrupts
            ; CCP setup
            usePage0
            movlw       H'04'
            movwf       T2CON
            usePage1
            movlw       tmr2val
            movwf       PR2
            usePage0
            movlw       H'0c'
            movwf       CCP1CON
            movlw       tmr2val
            movwf       TEMPLO
            bcf         STATUS,C
            rrf         TEMPLO,W
            movwf       CCPR1L
            clrf        CCPR1H
            movlw       H'0c'
            movwf       CCP2CON
;           movlw       H'02'                   ; this is the falling edge of the
            movlw       H'15'
            movwf       CCPR2L                  ; sample pulse. (was 02h for omni 1)
            clrf        CCPR2H                  ; 0x37 was determined by experimentation
            ;--------------------------------
            E2Init                              ; eeprom init
;           #if         0
            usePage1
            ; serial port setup stuff
;           movlw       H'3f'                   ; 9600 baud @9.8304Mhz
            movlw       H'0f'
            movwf       SPBRG
;           movlw       b'10100100'             ;Async, High baud rate
            movlw       B'10100000'
            movwf       TXSTA
            usePage0
            movlw       b'10000000'             ;Enable serial port
            movwf       RCSTA
            ; end serial port setup
;           endif
;stck
;           movlw       0ffh                    ; initialize FSR to end of page 1 SRAM
;           movwf       FSR                     ; This will be our stack. Stay above B0h.
;           usePage0
;           movlw       H'5f'
;           movlw       H'7f'
            movlw       H'20'
            movwf       FSR
            movlw       high        initloop
            movwf       PCLATH
initloop
            clrf        INDF
            incf        FSR,F
            btfss       FSR,7
            goto        initloop
            movlw       01h
            movwf       PORTB
            movlw       80h
            movwf       ADRES
            movlw       0ffh
            movwf       usgain
            movwf       usongain
```

```
          movwf     usoffgain
;         clrf      usoffadj
;         clrf      usonadj
;         clrf      iroffadj
;         clrf      uspscnt
;         clrf      irpscnt
;         clrf      LONTIMEHI
;         clrf      LONTIMELO
;         clrf      LOFFTIMEHI
;         clrf      LOFFTIMELO
          movlw     H'03'
          movwf     SECONDrefhi
          movlw     H'e8'
          movwf     SECONDreflo      ; 3e8h is 1000
          movlw     D'60'
          movwf     mcntref
;         clrf      mcntlo
;         clrf      mcnthi
;         clrf      SBITS
;         bcf       SBITS,2          ; disable LED (for test/debug)
;         bcf       SBITS,4
;         bcf       SBITS,5
;         bcf       SBITS,6
;         clrf      CCNT0
;         clrf      CCNT1
;         clrf      CCNT2
;         clrf      CCNT3
;         clrf      CBITS1
;         clrf      CBITS2
;         clrf      CBITS3
;         bsf       CBITS2,7         ; high gain mode
          bsf       CBITS2,0         ; set US dominant by default
;         clrf      avgturnon
          movlw     H'd0'
          usePage1
;         movlw     H'ff'
;         movwf     avgtimesincemot  ; this inits the avgtime to over 4min
;         clrf      timesincemotlo
;         clrf      timesincemothi
          clrf      FONCNT
          clrf      FOFFCNT
          clrf      uspulsecnt0
          clrf      uspulsecnt1
          clrf      uspulsemax
          movlw     H'7f'
          movwf     usminpulse       ; max value
          usePage0
          movlw     H'f0'            ; 1sec ticks pwr-on timeout — 4min
          movwf     TMRPOTLO
;         clrf      TMRPOTHI
;         clrf      timeradjlo
;         clrf      timeradjhi
;         movlw     H'0'
;         movwf     options
          bsf       RelayEnable
          movlw     high     setrelay
          movwf     PCLATH
          call      setrelay
          bsf       Occupied
          movlw     high     initsgf ; initialize the LED
          movwf     PCLATH
          call      initsgf
          if useDA==0
          movlw     high     initgmf ; initialize the LED
          movwf     PCLATH
          call      initgmf
          endif
          usePage1
          clrf      STATCNTL
          clrf      STATWORD
          usePage0
          clrf      NTRGATEstate
;         bcf       Interrogating
;         movlw     H'0a2'
;         movwf     FSR
          enableInts
          bsf       INTCON,5         ; enable RTCC interrupt
;*******************************************
; for development only
```

-continued

```
        ;****************************************************
        if      useDA==1
                doutd_s
        endif
        if      useLCD==1
                movlw   high    LCDInit
                movwf   PCLATH
                call    LCDInit
        endif
        ;****************************************************
        ;****************************************************
        ; This initial delay is for the EEPROM to initialize    *
        ;****************************************************
        movlw   D'11'
        addwf   CCNT0,W
        movwf   MTEMP
initdly1
        movf    CCNT0,W
        subwf   MTEMP,W
        movlw   high    initdlyend
        movwf   PCLATH
        btfsc   STATUS,Z        ; is it exactly 11ms?
        goto    initdlyend      ; yes
        movlw   high    initdly1
        movwf   PCLATH
        btfsc   STATUS,C        ; did the subtract borrow (more than 11ms)
        goto    initdly1        ; no...wait longer
initdlyend
        ; remember the sensor task is disabled until now
        movlw   high    eepromnotinit
        movwf   PCLATH
        E2Read  0               ; read eeprom address 0
        movf    DATAI,W
        movwf   MTEMP
        sublw   H'5a'
        btfss   STATUS,Z
        goto    eepromnotinit
        ; we read the eeprom here and initialize the variables
        E2Read  1               ; read eeprom address 1
        movf    DATAI,W
        movwf   usonadj
        E2Read  2               ; read eeprom address 2
        movf    DATAI,W
        movwf   usoffadj
        E2Read  3               ; read eeprom address 3
        movf    DATAI,W
        movwf   iroffadj
        E2Read  4               ; read eeprom address 4
        movf    DATAI,W
        movwf   CCNT3
        E2Read  5               ; read eeprom address 5
        bcf     CntrRollOver
        btfsc   DATAI,0         ; the stored cntrrollover bit just read
        bsf     CntrRollOver
        bcf     ASATimerReturn
        btfsc   DATAI,1
        bsf     ASATimerReturn  ; store ASATimerReturn enable bit
        bcf     ASATimerReturnState
        btfsc   DATAI,2
        bsf     ASATimerReturnState     ; store ASATimerReturnState bit
        E2Read  6               ; read eeprom address 6
        movf    DATAI,W
        movwf   timeradjlo
        E2Read  7               ; read eeprom address 7
        movf    DATAI,W
        movwf   timeradjhi
        E2Read  8               ; read eeprom address 8
        movf    DATAI,W
        usePage1
        movwf   timerLearnCoef
        usePage0
        movlw   high    endeeprominit
        movwf   PCLATH
        goto    endeeprominit
eepromnotinit
        E2WriteValue    0,H'5a'
        E2WriteValue    1,0     ; usonadj
        E2WriteValue    2,0     ; usoffadj
        E2WriteValue    3,0     ; iroffadj
```

-continued

|  | E2WriteValue | 4,0 | ; CCNT3 |
|  | E2WriteValue | 5,0 | ; bit fields, bit 0: cntrrollover |
|  | E2WriteValue | 6,0 | ; timeradjlo |
|  | E2WriteValue | 7,0 | ; timeradjhi |
|  | E2WriteValue | 8,0 | ; timerLearnCoef |

```
endeeprominit
            bsf       SBITS,0             ; enable sensor task
;           return
            endm
;
; ustask.asm
; source code for the ultrasonic sensor task
; COPYRIGHT (C) MYTECH CORP. 1996, 1997
; JJF
ultrasonictask                            ; level 1 on the pic stack
            bsf       ADCON0,2            ; start A/D
            bcf       USSense             ; clear the us sense bit
            bsf       PORTB,5
            btfss     CCNT0,0
            bcf       PORTB,5             ; external dither
            movlw     high     snsrad1
            movwf     PCLATH
snsrad1     btfsc     ADCON0,2            ; wait til conversion complete
            goto      snsrad1
            movf      ADRES,0             ; get a/d input
            addlw     80h
            movwf     TEMP9               ; save first a/d input
;           if        useDA==1
;           movf      TEMP9,W
;           addlw     H'80'
;           doutd     0                   ; 000
;           endif
            highpass
;           if        useDA==1
;           movf      TEMPHI,W
;           addlw     H'80'
;           doutd     1                   ; 001
;           endif
            movf      TEMPHI,W
            movwf     TEMP8
            movf      TEMPLO,W
            movwf     TEMP6
cfilt       movlw     high     bpf
            movwf     PCLATH
            call      bpf
snsrlbl3
            movlw     high     snsrlbl3
            movwf     PCLATH
;           if useDA==1
            ;@@@@@@
;           movf      TEMPHI,W
;           addlw     H'80'
;           doutd     2                   ; 010
            ;@@@@@@
;           endif
abs         btfss     TEMPHI,7            ; is it negative?
            goto      abspos              ; no
absneg      comf      TEMPHI,F
            comf      TEMPLO,W
            addlw     1
            btfsc     STATUS,C
            incf      TEMPHI,F
            movwf     TEMPLO
abspos      nop                           ; abs(BPF) in TEMPHI:TEMPLO
xgain       ;--------------------------------------------------
            ; Gain stage: this is an 8 by 16 mult        -
            ; We'll only use the hi 16 bits of the       -
            ; result.                                    -
            ; 8 by 16 mult: (abcd) * (ef)                -
            ; ab*ef*256 + cd*ef                          -
            ; We'll throw away the low byte of cd*ef     -
            ;--------------------------------------------------
            if        ADAPT==1
            movlw     high     usnogainasa
            movwf     PCLATH
            btfss     ASAEnable
            goto      usnogainasa
            movlw     high     gainadjust
            movwf     PCLATH
```

```
                    call      gainadjust       ; adjusted gain in W
                    movwf     TEMP7
                    movlw     high    usgainasaend
                    movwf     PCLATH
                    goto      usgainasaend
usnogainasa
                    movf      usoffgain,W
                    btfsc     Occupied
                    movf      usongain,W
                    movwf     TEMP7
usgainasaend
          else
                    movf      usoffgain,W
                    btfsc     Occupied
                    movf      usongain,W
                    movwf     TEMP7
          endif
          movlw     high      mult8x8
          movwf     PCLATH
          movf      TEMPHI,W
          movwf     TEMP8            ; store hi byte of |BPF|
          movf      TEMPLO,W
          movwf     TEMP9            ; lo byte of |BPF| in TEMP9
          movf      TEMP7,W          ; we now have the gain term in W
          call      mult8x8          ; TEMPHI:TEMPLO = W * LO(|BPF|)
          movf      TEMPHI,W         ; we only want the hi byte of this mult,
          movwf     TEMP6            ; since we are doing an 8x16 and taking
                                     ; only the hi 16 bits of the result.
          movf      TEMP8,W
          movwf     TEMP9            ; hi byte of |BPF| in TEMP9
          movf      TEMP7,W          ; we now have the gain term in W
          call      mult8x8          ; TEMPHI:TEMPLO = W * HI(|BPF|)
          movf      TEMP6,W
          addwf     TEMPLO,F
          btfsc     STATUS,C
          incf      TEMPHI,F
          bcf       STATUS,C
          rlf       TEMPLO,F
          rlf       TEMPHI,F
          bcf       STATUS,C
          rlf       TEMPLO,F
          rlf       TEMPHI,F
          bcf       STATUS,C
          rlf       TEMPLO,F
          rlf       TEMPHI,F
          movlw     high      nogainsat
          movwf     PCLATH
          btfss     TEMPHI,7
          goto      nogainsat
          movlw     H'7f'
          movwf     TEMPHI
          movlw     H'ff'
          movwf     TEMPLO
nogainsat
;         if useDA==1
;@@@@@@
;         movf      TEMPHI,W
;         addlw     H'80'
;         doutd     3                ; 011
;@@@@@@
;         endif
          movf      TEMPHI,W
          movwf     TEMP9
          movf      TEMPLO,W
          movwf     TEMP7            ; rect*gain in TEMP9:TEMP7
          ;----------------------------------------
          ; do the decimation filter here     -
          ; This gives a cutoff of ~2.5hz     -
          ;----------------------------------------
          movlw     high      genlp
          movwf     PCLATH
          movf      FSR,W
          movwf     TMPFSR
          movlw     6
          movwf     FCOUNT
          movlw     decimlo
          movwf     FSR
          call      genlp
          movf      TMPFSR,W
```

```
                movwf       FSR
                ;------------------------------------------
                ; do the decimation here, we will     -
                ; subsample by 64 which gives a       -
                ; new fs of ~16hz.                    -
                ;------------------------------------------
                movlw       H'3f'
                andwf       CCNT0,W
                btfss       STATUS,Z            ; if zero, then sample
                goto        nodecim
                movf        decimlo,W
                movwf       TEMP7
                movf        decimhi,W
                movwf       TEMP9
                movf        FSR,W
                movwf       TMPFSR
                movlw       high       genlp
                movwf       PCLATH
                movlw       4
                movwf       FCOUNT
                movlw       RECTAVGlo
                movwf       FSR
                call        genlp
                movf        TMPFSR,W
                movwf       FSR
nodecim
;               if useDA==1
;@@@@@@
;               movf        RECTAVGhi,W
;               addlw       H'80'
;               doutd       4
;@@@@@@
;               endif
                ;----------------------------------------------------------
                ; compute the new threshold
                ; rectavg + offset + fudgefactor(=f(rectavg))
                ;----------------------------------------------------------
                movf        RECTAVGhi,W
                movwf       TEMPHI
                movf        RECTAVGlo,W
                movwf       TEMPLO
                rlf         TEMPHI,W
                rrf         TEMPHI,F
                rrf         TEMPLO,F            ; ½
                movf        TEMPLO,W
                movwf       TEMP6
                movf        TEMPHI,W
                movwf       TEMP8
                btfsc       StrongAirCompensate ; if strong air compensation is enabled,
                goto        strongaircomp       ; then add 1*avg instead of .75*avg
                rlf         TEMPHI,W
                rrf         TEMPHI,F
                rrf         TEMPLO,F            ; ¼
strongaircomp
                movf        TEMPLO,W
                addwf       TEMP6,F
                btfsc       STATUS,C
                incf        TEMP8,F
                movf        TEMPHI,W
                addwf       TEMP8,F
;               rlf         TEMPHI,W
;               rrf         TEMPHI,F
;               rrf         TEMPLO,F            ; ⅛
;               rlf         TEMPHI,W
;               rrf         TEMPHI,F
;               rrf         TEMPLO,F            ; 1/16
;               rlf         TEMPHI,W
;               rrf         TEMPHI,F
;               rrf         TEMPLO,F            ; 1/32 rectavg in TEMPHI:TEMPLO
loioff          set         H'40'
hiioff          set         H'01'
                movlw       loioff
                addwf       TEMP6,F
                btfsc       STATUS,C
                incf        TEMP8,F
                movlw       hiioff
                addwf       TEMP8,F             ; ¾rectavg + H'0140' in TEMPHI:TEMPLO
                movf        TEMP6,W
                movwf       TEMPLO
```

-continued

```
                movf        TEMP8,W
                movwf       TEMPHI
                movf        RECTAVGlo,W
                addwf       TEMPLO,F
                btfsc       STATUS,C
                incf        TEMPHI,F
                movf        RECTAVGhi,W
                addwf       TEMPHI,F        ; 1.75rectavg + H'0140' in TEMPHI:TEMPLO
                btfss       TEMPHI,7
                goto        nothreshsat
                movlw       H'7f'
                movwf       TEMPHI
                movlw       H'ff'
                movwf       TEMPLO
nothreshsat
;               if useDA==1
;               ;@@@@@@
;               movf        TEMPHI,W
;               addlw       H'80'
;               doutd       5
;               ;@@@@@@
;               endif
integ           ;------------------------------------
                ; the integ update algorithm   -
                ;------------------------------------
lointegup                   set         H'00'
hiintegup                   set         H'02'
lointegdn                   set         H'80'
hiintegdn                   set         H'00'
                movlw       high        integdown
                movwf       PCLATH
                movf        TEMPLO,W
                subwf       TEMP7,F
                btfss       STATUS,C        ; borrow?
                decf        TEMP9,F         ; yes
                movf        TEMPHI,W
                subwf       TEMP9,F         ; TEMP7:TEMP9 = rect*gain - thresh
                btfss       STATUS,C        ; borrow?
                goto        integdown       ; yes
                btfsc       TEMP9,7         ; result negative?
                goto        integdown       ; yes
                movlw       high        integmax
                movwf       PCLATH
                movlw       lointegup
                addwf       integlo,F
                btfsc       STATUS,C        ; carry?
                incf        integhi,F       ; yes
                btfsc       integhi,7       ; overflow?
                goto        integmax        ; yes
                movlw       hiintegup
                addwf       integhi,F
                btfsc       STATUS,C        ; carry?
                goto        integmax        ; yes
                movlw       high        endinteg
                movwf       PCLATH
                btfss       integhi,7       ; overflow?
                goto        endinteg        ; no
integmax
                movlw       H'7f'           ; saturate at 0x7fff
                movwf       integhi
                movlw       H'ff'
                movwf       integlo
                movlw       high        endinteg
                movwf       PCLATH
                goto        endinteg
integdown
                movlw       high        integmin
                movwf       PCLATH
                movlw       lointegdn
                subwf       integlo,F
                btfss       STATUS,C        ; borrow?
                decf        integhi,F       ; yes
                btfsc       integhi,7       ; negative?
                goto        integmin        ; yes
                movlw       hiintegdn
                subwf       integhi,F
                btfss       STATUS,C        ; borrow?
                goto        integmin        ; yes
                movlw       high        endinteg
```

-continued

```
              movwf    PCLATH
              btfss    integhi,7           ; negative?
              goto     endinteg            ; no
integmin
              clrf     integhi             ; saturate at 0x0000
              clrf     integlo
endinteg
              nop
;             if useDA==1
;@@@@@@
;             movf     integhi,W
;             addlw    H'80'
;             doutd    6
;@@@@@@
;             endif
              movlw    high     uszerotrth
              movwf    PCLATH
              movf     usgain,0
              andlw    0feh
              btfsc    STATUS,Z            ; zero bit set?
              goto     uszerotrth          ; don't sense if sens gain pot <==1
; ------Comparator----------------------
lothresh               set      H'00'
hithresh               set      H'30'
comp          movf     integlo,W
              movwf    TEMP7
              movf     integhi,W
              movwf    TEMP9
              movlw    lothresh
              subwf    TEMP7,F
              btfss    STATUS,C            ; borrow?
              decf     TEMP9,F             ; yes
              movlw    hithresh
              subwf    TEMP9,F             ; TEMP9:TEMP7 = integ - thresh
              movf     TEMP9,W
              movwf    usdecision
;             if       useDA==1
;             movf     usdecision,W
;             addlw    H'80'
;             doutd    7                   ; 111
;             endif
ustlu         ;--------------------------------------------------------
              ; do the lookup for the us decision here        -
              ;--------------------------------------------------------
              ; first check to see if the decision is >=0, ie -
              ; the sensor has detected motion.               -
              ;--------------------------------------------------------
              movlw    high     suremotion
              movwf    PCLATH
              comf     usdecision,W        ; if decision is positive, then negating
              addlw    1                   ; will make it <0,
              movwf    TEMP9
              btfsc    STATUS,C            ; if -decision=0, then motion for sure.
              goto     suremotion
              btfsc    TEMP9,7             ; if -decision<0, then motion for sure.
              goto     suremotion
              ;--------------------------------------------------------
              ; the decision value is below the motion threshold
              ; TEMP9 now holds -(integ - thresh), if
              ; greater than 16 then no motion for sure.
              ;--------------------------------------------------------
              movlw    high     uszerotrth
              movwf    PCLATH
              movf     TEMP9,W
              andlw    H'f0'               ; if any hi bit set, then -decision>16
              btfss    STATUS,Z            ; if zero, then motion is marginal
              goto     uszerotrth          ; no movement...
              ;--------------------------------------------------------
              ; The motion is marginal, do the truth lookup   -
              ;--------------------------------------------------------
              movlw    high     ustruthlookup
              movwf    PCLATH
              movf     usdecision,W
              addlw    H'10'               ; limit to 0-15, should be anyway...
              andlw    H'0f'
              call     ustruthlookup
              movwf    TEMP8
              movlw    high     occup
              movwf    PCLATH
```

```
            goto       occup
suremotion
            movlw      high       occup
            movwf      PCLATH
            ; just saw motion
            movlw      H'07f'
            movwf      TEMP8
            bsf        USSense            ; set us sense bit, for us only mode
            ;--------------------------------------------------------------------
            ; we enable interrogation when the we know we have definately   -
            ; seen motion and we are not currently interrogating.           -
            ;--------------------------------------------------------------------
            btfsc      Interrogating      ; if interrogation already enabled,
            goto       occup              ; skip over enable step
            ;--------------------------------------------------------------------
            ; no interrogation when the LED override switch is on           -
            ;--------------------------------------------------------------------
            btfsc      NoLEDFlag
            goto       occup
            bsf        Interrogating      ; otherwise enable it and
            movlw      H'02'              ; set up next step of interrogations
            movwf      NTRGATEstate
            movlw      H'ff'
            movwf      NTRGATEcnt
occup
            ; this is where we do the pulse stretching
            ; we only do pulse stretching for valid motion(truth level)
            movlw      high       endusstretch
            movwf      PCLATH
            decf       uspscnt,F          ; reduce stretch count
            btfsc      STATUS,Z           ; did count reach zero?
            clrf       ustruth            ; yes
            movf       ustruth,W
            subwf      TEMP8,W            ; newtruth – oldtruth
            btfss      STATUS,C           ; did it borrow?
            goto       endusstretch       ; yes, so keep old
            movf       TEMP8,W
            movwf      ustruth
            movlw      H'5f'
            movwf      uspscnt
endusstretch
            ; Turn on LED
            ;---------------------------------------------------------------
            ; if we are currently reporting status with the     -
            ; LED's then don't send any indication of motion    -
            ;---------------------------------------------------------------
            movlw      high       aro1
            movwf      PCLATH
usePage1
            btfsc      STATCNTL,7
            goto       aro1
            ;---------------------------------------------------------------
            ; if LED is currently in use, then leave it alone   -
            ;---------------------------------------------------------------
usePage0
            btfsc      SBITS,2            ; if led task on, then skip
            goto       aro1
            ;---------------------------------------------------------------
            ; if led override switch is on, leave LED alone     -
            ;---------------------------------------------------------------
            btfsc      NoLEDFlag          ; is led override switch turned on
            goto       aro1               ; yes, so don't turn on LED
            ;---------------------------------------------------------------
            ; we now need to determine if the LED should be     -
            ; turned on based on the dual tech mode and the     -
            ; 'truth' of our motion signal.                     -
            ;---------------------------------------------------------------
            movlw      high       usHSLED
            movwf      PCLATH
            btfsc      options,0          ; which dual tech mode
            goto       usHSLED            ; we are in HS mode
            ;---------------------------------------------------------------
            ; we are in HC mode, so we need to find the         -
            ; line 'a+b-60h=40h' (the 'and' equation). We       -
            ; choose the point where a=b, which is 50h.         -
            ;---------------------------------------------------------------
            movlw      high       usHCLED
            movwf      PCLATH
            movlw      H'50'
```

-continued

```
                subwf       ustruth,W           ; ustruth - 50h
                btfsc       STATUS,Z
                goto        usHCLED             ; ustruth = 50h
                movlw       high        aro1
                movwf       PCLATH
                btfss       STATUS,C            ; status is still from subwf
                goto        aro1                ; ustruth < 50h
usHCLED
                bsf         PORTB,1
                movlw       high        aro1
                movwf       PCLATH
                goto        aro1
usHSLED         movlw       H'7f'
                subwf       ustruth,W           ; ustruth - 7fh
                btfsc       STATUS,Z            ; are they equal?
                bsf         PORTB,1             ; yes, so turn on led
                movlw       high        aro1
                movwf       PCLATH
                goto        aro1
uszerotrth
                ; there's no motion, unless we are currently stretching
                ; a previous pulse
                movlw       high        uszeroyes
                movwf       PCLATH
                movf        uspscnt,W
                btfsc       STATUS,Z
                goto        uszeroyes
                ; we are stretching a previous pulse
                decf        uspscnt,F
                movlw       high        aro1
                movwf       PCLATH
                goto        aro1
uszeroyes
                clrf        ustruth
                ; leave led alone if it is in use
                movlw       high        aro1
                movwf       PCLATH
                btfsc       SBITS,2
                goto        aro1
                ; make sure led is off
                btfsc       PORTB,1
                bcf         PORTB,1
aro1
snsrend
                usePage0
;               bcf         PORTB,7             ; how much compute left?
;               if useDA==1
;@@@@@@
;               movf        ustruth,W
;               addlw       H'80'
;               doutd       6                   ; 110
;@@@@@@
;               endif
                ; this is where we determine the characteristics of any
                ; motion currently happening. the objective is to find
                ; the smallest motion pulse while the lights are on.
                ; this will give a measure of how much the lights-on
                ; sensitivity can be lowered.
                btfss       Occupied
                return
                ; if currently not inside a pulse, check for the
                ; beginning of a pulse, otherwise check for the
                ; end of the pulse.
                movlw       high        usfindpulse
                movwf       PCLATH
                usePage1
                movf        uspulsecnt1,W
                iorwf       uspulsecnt0,W       ; if both are 0, the 'or' is 0
                btfsc       STATUS,Z            ; if 0, then not in pulse
                goto        usfindpulse         ; not inside pulse, find one
                usePage0
                ; inside pulse
                movlw       high        usendpulse
                movwf       PCLATH
                btfsc       usdecision,7        ; is usdecision negative?
                goto        usendpulse          ; yes, so end of pulse. is it the smallest?
                ; not at end of pulse, see if level is max of the pulse
                usePage1
                incf        uspulsecnt0,F
```

-continued

```
                btfsc       STATUS,Z
                incf        uspulsecnt1,F       ; increment pulse width
                usePage0
                movf        usdecision,W
                usePage1
                subwf       uspulsemax,W        ; max - decision
                usePage0
                btfsc       STATUS,C            ; did it borrow?
                return                          ; no, so decision not max of pulse
                ; save the new max of the pulse
                movf        usdecision,W
                usePage1
                movwf       uspulsemax
                usePage0
                return
usendpulse
                ; we are at the end of the pulse, check to see if the
                ; recent pulse is the smallest so far.
                movlw       high        usendpulseend
                movwf       PCLATH
                usePage1
                movf        uspulsemax,W
                subwf       usminpulse,W        ; min pulse - pulse max
                btfss       STATUS,C            ; did it borrow?
                goto        usendpulseend       ; yes, so pulse is not smallest
                usePage1
                movf        uspulsemax,W
                movwf       usminpulse
                movf        uspulsecnt0,W
                movwf       usminpw0
                movf        uspulsecnt1,W
                movwf       usminpw1
usendpulseend
                usePage1
                clrf        uspulsecnt0         ; clear pulse count
                clrf        uspulsecnt1
                usePage0
                return
usfindpulse
                ; we are not currently looking at a pulse, so we
                ; need to look for a new one
                usePage0
                btfsc       usdecision,7
                return                          ; not a new pulse
                ; we have found a new pulse
                movf        usdecision,W
                usePage1
                movwf       uspulsemax
                movlw       1
                movwf       uspulsecnt0
                clrf        uspulsecnt1
                usePage0
                return                          ; end sensor task
ustruthlookup
                ; W has the motion level [0,15]
                movwf       TEMP7
                movlw       high        ustrthlu
                movwf       PCLATH
                movf        TEMP7,W
                addlw       low         ustrthlu
                btfsc       STATUS,C
                incf        PCLATH,F
                movwf       PCL
ustrthlu
                retlw       0x0         ;0
                retlw       0x02        ;1
                retlw       0x04        ;2
                retlw       0x08        ;3
                retlw       0x0c        ;4
                retlw       0x10        ;5
                retlw       0x18        ;6
                retlw       0x28        ;7
                retlw       0x40        ;8
                retlw       0x58        ;9
                retlw       0x68        ;10
                retlw       0x6f        ;11
                retlw       0x74        ;12
                retlw       0x78        ;13
                retlw       0x7c        ;14
```

-continued

```
                retlw       0x7f        ;15
;---------------------------------------------------------------
; mult8x8
; 8 by 8 multiply
; Inputs:
;           W, TEMP9
; Outputs:
;           16bit result in TEMPHI:TEMPLO
;---------------------------------------------------------------
mult8x8
                usePage0
                clrf        TEMPHI
                clrf        TEMPLO
                bcf         STATUS,C        ; clear carry bit
                btfsc       TEMP9,0
                addwf       TEMPHI,1
                rrf         TEMPHI,1
                rrf         TEMPLO,1
                btfsc       TEMP9,1
                addwf       TEMPHI,1
                rrf         TEMPHI,1
                rrf         TEMPLO,1
                btfsc       TEMP9,2
                addwf       TEMPHI,1
                rrf         TEMPHI,1
                rrf         TEMPLO,1
                btfsc       TEMP9,3
                addwf       TEMPHI,1
                rrf         TEMPHI,1
                rrf         TEMPLO,1
                btfsc       TEMP9,4
                addwf       TEMPHI,1
                rrf         TEMPHI,1
                rrf         TEMPLO,1
                btfsc       TEMP9,5
                addwf       TEMPHI,1
                rrf         TEMPHI,1
                rrf         TEMPLO,1
                btfsc       TEMP9,6
                addwf       TEMPHI,1
                rrf         TEMPHI,1
                rrf         TEMPLO,1
                btfsc       TEMP9,7
                addwf       TEMPHI,1
                rrf         TEMPHI,1
                rrf         TEMPLO,1
                return
;---------------------------------------------------------------
; gainadjust —
; the adjustment is a two's complement num
; the gain is an unsigned number.
; The adjustment should be bounded well within
; +/-127.
; return the adjusted gain in W register
;---------------------------------------------------------------
gainadjust
                movlw       high        gainaddpos
                movwf       PCLATH
                movf        usoffgain,W
                btfsc       Occupied
                movf        usongain,W
                movwf       TEMP7
                movf        usoffadj,W
                btfsc       Occupied
                movf        usonadj,W
                movwf       TEMP8
                btfss       TEMP8,7         ; is it negative or positive?
                goto        gainaddpos
                ; adjust term is negative, so check for negative overflow
                addwf       TEMP7,W
                btfss       STATUS,C
                movlw       H'1'            ; minimal
                return
gainaddpos
                ; adjust term is positive, so check for overflow
                addwf       TEMP7,W
                btfsc       STATUS,C
                movlw       H'ff'           ; max
                return
```

-continued

```
gainlookup
          usePage0
          andlw     H'0f'              ; limit to 16
          movwf     TEMP7
          movlw     high      gainlustart
          movwf     PCLATH
          movf      TEMP7,W
          addlw     low       gainlustart
          btfsc     STATUS,C
          incf      PCLATH,F
          movwf     PCL
gainlustart
          retlw     D'1'
          retlw     D'4'
          retlw     D'9'
          retlw     D'16'
          retlw     D'25'
          retlw     D'36'
          retlw     D'49'
          retlw     D'64'
          retlw     D'81'
          retlw     D'100'
          retlw     D'121'
          retlw     D'144'
          retlw     D'169'
          retlw     D'196'
          retlw     D'225'
          retlw     D'255'
;
; PIRtask.asm
; COPYRIGHT (C) MYTECH CORP. 1996, 1997
;
; the PIR task
; orig: erw
;         composition mechanism 8-15-96 JJF
;         tighter filters 8-20-96 JJF
;
irtruthlookup
          movwf     TEMP9
          movlw     high      pirlu
          movwf     PCLATH
          movf      TEMP9,W
          addlw     low       pirlu
          btfsc     STATUS,C
          incf      PCLATH,F
          movwf     PCL
pirlu     retlw     0x0       ;0
          retlw     0x2       ;1
          retlw     0x4       ;2
          retlw     0x8       ;3
          retlw     0x0c      ;4
          retlw     0x10      ;5
          retlw     0x18      ;6
          retlw     0x28      ;7
          retlw     0x40      ;8
          retlw     0x58      ;9
          retlw     0x68      ;10
          retlw     0x70      ;11
          retlw     0x74      ;12
          retlw     0x78      ;13
          retlw     0x7c      ;14
          retlw     0x7f      ;15
PIRhpfilt macro
          ; --- first calculate pir low pass ----------
          ; TEMP9 already contains raw pir signal
          clrf      TEMP7
          movlw     high      genlp
          movwf     PCLATH
          movf      FSR,W
          movwf     TMPFSR
          movlw     6
          movwf     FCOUNT
          movlw     PIRLPLO
          movwf     FSR
          call      genlp              ; lowpass(PIR) in PIRLPHI:PIRLPLO
```

```
                movf        TMPFSR,W
                movwf       FSR
                ;---- calculate pir high pass -------------
                ; yhp(n) = x(n) - ylp(n)
                ;------------------------------------------
                comf        PIRLPHI,W
                movwf       TEMP8
                comf        PIRLPLO,W       ; negate
                addlw       1
                btfsc       STATUS,C        ; carry bit
                incf        TEMP8,F
                movwf       TEMP6           ; -pirlp in TEMP8, TEMP6
                movf        TEMP9,W
                addwf       TEMP8,F         ; TEMP8:TEMP6 = pir - pirlp
                endm
;               return
PIRavgfilt      macro
                movf        TEMP8,W
                movwf       TEMP9
                movf        TEMP6,W
                movwf       TEMP7
                movlw       high     genlp
                movwf       PCLATH
                movf        FSR,W
                movwf       TMPFSR
                movlw       8
                movwf       FCOUNT
                movlw       PIRAVGLO
                movwf       FSR
                call        genlp           ; avg(PIR) in PIRAVGLO:PIRAVGLO
                movf        TMPFSR,W
                movwf       FSR
                endm
;               return
;
; max routine
; returns the max of registers TEMP7 and TEMP8 in W
;
max             movlw       high     max2
                movwf       PCLATH
                movf        TEMP8,W
                subwf       TEMP7,W ; TEMP7-TEMP8, if borrow, TEMP8>TEMP7
                btfsc       STATUS,C
                goto        max2
                movf        TEMP8,W
                return
max2            movf        TEMP7,W
                return
runPIR          nop
                movlw       0a1h            ; 1010 0001 enable an4 a/d
                movwf       ADCON0          ; next reading will be PIR input (ch4 pin 7)
                bcf         IRSense         ; clear the pir sense bit.
                movlw       high     pirwait1
                movwf       PCLATH
                movlw       D'24'
                movwf       TEMP6
pirwait1
                decfsz      TEMP6,F
                goto        pirwait1
conv7           bsf         ADCON0,2        ; start a/d conversion
                movlw       high     waitPIR
                movwf       PCLATH
waitPIR         btfsc       ADCON0,2        ; wait til conversion complete
                goto        waitPIR         ; skip if conversion is complete
adPIR           movf        ADRES,0         ; get a/d input
                addlw       080h            ; center a/d output around 0
                movwf       TEMP9           ; save PIR input
;               if          useDA==1
;               movf        TEMP9,W
;               addlw       H'80'
;               doutd       0               ; 000
;               endif
                PIRhpfilt
;               if          useDA==1
;               movf        TEMP8,W
;               addlw       H'80'
;               doutd       1               ; 001
;               endif
                PIRavgfilt
```

```
;             if         useDA==1
;             movf       PIRAVGHI,W
;             addlw      H'80'
;             doutd      2                    ; 010
;             endif
; ------PIR Window Comparator---------------------------------
pirwind
              movf       PIRAVGLO,W
              subwf      TEMP6,F              ; lobyte(hp-avghp)
              btfss      STATUS,C             ; borrow?
              decf       TEMP8,F              ; yes
              movf       PIRAVGHI,W
              subwf      TEMP8,F              ; hibyte(hp-avghp)
              movlw      high       PIRpos
              movwf      PCLATH
              btfss      TEMP8,7              ; skip next if sign is 1
              goto       PIRpos
PIRneg        comf       TEMP8,F              ; get neg of (hp-avghp)
              comf       TEMP6,F
              incf       TEMP6,F
              btfsc      STATUS,Z
              incf       TEMP8,F
PIRpos        nop                             ; abs(PIRavg-TEMP8) in TEMP7
;             if         useDA==1
;             movf       TEMP8,W
;             addlw      H'80'
;             doutd      3                    ; 011
;             endif
              movlw      high       PIRnomotion
              movwf      PCLATH
              movlw      H'7f'                ; 127
              subwf      PIRthresh,W
              btfsc      STATUS,Z             ; if PIRthresh is 127 (max.) then
              goto       PIRnomotion          ; do not try to sense motion
PIRcomp       ; Compare abs(hp-hpavg) to threshold
              movlw      high       irnoadjust
              movwf      PCLATH
              movf       PIRthresh,W
              btfss      ASAEnable            ; apply adjustment only if asa enabled
              goto       irnoadjust
              movf       iroffadj,F
              btfsc      STATUS,Z             ; no adjustment present
              goto       irnoadjust
              movlw      high       iradjpos
              movwf      PCLATH
              movf       PIRthresh,W
              btfss      iroffadj,7           ; is adjustment negative?
              goto       iradjpos
              addwf      iroffadj,W
              btfss      STATUS,C
              movlw      H'16'                ; min thresh
              movwf      TEMP7
              movlw      high       irnoadjust
              movwf      PCLATH
              movf       TEMP7,W
              goto       irnoadjust
iradjpos
              addwf      iroffadj,W
              btfsc      STATUS,C             ; make sure adjustment did not rollover
              movlw      H'7f'                ; if it did, saturate at most positive #
irnoadjust
              movwf      TEMP9
              subwf      TEMP8,W              ; |(hp-hpavg)| - threshold
              movwf      pirdecision
              if         useDA==1
              movf       pirdecision,W
              addlw      H'80'
              doutd      7                    ; 100
              endif
;             if         useDA==1
;             movf       TEMP9,W
;             addlw      H'80'
;             doutd      7                    ; 110
;             endif
              movlw      high       pirlbl3
              movwf      PCLATH
              btfss      pirdecision,7        ; if motion detected, forget noise estimate
              goto       pirlbl3
              btfsc      Occupied             ; if occupied, forget noise estimate
```

-continued

```
                goto        pirlbl3
        ;-------------------------------------------------------
        ; compute an estimate of the ir noise floor    -
        ; when the space is not occupied.              -
        ;-------------------------------------------------------
                movf        pirdecision,W
                movwf       TEMP8
                usePage1
                movf        irRecentMax,W
                usePage0
                movwf       TEMP7
                movlw       high      max
                movwf       PCLATH
                call        max
                usePage1
                movwf       irRecentMax
                usePage0
pirlbl3
                movlw       high      pirlbl2
                movwf       PCLATH
                ; here we do the lookup of the
                ; truth of the pir sensor value.
                btfsc       pirdecision,7       ; is result positive?
                goto        pirlbl2             ; No. motion, if any, is marginal.
pir1truth
                movlw       H'7f'               ; Compare was positive, definite motion.
        ;       movwf       pirtruth            ; the truth is 0x7f for sure.
                movwf       TEMP8
                bsf         IRSense             ; set ir sense bit for ir only mode
                movlw       high      pirmotion
                movwf       PCLATH
                goto        pirmotion
pirlbl2
                comf        pirdecision,W
                addlw       1
                btfsc       STATUS,C            ; if add carried, then motion for sure
                goto        pir1truth
                movwf       TEMP7               ; TEMP7 = -pirdecision
                andlw       H'f0'
                btfss       STATUS,Z            ; if any high bits, then pirdecision was
                goto        PIRnomotion         ; large negative, so no motion.
                movlw       high      irtruthlookup
                movwf       PCLATH
                movf        TEMP7,W             ; remember TEMP7=-(|PIRHPHI-PIRHPAVG|-threshold)
                andlw       H'0f'               ; limit to 0-15 range
                sublw       H'0f'               ; reverse the limit
                call        irtruthlookup
        ;       movwf       pirtruth
                movwf       TEMP8
pirlbl1
                movlw       high      PIRnomotion
                movwf       PCLATH
                movf        pirtruth,F
                btfsc       STATUS,Z            ; is pirtruth = 0?
                goto        PIRnomotion         ; yes, so no motion sensed
;pirmotionled
pirmotion
                ; this is where we do the pulse stretching
                ; we only do pulse stretching for valid motion(truth level)
                movlw       high      endirstretch
                movwf       PCLATH
                decf        irpscnt,F           ; reduce stretch count
                btfsc       STATUS,Z            ; did count reach zero?
                clrf        pirtruth            ; yes
                movf        pirtruth,W
                subwf       TEMP8,W             ; newtruth - oldtruth
                btfss       STATUS,C            ; did it borrow?
                goto        endirstretch        ; yes, so keep old
                movf        TEMP8,W
                movwf       pirtruth
                movlw       H'04'
                movwf       irpscnt
endirstretch
        ;-------------------------
        ; we have motion    -
        ;-------------------------
                movlw       high      PIRend
                movwf       PCLATH
                btfsc       NoLEDFlag           ; is led override switch turned on
```

-continued

```
          goto      PIRend
;-----------------------------------------------------------
; we now need to determine if the LED should be
; turned on based on the dual tech mode and the
; 'truth' of our motion signal.
;-----------------------------------------------------------
          movlw     high      irHSLED
          movwf     PCLATH
          btfsc     options,0            ; which dual tech mode
          goto      irHSLED              ; we are in HS mode
;-----------------------------------------------------------
; we are in HC mode, so we need to find the
; line 'a+b-60h=40h' (the HC equation). We
; choose the point where a=b, which is 50h.
;-----------------------------------------------------------
          movlw     high      irHCLED
          movwf     PCLATH
          movlw     H'50'
          subwf     pirtruth,W           ; pirtruth - 50h
          btfsc     STATUS,Z
          goto      irHCLED              ; pirtruth=50h
          movlw     high      PIRend
          movwf     PCLATH
          btfss     STATUS,C             ; STATUS is still result of subwf
          goto      PIRend               ; pirtruth<50h
irHCLED
          bcf       GreenLED
;         if useDA==0
;         movlw     high      initgmf
;         movwf     PCLATH
;         call      initgmf              ; turn on the LED, remember this
;                                        ; will delay for 100ms.
;         endif
          movlw     high      PIRend
          movwf     PCLATH
          goto      PIRend
irHSLED
          movlw     high      PIRend
          movwf     PCLATH
          movlw     H'7f'
          subwf     pirtruth,W           ; pirtruth - 7fh
          btfss     STATUS,Z             ; are they equal?
          goto      PIRend               ; no, so don't turn on led
          bcf       GreenLED
;         if useDA==0
;         movlw     high      initgmf
;         movwf     PCLATH
;         call      initgmf              ; turn on the LED, remember this
;                                        ; will delay for 100ms.
;         endif
          movlw     high      PIRend
          movwf     PCLATH
          goto      PIRend
PIRnomotion
          ; there's no motion unless we are stretching
          ; a previous pulse
          movlw     high      irzeroyes
          movwf     PCLATH
          movf      irpscnt,W
          btfsc     STATUS,Z
          goto      irzeroyes
          ; we are stretching a previous pulse
          decf      irpscnt,F
          movlw     high      PIRend
          movwf     PCLATH
          goto      PIRend
irzeroyes
          clrf      pirtruth
          bsf       GreenLED
PIRend
;         if        useDA==1
;         movf      pirtruth,W
;         addlw     H'80'
;         doutd     5
;         endif
          return
;
; o2sermon.asm
; COPYRIGHT (C) MYTECH CORP. 1996, 1997
```

-continued

```
; jjf
serrpt
; start by sending the header: preamble, version,
; # of data bytes, and checksum.
; [5ah][1-0-A-0-5][numbytes][checksum]
            usePage0
            movlw      high       serw1
            movwf      PCLATH
serw1       btfss      PIR1,TXIF
            goto       serw1
            movlw      H'5a'                ; preamble char
            movwf      TXREG
            movwf      MTEMP1               ; start checksum
            movlw      high       serw2
            movwf      PCLATH
serw2       btfss      PIR1,TXIF
            goto       serw2
            movlw      H'31'                ; ascii '1'
            movwf      TXREG
            addwf      MTEMP1               ; add to checksum
            movlw      high       serw3
            movwf      PCLATH
serw3       btfss      PIR1,TXIF
            goto       serw3
            movlw      H'30'                ; ascii '0'
            movwf      TXREG
            addwf      MTEMP1               ; add to checksum
            movlw      high       serw4
            movwf      PCLATH
serw4       btfss      PIR1,TXIF
            goto       serw4
            movlw      H'41'                ; ascii 'A'
            movwf      TXREG
            addwf      MTEMP1               ; add to checksum
            movlw      high       serw5
            movwf      PCLATH
serw5       btfss      PIR1,TXIF
            goto       serw5
            movlw      H'30'                ; ascii '0'
            movwf      TXREG
            addwf      MTEMP1               ; add to checksum
            movlw      high       serw6
            movwf      PCLATH
serw6       btfss      PIR1,TXIF
            goto       serw6
            movlw      H'36'                ; ascii '6'
            movwf      TXREG
            addwf      MTEMP1               ; add to checksum
            movlw      high       serw7
            movwf      PCLATH
serw7       btfss      PIR1,TXIF
            goto       serw7
            movlw      H'c0'                ; number of data words
            movwf      TXREG
            addwf      MTEMP1               ; add to checksum
            movlw      high       serw8
            movwf      PCLATH
serw8       btfss      PIR1,TXIF
            goto       serw8
            movf       MTEMP1,W             ; now send the checksum
            movwf      TXREG
            movlw      H'20'
            movwf      FSR
            movlw      high       serw9
            movwf      PCLATH
serw9       btfss      PIR1,TXIF
            goto       serw9
            movf       INDF,W
            movwf      TXREG
            incf       FSR,F
            btfss      FSR,7                ; overflow
            goto       serw9
            movlw      H'a0'
            movwf      FSR
            movlw      high       serw10
            movwf      PCLATH
serw10      btfss      PIR1,TXIF
            goto       serw10
            movf       INDF,W
```

```
            movwf      TXREG
            incf       FSR,F
            btfsc      FSR,7          ; overflow
            goto       serw10
            return
; irnoise.asm
; Copyright (C) 1996, 1997 Mytech Corp.
;
; John J. Fowler
;
;
; This file should be included in the main sensor
; file when using the IR Noise Estimate Adaptation
; feature. The macros contained in this file should
; then be placed in the appropriate places as
; defined below.
;
; INEMonitorPIRDetector — This macro should be placed
; at the end of the PIR sensor DSP code. It monitors
; the output of the threshold comparison to determine
; if motion has occurred. The routine assumes that there
; is a variable named 'pirdecision' which contains the
; result of the comparison. There must be a bit variable
; called 'Occupied' which is high the the space is occupied.
; The routine also uses a 16bit variable called
; LOFFTIMEHI:LOFFTIMELO which holds the amount of time that
; the space has been unoccupied. The routine places the new
; peak noise estimate in the variable named 'irRecentMax'.
;
; INEBeginLightsOff — This macro simply resets the 4 minute
; running maximum of the IR signal which is held in the
; variable called 'irRecentMax'. This routine should be run
; each time the load is de-energized.
;
; INEMinuteTask — This macro uses the short time running maximum
; of the IR signal, irRecentMax, to compute the long term
; running max of the IR noise. Effectively, this routine
; is performing the statistical order filter during each
; unoccupied period maintaining the result in the variable
; called 'irNoiseEst'. This routine also handles the task of
; double buffering 'irNoiseEst' by moving the most recent
; value of 'irNoiseEst' into the variable called 'irNoiseEstPrev'.
; This routine should be run every minute. It uses a variable
; called 'mcntlo' to determine when it should perform the
; actions mentioned above.
;
; INEFiniteMemory — This macro is used to give the IR Noise
; estimate a finite life span. Without this routine, the
; IR Noise Estimate will never decay once it reaches the
; highest possible value. This routine guarantees that once
; the IR Noise naturally begins to decline (perhaps due to
; seasonal change), the IR Noise Estimate will follow.
; The routine should be run each time the load is energized.
;
; IRNoiseExecute — This routine performs the actual check of
; the IR Noise Estimate against the boundaries of the desired
; noise region and makes adjustmentsthe variable 'iroffadj' as
; necessary. This routine should be placed in the 'main'
; routine. It is scheduled by setting the bit variable
; called 'IRNoiseCheckEnable'. The routine should be
; scheduled each time the load is energized.
;
INEMonitorPIRDetector macro
            movlw      high       dontdoirmax
            movwf      PCLATH
            btfss      pirdecision,7  ; if motion detected, forget noise estimate
            goto       dontdoirmax
            btfsc      Occupied       ; if occupied, forget noise estimate
            goto       dontdoirmax
            ;-------------------------------------------------------
            ; compute an estimate of the ir noise floor    -
            ; when the space is not occupied.              -
            ;-------------------------------------------------------
            movlw      high       doirmax
            movwf      PCLATH
            movf       LOFFTIMEHI,W
            btfss      STATUS,Z       ; if lofftimehi!=0, then >=8sec for sure
            goto       doirmax
            movlw      high       dontdoirmax
```

-continued

```
               movwf    PCLATH
               movf     LOFFTIMELO,W
               andlw    H'F8'
               btfsc    STATUS,Z          ; if 'and'=0, then <8sec since lights off
               goto     dontdoirmax
doirmax
               movf     pirdecision,W
               movwf    TEMP8
               usePage1
               movf     irRecentMax,W
               usePage0
               movwf    TEMP7
               movlw    high     i8max
               movwf    PCLATH
               call     i8max
               usePage1
               movwf    irRecentMax
               usePage0
dontdoirmax
               endm
INEBeginLightsOff         macro
               usePage1
               movlw    H'80'
               movwf    irRecentMax       ; set ir max to most negative number
               usePage0
               endm
INEMinuteTask             macro
;--------------------------------------------------------------------
; in order to get a better estimator of the ir noise       -
; level, we maintain a running max of the noise. Once      -
; every 4 minutes while the space is not occupied this     -
; running max is compared with the current ir noise        -
; estimate. The largest is the new noise estimate of       -
; the ir circuit.                                          -
;--------------------------------------------------------------------
; we only want to check the noise estimate once every      -
; four minutes. If double buffered, the noise est.         -
; will always be at least 4 min prior to the turn-on.      -
;--------------------------------------------------------------------
; execute at proper timeslice
               movlw    high     minnomaxreset
               movwf    PCLATH
               movlw    H'03'
               andwf    mcntlo,W
               btfss    STATUS,Z
               goto     minnomaxreset
               movlw    high     endminirest
               movwf    PCLATH
               ; do only when vacant
               btfsc    Occupied
               goto     endminirest
               ; only when vacant for at least ~29 min
               movlw    H'07'
               subwf    LOFFTIMEHI,W      ; lofftimehi - 7
               btfss    STATUS,C          ; if borrow then < ~29.87min
               goto     endminirest       ; borrow
               usePage1
               movf     irRecentMax,W
               usePage0
               movwf    TEMP8
               usePage1
               movf     irNoiseEst,W
               movwf    irNoiseEstPrev    ; we double buffer the noise estimator
               usePage0
               movwf    TEMP7             ; INE --> TEMP7
               movlw    high     max
               movwf    PCLATH
               call     max
               usePage1
               movwf    irNoiseEst
endminirest
               usePage1
               movlw    H'80'
               movwf    irRecentMax
minnomaxreset
               usePage0
               endm
```

-continued

```
INEFiniteMemory            macro
            ;----------------------------------------------------------
            ; we need to remove the 'infinite memory' trait of       -
            ; the ir noise estimate. We'll reduce the estimate       -
            ; by 25% every time an occupancy cycle begins.           -
            ; We really want to reduce the estimate of the           -
            ; noise floor. Since the estimate is usually < 0,        -
            ; a mathematical reduction by 25% actually is an         -
            ; increase in the estimate. We solve this problem        -
            ; by making the estimate unsigned, applying the          -
            ; mathematical reduction, and going back to signed.      -
            ;----------------------------------------------------------
            usePage1
            movlw      H'80'              ; roll the number around for
            addwf      irNoiseEst,F       ; convenient math
            bcf        STATUS,C
            rrf        irNoiseEst,F       ; ½ INE —> INE
            bcf        STATUS,C
            rrf        irNoiseEst,W       ; ¼ INE —> W
            addwf      irNoiseEst,F       ; ¾ INE —> INE
            movlw      H'80'
            addwf      irNoiseEst,F       ; don't forget to roll it back!
            usePage0
            endm
IRNoiseExecute             macro
            movlw      high       noircheck
            movwf      PCLATH
            btfss      IRNoiseCheckEnable
            goto       noircheck
            bcf        IRNoiseCheckEnable
            ;----------------------------------------------------------
            ; We look at the ir noise                                 -
            ; estimate. If it is sufficiently small then we can       -
            ; lower the threshold(increase sensitivity).              -
            ;----------------------------------------------------------
            movlw      high       irtoolrg
            movwf      PCLATH
            usePage1
            comf       irNoiseEstPrev,W   ; use the older noise estimate
            addlw      1                  ; -noise estimate in W
            usePage0
            movwf      MTEMP              ; store -noise estimate
            andlw      H'e0'              ; is it greater than 31 below threshold?
            btfsc      STATUS,Z           ; if 'and' is 0, then -noise is too large
            goto       irtoolrg           ; -(noise estimate) might be too large!
            ; noise level really low, maybe threshold too high...
            movlw      B'01100000'        ; ⅜ weighting factor
            movwf      MTEMP4
            movlw      high       o2AdjustIR_up
            movwf      PCLATH
            call       o2AdjustIR_up
            usePage1
            incf       INECount,F
            movlw      H'ff'
            btfsc      STATUS,Z
            movwf      INECount
            usePage0
            movlw      high       endirnoisefix
            movwf      PCLATH
            goto       endirnoisefix
irtoolrg
            movlw      high       endirnoisefix
            movwf      PCLATH
            movf       MTEMP,W
            andlw      H'f0'              ; is it >= 15
            btfss      STATUS,Z           ; if 'and' is 0, then -noise is too small
            goto       endirnoisefix      ; noise is within range [-15,-32], no change
            ; noise too large
            movlw      B'01100000'        ; ⅜ weighting factor
            movwf      MTEMP4
            movlw      high       o2AdjustIR_dn
            movwf      PCLATH
            call       o2AdjustIR_dn
            usePage1
            incf       INECount,F
            movlw      H'ff'
            btfsc      STATUS,Z
            movwf      INECount
            usePage0
```

```
-continued endirnoisefix
noircheck
        endm
```

What is claimed is:

1. An occupancy based load controller, comprising:

at least one occupancy sensor for producing at least one occupancy estimator signal indicative of motion within a space;

a programmable microprocessor, connected to said at least one occupancy sensor, for calculating an occupancy signal from said at least one occupancy estimator signal, for comparing said occupancy signal to an activation threshold, and for adjusting a sensitivity of said at least one occupancy sensor as a function of time-varying noise that corrupts said at least one occupancy estimator signal when said electrical load is de-energized; and a controllable load energizing device responsive to said programmable microprocessor, operable to automatically energize an electrical load when said microprocessor determines that said occupancy signal is greater than said activation threshold.

2. The load controller of claim 1, said at least one occupancy sensor including a PIR sensor, said programmable microprocessor further adjusting said sensitivity of said PIR sensor as a function of seasonal infrared noise that corrupts an output of said PIR sensor.

3. A method of operating a occupancy based load controller, including: at least one occupancy sensor for producing at least one occupancy estimator signal indicative of motion within a space, a programmable microprocessor, connected to said at least one occupancy sensor, for comparing said occupancy estimator signal to a predetermined threshold; and a controllable load energizing device responsive to said programmable microprocessor, operable to automatically energize an electrical load when said microprocessor determines that said occupancy estimator signal is greater than said predetermined threshold; said method comprising:

estimating noise that corrupts said at least one occupancy estimator signal when said electrical load is de-energized; and adjusting a sensitivity of said at least one occupancy sensor as a function of said estimated noise.

4. The method of claim 3, said estimating step comprising, estimating said noise by filtering said occupancy estimator signal using a statistical order filter.

5. The method of claim 3, said estimating step comprising, estimating said noise by digitally filtering said occupancy estimator signal.

6. The method of claim 3, said estimating step comprising, estimating said noise by time integrating said occupancy estimator signal.

7. The method of claim 3, said estimating step comprising, estimating said noise by averaging said occupancy estimator signal over time.

8. The method of claim 3, said estimating step comprising, estimating said noise by detecting an envelope of said occupancy estimator signal.

9. The method of claim 3, said step of adjusting said sensitivity, comprising, adjusting said predetermined threshold.

* * * * *

UNITED STATES PATENT AND TRADEMARK OFFICE
CERTIFICATE OF CORRECTION

PATENT NO.    : 6,078,253
DATED         : June 20, 2000
INVENTOR(S)   : John J. Fowler It is certified that error appears in the above-identified patent and that said Letters Patent is hereby corrected as shown below:

Title page,
[63], please delete "08/795,367" and insert therefor -- 08/795,327 --.
Page 2, References Cited [56], please delete "5,504,476" and insert therefor -- 5,504,473 --.
Page 2, References Cited [56], please delete "4,787,222" and insert therefor -- 4,787,722 --.
Page 2, References Cited [56], please add:
-- 5,034,579   7/1991   Rowland   200/61.45R --.

Signed and Sealed this

Twenty-fifth Day of September, 2001

Attest:

NICHOLAS P. GODICI
Attesting Officer    Acting Director of the United States Patent and Trademark Office